US010673373B2

(12) United States Patent
Hudson et al.

(10) Patent No.: US 10,673,373 B2
(45) Date of Patent: Jun. 2, 2020

(54) BUILDING INTEGRATED PHOTOVOLTAIC ROOFING ASSEMBLIES AND ASSOCIATED SYSTEMS AND METHODS

(71) Applicant: SolarCity Corporation, San Mateo, CA (US)

(72) Inventors: Tyrus Hawkes Hudson, Petaluma, CA (US); Charles Almy, Berkeley, CA (US); Martin Seery, San Rafael, CA (US); Daniel Preston Flanigan, Petaluma, CA (US); Ryan Devine, Richmond, CA (US); River Broussard, Santa Rosa, CA (US)

(73) Assignee: SolarCity Corporation, San Mateo, CA (US)

( * ) Notice: Subject to any disclaimer, the term of this patent is extended or adjusted under 35 U.S.C. 154(b) by 279 days.

(21) Appl. No.: 15/246,475

(22) Filed: Aug. 24, 2016

(65) Prior Publication Data

US 2017/0237389 A1     Aug. 17, 2017

Related U.S. Application Data

(60) Provisional application No. 62/294,743, filed on Feb. 12, 2016, provisional application No. 62/308,828, (Continued)

(51) Int. Cl.
*H02S 20/23*     (2014.01)
*H02S 20/25*     (2014.01)
(Continued)

(52) U.S. Cl.
CPC ............... *H02S 20/23* (2014.12); *E04D 3/30* (2013.01); *E04D 3/36* (2013.01); *E04D 3/361* (2013.01);
(Continued)

(58) Field of Classification Search
CPC ....... H02S 20/23; H02S 20/25; H01L 31/0443
See application file for complete search history.

(56) References Cited

U.S. PATENT DOCUMENTS 1,706,924 A   3/1929  Kane
4,336,413 A   6/1982  Tourneux
(Continued)

FOREIGN PATENT DOCUMENTS

CN    201460052 U    5/2010
CN    201656141      11/2010
(Continued)

OTHER PUBLICATIONS

Ilzhoefer Werner, DE-102012209738-A1, Dec. 2013, English Machine Translation.*
(Continued)

*Primary Examiner* — Tae-Sik Kang
(74) *Attorney, Agent, or Firm* — Dentons US LLP

(57) ABSTRACT

Building integrated photovoltaic (BIPV) systems provide for solar panel arrays that can be aesthetically pleasing and appear seamless to an observer. BIPV systems can be incorporated as part of roof surfaces as built into the structure of the roof, flush or forming a substantively uniform plane with roof panels or other panels mimicking a solar panel appearance. Pans supporting BIPV solar panels can be coupled by standing seams, in both lateral and longitudinal directions, to other photovoltaic-supporting pans or pans supporting non-photovoltaic structures, having both functional and aesthetic advantages. In some configurations, the appearance of BIPV systems can be particularly aesthetically pleasing and generally seamless to an observer.

20 Claims, 61 Drawing Sheets

Related U.S. Application Data filed on Mar. 15, 2016, provisional application No. 62/313,678, filed on Mar. 25, 2016, provisional application No. 62/354,599, filed on Jun. 24, 2016, provisional application No. 62/357,329, filed on Jun. 30, 2016, provisional application No. 62/374,704, filed on Aug. 12, 2016.

(51) Int. Cl.

| | | |
|---|---|---|
| H01L 31/0443 | (2014.01) | |
| H02S 30/10 | (2014.01) | |
| E04D 3/361 | (2006.01) | |
| E04D 3/40 | (2006.01) | |
| E04D 3/30 | (2006.01) | |
| E04D 3/366 | (2006.01) | |
| E04D 3/36 | (2006.01) | |
| F24S 25/40 | (2018.01) | |
| H02S 40/40 | (2014.01) | |
| H02S 40/42 | (2014.01) | |
| E04D 3/363 | (2006.01) | |
| E04D 3/367 | (2006.01) | |
| E04D 12/00 | (2006.01) | |
| E04D 13/17 | (2006.01) | |
| F24S 20/00 | (2018.01) | |
| F24S 20/67 | (2018.01) | |

(52) U.S. Cl.
CPC ............ *E04D 3/363* (2013.01); *E04D 3/364* (2013.01); *E04D 3/366* (2013.01); *E04D 3/40* (2013.01); *E04D 12/004* (2013.01); *E04D 13/17* (2013.01); *F24S 25/40* (2018.05); *H01L 31/0443* (2014.12); *H02S 20/25* (2014.12); *H02S 30/10* (2014.12); *H02S 40/40* (2014.12); *H02S 40/425* (2014.12); *F24S 20/67* (2018.05); *F24S 2020/13* (2018.05); *Y02A 30/62* (2018.01); *Y02B 10/12* (2013.01); *Y02B 10/20* (2013.01); *Y02E 10/44* (2013.01); *Y02E 10/47* (2013.01); *Y02E 10/50* (2013.01)

(56) References Cited

U.S. PATENT DOCUMENTS

| | | |
|---|---|---|
| 4,389,533 A | 6/1983 | Ames |
| 4,392,009 A | 7/1983 | Napoli |
| 4,433,200 A | 2/1984 | Jester et al. |
| 4,439,969 A | 4/1984 | Bartlett |
| 5,092,939 A | 3/1992 | Nath et al. |
| 5,363,624 A | 11/1994 | Cotter |
| 5,394,666 A | 3/1995 | Zahner, III |
| 5,409,549 A | 4/1995 | Mori |
| 5,651,837 A | 7/1997 | Ohtsuka et al. |
| 5,697,192 A | 12/1997 | Inoue |
| 6,065,256 A | 5/2000 | Joko |
| 6,269,596 B1 | 8/2001 | Ohtsuka et al. |
| 6,501,013 B1 | 12/2002 | Dinwoodie |
| 7,210,273 B2 | 5/2007 | Zahner, III |
| 7,328,534 B2 | 2/2008 | Dinwoodie |
| 7,592,537 B1 | 9/2009 | West |
| 8,495,997 B1 * | 7/2013 | Laubach ............... F24J 2/5233 126/621 |
| 8,511,006 B2 | 8/2013 | Reisdorf et al. |
| 8,522,493 B1 | 9/2013 | Rogers |
| 8,555,569 B2 | 10/2013 | Crasnianski |
| 8,745,935 B2 | 6/2014 | DuPont et al. |
| 8,782,972 B2 | 7/2014 | Grieco |
| 8,833,005 B1 | 9/2014 | Croft et al. |
| 8,904,718 B2 | 12/2014 | Schick et al. |
| 8,910,433 B2 | 12/2014 | Kacandes |
| 8,991,116 B2 | 3/2015 | Richardson |
| 9,080,792 B2 | 7/2015 | Patton et al. |
| 9,169,646 B2 | 10/2015 | Rodrigues et al. |
| 9,184,325 B2 | 11/2015 | Schulze et al. |
| 9,273,885 B2 | 3/2016 | Rodriguez et al. |
| 2010/0313499 A1 | 12/2010 | Gangemi |
| 2010/0313501 A1 * | 12/2010 | Gangemi ............... F24S 25/40 52/173.3 |
| 2012/0060896 A1 * | 3/2012 | Schafer ............... H01L 31/0521 136/246 |
| 2012/0244729 A1 * | 9/2012 | Rivera .................. F24J 2/4638 439/97 |
| 2012/0306289 A1 * | 12/2012 | Pozsgay ............ H01L 31/02021 307/131 |
| 2013/0167472 A1 | 7/2013 | Jenkins et al. |
| 2014/0020308 A1 | 1/2014 | Heisler |
| 2014/0150843 A1 | 6/2014 | Pearce et al. |
| 2015/0083194 A1 * | 3/2015 | Matsushima ....... H01L 31/0525 136/248 |

FOREIGN PATENT DOCUMENTS

| | | |
|---|---|---|
| CN | 202644866 U | 1/2013 |
| CN | 103485490 A | 1/2014 |
| DE | 7714688 | 1/1978 |
| DE | 7914879 | 10/1979 |
| DE | 7923325 | 12/1979 |
| DE | 2828170 | 1/1980 |
| DE | 7920668 | 4/1980 |
| DE | 2920997 | 12/1980 |
| DE | 2922652 | 12/1980 |
| DE | 2951285 | 7/1981 |
| DE | 2951810 | 7/1981 |
| DE | 8030163 | 7/1981 |
| DE | 3025348 | 1/1982 |
| DE | 8120962 | 1/1982 |
| DE | 2925293 | 9/1982 |
| DE | 3016847 | 11/1982 |
| DE | 3128253 | 2/1983 |
| DE | 2749490 | 3/1984 |
| DE | 3048113 | 2/1985 |
| DE | 2720824 | 5/1985 |
| DE | 3221490 | 1/1986 |
| DE | 3529970 | 2/1987 |
| DE | 3247467 | 9/1987 |
| DE | 2935001 | 6/1991 |
| DE | 9115759 | 2/1992 |
| DE | 3014295 | 7/1992 |
| DE | 4117430 | 12/1992 |
| DE | 4234947 | 4/1993 |
| DE | 4201489 | 7/1993 |
| DE | 4312083 | 10/1993 |
| DE | 4230537 | 3/1994 |
| DE | 29506798 | 6/1995 |
| DE | 29510106 | 9/1995 |
| DE | 4421078 | 2/1996 |
| DE | 4429394 | 2/1996 |
| DE | 19502215 | 8/1996 |
| DE | 19521098 | 12/1996 |
| DE | 29620459 | 1/1997 |
| DE | 19603540 | 8/1997 |
| DE | 19615165 | 10/1997 |
| DE | 29803796 | 5/1998 |
| DE | 29805791 | 6/1998 |
| DE | 29822489 | 2/1999 |
| DE | 29822490 | 3/1999 |
| DE | 29904440 | 5/1999 |
| DE | 29905410 | 7/1999 |
| DE | 29914080 | 2/2000 |
| DE | 29914249 | 2/2000 |
| DE | 19902532 | 8/2000 |
| DE | 19934449 | 2/2001 |
| DE | 19938554 | 2/2001 |
| DE | 20103069 | 5/2001 |
| DE | 20104774 | 6/2001 |
| DE | 20109941 | 8/2001 |
| DE | 20017402 | 2/2002 |
| DE | 10064164 | 6/2002 |
| DE | 10047400 | 2/2003 |
| DE | 10136037 | 3/2003 |

(56) References Cited

FOREIGN PATENT DOCUMENTS

| | | |
|---|---|---|
| DE | 20300233 | 4/2003 |
| DE | 10142383 | 7/2003 |
| DE | 10226024 | 12/2003 |
| DE | 20312719 | 4/2004 |
| DE | 10306529 | 6/2004 |
| DE | 202004010814 | 9/2004 |
| DE | 202004009677 | 11/2004 |
| DE | 202005018137 | 1/2006 |
| DE | 102004043205 | 3/2006 |
| DE | 202005019022 | 3/2006 |
| DE | 102005018687 | 11/2006 |
| DE | 202006012708 | 11/2006 |
| DE | 202006012709 | 11/2006 |
| DE | 202006013600 | 12/2006 |
| DE | 202006015220 | 2/2007 |
| DE | 202006017461 | 2/2007 |
| DE | 102005049222 | 4/2007 |
| DE | 202006012707 | 5/2007 |
| DE | 202006009582 | 6/2007 |
| DE | 202006008614 | 8/2007 |
| DE | 102006038730 | 12/2007 |
| DE | 202007012304 | 12/2007 |
| DE | 102006038729 | 2/2008 |
| DE | 102006038731 | 2/2008 |
| DE | 202008001826 | 5/2008 |
| DE | 10356690 | 7/2008 |
| DE | 202008007662 | 8/2008 |
| DE | 202008011091 | 10/2008 |
| DE | 202008010046 | 12/2008 |
| DE | 202008014730 | 1/2009 |
| DE | 202008015141 | 2/2009 |
| DE | 202007017351 | 4/2009 |
| DE | 102008013263 | 9/2009 |
| DE | 102009017997 | 10/2009 |
| DE | 202009005145 | 10/2009 |
| DE | 102008022018 A1 | 11/2009 |
| DE | 102008026505 | 2/2010 |
| DE | 102008060453 | 2/2010 |
| DE | 202009013596 | 2/2010 |
| DE | 202009013597 | 2/2010 |
| DE | 202009013598 | 2/2010 |
| DE | 102008041492 | 3/2010 |
| DE | 202009016159 | 3/2010 |
| DE | 202009017110 | 3/2010 |
| DE | 202008013999 | 4/2010 |
| DE | 202009013602 | 4/2010 |
| DE | 102008062087 | 6/2010 |
| DE | 202010002489 | 6/2010 |
| DE | 102009012669 | 9/2010 |
| DE | 202010005492 U1 | 9/2010 |
| DE | 202010005806 | 9/2010 |
| DE | 202010007766 | 9/2010 |
| DE | 202010007392 | 10/2010 |
| DE | 202010008139 | 10/2010 |
| DE | 102009022670 A1 | 12/2010 |
| DE | 102008055954 | 1/2011 |
| DE | 102009043811 | 2/2011 |
| DE | 202010014168 | 2/2011 |
| DE | 102009048501 | 3/2011 |
| DE | 202010016184 | 3/2011 |
| DE | 102009048884 | 4/2011 |
| DE | 202011001912 | 4/2011 |
| DE | 202011000264 | 6/2011 |
| DE | 202011100615 | 7/2011 |
| DE | 202011101279 | 7/2011 |
| DE | 102010010457 | 9/2011 |
| DE | 102010010676 | 9/2011 |
| DE | 102010013461 | 10/2011 |
| DE | 202011050829 | 10/2011 |
| DE | 102010023259 | 11/2011 |
| DE | 102010022845 | 12/2011 |
| DE | 102010036393 | 1/2012 |
| DE | 202009018550 | 1/2012 |
| DE | 202011052358 | 1/2012 |
| DE | 102010035529 | 3/2012 |
| DE | 102010054175 | 6/2012 |
| DE | 102011011833 | 8/2012 |
| DE | 102011052929 | 8/2012 |
| DE | 102010034841 | 10/2012 |
| DE | 102011001848 | 10/2012 |
| DE | 202012102087 | 10/2012 |
| DE | 202012008622 | 11/2012 |
| DE | 102011104516 | 12/2012 |
| DE | 102011105309 | 12/2012 |
| DE | 102011052212 | 1/2013 |
| DE | 202012005836 | 1/2013 |
| DE | 102012002387 | 8/2013 |
| DE | 102012011529 | 12/2013 |
| DE | 102012209738 A1 * 12/2013 ............ H02S 20/24 |||
| DE | 202013010199 | 12/2013 |
| DE | 102009018362 | 4/2014 |
| DE | 202013004982 | 6/2014 |
| DE | 102014011705 A1 | 2/2016 |
| DK | 467179 | 5/1980 |
| DK | 156281 | 12/1989 |
| EP | 0048982 | 4/1985 |
| EP | 0018543 | 8/1985 |
| EP | 0674141 | 9/1995 |
| EP | 0924775 | 6/1999 |
| EP | 1 310 747 A1 | 5/2003 |
| EP | 0960990 | 9/2004 |
| EP | 1860706 | 11/2007 |
| EP | 2117051 | 11/2009 |
| EP | 2230362 | 9/2010 |
| EP | 2239388 A1 | 10/2010 |
| EP | 2242112 | 10/2010 |
| EP | 2246902 | 11/2010 |
| EP | 2317244 | 5/2011 |
| EP | 2348542 | 7/2011 |
| EP | 2541618 | 1/2012 |
| EP | 2159850 | 3/2012 |
| EP | 2584282 | 4/2013 |
| EP | 2945283 | 8/2018 |
| FR | 2457356 | 12/1980 |
| FR | 2499693 | 8/1982 |
| FR | 2500134 | 8/1982 |
| FR | 2506370 | 12/1985 |
| FR | 2509445 | 8/1986 |
| FR | 2548714 | 9/1987 |
| FR | 2854183 | 10/2004 |
| FR | 2888862 | 1/2007 |
| FR | 2920453 | 3/2009 |
| FR | 2923082 A1 | 5/2009 |
| FR | 2926312 | 7/2009 |
| FR | 2933113 | 1/2010 |
| FR | 2937353 | 4/2010 |
| FR | 2937663 | 4/2010 |
| FR | 2938279 | 5/2010 |
| FR | 2933433 | 8/2010 |
| FR | 2931180 | 9/2010 |
| FR | 2943369 | 9/2010 |
| FR | 2934286 | 12/2010 |
| FR | 2950375 | 3/2011 |
| FR | 2953874 | 6/2011 |
| FR | 2949487 | 9/2011 |
| FR | 2957101 | 9/2011 |
| FR | 2948956 | 10/2011 |
| FR | 2949799 | 10/2011 |
| FR | 2958379 | 10/2011 |
| FR | 2958380 | 10/2011 |
| FR | 2958953 | 10/2011 |
| FR | 2948955 | 11/2011 |
| FR | 2959799 | 11/2011 |
| FR | 2960047 | 11/2011 |
| FR | 2960049 | 11/2011 |
| FR | 2960626 | 12/2011 |
| FR | 2961231 | 12/2011 |
| FR | 2961232 | 12/2011 |
| FR | 2961584 | 12/2011 |
| FR | 2945304 | 1/2012 |
| FR | 2962464 | 1/2012 |
| FR | 2962524 | 1/2012 |
| FR | 2962745 | 1/2012 |
| FR | 2963035 | 1/2012 |

(56) References Cited

FOREIGN PATENT DOCUMENTS

| | | |
|---|---|---|
| FR | 2963089 | 1/2012 |
| FR | 2956729 | 2/2012 |
| FR | 2964128 | 3/2012 |
| FR | 2964398 | 3/2012 |
| FR | 2964681 | 3/2012 |
| FR | 2965830 | 4/2012 |
| FR | 2957953 | 5/2012 |
| FR | 2958952 | 5/2012 |
| FR | 2966853 | 5/2012 |
| FR | 2966854 | 5/2012 |
| FR | 2967433 | 5/2012 |
| FR | 2967704 | 5/2012 |
| FR | 2968740 | 6/2012 |
| FR | 2924141 | 8/2012 |
| FR | 2960046 | 8/2012 |
| FR | 2960048 | 8/2012 |
| FR | 2963037 | 8/2012 |
| FR | 2960627 | 9/2012 |
| FR | 2973408 | 10/2012 |
| FR | 2974244 | 10/2012 |
| FR | 2974829 | 11/2012 |
| FR | 2952092 | 1/2013 |
| FR | 2978177 | 1/2013 |
| FR | 2969190 | 2/2013 |
| FR | 2979007 | 2/2013 |
| FR | 2961348 | 7/2013 |
| FR | 2964680 | 8/2013 |
| FR | 2979753 | 8/2013 |
| FR | 2987663 | 9/2013 |
| FR | 2980563 | 10/2013 |
| FR | 2951208 | 12/2013 |
| FR | 2963986 | 2/2014 |
| FR | 2973576 | 2/2014 |
| FR | 2997171 | 4/2014 |
| FR | 2999205 | 6/2014 |
| FR | 2999362 | 6/2014 |
| FR | 3001988 | 8/2014 |
| FR | 2948709 | 3/2015 |
| FR | 2958731 | 10/2015 |
| FR | 2983570 | 7/2018 |
| HU | 227066 | 6/2010 |
| IT | 1093873 | 7/1985 |
| IT | 1102699 | 10/1985 |
| IT | 1141246 | 10/1986 |
| IT | 1192554 | 4/1988 |
| IT | 1201027 | 1/1989 |
| IT | 227593 | 12/1997 |
| IT | 1391853 | 1/2012 |
| JP | H11 107472 A | 4/1999 |
| JP | 2002-013266 A | 1/2002 |
| JP | 2002-294955 A | 10/2002 |
| JP | 2014-214429 A | 11/2014 |
| NL | 1019326 | 5/2003 |
| NL | 1024168 | 3/2004 |
| NL | 1036093 | 4/2010 |
| WO | 9817880 | 4/1998 |
| WO | 9963281 | 12/1999 |
| WO | 2009018016 A2 | 2/2009 |
| WO | 2009112933 A2 | 9/2009 |
| WO | 2009138319 | 11/2009 |
| WO | 2010017982 | 2/2010 |
| WO | 2010049886 | 5/2010 |
| WO | 2010132638 A1 | 11/2010 |
| WO | 2011007201 | 1/2011 |
| WO | 2011151590 | 12/2011 |
| WO | 2012116306 A1 | 8/2012 |
| WO | 2012136194 | 10/2012 |
| WO | 2012168179 | 12/2012 |
| WO | 2014086503 A1 | 6/2014 |
| WO | 2014093081 A2 | 6/2014 |
| WO | 2015055714 A1 | 4/2015 |

OTHER PUBLICATIONS

Drexel Metals, "FW1 Flush Profile", retrieved from the internet on Feb. 1, 2017 at: http://drexmet.com/product-list/fw1-flush-profile, Drexel Metals Inc., Louisville, KY, 2 pages.

Invitation to Pay Fees and Partial International Search Report, dated Apr. 6, 2017, for corresponding International Patent Application PCT/US2016/069010, 8 pages.

International Search Report and Written Opinion dated Apr. 6, 2017, for related International Application PCT/US2016/069104, 12 pages.

International Search Report and Written Opinion, dated Jun. 6, 2017, for related International Application PCT/US2016/069010, 20 pages.

* cited by examiner

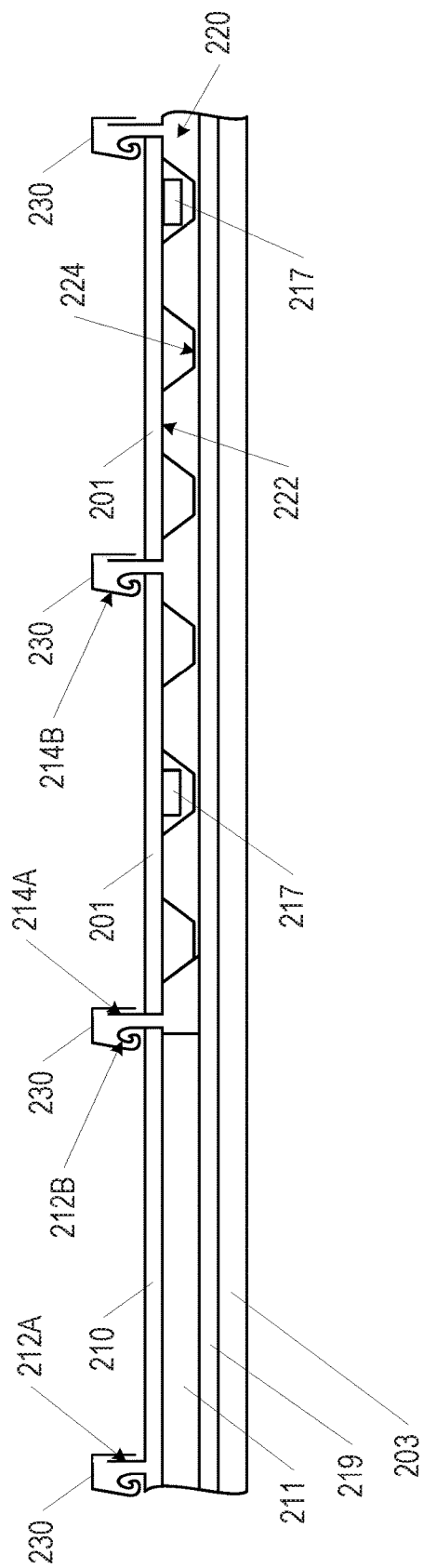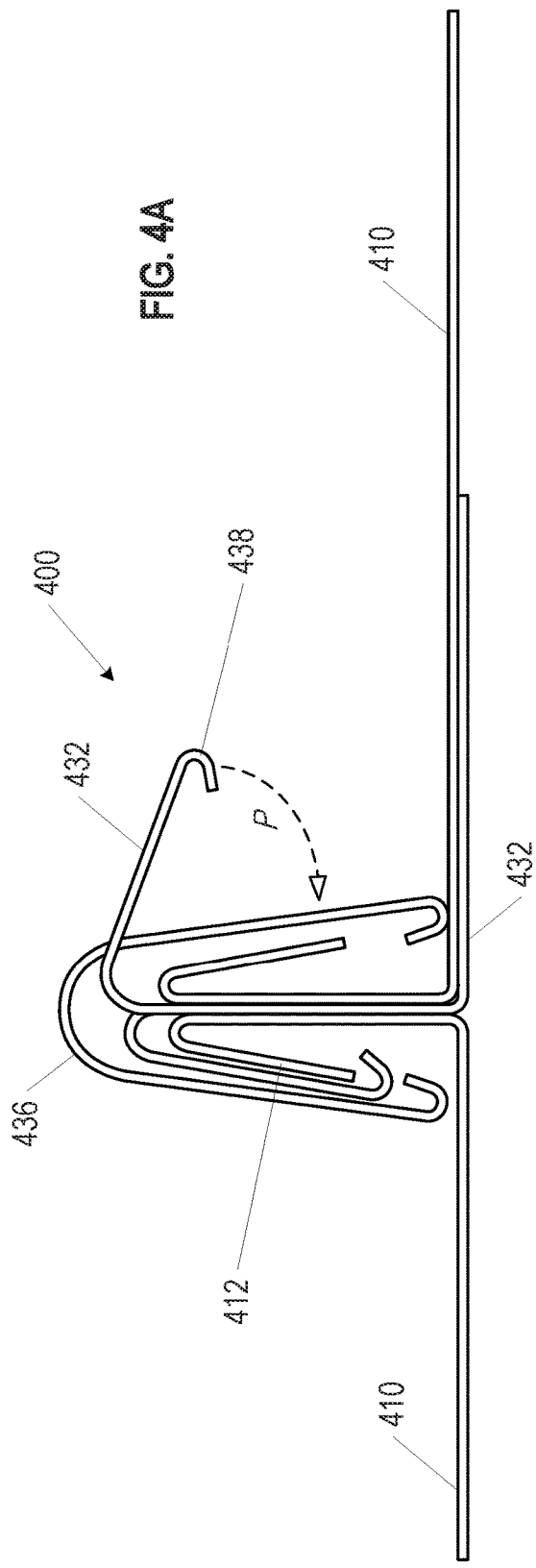

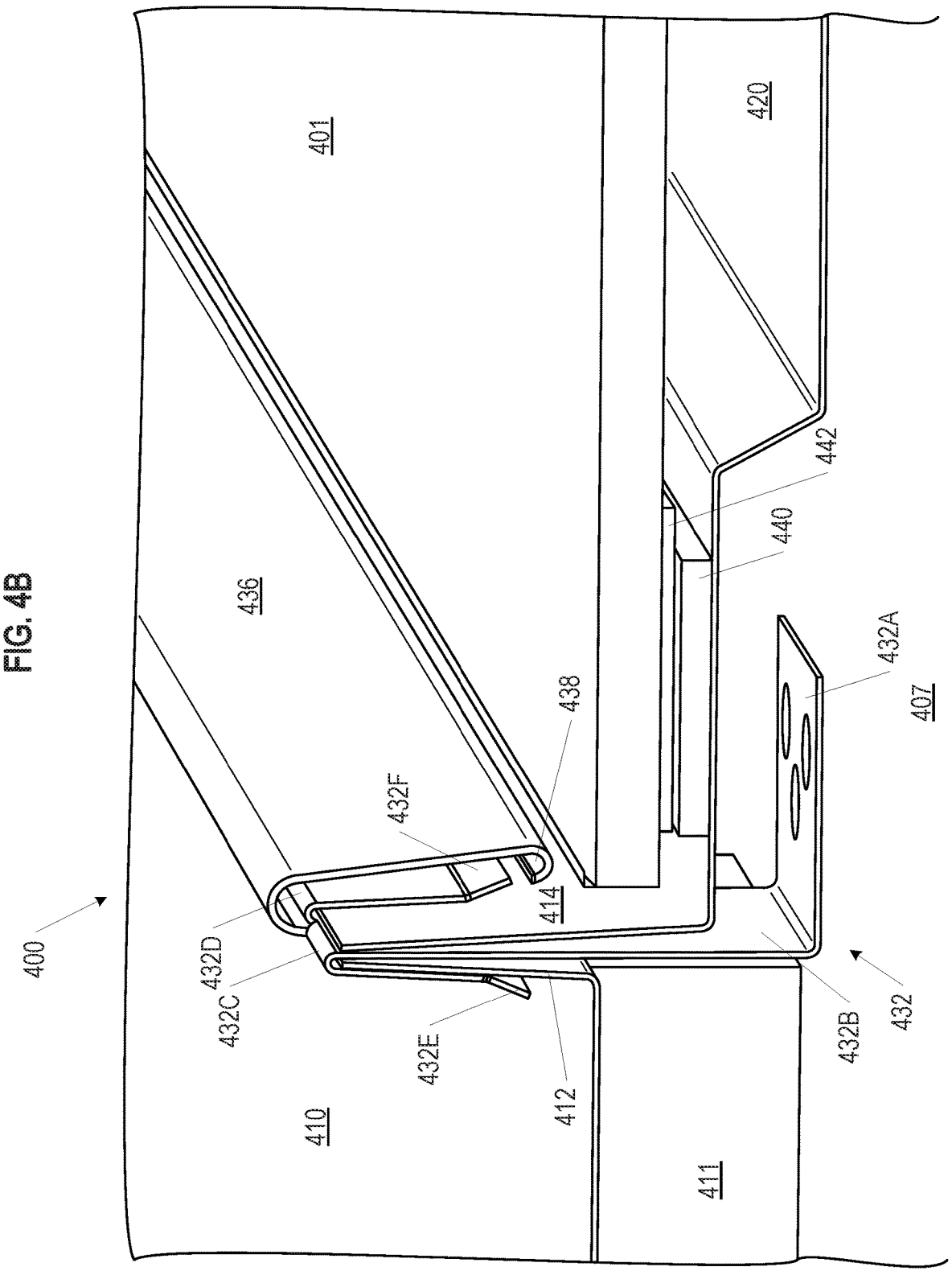

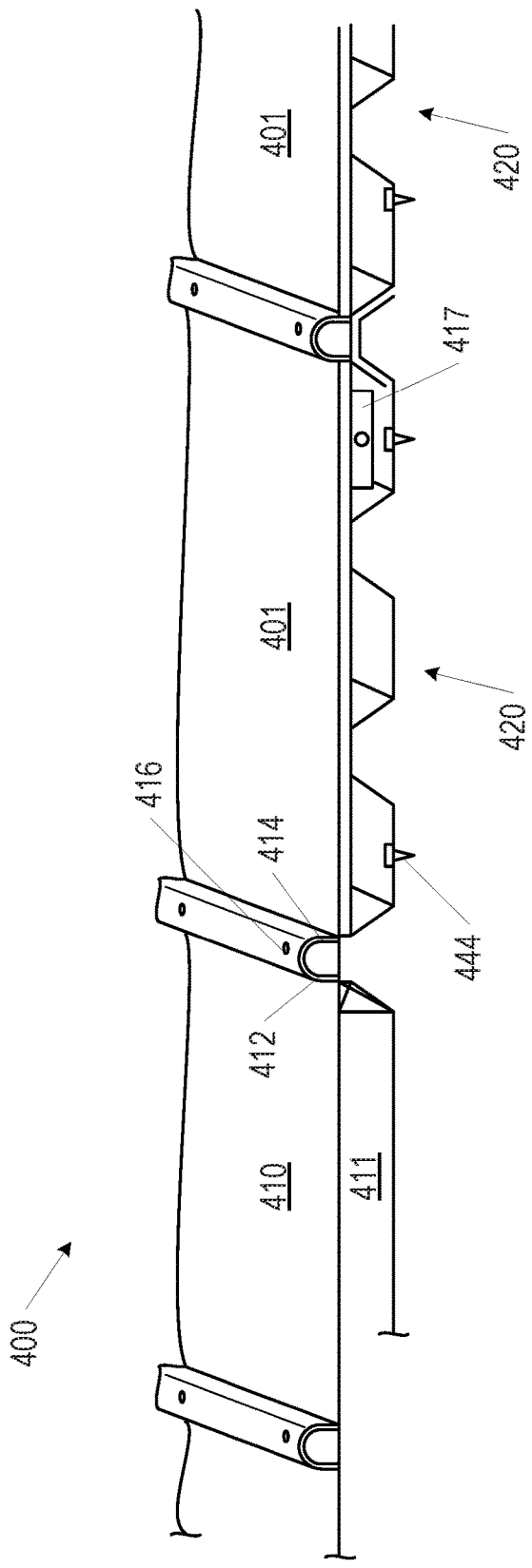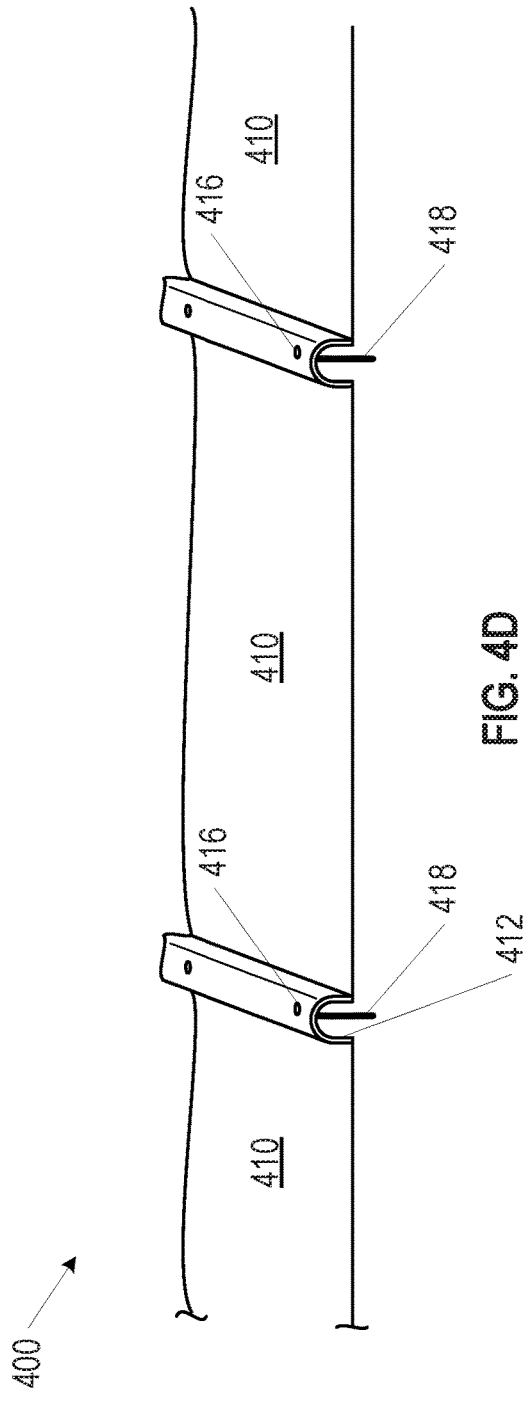

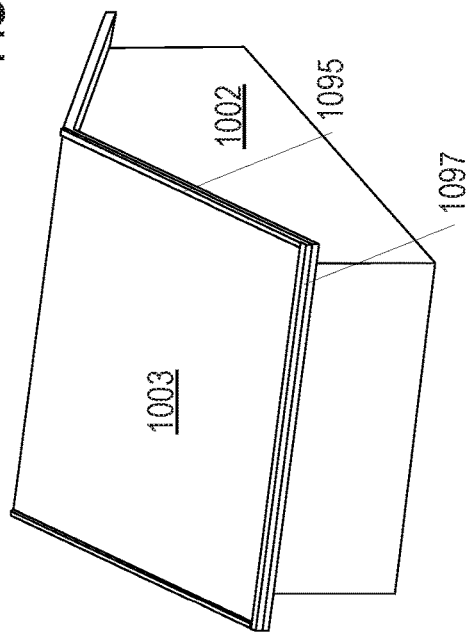
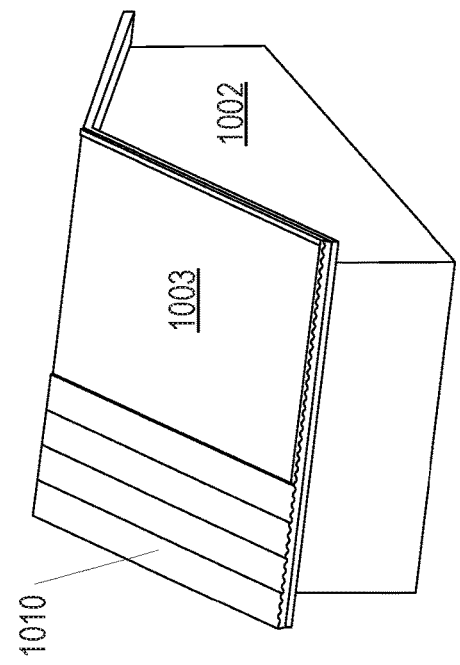
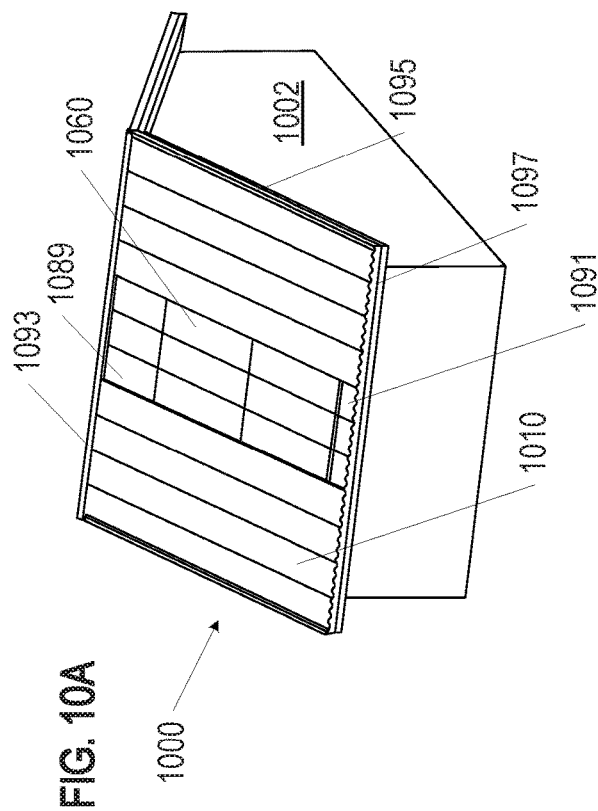
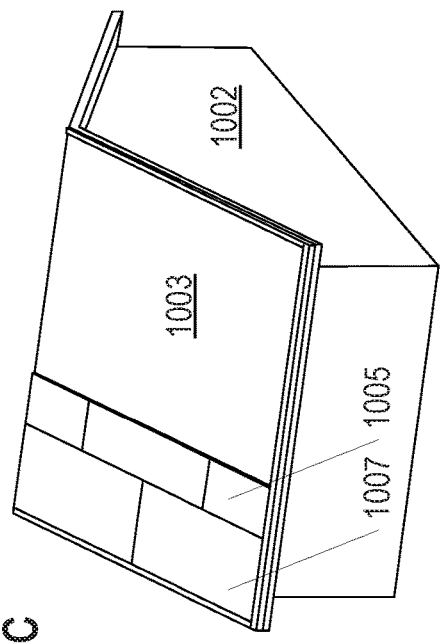

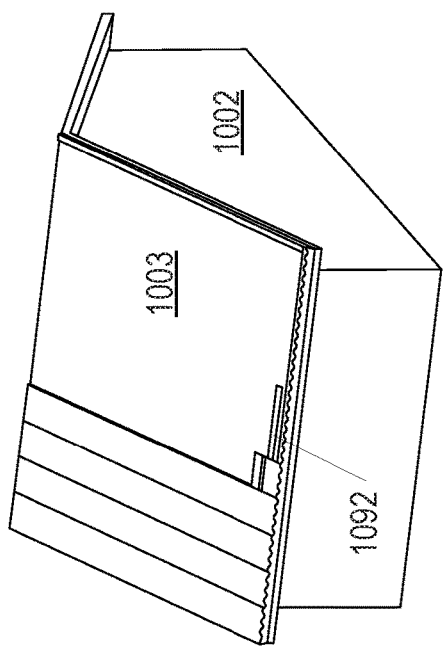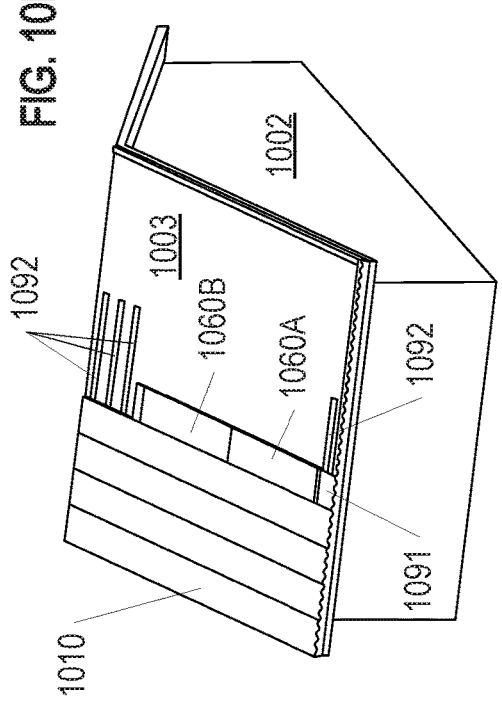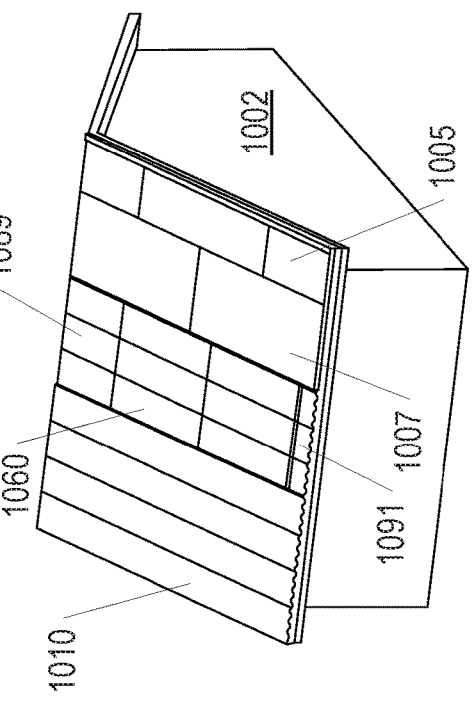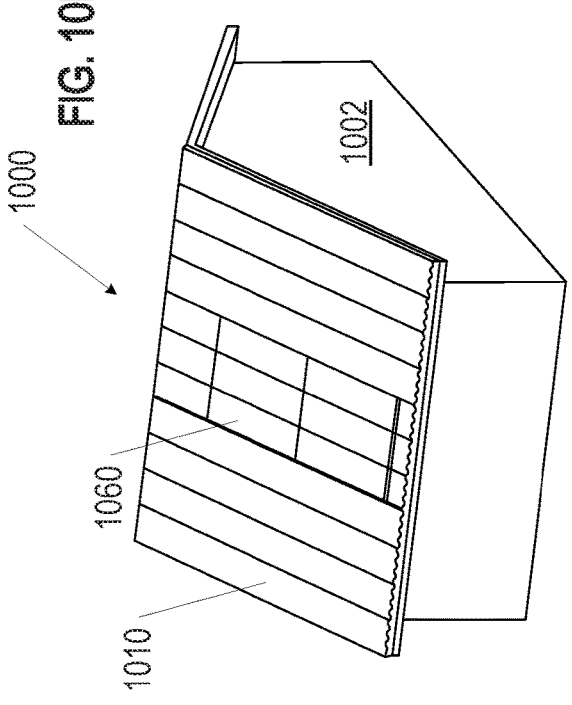

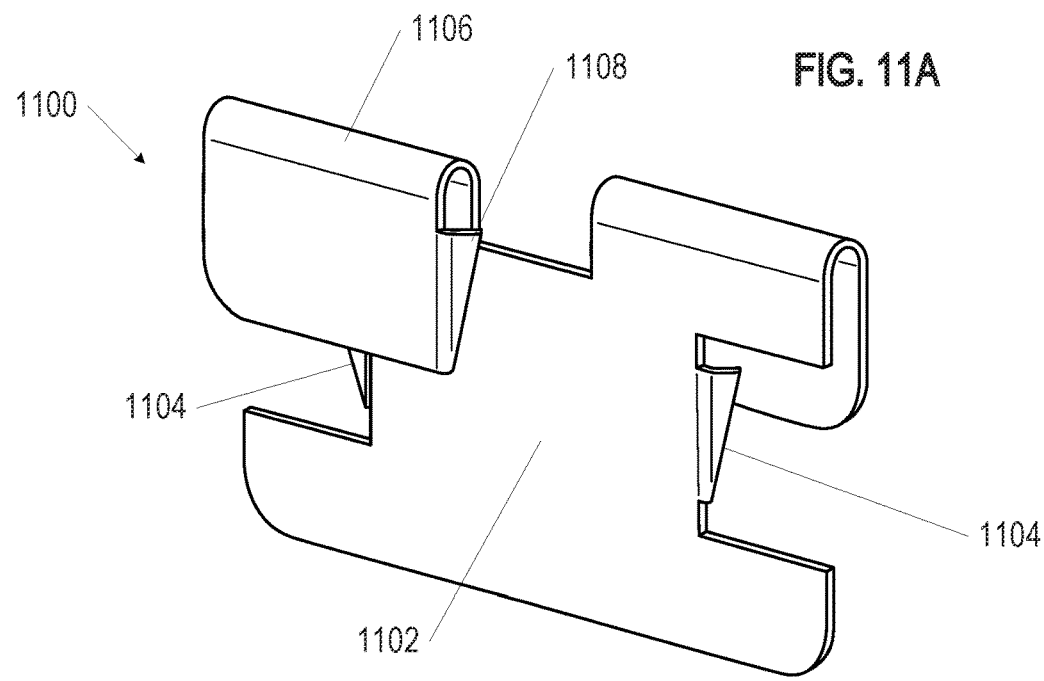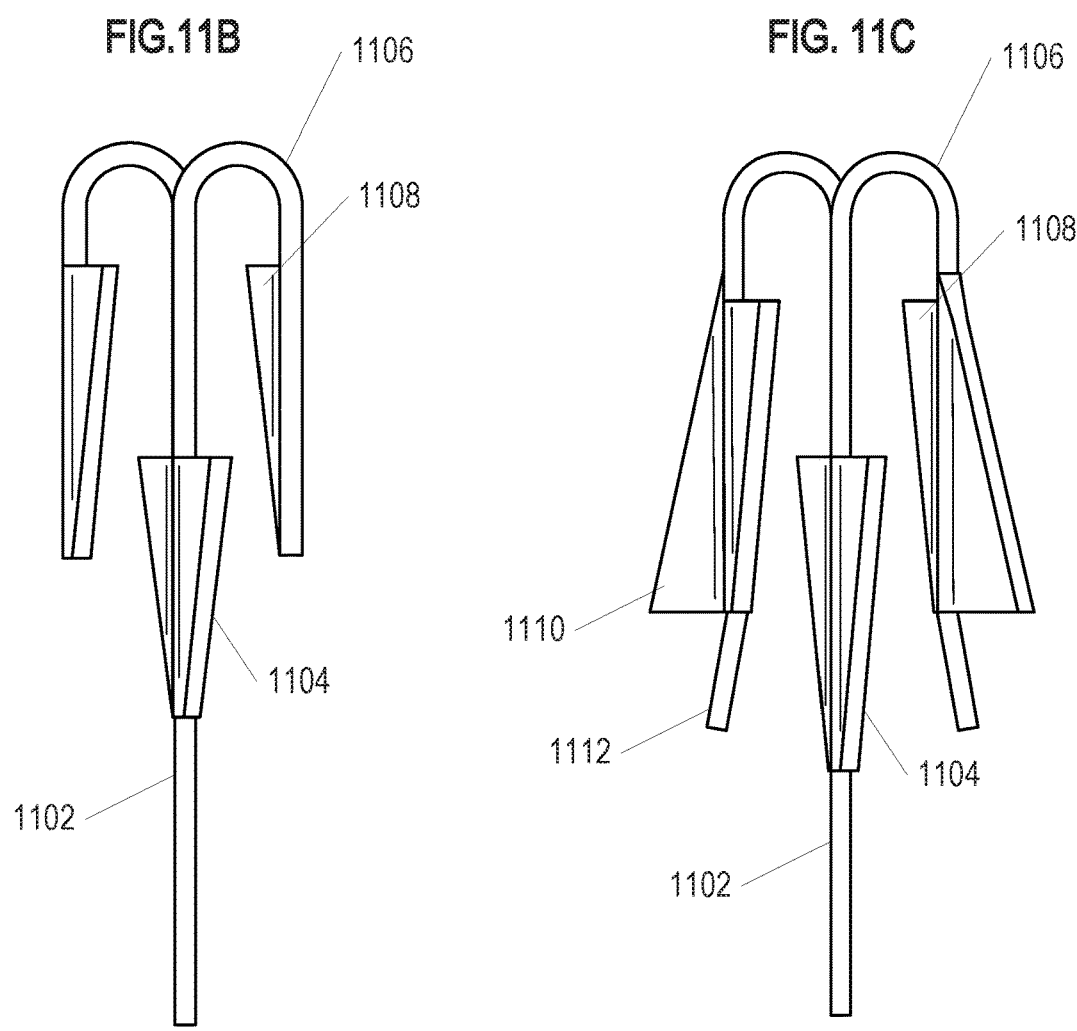

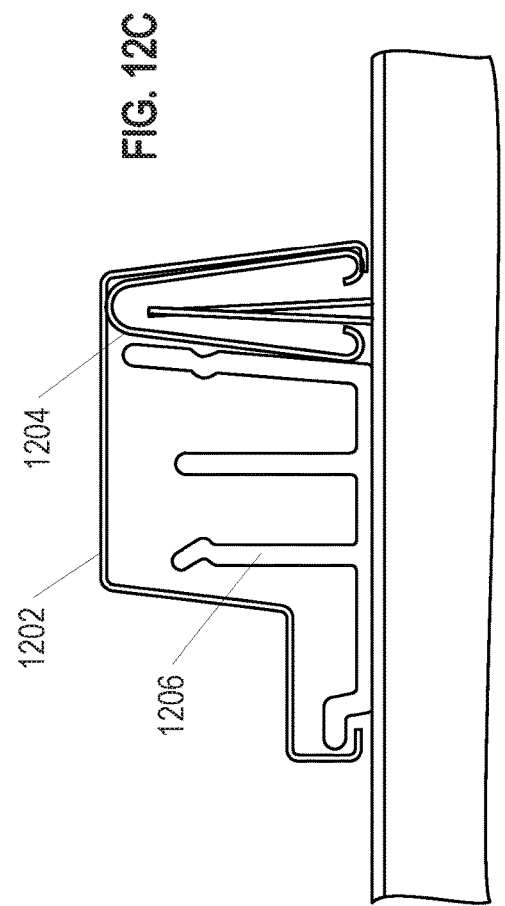
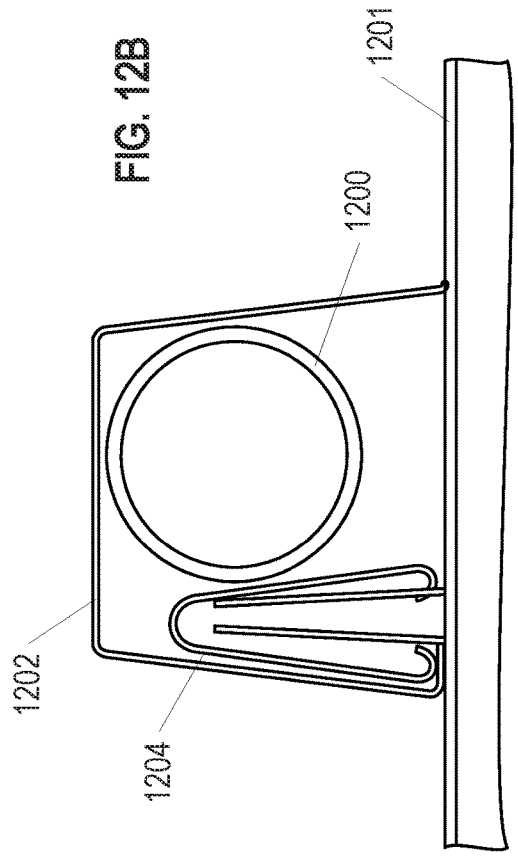
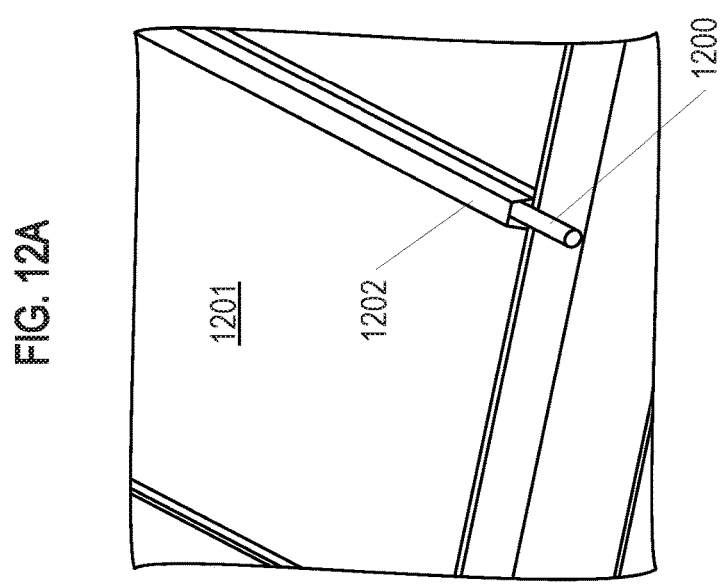

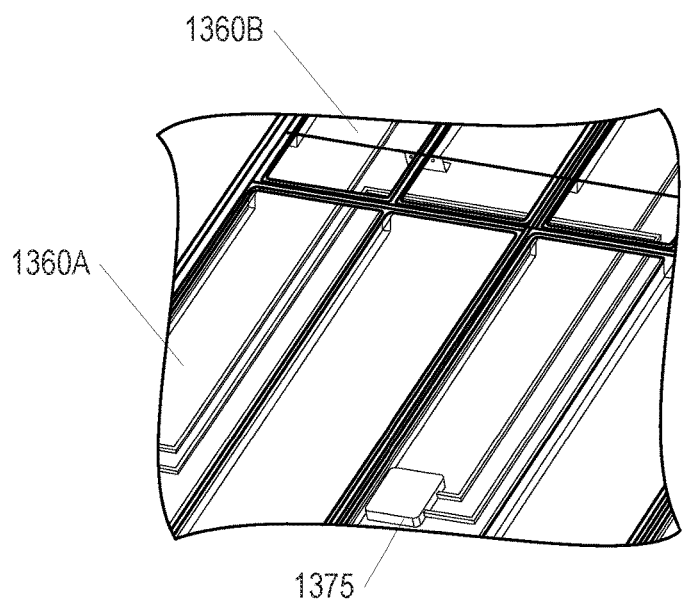
FIG. 13C
FIG. 13D
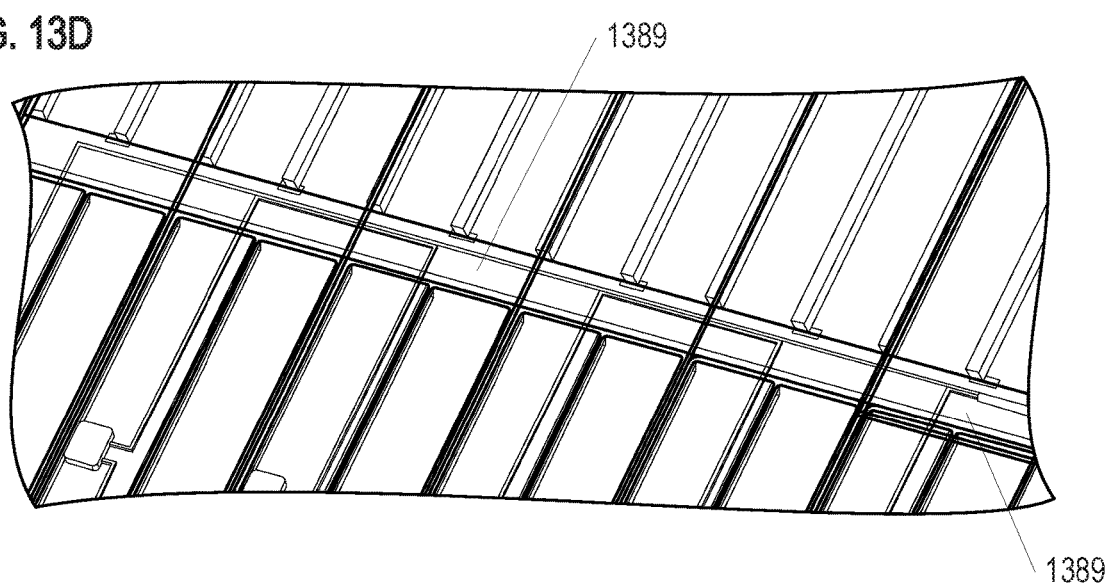
FIG. 13E
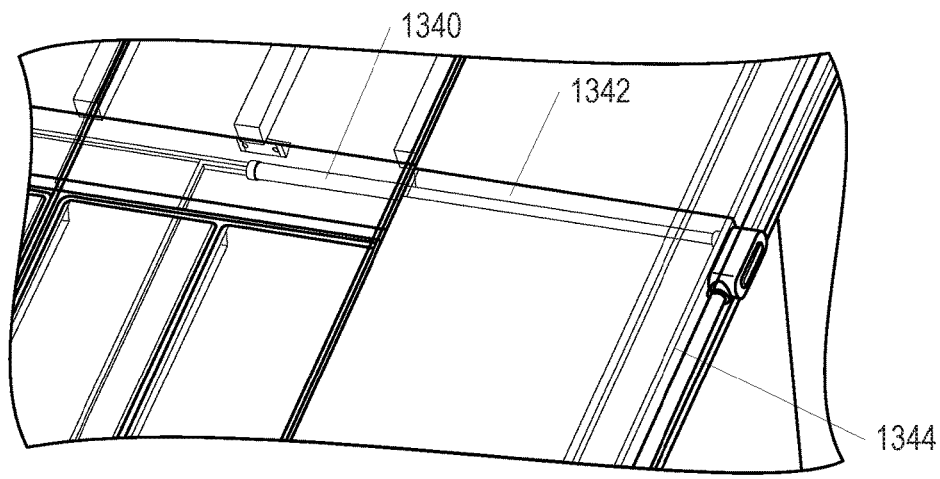

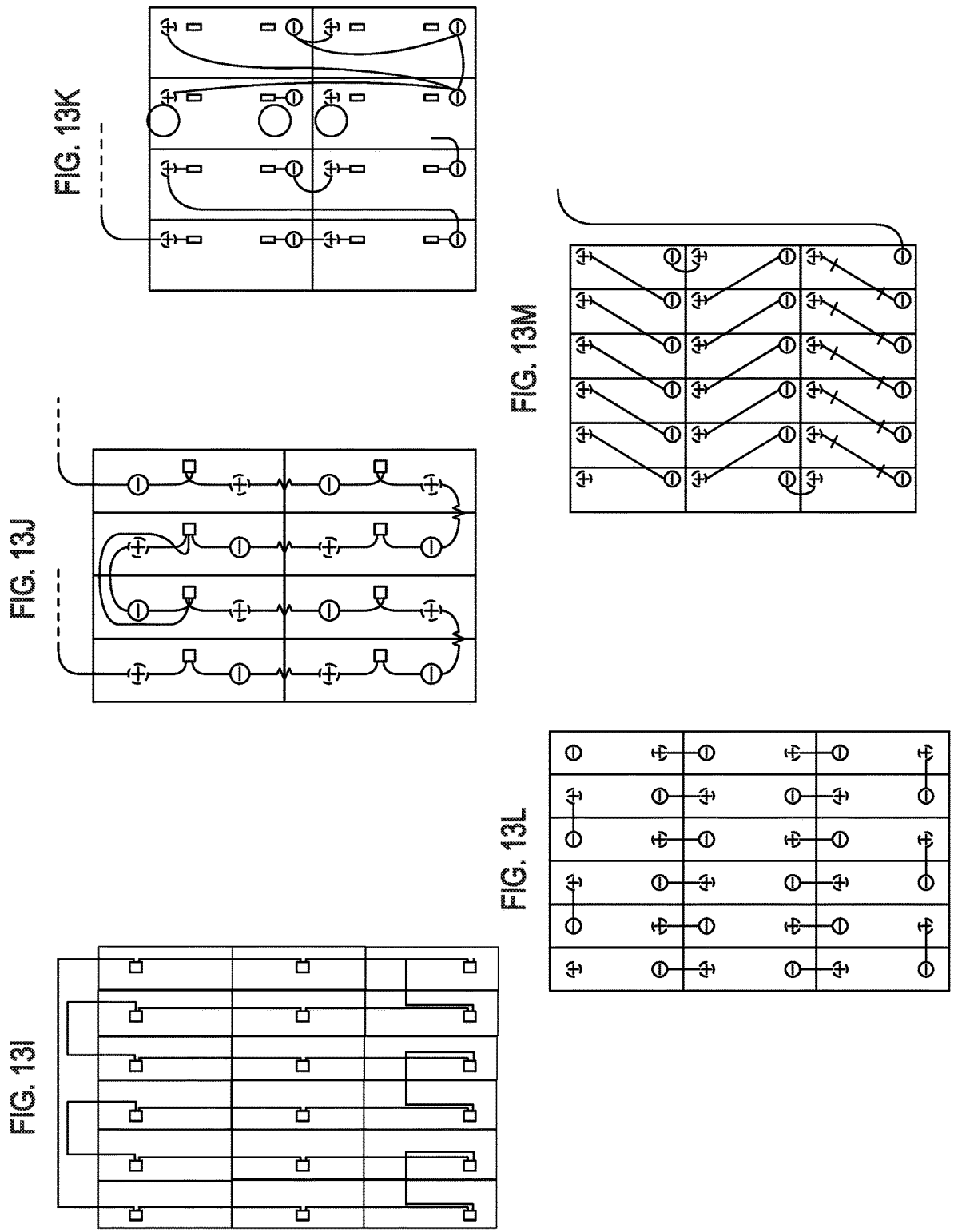

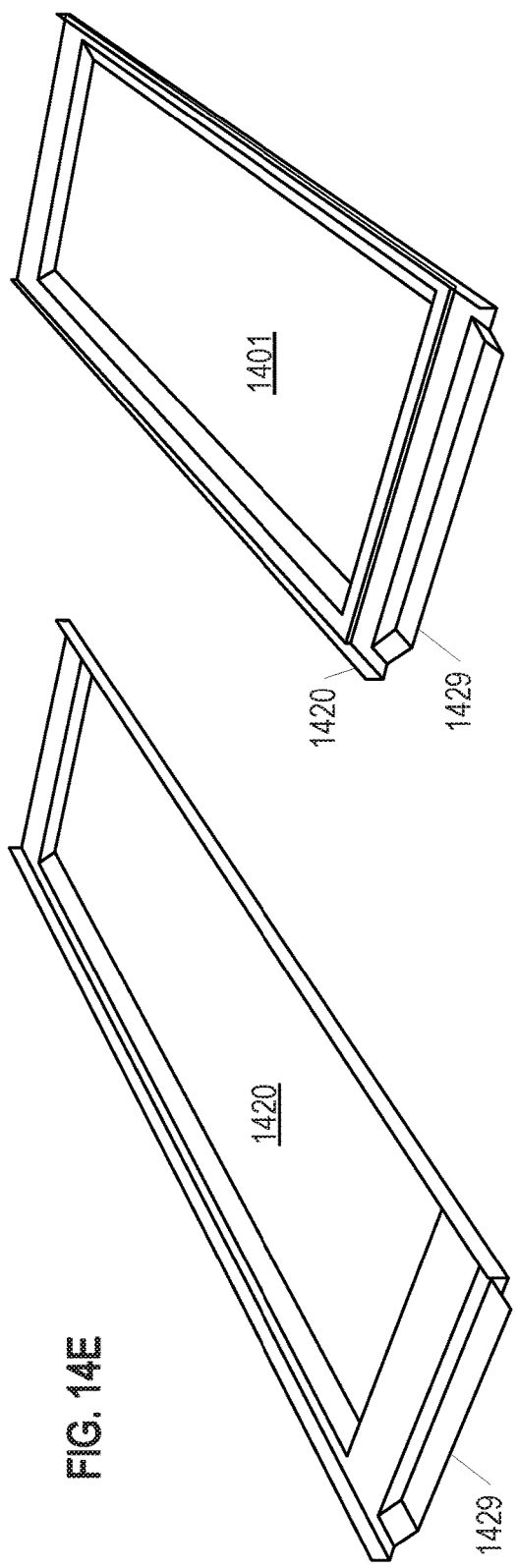
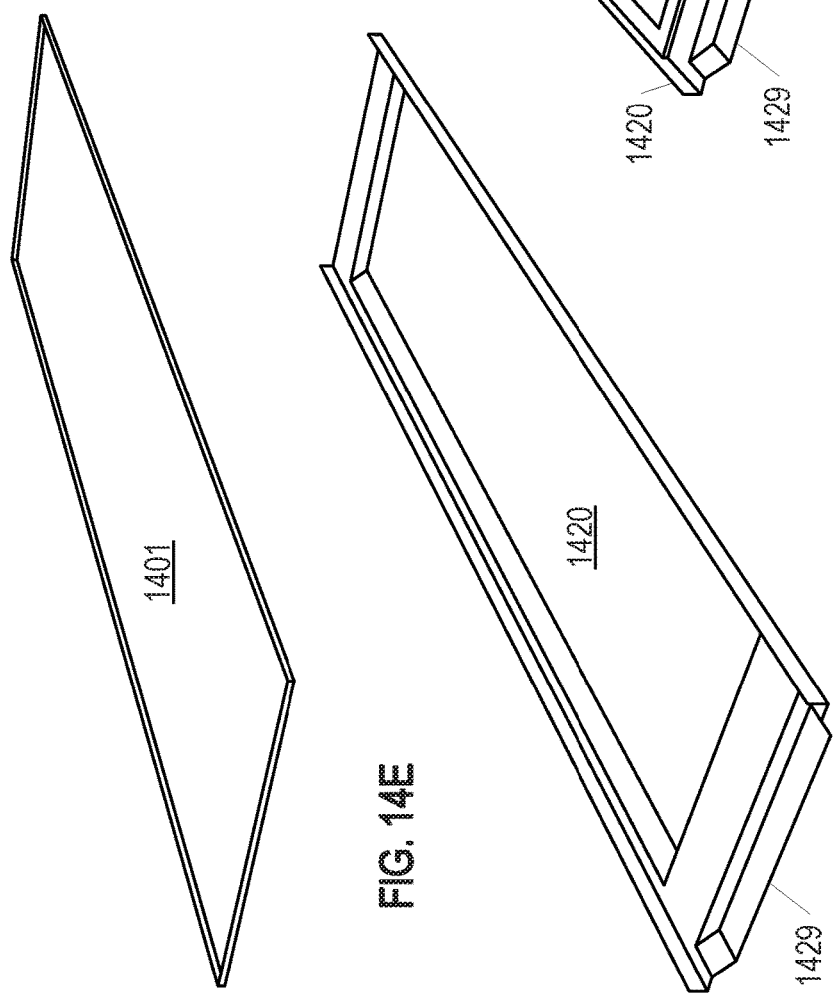
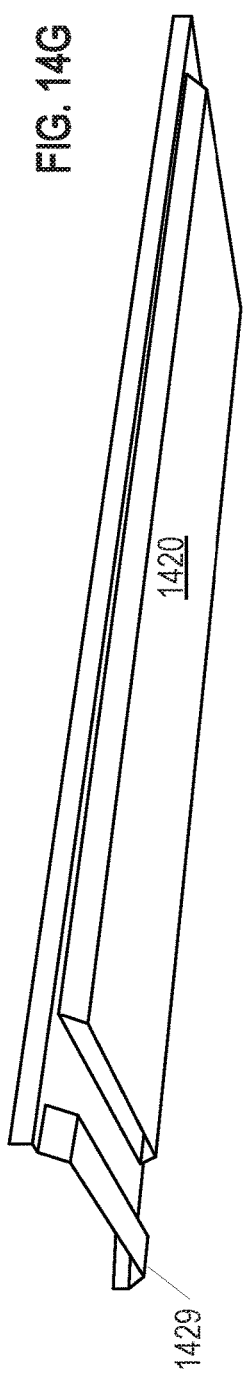

FIG. 25
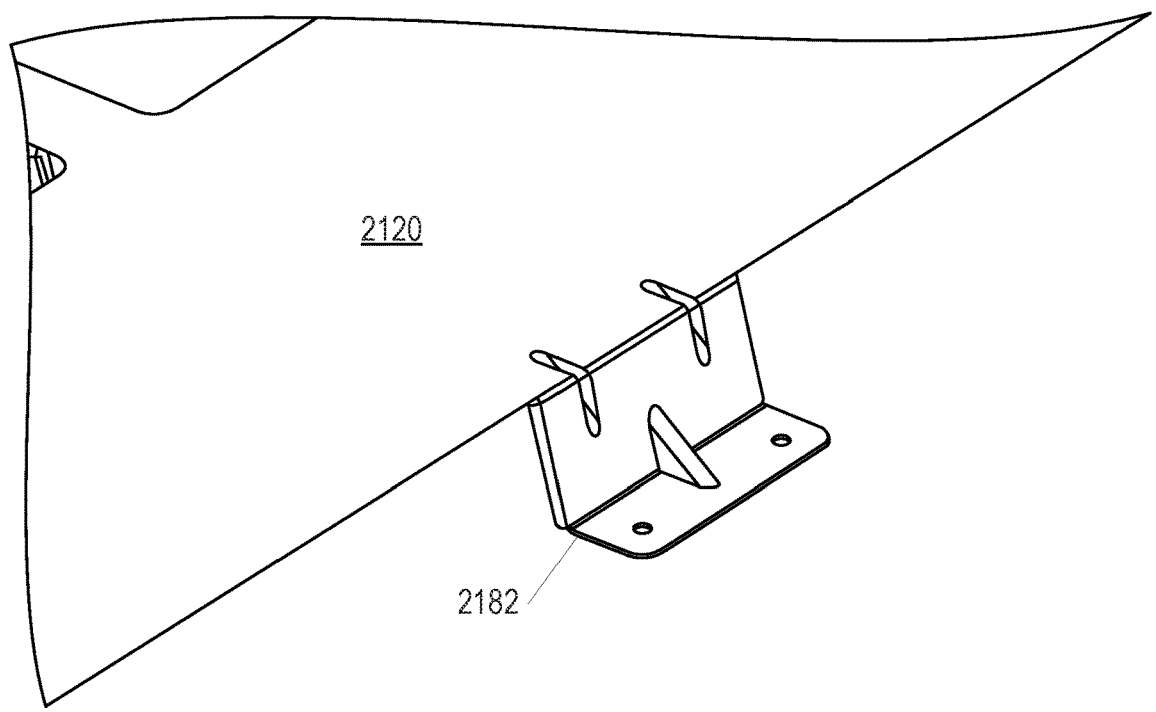
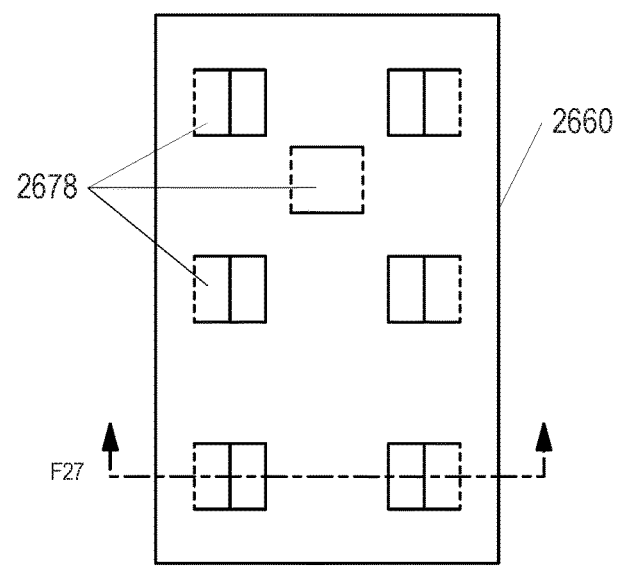
FIG. 26
FIG. 27A
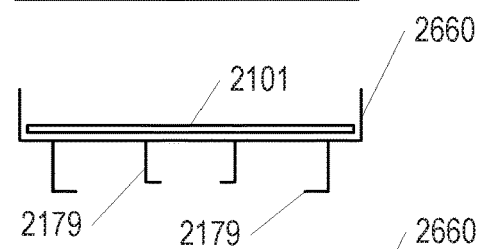
FIG. 27B

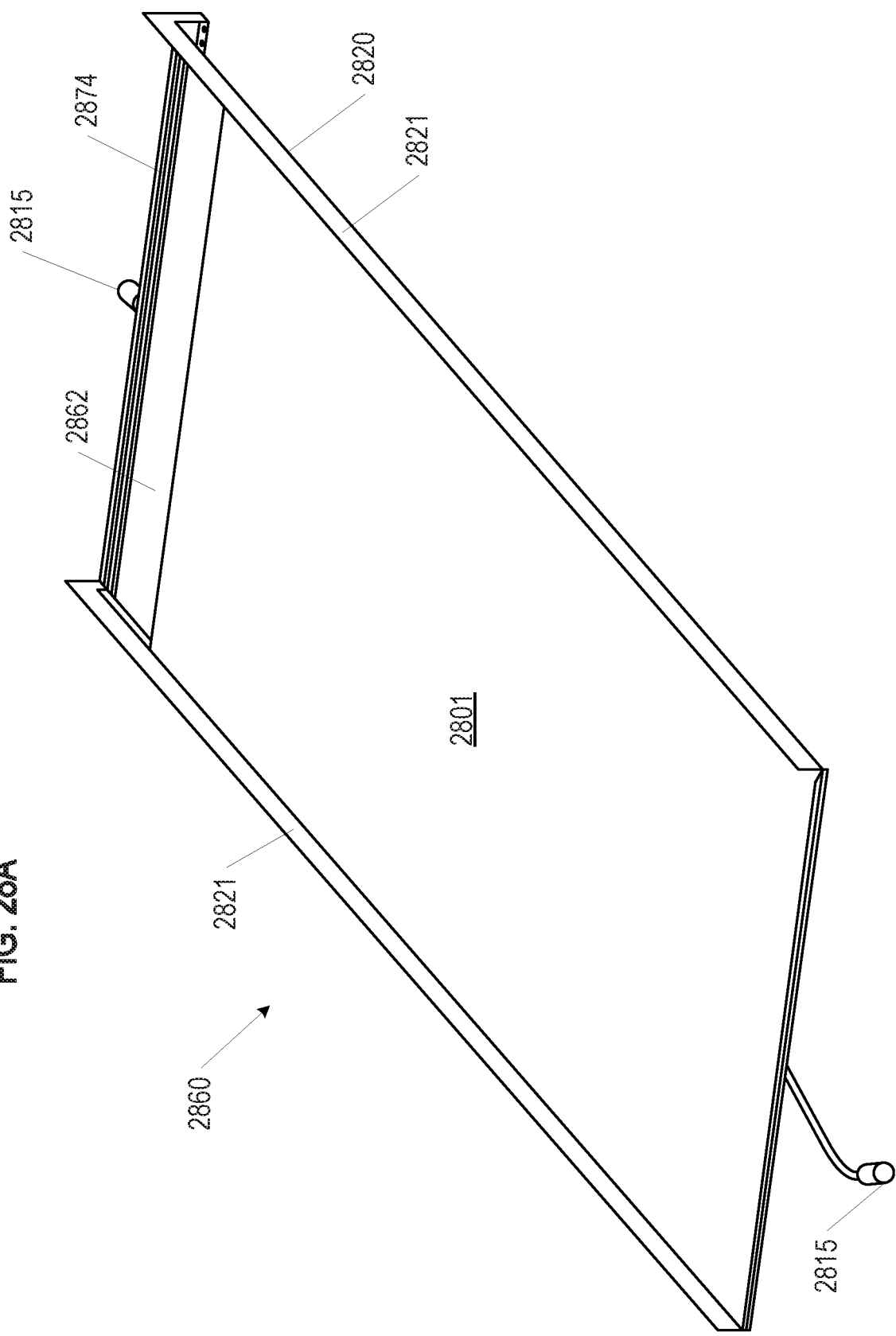

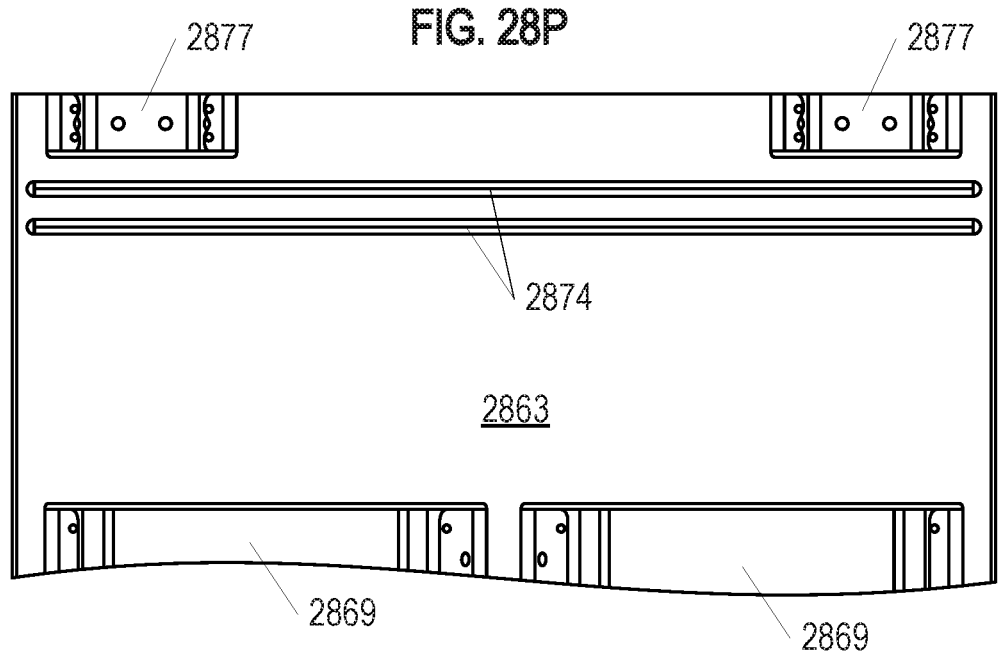
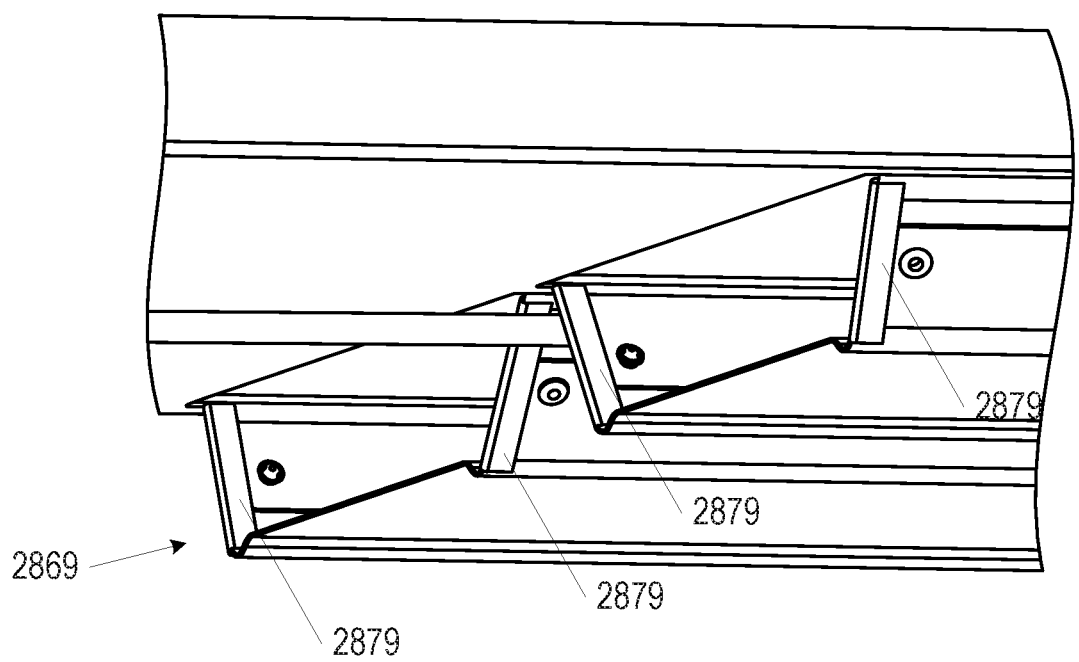

FIG. 32A
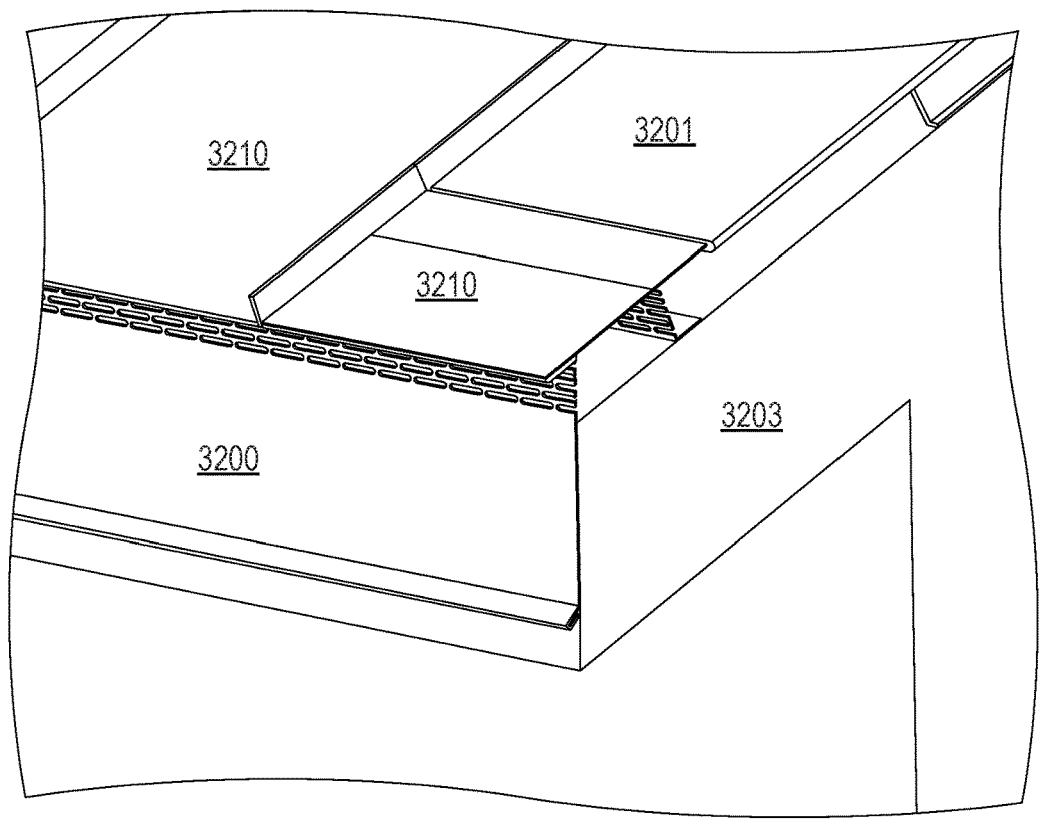
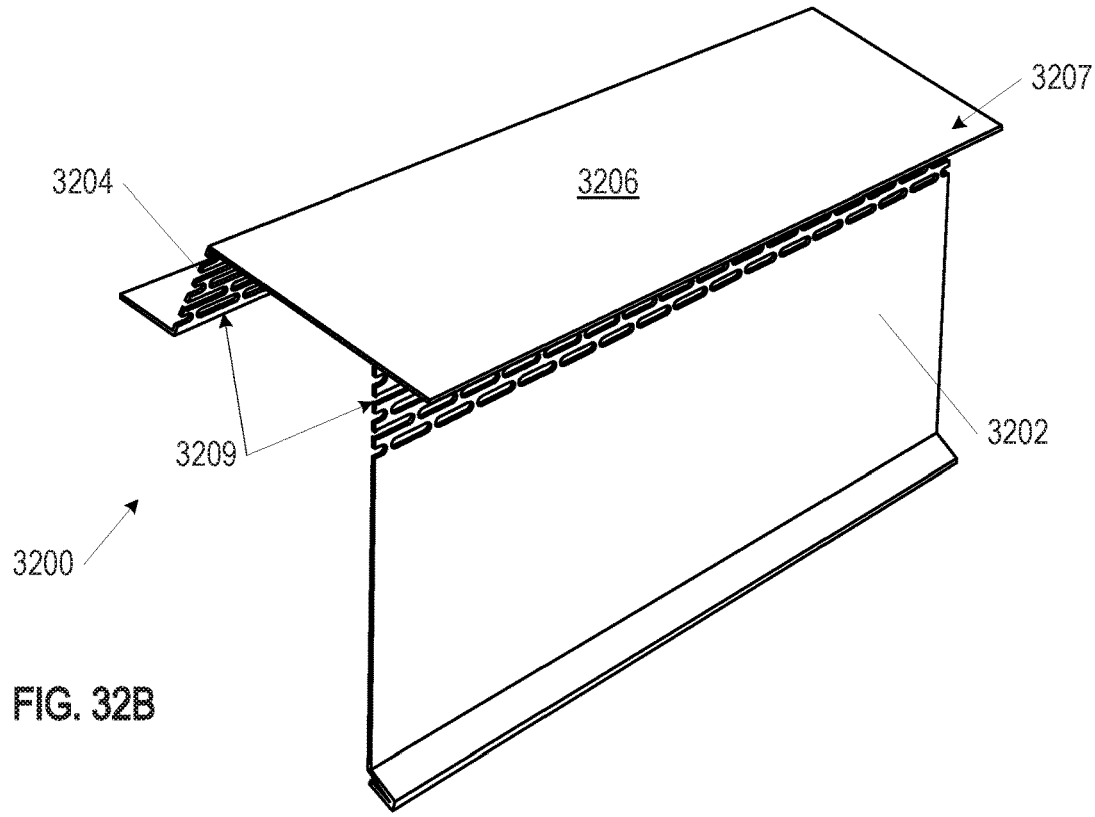
FIG. 32B

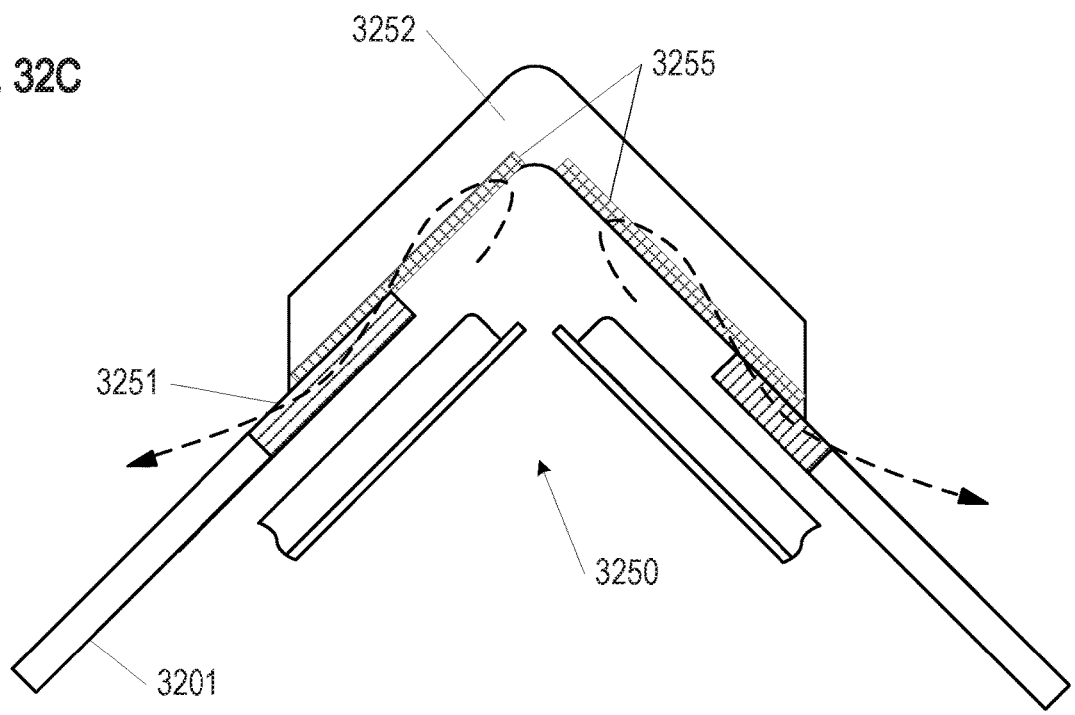
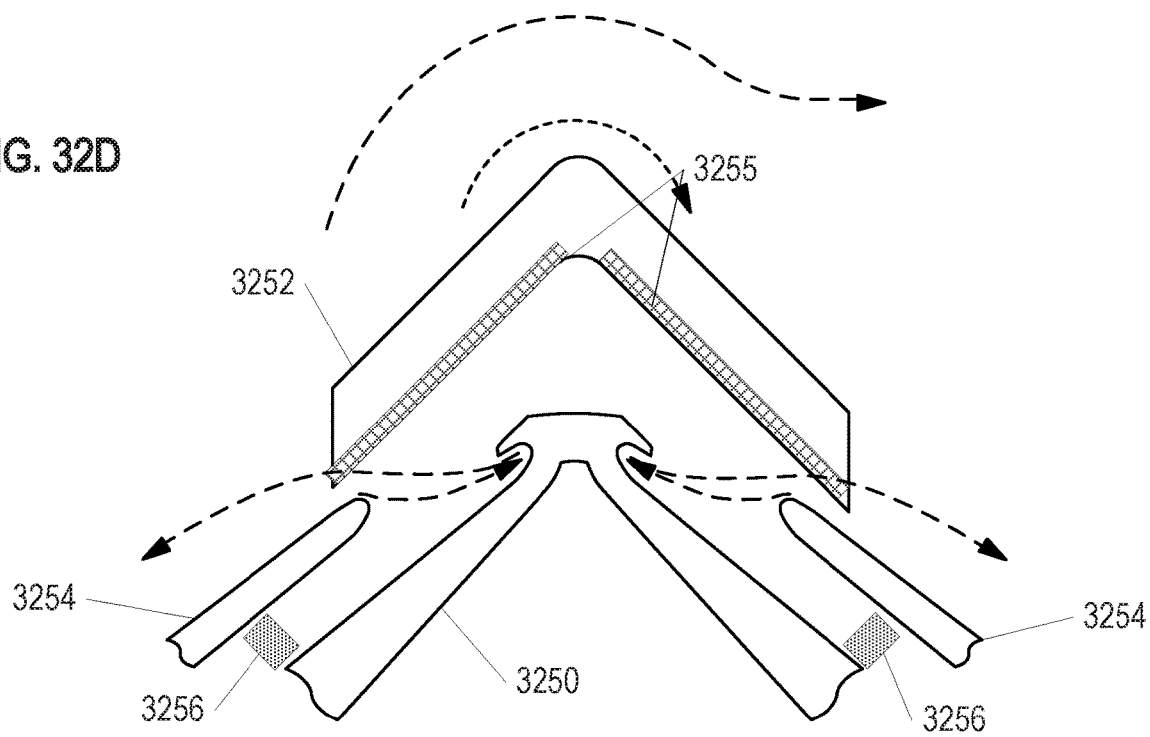

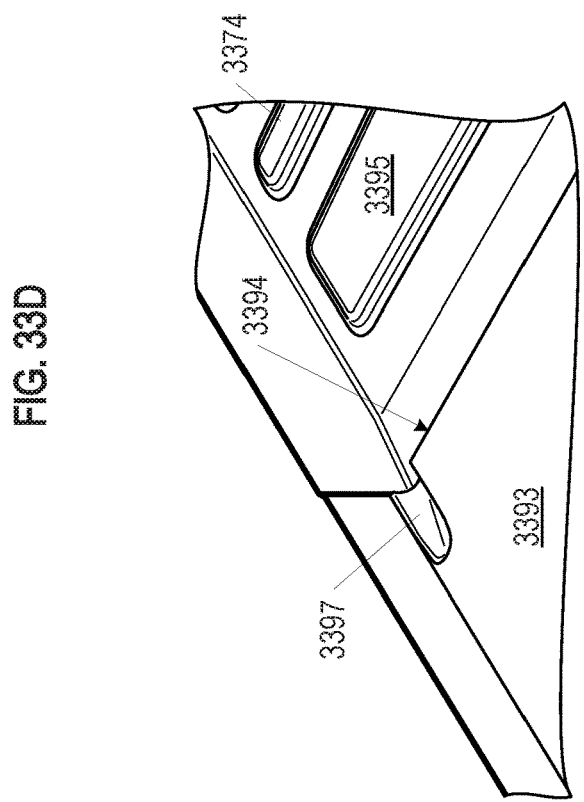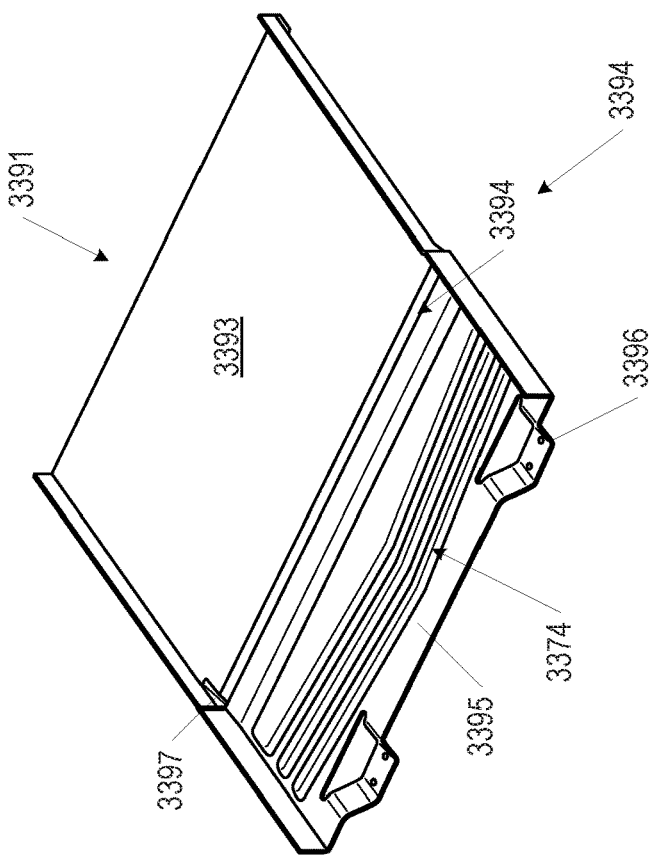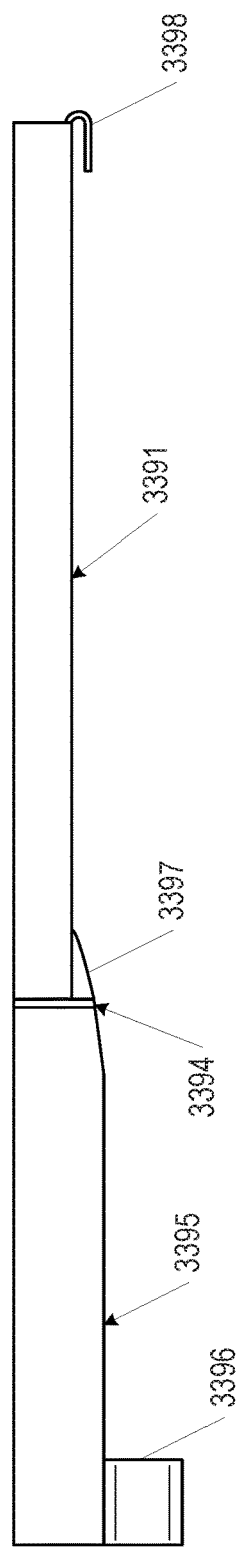

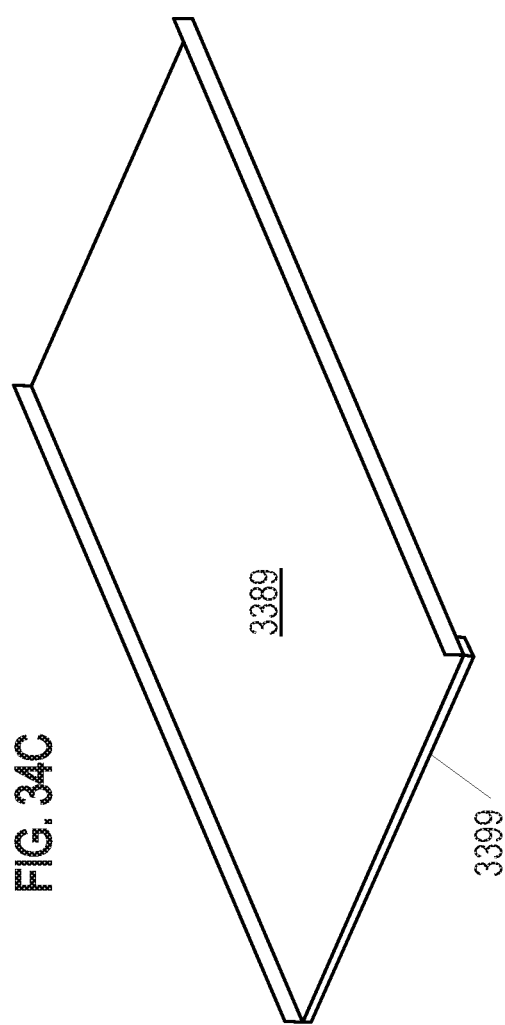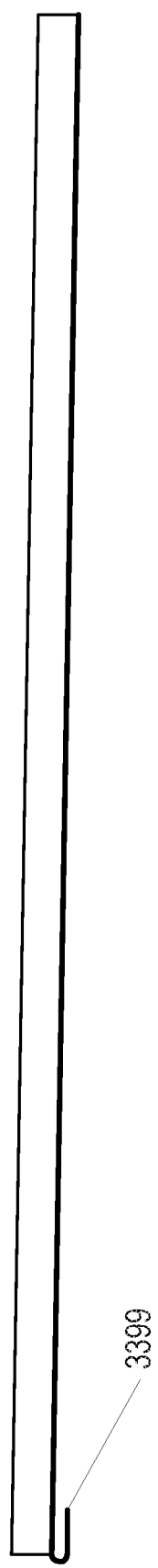

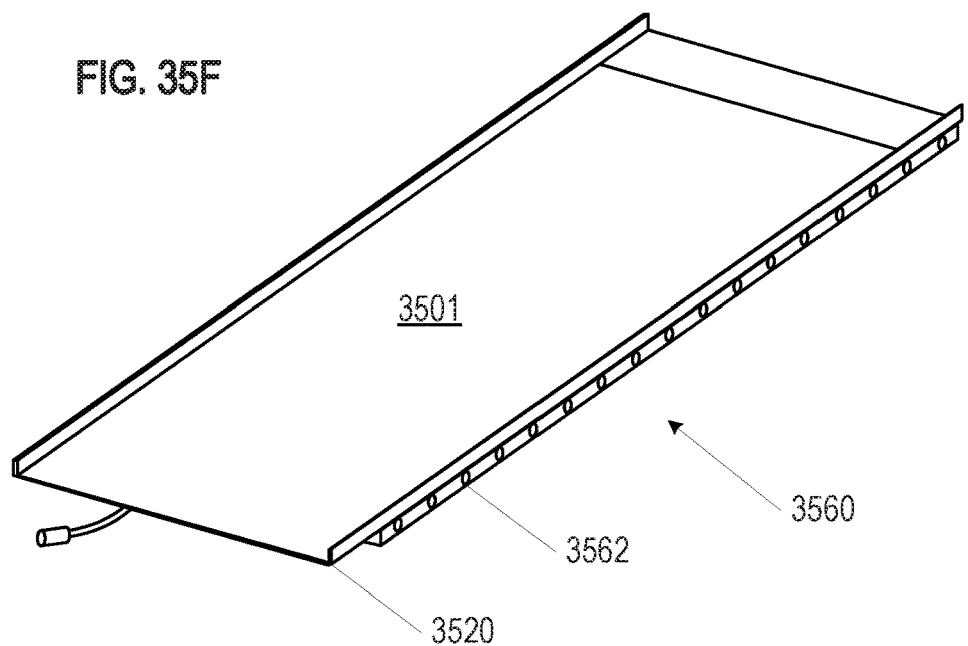
FIG. 35F
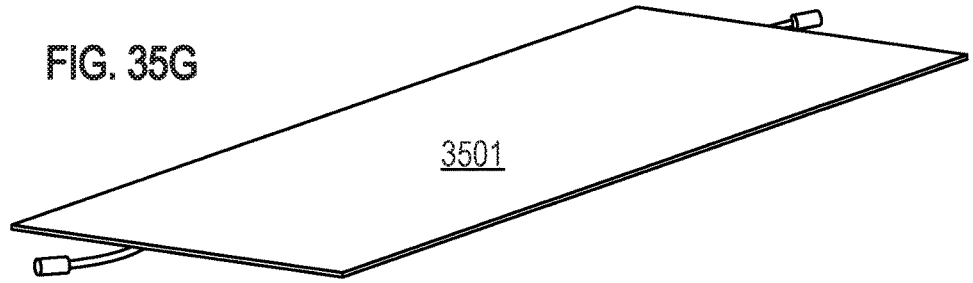
FIG. 35G
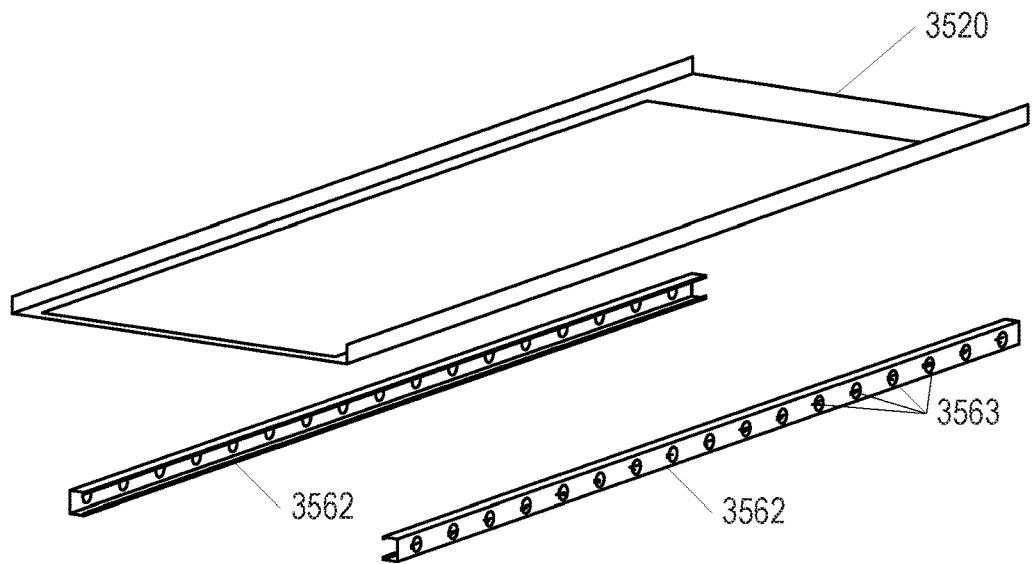

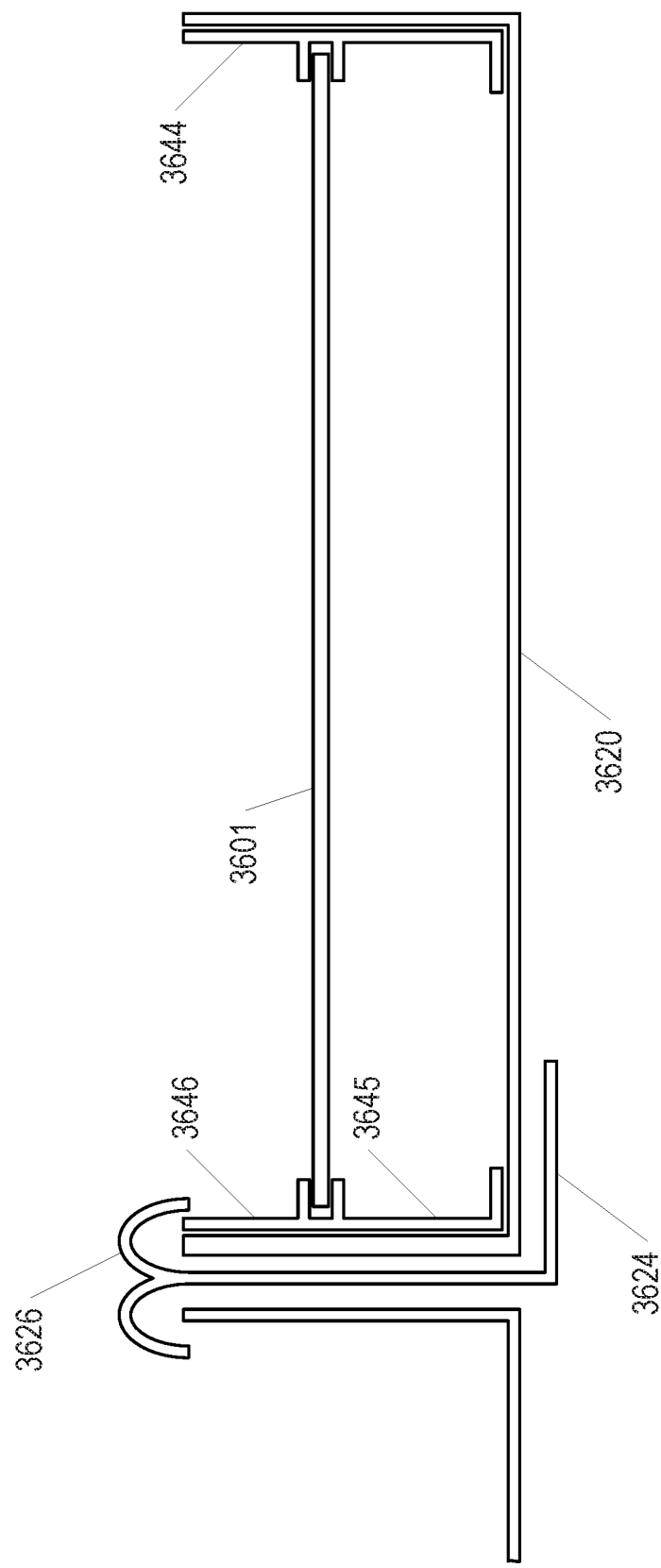

BUILDING INTEGRATED PHOTOVOLTAIC ROOFING ASSEMBLIES AND ASSOCIATED SYSTEMS AND METHODS

CROSS-REFERENCE TO RELATED APPLICATIONS

This claims the benefit of: U.S. Provisional Application No. 62/294,743, entitled "BUILDING INTEGRATED PHOTOVOLTAIC ROOFING SYSTEM" and filed on Feb. 12, 2016; U.S. Provisional Application No. 62/308,828, entitled "BUILDING INTEGRATED PHOTOVOLTAIC ROOFING SYSTEM" and filed on Mar. 15, 2016; U.S. Provisional Application No. 62/313,678, entitled "BUILDING INTEGRATED PHOTOVOLTAIC ROOFING SYSTEM" and filed on Mar. 25, 2016; U.S. Provisional Application No. 62/354,599, entitled "BUILDING INTEGRATED PHOTOVOLTAIC ROOFING ASSEMBLIES AND ASSOCIATED SYSTEMS AND METHODS" and filed on Jun. 24, 2016; U.S. Provisional Application No. 62/357,329, entitled "BUILDING INTEGRATED PHOTOVOLTAIC ROOFING ASSEMBLIES AND ASSOCIATED SYSTEMS AND METHODS" and filed on Jun. 30, 2016; and U.S. Provisional Application No. 62/374,704, entitled "BUILDING INTEGRATED PHOTOVOLTAIC ROOFING ASSEMBLIES AND ASSOCIATED SYSTEMS AND METHODS" and filed on Aug. 12, 2016, which are all herein incorporated by reference in their entireties. This is also related to concurrently filed non-provisional application U.S. Ser. No. 15/246,486 (Applicant Reference P261-GNUS) and U.S. Ser. No. 15/246,495 (Applicant Reference P261-9NUS), both entitled "BUILDING INTEGRATED PHOTOVOLTAIC ROOFING ASSEMBLIES AND ASSOCIATED SYSTEMS AND METHODS," filed on the same day as this paper, and which are both hereby incorporated herein by reference in their entireties.

TECHNICAL FIELD

This generally relates to photovoltaic arrays.

BACKGROUND

Solar is becoming increasingly popular in the United States and abroad, but penetration remains relatively low versus the number of homes that could benefit from solar. The price per kilowatt for solar is now competitive with or below that of utility power in most areas, however, solar largely remains a niche product for those who value saving money, reducing $CO_2$ emissions, or both.

One factor that may limit the adoption of solar technology is aesthetics. Most residential solar systems are installed as modules on an existing tile or composition shingle roof. The solar array, which often only covers a portion of the roof, or even a portion of one mounting plane on the roof, stands out as separate and distinct from the existing roof, both in height and material. This structure is therefore visible even from the street level and over large distances.

Another obstacle to solar adoption in existing homes is the dissonance between the age of the existing roof and the solar system, particularly where the existing roof is made from composition shingle. The expected life of a solar system and a composition shingle roof are both about 25 years depending on the local climate, but the existing roof may be several years, if not decades, into that lifespan when a prospective customer is contacted. So the customer may be presented with the dilemma of getting a new roof first, increasing the cost of going solar, or installing a 25-year solar system on a roof, which may have a relatively shorter remaining operational lifespan.

Accordingly, there is a need to resolve the dissonance between the expected life of the solar system and the remaining life of the roof that also blends in more aesthetically with the complete roof surface or at least the mounting plane and that doesn't require the prospective customer to pay for a new roof and a new solar system over that roof.

BRIEF SUMMARY

Various embodiments provide a new and improved approach to installing solar on existing roofs, and in particular, existing composition shingle roofs. Some fit over an existing composition shingle roof and/or other suitable roof surfaces (e.g., a metal seam roof, roof deck, underlayment or insulation layer). Some have improved aesthetics that reduce the visual differences between solar and non-solar portions of the roof. Some are more modular and/or simplify the replacement capability of individual photovoltaic ("PV") modules of the system. In addition, some cost less to make and install compared to conventional solar systems. And some solar systems can be installed as a new roof rather than a re-roof or mounted to an existing roof. These and other embodiments are discussed in greater detail in the detailed description and drawing figures.

BRIEF DESCRIPTION OF THE DRAWINGS

Illustrative aspects of the present disclosure are described in detail below with reference to the following drawing figures. It is intended that that embodiments and figures disclosed herein are to be considered illustrative rather than restrictive

FIG. 3C shows a cross-sectional view of a building integrated photovoltaic system according to various embodiments of this technology.

FIG. 4A shows a cross-sectional, close up end view of a portion of a building integrated photovoltaic system including coupled seams according to certain embodiments of this technology.

FIG. 4B shows a cross-sectional view of a seam cover, seam clip, and standing seams according to certain embodiments of this technology.

FIGS. 4C and 4D show cross-sectional views of a building integrated photovoltaic system including seams that are coupled according to yet further embodiments of this technology.

FIGS. 5-9A show a perspective view, cross-sectional front view, and various side views respectively of a portion of a building integrated photovoltaic system according to other various embodiments of this technology

FIGS. 10A-10H show an example of a building integrated photovoltaic ("BIPV") system installation on a building including one or more features or components (e.g., roofing components, transition pans, PV module assemblies, roof pans, underlayment layers), in whole or in part, according to various embodiments of this technology.

FIGS. 11A-11H show different views of a grounding clip for use with a PV system according to certain embodiments of this technology.

FIGS. 12A-12C show different views of wiring caps and clips for use with a PV system according to various embodiments of this technology.

FIGS. 13A-13M show various wiring systems, circuits, and pathways in accordance with various embodiments of this technology.

FIGS. 14A-14G show other wiring features and support pan structures in accordance with certain embodiments of this technology.

FIGS. 26, 27A, and 27B show top, end, and cross-sectional schematic views of an alternative PV module pan assembly usable with BIPV systems, according to various embodiments of this technology.

FIGS. 28A-28L show various views including top perspective, side, end, and exploded views of another PV module-pan assembly usable with building integrated photovoltaic systems, according to various embodiments of this technology.

FIGS. 28M-28Q show mounting portions that can be formed or secured along a rear or up-roof edge surface of pan, according to various embodiments of this technology.

FIGS. 32A-32D show detailed views of various embodiments of roofing components that can be used with various solar panel arrays, according to various embodiments of this technology FIGS. 33A-33E show various views of a non-PV down-roof transition pan, according to various embodiments of this technology.

FIGS. 34A-34D show various views of non-PV up-roof transition pans positioned above or mounted to rows of vented battens, according to various embodiments of this technology.

FIGS. 35A-35I show other various embodiments of PV module pan assemblies that can be provided with PV systems as described herein.

FIG. 36H shows a simplified schematic of PV module-pan assembly system according to various embodiments of this technology.

DETAILED DESCRIPTION

Figure 1A:
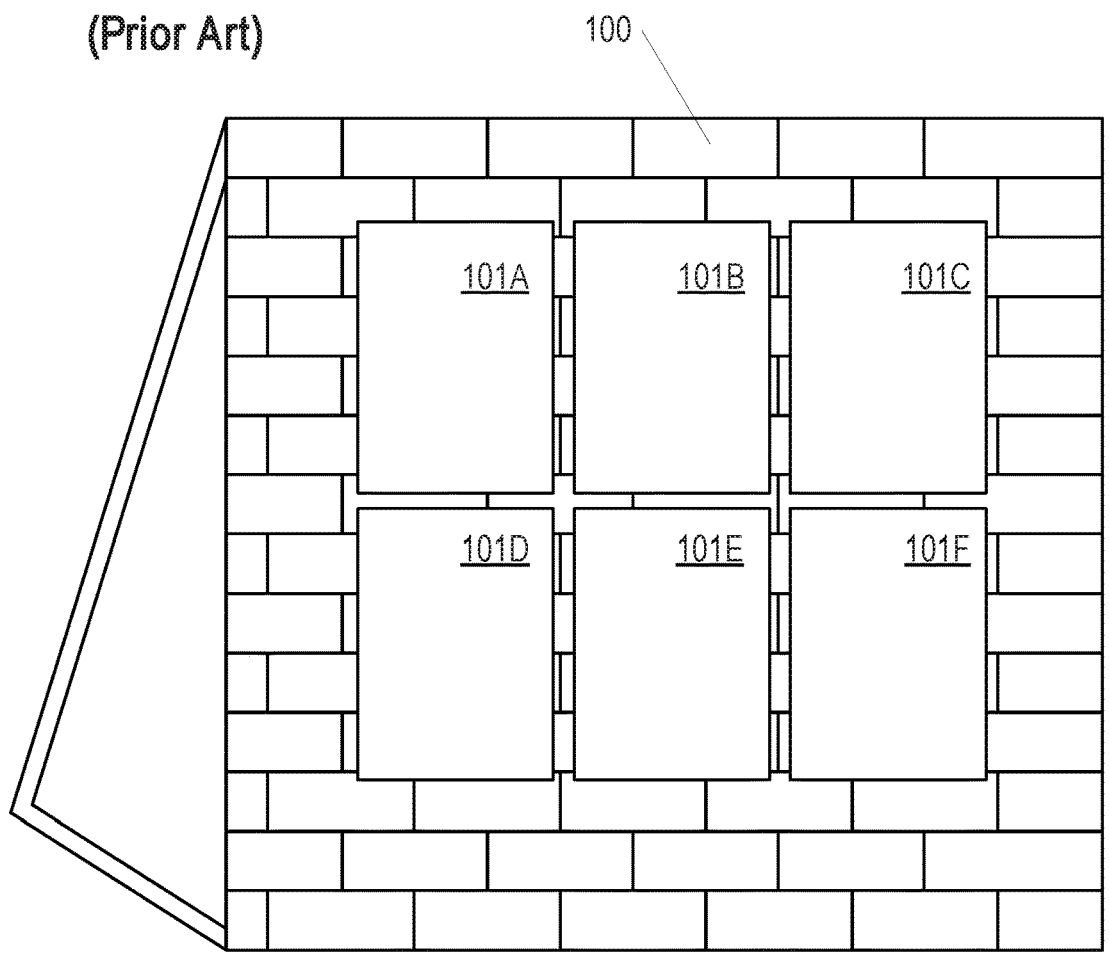
FIG. 1A shows an example of a prior art photovoltaic array installed on a roof.

The present disclosure describes various embodiments of photovoltaic roofing systems and associated systems and methods. Some embodiments relate to building integrated photovoltaic module assemblies and associated systems and methods. In various embodiments, the systems described herein lower costs of conventional systems in which a PV system is installed over a roof, and at the same time can provide an improved aesthetic for a PV roof system.

Certain details are set forth in the following description and in the Figures to provide a thorough understanding of various embodiments of the present technology. Other details describing well-known structures and systems often associated with PV systems, roofs, etc., however, are not set forth below to avoid unnecessarily obscuring the description of the various embodiments of the present technology.

Many of the details, dimensions, angles and other features shown in the Figures are merely illustrative of particular embodiments. Accordingly, other embodiments can include other details, dimensions, angles and features without departing from the spirit or scope of the present invention. Various embodiments of the present technology can also include structures other than those shown in the Figures and are expressly not limited to the structures shown in the Figures. Moreover, the various elements and features shown in the Figures may not be drawn to scale. In the Figures, identical reference numbers identify identical or at least generally similar elements.

As used herein, the term "substantially" refers to the complete or nearly complete extent or degree of an action, characteristic, property, state, structure, item, or result. For example, an object that is "substantially" uniform in height to another object would mean that the objects are either completely or nearly completely uniform in height. The exact allowable degree of deviation from absolute completeness may in some cases depend on the specific context, however, generally speaking, the nearness of completion will be so as to have the same overall result as if absolute and total completion were obtained.

As used herein, the term "about" is used to provide flexibility to a numerical range endpoint by providing that a given value may be "above" or "below" the value. For example, the given value modified by about may be, for example, by ±5%, ±10%, ±15%, ±20%.

Wherever used throughout the disclosure and claims, the term "generally" has the meaning of "approximately" or "closely" or "within the vicinity or range of". The term "generally" as used herein is not intended as a vague or imprecise expansion on the term it is selected to modify, but rather as a clarification and potential stop gap directed at those who wish to otherwise practice the appended claims, but seek to avoid them by insignificant, or immaterial or small variations. All such insignificant, or immaterial or small variations should be covered as part of the appended claims by use of the term "generally".

As used herein, the term "building integrated photovoltaic system" of "BIPV" generally refers to photovoltaic systems integrated with building materials to form at least a portion of a building envelope. For example, the BIPV system can form the roof or roofing membrane of a building. The BIPV systems described herein can be retrofitted, can be a part of a new construction roof, or a combination of both. The PV modules, PV module pans, or both (depending on the particular embodiment) can be used as the actual building envelope (e.g., roofing membrane) to provide a watertight or substantially watertight seal. Alternatively, in other embodiments, the PV components (e.g., photovoltaic modules and associated wiring) of the system may be affixed over the building envelope in a manner that simulates the appearance of BIPV without having the PV system components be part of the building envelope. In other words, the PV modules may be installed over a metal roof pan or support pan that makes up part of the building envelope. As used herein, the term "BIPV system" may be used to refer to either configuration.

As used herein, the terms "up-roof" and "down-roof" are used to provide orientation, direction, position, or a reference point relative to or in context of a roof or roofing surface upon which the systems described herein are installed on and/or form a portion of. Up-roof generally refers to an orientation that is relatively closer to the roof ridge while down-roof refers to an orientation that is relatively closer to the roof eave.

As used herein, the singular forms "a", "an", and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Spatially relative terms, such as "beneath", "below", "lower", "above", "upper", and the like, may be used herein for ease of description to describe one element or feature's relationship to another element(s) or feature(s) as shown in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below, depending on the context of its use. The device may be otherwise oriented (rotated 90 degrees or at other orientations) and the spatially relative descriptors used herein are interpreted accordingly.

Although the terms "first", "second", etc. may be used herein to describe various elements, components, regions, layers and/or sections, it should be understood that they should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

As used herein, the terms "and/or" and "at least one of" include any and all combinations of one or more of the associated listed items.

Rapid shutdown devices ("RSD") for PV systems can be applied to the systems described herein, and can be located or positioned in various locations. In some embodiments, a recess or other opening can be made in structural support pans (e.g. a transition pan or a non-PV pan) through insulation such that RSD can be inset or positioned inside recessed opening. Vents can be positioned on top of opening to conceal or cover opening. Structural support pans can be elements of roofing frames or array systems that provide stability or integrity to the overall structures, as described in further detail below. RSD can be positioned within a box or other suitable container prior to positioning within recess. In other embodiments, RSD can be positioned under eaves, or eave flashings or gutters. In yet other embodiments, RSD can be positioned within attic portions of a building.

Generally, PV modules are crystalline-based solar panels, which can be either or both of monocrystalline solar panels or polycrystalline (multi-crystalline) solar panels. The laminate or wafer forming the solar energy-collecting surface of such PV modules can be mechanically coupled, adhered, or bonded to structurally supporting pans. In some embodiments, PV modules can include layers of amorphous silicon or thin film variations of solar energy-collecting laminates (unlike traditional thin-film solar materials directly applied to continuous metal sheets of a roof). Generally, PV pan-module assemblies as considered herein, including PV modules, solar panels and laminates, have individual structures that can be used in combination to form larger solar arrays and/or building structures, as set forth below. Alternatively, thin-film PV modules, such as cadmium telluride, copper indium gallium diselenide, or amorphous thin-film silicon may be used. In still further embodiments, cells based on perovskite or other as of yet non-commercialized materials may be used. The particular type of cell technology used is a design choice and not critical to the various embodiments of the invention.

FIG. 1A shows a prior art PV array installed on roof 100. The exemplary PV array of FIG. 1A includes six solar panels 101 or modules (identified individually as solar panels 101A-101F). Though not shown in detail, panels 101A-101F are mounted on roof 100 using one of various known rail-based or rail-free mounting systems, as are currently employed by solar installers, such as San Mateo, Calif.-based SolarCity Corporation.

Figure 1B:
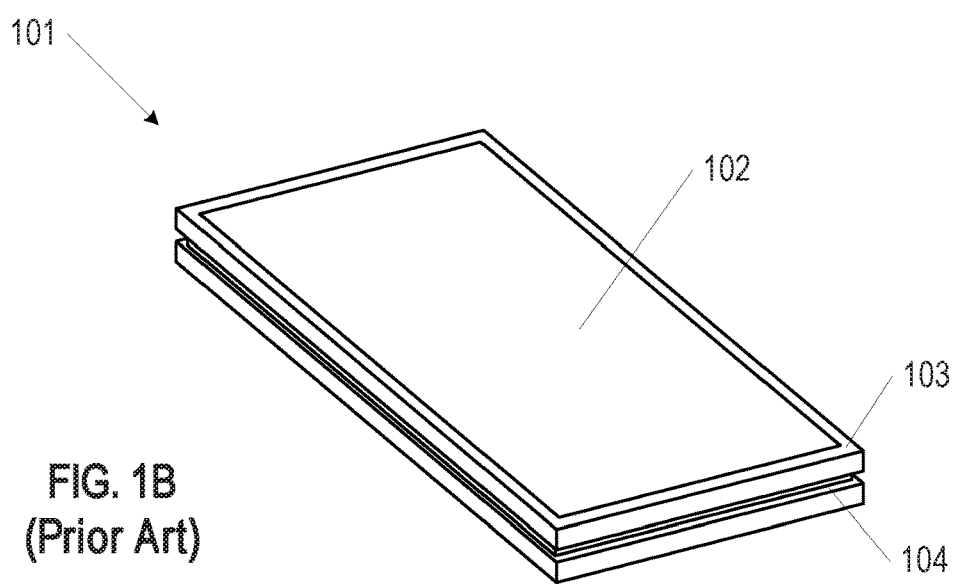
FIG. 1B shows an exemplary prior art photovoltaic module.

FIG. 1B shows one type of conventional solar panel 101 in more detail. Solar panel 101 includes PV laminate 102, which in conventional silicon-based cells, consists of a silicon sandwich of p-doped and n-doped silicon layers, a top glass sheet protecting the laminate, and a back sheet that can include a plurality of layers—and rigid metal frame 103, supporting PV laminate 102. Although shown as a unitary structure, laminate 102 may include a plurality of individual solar cells that are wired together to form a single unit under the top glass sheet. In the example shown in FIG. 1B, frame 103 is a grooved frame with groove 104 surrounding the outer face of frame 103 on all sides. Grooved frame modules such as module 101 are manufactured and sold by SolarCity Corporation of San Mateo, Calif. In such a module, groove 104 serves as mechanism for attaching other mounting hardware (e.g., a leveling foot, an interlock) to join modules together and to support the modules over a roof surface. Those of ordinary skill in the art will appreciate that panel 101 may also have a plain, non-grooved frame. Non-grooved frames are typically interconnected to one another and connected to the roof using connectors that clamp down between the top and bottom edges of the frame.

Although these types of framed PV modules achieve their structural function, they are aesthetically suboptimal and have material usage inefficiencies. First, conventional PV systems, such as that shown in FIG. 1A, are typically installed over an existing roof, essentially requiring redundant structure since the PV array will shield most of the portion of the roof that it is installed over. Second, conventional systems are deemed by some people to be unaesthetic. Conventional PV modules usually come in one of two colors: blue, signifying a poly-crystalline silicon structure, and black, signifying a mono-crystalline silicon or thin-film structure. The metal frame portion can be painted black to help it blend in with the roof surface, or it can simply be raw aluminum. Regardless of whether blue or black modules are used, the difference between the look of the portion of the roof that is covered with solar and the remainder of the roof is generally quite dramatic. As a result, roofs that are partially covered with solar panels have an aesthetic contrast that can be seen from very far distances due to the difference in reflectivity, elevation, height, and/or color between these two very different surfaces.

Building Integrated Photovoltaic Array & Coupling Seams

Figure 2A:
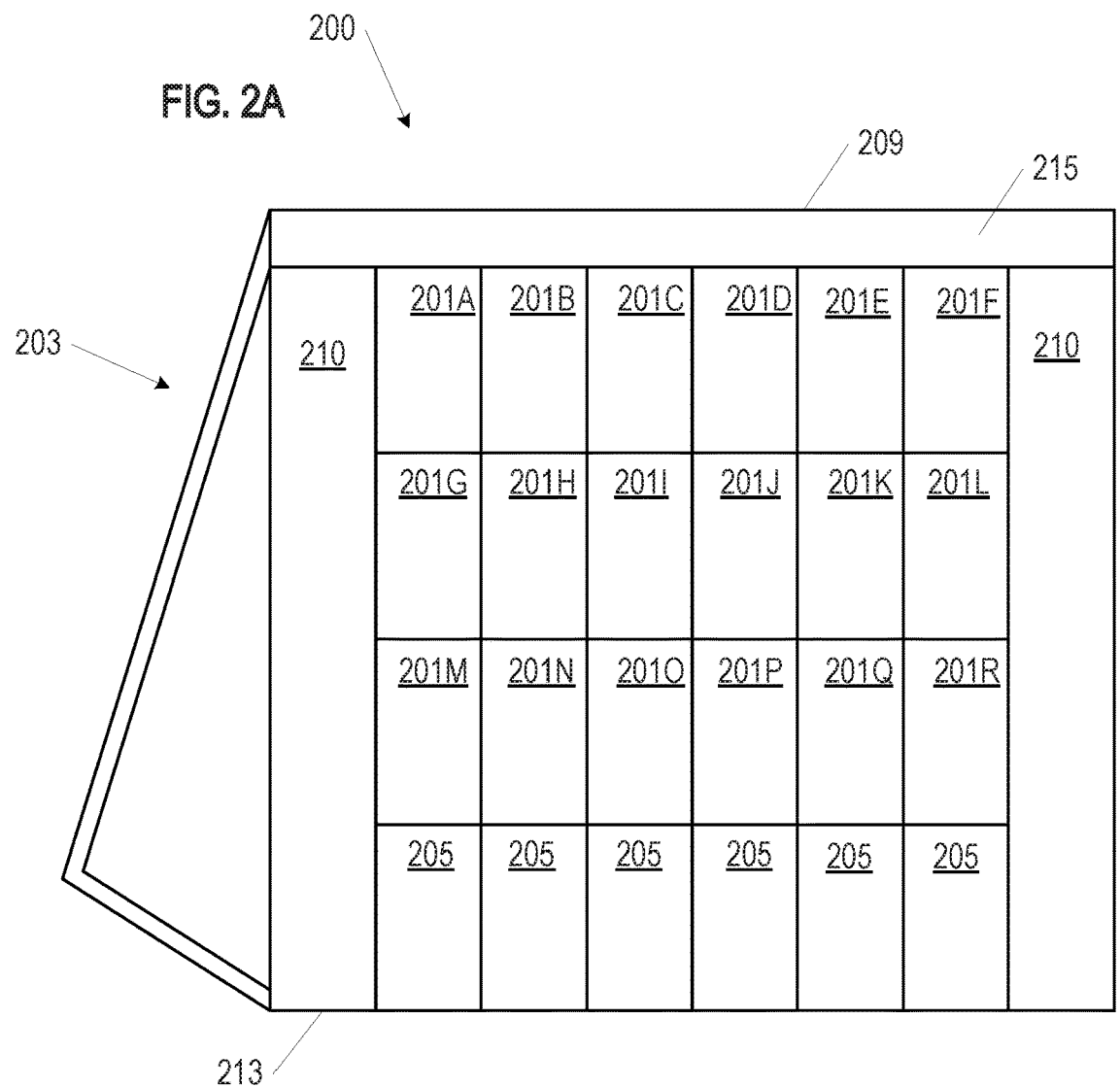
FIG. 2A shows a building integrated photovoltaic system according to various embodiments of this technology.

FIG. 2A shows BIPV system 200 installed on a plane of roof surface 203. System 200 is arranged in vertical pans on existing roof 203 to mimic the look of an all metal standing seam metal (e.g., steel, aluminum, galvanized) roof with evenly spaced vertical seams running from the roof ridge to the eave. The resultant BIPV system is comprised of six vertical pan sections containing PV modules 201A-201R, regular roof pans 210, and dummy or transition pans 205 that complete the six vertical columns (e.g., col. 1=201A, 201G, 201M; col. 2=201B, 201H, 201N; col. 3=201C, 201I, 201O; col. 4=201D, 201J, 201P; col. 5=201E, 201K, 201Q; and col. 6=201F, 201L, 201R). As discussed in greater detail herein, in some embodiments, the PV modules in each column (e.g., 1, 2, 3, 4, 5, and 6) may be affixed to a roof pan containing raised seams on either side. In other embodiments, the PV modules in each column may make up a portion of the roof-facing portion of the pan. Ridge cap 215 sits at the top of the resultant array, and as discussed herein may be used for venting, heat dissipation, and wire management. Together, these elements form an integrated PV roofing system 200 that reduces the redundancy inherent in conventional PV systems while providing a uniform look.

Standing seam as understood herein refers to the raised seams running up-roof to down-roof on both sides of a roof pan that are used to interlocking adjacent pans. The standing seams can be vertically or upwardly extending sidewalls or flanges and may be held together with clips or other fasteners. The seams between pans may be covered with a cap or other feature that keeps them watertight while concealing the seam. While shown as extending substantially perpendicular to a base planar surface portion (e.g., the plane of the roof surface or PV modules), in other embodiments, the standing seams can extend at angles other than ninety degree. Systems and features described herein can also be applied to non-metal (e.g., comp shingle, tile) roofs.

The seams (e.g., raised seams) of adjacent roof pans used in the PV systems described herein can be interlocked (e.g., coupled or secured together) in a variety of manners. For example, seams can be interlocked by folding (e.g., bending, rolling) one seam over the another seam and crimping them together (see e.g., FIG. 3C), which creates equally spaced, interlocked seams running from roof ridge 209 to roof eave 213. In some embodiments, seams are interlocked or snap-locked by clips, clamps, covers, or other suitable mechanical fasteners (e.g., rivets and screws) that fit over the entire seam as described in more detail below with reference to FIGS. 4A-4D. In yet further embodiments, seams can be welded or otherwise bonded or adhered together. As noted above, in certain embodiments seams of systems described herein can be inverted (e.g., extended or bent in a downward direction such that they are positioned below the roof or PV module surfaces) as compared to the standing or raised seams.

In yet further embodiments, the seams can be hemmed, folded, or bent into different configurations to provide improved engagement features as described in more detail below (see e.g., FIG. 4B). For example, a clip used to engage and couple the hemmed seams can include one or more hook portions that can engage (e.g., be "snap-locked") the seams in a manner to provide increased resistance to pullout in response to uplift forces (e.g., wind uplift). Further, having such hemmed or bent seams can provide improved safety when shipping and installing such components by reducing the number of exposed sharp edges. In yet other embodiments, the seams can be inverted or extended (e.g., bent) downward such that ends of the seams are positioned below the planar, roof surface portions of the metal roof.

System 200 includes a solar array of eighteen low profile building integrated PV modules 201 (identified individually as PV modules 201A-201R arranged in six columns and three rows of PV modules). PV modules 201 can, in some contexts, also be referred to as PV panels or solar panels. In other embodiments, system 200 can include a different number of columns or rows of PV modules (e.g., two rows). Further, the columns and/or rows can be spaced apart as desired (e.g., not directly adjacent to each other). System 200 can also include dummy modules 205 (alternatively referred to as dummy panels) and columns of standard roof pans 210 that contain no solar PV modules. Dummy modules 205 generally refer to roof structures that can mimic the appearance of PV modules 201, serving a function similar to standard roof pans 210. In some contexts, roof pans 210 can alternatively be referred to as general support pans or non-PV pans.

Figure 3A:
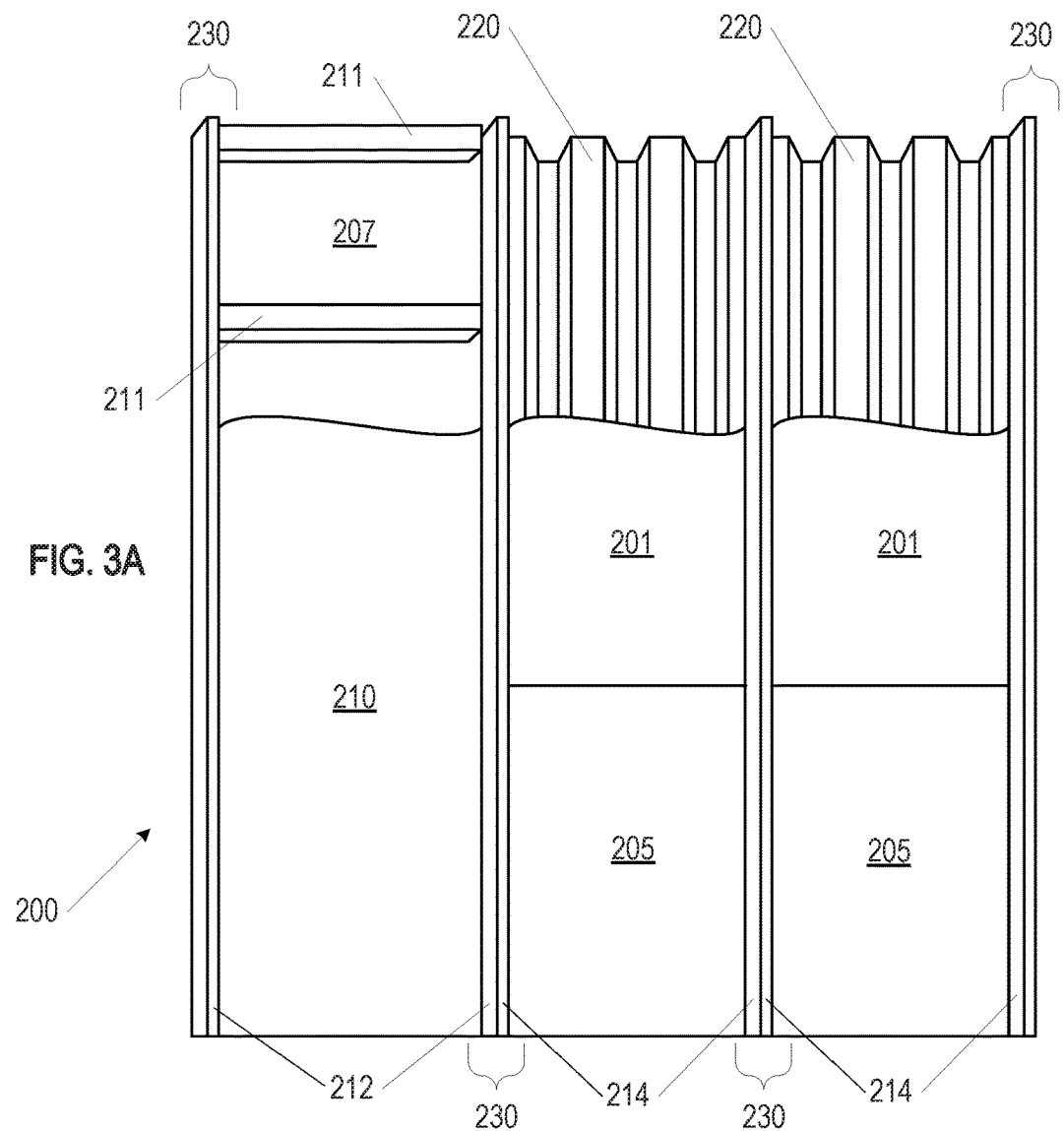
FIG. 3A shows a partial cutaway view of a portion of a building integrated photovoltaic system according to various embodiments of this technology.

As discussed above, PV modules 201A-201R can be placed or mounted within ordinary pans that are substantially the same as non-PV pans 210. Alternatively, they may be installed in, or part of special pans (e.g., pans 220 in FIG. 3A) so that the height of modules 201A-R is substantially equal to the height of non-PV pans 210. Moreover, as discussed in greater detail herein, the pans holding modules 201A-201R, in columns 1-6, may be specifically configured with additional recesses (e.g., 224) to accommodate module junction boxes 217 and route power cables as shown in FIGS. 3A and 3C. In contrast, standard roof pans 210 generally refer to traditional structures and panels used for the tiling or construction of roofs, which do not include PV electricity generation components. Such non-PV pans 210 may be installed over roof battens 211 as seen in the partial cutaway view of FIG. 3A. Alternatively, they may be installed directly on the roof deck. Dummy modules 205 are roof pans that are used to complete a column of PV pans, after the PV portion stops. Dummy modules 205 may not only mimic the appearance of PV modules 201, but they may be mounted on PV pans 220 instead of PV module 201. In such a case, dummy modules 205 can maintain a uniform appearance alongside PV modules and provide space beneath the generally uniform planar surface of PV modules 201 of system 200, in which electrical components can be centralized, ventilation can be achieved, or where access to underlying roof 203 (e.g. sub-roofing, an attic, etc.) can be provided.

Dummy modules 205 can be substituted for, or configured to appear similar to, roof pans 210 and/or PV modules 201. For example, dummy modules 205 can be painted to match in color or appearance of roof pans 210 and/or PV modules 201. In some embodiments, dummy modules 205 can be used as transition pans at up-roof (e.g. at ridge 209 of roof 203) or down-roof portions (e.g., at eave 213 of roof 203) at the beginning and/or end of a column of PV modules 201, as described in more detail below. In other embodiments, roof pans 210 can be used as transition pans, such as part of a column of PV modules 201. As used herein, the term transition pan refers to sections of roof pan that are used to transition between different pan types (e.g., PV pan 220 and non-PV pan 210) or to complete a column before PV modules start or after they stop. In certain embodiments, dummy modules 205 can be installed adjacent to side portions of roof 203, in place of, or along with roof pans 210. In other embodiments, roof pans 210 can be used or substituted for one or more dummy modules 205. In some embodiments, dummy modules 205 can include roof pan 210 or panel or a PV module layer (e.g., glass, backsheet, etc.) positioned on a batten or other pan mount.

System 200 can include ridge cap 215 to cover roof ridge 209 and may be used to conceal and protect wires (e.g., conduits or cables) or other equipment (e.g., fans, vents, connectors, inverters, jumpers, home-run connections). System 200 can also include other roofing components (e.g., flashings, gutters, vents, caps, covers, trims), for example, at eave 213, or at hips, valleys, or sides of the roof (not shown). While FIG. 2A shows system 200 including eighteen PV modules 201A-201R, in some embodiments, system 200 includes a solar array with more or less than eighteen PV modules 201. Further, in some embodiments, a column of roof pans 210 can also include dummy modules 205 and/or PV modules 201.

Figure 2B:
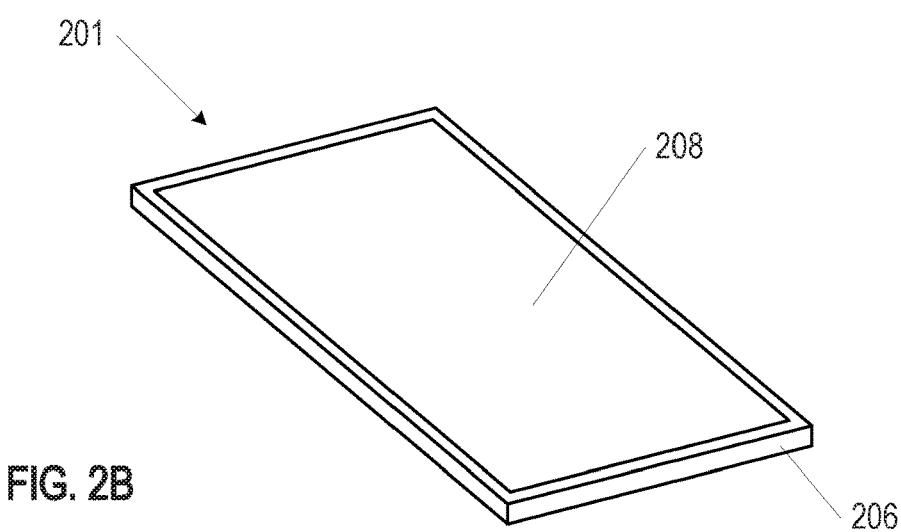
FIG. 2B shows an exemplary photovoltaic module usable with a building integrated photovoltaic system according to various embodiments of this technology.

FIG. 2B shows exemplary low-profile BIPV module 20. In various embodiments, PV modules 201 can include any number of cells, including more or less than conventional 60-cell or 72-cell solar panels. For example, PV module 201 may have 3 columns of 11 cells, 3 columns of 10 cells, or, in a shingled configuration, 3 columns of thirty-three 33 sub-cells, where each cell is cut into 3 shingled cells. PV modules 201 can also include bi-facial, shingled cells, or a combination thereof. As shown, PV modules 201 can be about half the width of conventional, full-width modules. Further embodiments of PV modules 201 can have a specific number of solar cells, such as 12-cell, 20-cell, 24-cell, 30-cell, 36-cell, 40-cell, 42-cell, 48-cell, 54-cell, or 56-cell embodiments. Other embodiments of the present technology can include PV modules having 60-cell, 70-cell, 80-cell, or 92-cell solar panels, or other such solar panels as known in the field. Further embodiments can have PV modules 201 with other number-of-cell embodiments within the above-considered ranges. The various embodiments of PV modules 201 with different numbers of solar cells allows for flexibility in selecting solar panels appropriate for any given system installation.

PV modules 201 can also be frameless or have a minimized frame structure, as shown in FIG. 2B. In other words, PV modules 201 can be constructed without a rigid frame (e.g., made of metal, plastic) surrounding or enclosing the edges of the panel, or in some embodiments, surrounding only a portion of the bottom and sides but not the top of the module. Individual PV modules 201 can include layer of top glass 208 and a back sheet that will sandwich the internal PV layers as described in more detail below with respect to FIGS. 2C and 2D without any framing. In certain embodiments, because PV modules 201A-201R can be supported by PV pans 220 (e.g., tray, plate—as shown, for example in FIG. 3A), where PV pans 220 with raised portions 222, whereas PV pans 220 sit on and/or are secured to roof 203 or other suitable roof surface at valleys 224, PV modules 201A-201R may not need to be as strong as framed panels in an ordinary or conventional array. In other words, in an ordinary or conventional array, the panel frame can become part of the mounting system and is subject to the same forces and moments as the mounting system, whereas in contrast, PV pans 220 can primarily bear load instead of PV modules 201. PV modules 201 and PV pans 220 form PV module-pan assemblies when bonded or otherwise coupled to each other. Frameless, low profile solar PV modules are not required. For example, a framed module can used and the frame can be color matched to PV pan 220.

Generally, in various embodiments, either or both of non-PV metal roof pans and transition pans can be painted to appear like PV modules, for example, replicating solar cell lines, color, and other visual characteristics of PV modules. Similarly, either or both of non-PV metal roof pans and transition pans can have visual or structural characteristics to track PV module-pan assemblies. The combination of these elements can provide for an overall roof appearance that is visually pleasing, with minimal points of contrast or sharp edges to distract the eye of an observer.

It should be understood that in these embodiments, roof pitches where such systems are installed are non-zero, and that the systems are installed to account for the angle or slope of (non-flat) roofs. The distances or gaps between various pans, modules, and assemblies, and the degree to which such gaps are concealed will be dependent on roof pitch, the distance a viewer is from the roof, and the height of the viewer.

Figure 2C:
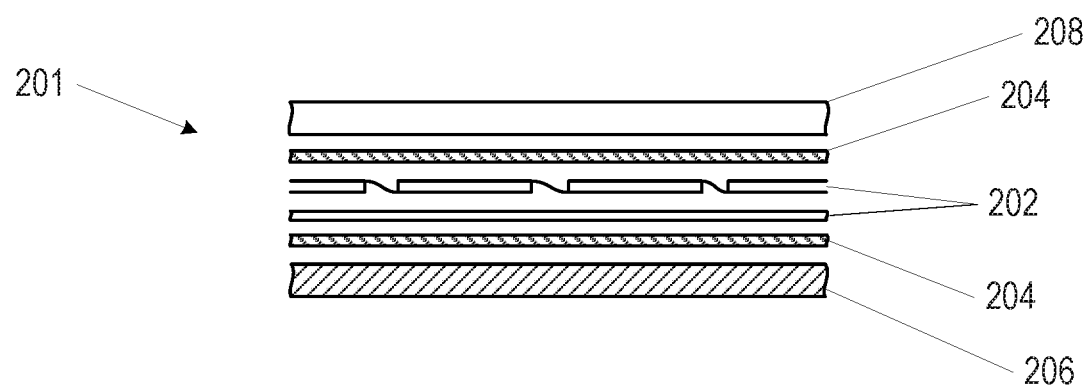
FIGS. 2C and 2D show exploded cross-sectional views of the PV module of FIG. 2B showing the different layers of the PV module according to various embodiments of this technology.
Figure 2D:
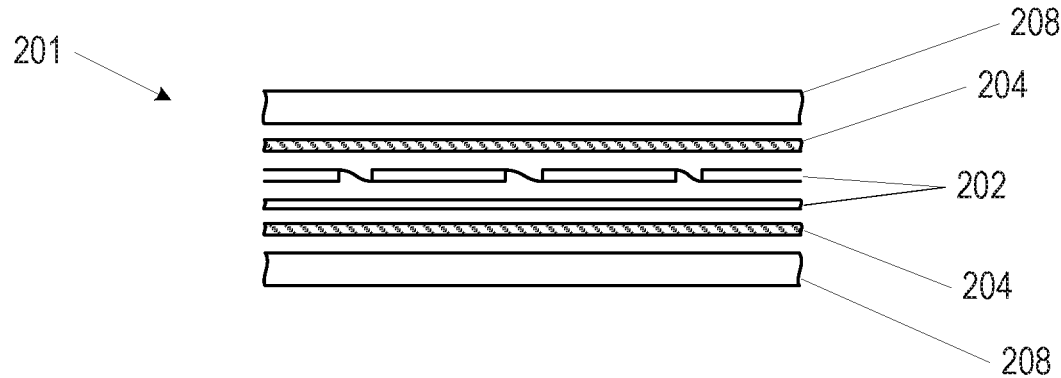

FIGS. 2C and 2D show in further detail the layers of exemplary PV modules 201. In some embodiments, PV modules 201 described herein refer to crystalline-type (e.g., non-thin film or amorphous solar) solar modules. However, PV modules 201 are not limited to crystalline-type solar cell technology. For example, in other embodiments, thin-film or amorphous solar (e.g., amorphous silicon) can be used as laminate layers with certain embodiments of PV modules 201 described herein. In yet further embodiments, hybrid crystalline and amorphous solar modules can be used with PV modules 201 systems described herein. In other embodiments, other types of solar cells (e.g., non-silicon based semiconductors, partial silicon, non-crystalline, partial crystalline, organic, carbon-based, perovskite, cadmium-telluride, copper-indium-gallium-selenide ("CIGS"), dye sensitized, transparent luminescent solar concentrator, polymer, transparent cells) can be provided as part of PV modules 201.

As shown in FIG. 2C and noted above, in some embodiments, PV module 201 can include PV layers 202 (e.g., solar cells, semiconductor layers, bussing, insulation, laminate) sandwiched between encapsulation layers 204 (e.g., EVA). PV modules 201 can further include one or more backsheets 206 (e.g., polyvinyl fluoride film) and/or glass layers 208. As shown in FIG. 2D, PV modules 201 can include first and second glass layers 208 (e.g., "glass on glass") sandwiching encapsulation layers 204. The glass on glass PV modules 201 can also eliminate or reduce the need for additional intermediate material layers (e.g., a pan portion, underlayment, felt paper) between a bottom of PV module 201 and existing roofing surfaces, which may otherwise be used for fire protection or other purposes. In certain embodiments, PV modules 201 can include both glass layer 208 and one or more backsheet layers 206. In yet further embodiments, PV modules 201 can include one or more additional layers (e.g., transparent coatings, insulation layers, phase change material layers to help with heat transfer) on a top side (e.g. the side of PV module 201 incident to solar energy), rear side (e.g. the side of PV module 201 proximate to the installation surface or roof), or as intermediate layers.

In some embodiments, tape, edge trim, or other edge protection materials can be applied to corners, edges or sides of PV modules 201 to protect PV modules 201 from damage during shipping or installation. These can be configured to be tear-away or permanent materials. Encapsulation layers 204 or backsheet layers 206 can also be optionally trimmed during manufacturing such that they can be rolled over PV module 201 edges and laminates to provide edge protection. Any or all portions of encapsulation layers 204 or backsheet layers 206 can then be removed prior to, or during installation, on a roof. In certain embodiments, glass edges of glass layer(s) 208 can be rounded or beveled accordingly for ease of installation.

Although backsheet layers 206 can have a light color, such as white, PV modules 201 can include non-white (e.g., black, blue, transparent) backsheet layers 206. Non-white backsheet layers 206 can improve aesthetics by reducing glare or reflection off or through glass layers 208 or a mounting pan as compared to white backsheet layers 206. Additionally, black or blue backsheets tend to be closer in color to conventional solar cells or PV modules. Thus, non-white backsheets can create a more uniform appearance with the rest of the system. Backsheet layers 206 (or other layers) may be cut at an angle, such that the cut, exposed portion of backsheet layer 206 faces roof 203, or is oriented in a substantially downward direction (e.g., toward the roof) when PV modules 201 are assembled and mounted to the roofing surface.

The arrangement of backsheet layers 206 above or below PV layers 202 and encapsulation layers 204 can provide for added thermal control and/or directed light reflection within PV modules 201. In some embodiments, PV modules 201 may include first and second backsheet layers 206 (e.g., non-white or white) sandwiching encapsulation layers 204 (e.g., on both air and cell sides of PV module stack). Further, backsheet layers 206 can be integrated with encapsulation layers 204 or adhesive layers in certain embodiments. Certain backsheets can also provide PV modules 201 with improved thermal dissipation or heat reflective properties, electrical insulation, or protection from damage, moisture, or UV degradation. Such backsheets can include dyMat™, DuraShield®, or PowerShield®.

Figure 3B:
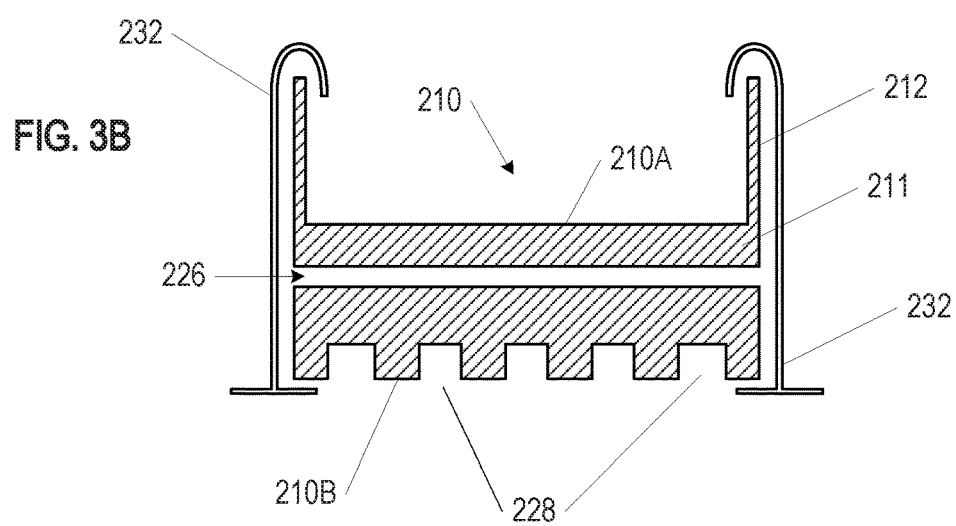
FIG. 3B shows a cross-sectional view of a structurally integrated non-PV roof pan or panel configured in accordance with certain embodiments of this technology.

FIG. 3A shows a partial cutaway view of a portion of building integrated PV system 200, and FIG. 3B shows a cross-sectional view of the same system 200. FIGS. 3A and 3B show the layers of different materials or components used to construct system 200. System 200 can be installed, for example, directly over an existing composition shingle roof layer and/or other suitable roof surface or structure (e.g., a roof deck, metal seam roof, insulating layer, underlayment, ice dam protection membrane, slip sheet, batten, purlin, rafter, flashing, furring strip). Alternatively, the existing roof may be scraped clean before installing system 200. In still further embodiments, system 200 may be installed as part of new construction where there is no existing weather resistant roof surface other than the plywood roof deck.

After a desired size of the solar array has been determined (e.g., based on orientation of the roof, space considerations, weight considerations, amount of electricity production required, efficiency of modules, amount of sunlight), trim, vent, or flashing at the eave or sides of roof 203 can be installed. Battens 211 can then be installed across roof 203 in areas (e.g., columns) of roof 203 where non-PV modules will be placed. For a composition shingle roof, battens 211 can be attached directly over the composition shingle roof in a series of rows that run from roof ridge 209 down to roof eave 213 and/or as continuous or semi-continuous layers or sheets of insulation material, which in some aspects, can be referred to as intermediate layers 219 of roof 203. Non-PV roof pan(s) 210 and/or dummy modules 205 can then, for example, be installed over battens 211.

In alternative embodiments, battens 211 can be pre-installed, secured to, or otherwise integrated with an underside of non-PV roof pans 210 and/or dummy modules 205 (e.g., forming a structurally integrated roof panel) prior to securing roof pans 210 to roof 203. For example, as shown in FIG. 3B, non-PV roof pans 210 can include batten 211 (e.g., foam, isoboard, polyisocyanurate foam, or other insulation materials) sandwiched between upper pan surface 210A and lower pan surface 210B. Lower pan surface 210B can be secured to upper pan surface 210A to provide improved overall rigidity of roof pan 210. This can help reduce unintended detachment of roof pans 210 as well as resistance to uplift from wind. For example, lower pan surface 210B can include raised seams 232 secured or configured to be secured to standing seams 212 of upper pan surface 210A with seam clips or other suitable fasteners (e.g., rivets), or be welded together. Further, in certain embodiments, batten material can include one or more primary wiring channels 226 (or "pathways") that provide space for wire routing and management, and that can be oriented in either or both of an "East-West" direction (transverse to the length of roof pan 210) or a "North-South" direction (longitudinally along the length of roof pan 210). Similarly, in some embodiments, lower pan surface 210B can include one or more secondary wiring channels 228 that provide space for wire routing and management, and that can be oriented in either or both of an "east-west" direction (transverse to the length of roof pan 210) or a "North-South" direction (longitudinally along the length of roof pan 210).

While battens 211 are shown in FIG. 3A as extending generally horizontally (e.g., side-to-side) in rows across roof 203 between corresponding seams 212 (identified individually as seams 212A and 212B) of non-PV pans 210, battens 211 can be positioned on or extend across roof 203 in a direction generally parallel to or at an angle to a longitudinal axis of standing seams 212. Although battens 211 have a rectangular cross-section, any other suitable cross-sectional shapes (e.g., triangular, square, trapezoidal) can be used. Battens 211 can have one or more cross-sectional sizes. For example, battens 211 can have a cross-sectional dimension equal to or about 1"×4", 1.5"×4", 1.75"×4", 2"×4", 3"×4" (where quotation marks indicate inches), or any value in between.

Battens 211 may also be spaced apart or include one or more channels or apertures such that cables, conduits, or other wires can be routed through or pass across the roof underneath the pans (e.g., in either or both of North-South and East-West directions). Battens 211 can, for example, be made of wood or other suitable materials (e.g., foam, rubber, polystyrene, isoboard, metal, polyisocyanurate foam). In certain embodiments, battens 211 can include a layer of reflective material. In yet further embodiments, battens 211 can include one or more continuous or semi-continuous layers of suitable materials as set forth above.

Non-PV roof pans 210 can be manufactured in pre-cut lengths (e.g., 6', 8', 10') and cut to fit into custom lengths as needed for any given installation. Roof pan 210 can also be pre-formed with standing seam 212, ridge or other feature that matches or mimics PV pan standing seam 214 as configured between adjacent low profile building integrated PV modules 201. As shown in FIG. 3C, roof pan 210 can have standing seam 212 with larger outer seam 212A on the left side and smaller inner seam 212B on the right side. PV standing seams 214, also with left side larger outer seam 214A and right side smaller inner seam 214B, can mirror seams 212A and 212B, or vice versa. These configurations facilitate interconnection or interlocking of standing seams 212 of roof pan 210 with corresponding standing seams 214 of PV pan 220, forming interlocked standing seam 230. Alternatively, all seams can be the same. Battens 211 can be sized to maintain roof pan 210 at a height or elevation that is equal to or substantially similar to surrounding PV modules 201 and dummy modules 205. Battens 211 can also support roof pan 210 from below so that if for example, an installer steps on roof pan 210 during installation, roof pan 210 is less likely to dent or take on the shape of the course of shingles below.

FIGS. 3A and 3C show one or more PV pans 220 that extend in a column adjacent to roof pan 210. PV pans 220 in this embodiment are partially corrugated pans with a series of ridges 222 (alternatively referred to as peaks) and channels 224 (alternatively referred to as troughs or valleys) formed in PV pans 220 that provide support to PV modules 201 mounted on PV pan 220. PV modules 201 and dummy modules 205 can be installed over PV pan 220 to form a complete column of similar looking material. Dummy modules 205 can also be made of glass, painted metal, plastic or other material that matches the color, reflectivity, and/or texture of PV modules 201 or non-PV roof pans 210.

As noted above, dummy modules 205 can also be configured as transition pans at down-roof or up-roof portions of a column of PV modules 210 and PV pans 220. Transition pans can be installed at up-roof and down-roof portions (e.g., ridge or eave, respectively) of a PV system (e.g., a roof). Dummy pans 205 can appear the same or substantially similar in appearance to the non-PV roof pans 210 and/or the assembly of PV modules 201 with PV pans 220. Various embodiments are described in more detail and shown below.

Similarly, non-roof pans 210 can also be similarly configured (e.g., painted) to match the color, reflectivity and texture of PV modules 201, or vice versa. In some embodiments, modification of dummy modules 205 or non-PV roof pans 210 can include grid-lines or other features (e.g., printed cells, bussing, or busbars) to further match the appearance of PV modules 201.

In certain embodiments, one or more PV module junction boxes 217 (alternatively referred to as "j-boxes") can fit within or extend into one of channels 224 of PV pan 220. Junction boxes 217 can be attached to or extend from a bottom surface of the PV modules into channels 224. As described in more detail below, having more than one junction box 217 (e.g., V+ and V−) can provide additional or improved potential wire routing pathways or connections. Further, including more than one junction box 217 can decrease the profile or size required of each junction box 217, relative to a single j-box implementation and also reduce the amount of external or internal wire (e.g., copper wire) required for electrically connecting cells and PV modules of a PV system relative to using one junction box 217 in certain embodiments. In certain embodiments, efficiency can be improved by reducing internal or external resistances by reducing the amount of internal or external wiring.

One or more junction boxes 217 can be center mounted, for example, on the underside of PV module 201, as shown in the center portion of FIG. 3C. Junction boxes 217 can also be mounted off-center (e.g., more proximate to opposing sides and/or ends of PV module 201 rather than a center or center-line of PV module 201) on the underside of PV module 201, as shown under PV module 201 in the right side portion of FIG. 3C. In some implementations, primary wiring channels 226 and/or secondary wiring channels 228 can accommodate the wires and connectors that interconnect adjacent or proximate PV modules 201 to each other as part of system 200, as well as the home run connection to a power substation connected to system 200. Junction boxes 217 can be pre-assembled, clipped, or bonded to PV modules 201. Wires or cables for connection to other junction boxes 217 can optionally be pre-attached (e.g., taped, with clips) to PV modules 201 prior to installation. In certain embodiments, PV modules 201 can include micro-inverters, DC optimizers, or other module-level electronics as part of or separate from the housing that also holds junction boxes 217.

As shown in FIG. 3C, either battens 211 or PV pans 220, or both can be installed over existing composition shingle roof or roof deck 203. In some embodiments, intermediate layers 219 of felt paper, insulation (e.g., battens, isoboard, polyisocyanurate foam, foam), reflective layers, underlayment (e.g., moisture, fire protection, or other suitable insulation layers such as VersaShield®, MetShield®, or Dens-Deck®), and/or other suitable layers can be positioned between shingle roof 203 and bottom of battens 211 or PV pans 220. In certain embodiments, battens 211 or PV pans 220 can be mounted onto an existing or newly installed roof deck with no composition shingle thereon. In yet further embodiments, intermediate layers 219 can be positioned on top of battens 211 or further insulation layers, instead of, or in addition to, under battens 211. Further, battens 211 (e.g., insulation layer or other spacers or raisers) can space roof pans 210 to a desired height above roof 203 surface, for example, such that roof pans 210 are coplanar with PV modules 201 or dummy modules 205.

Installation of system 200 can continue with another PV pan 220 or column of PV pans 220 being joined to first column of PV pan(s) 220 via another respective standing seam 230. In certain embodiments, PV pans 220 will be covered by PV modules 201, roof pans 210, or dummy modules 205, thus, screws or other suitable fasteners (e.g., glue, nails, clips) can be used to attach further PV pans 220 directly to roof 203 surface or structure. Similarly, further columns of roof pans 210 and/or PV pans 220 can be installed on either side of system 200 not show, in other words, to the further right of side of PV pans 220 and/or to the further left of non-PV roof pans 210, and joined with respective roof pans 210 and PV pans 220 using another standing seam 230.

After non-PV roof pans 210 and PV pans 220 have been installed with standing seams 230 formed for the full coverage of system 200 for given roof 203, either dummy modules 205 and low profile PV modules 201 can be installed directly over PV pans 220. In some embodiments, PV modules 201 can be joined to PV pans 220 prior to installing PV pans 220 to roof 200 and/or forming interlocked seams 230. Dummy modules 205 can be bonded to roof pans 210 and PV modules 201 can be bonded to PV pans 220, for example, with a non-watertight (e.g. hook and loop) or watertight/substantially watertight adhesive (e.g., glue, sealants such as PV 804, RTV, PV-8030, thermal adhesive), or otherwise suitably coupled via one or more mechanical fasteners (e.g., clips, clamps, screws), depending whether system 200 is configured to allow water to flow between PV modules 201 and PV pans 220 or to maintain water above PV module 201 surface and out of PV pan 220. For example, in various embodiments, dummy modules 205, roof pan 210, or PV modules 201 can have one or more standing seams or rail portions that can be bonded to a separate pan that has seams or rails and can further be interlocked under a seam cover or other engagement features to form of standing seam 230. In other aspects, dummy modules 205 can be bonded to PV pans 220, to be arranged intermittently between with PV modules 201 also bonded to PV pans 220.

Once the array has been completed and all electrical interconnections made, ridge cap 215 can be installed over roof ridge 209 to conceal top edges of roof pans 210 and PV pans 220 as well as any PV wires or cables. The result of deploying and installing roof pans 210, dummy modules 205, and low profile building integrated PV modules 201 is to create an aesthetically consistent PV array with a uniform or substantially uniform look and elevation that is essentially a re-roof (or a newly installed roof) of an existing structure (e.g. a customer's home) with less material than conventional solar plus roofing. The entire roof, including PV modules 201, dummy modules 205, and flat roof pans 210 form a planar or substantially planar array of uniform or substantially uniform height. Because metal roofs are known to generally last 30-50 years, depending on climate, roof 203 can last at least as long as the solar panel system 200, thereby greatly minimizing or eliminating the possibility that roof 203 will expire before BIPV system 200 has reached an expected end of functional life. While shown here as part of an on-roof system, it can be understood that the installation process can also apply to PV pans and modules assembled as part of a built-in solar assembly, incorporated into the framing structure of a roof.

Figure 4E:
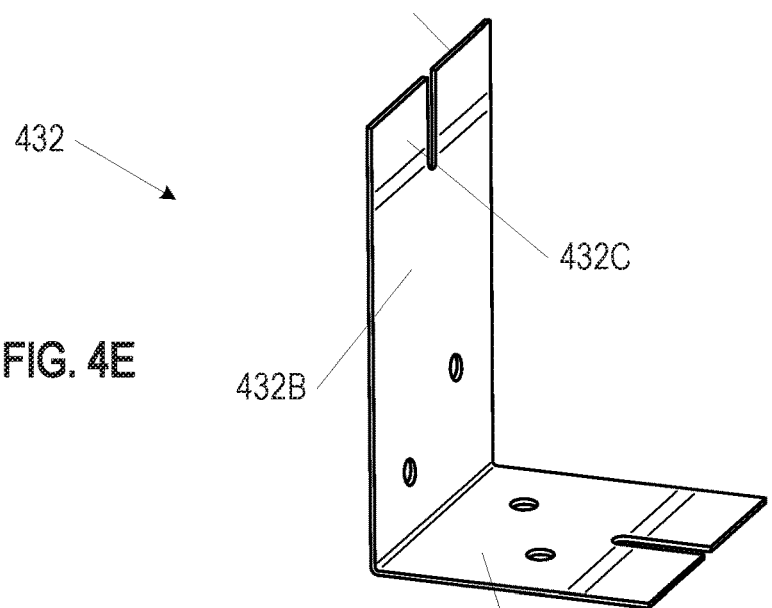
FIGS. 4E-4G further show different views of a seam clip configured in accordance with an embodiment of this technology.

FIGS. 4A-4I show other ways to assemble and interlock the seams of adjacent pans and modules and/or attach a PV module to a pan (e.g., a corrugated pan). FIG. 4A is a general representation of standing seam assembly 400, and FIG. 4B is a magnified, cross-sectional view of a portion of a PV system having corresponding standing seams of two adjacent pans, non-PV pan 410 and PV pan 420, interlocked or coupled together with one or more seam clips 432 to form standing seam assembly 400 in accordance with various embodiments. This could be a system such as system 200 in FIGS. 2A, 3A-3C, or a system such as that shown in other embodiments of this disclosures. Non-PV pan seam 412 of non-PV pan 410 and PV pan seam 414 of PV pan 420 can be interlocked with seam clip 432 positioned therebetween. Seam clip 432 can include two or more tabs (identified individually as first tab 432C and second tab 432D) that can be folded (e.g., bent or crimped) over respective standing seams non-PV pan seam 412 and PV pan seam 414 to interlock non-PV pan 410 and PV pan 420 together. Moreover, standing seam assembly 400 can, for example, hold and position both non-PV pan 410 and PV pan 420 such that the surfaces of non-PV pan 410 and PV module 401 form a uniform or substantially uniform planar surface. In aggregate, PV module 401, whether bonded, adhered, or mechanically coupled to PV pan 420, can be referred to as a PV pan-module assembly.

In various embodiments, as noted above and shown in FIG. 4A, standing seams, such as non-PV pan seams 412 of non-PV pans 410 can be hemmed or bent into various shapes rather than extend in a substantially vertical direction. The various shapes of non-PV pan seams 412 and PV pan seams 414 can include, for example, standing seams that are hemmed inwardly or medially toward each other, closed hems (e.g. with no gap), open hems where the hemmed portion can extend at various angles relative to a vertical axis. Such hemming can provide improved stiffness and rigidity that can help mitigate wind uplift as well as ease of installing or moving pans. The tabs of seam clips 432 can then include bent, hook, J-shaped, other projection, or engagement portions 438 for engaging hemmed non-PV pan seams 412 (e.g., in a snap-lock manner). Tabs of seam clips 423 can be installed extending generally upward in a vertical direction and then bent along a path P in FIG. 4A to be in an orientation to latch or interlock with standing seams. Seam cover 436 can then be cut to the appropriate length and assembled over the top of the interlocked (bent-over) seam clips 432 and standing non-PV pan seams 412. As noted above, this secured assembly can provide improved resistance to pullout of pans from the clips in response to, for example, wind uplift. Similarly, PV pan seams 414 of PV pans 420 can be hemmed or bent into various shapes rather than extend in a substantially vertical direction, and the tabs of seam clips 432 can include bent, hook, J-shaped, other projection, or engagement portions 438 for engaging hemmed PV pan seams 412 to secure PV pans 420 to a structure.

Shown in FIG. 4B, seam clip 432 can be attached to an existing roof surface or structure 407 (e.g., roof deck, composition shingle, rafter) prior to laying the pans over seam clip 432. In some embodiments, as shown, seam clip 432 has an L-shaped cross section with base portion 432A that extends under a lower surface of one of the non-PV pan 410 or PV pan 420 when attached to roof surface 407, and wall portion 432B extending between the respective non-PV pan seam 412 and PV pan seam 414. Seam clip 432 can include first tab 432C and second tab 432D, each of which can be configured to bend in opposite directions from each other, and thereby be positioned to latch or couple with standing seams on either side of seam clip 432. Further, both first tab 432C and second tab 432D can include one or more projections or "wing" portions, referred to as first tab wing 432E and second tab wing 432F, respectively, to engage with corresponding engagement features of seam cover 436 as described in more detail below.

In certain embodiments, seam cover 436 (or cap) can be attached over adjacent non-PV pan seam 412 and PV pan seam 414. Seam cover 436 can help reduce and ideally prevent the ingress of water, wind, or other debris to the space under either non-PV pans 410 or PV pans 420, or between standing seams. In various embodiments, seam cover 436 can include engagement features 438 (e.g., hooks, curved portions, J-shaped end portions) to engage or mate with corresponding projections, such as first tab wing 432E and second tab wing 432F, extending from first tab 432C and second tab 432D, respectively, to secure or couple seam cover 436 to seams clips 432 onto the respective standing seams of interlocked pans. In some aspects, first tab wing 432E and second tab wing 432F can have a spring tension, such that engagement between first tab wing 432E and second tab wing 432F with engagement features 438 secures seam cover 436 with seam clip 432 due to the mechanical interlocking of these parts and/or the frictional interface between these parts due to the restoring spring force of first tab wing 432E and second tab wing 432F on opposing interior sides of seam cover 436.

As shown, PV modules 401 can be attached to the upper surfaces (e.g., ridges 422) of corrugated PV pans 420 with adhesive 440 (e.g., hook and loop, sealant, glue) or with other types of suitable mechanical fasteners. Adhesive 440 can include one or more hook and loop strips or patches. In other embodiments, glue or other types of adhesives 440 can be applied to PV module 401 and PV pan 420 to couple or bond PV module 401 to PV pan 420. In some embodiments, the underside or backside (e.g., backsheet) of PV module 401 can include one or more layers, strips, and/or patches of padding 442 between applied adhesive 440 and PV module 401. Padding 442 can help protect PV module 401 and/or improve adhesion with adhesive 440. In other embodiments, padding 442 can be attached to the ridge portions 422 of pan 420. In certain embodiments, padding 442 (e.g., VHB tape, hook and loop) of a desired thickness can be applied to PV pans 420 or PV modules 401 in order to set PV modules 401 at a desired height above PV pan 420, such that PV module 401 will be mounted at a specified height (e.g. uniform with proximate non-PV pans 410) after applying adhesive 440. In such cases, padding 442 can be mounted to PV modules 401 prior to the application of adhesive 440.

FIGS. 4C and 4D are cross-sectional views of building integrated PV system 400 with seams secured according to other embodiments of the present technology. As shown, respective non-PV pan seams 412 of roof pans 410 and PV pan seams 414 of PV pans 420 can be secured together or interlocked by overlapping the seams and using rivets 416 to secure them together. As described above, PV pans 420 can be secured to the roof through the overlapping portion of via one or more rivets 416, screws 418, or other fastening members 444 (where fastening members 444 can be nails, bolts, etc.). FIG. 4D shows an embodiment where corresponding non-PV pan seams 412 of adjacent columns of non-PV pans 410 (e.g. roof pans) are secured together with rivets 416. Further, screws 418 can be hidden under an upper seam of the overlapping non-PV pan seams 412 and extend through the lower seam into an underlying roof (e.g., into a batten, rafter, deck, or other roof structure) to secure non-PV pans 410 to the underlying roof.

Figure 4F:
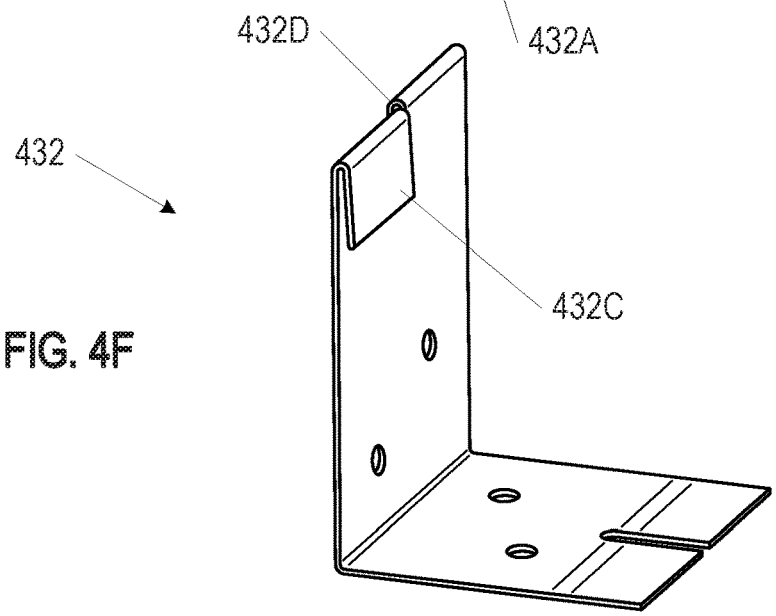
Figure 4G:
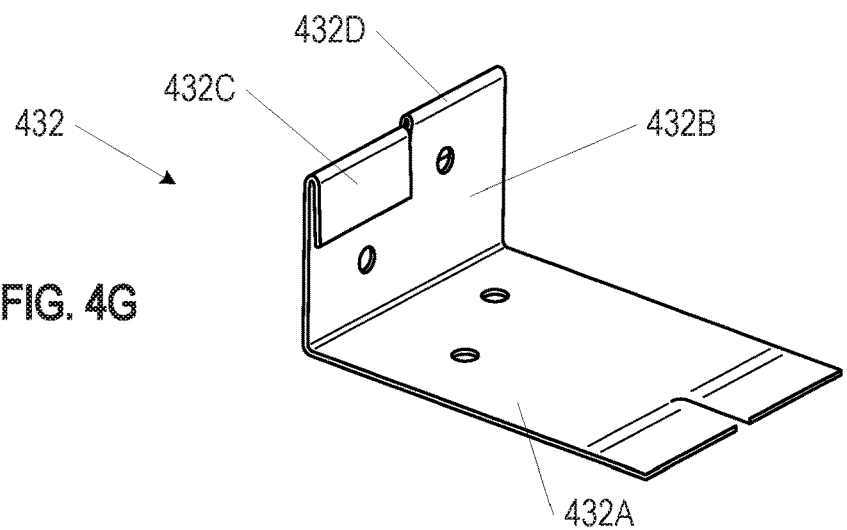

FIGS. 4E-4G show various isolated views of an embodiment of seam clip 432 that can be used to interlock or couple standing seams of PV pan-module assemblies, transition pans, or roof pans. Seam clip 432 can be configured to have tab portions, hook portions, or the like. Seam clip 432 can have a substantially L-shaped configuration or body having first surface 432A (alternatively referred to as a "base" surface) and second surface 432B (alternatively referred to as a "wall" surface) extending substantially perpendicular relative to each other. Such seam clips 432 can save or reduce manufacturing costs (e.g., by having one SKU). Seam clip 432 can be dimensioned such that seam clip 432 can be positioned below battens or other insulation layers (e.g., isoboard) to couple seams of adjacent pans (e.g. roof pans, PV pans, non-PV pans, transition pans, etc.) in a first configuration. Seam clip 432 can also be positioned above battens or other insulation layer to couple seams of adjacent pans in a second configuration.

In some embodiments, first surface 432A is smaller than second surface 432B (e.g., FIG. 4E). In other embodiments, first surface 432A can have a greater length relative to second surface 432B (e.g., FIG. 4G). Each of first surface 432A and second surface 432B can include corresponding tab portions that can be bent over as noted above. In the context of the present disclosure, first surface 432A can be considered the portion of seam clip 432 that is in contact with the mounting surface while second surface 432B can be considered the portion of seam clip extending upward and perpendicularly away from the mounting surface. Thus, if seam clip 432 is reoriented for a particular installation, the base surface and wall surface of seam clip can be defined such that second surface 432B can have a greater length relative to first surface 432A. Accordingly, both first tab 432C and second tab 432D refer to bendable tabs at the end of second surface 432B, although both first surface 432A and second surface 432B have tabs at their ends. The particular tabs used will depend on the orientation of clip 432. As a result, instead of having two SKUs for two different sized seam clips 432, one SKU or seam clip 432 can be provided that can be mounted in two different configurations.

Figure 4H:
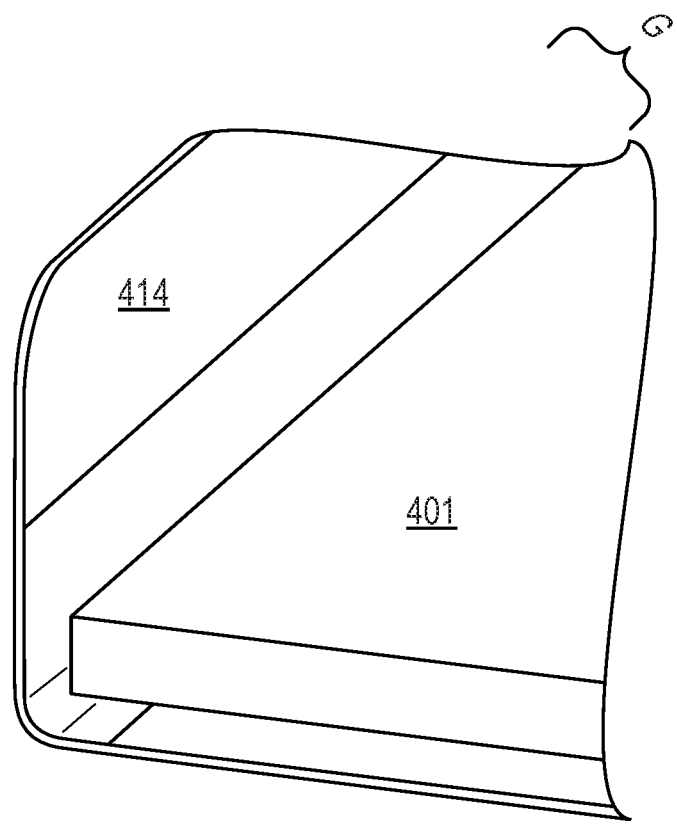
FIGS. 4H and 4I show spacing and a filling or wedge member between photovoltaic modules and proximate side walls, in accordance with aspects of this technology.
Figure 4I:
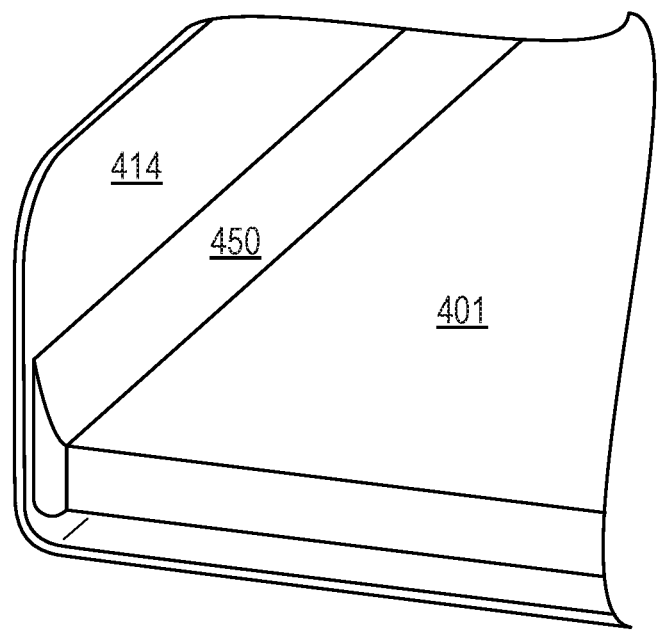
Figure 5:
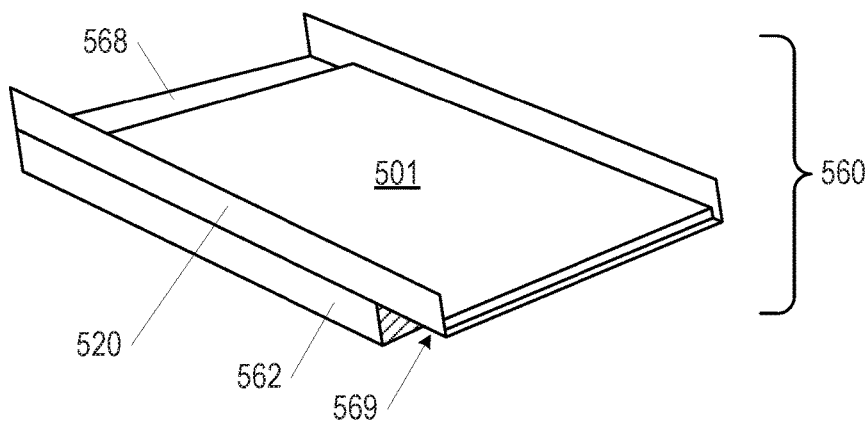
Figure 6:
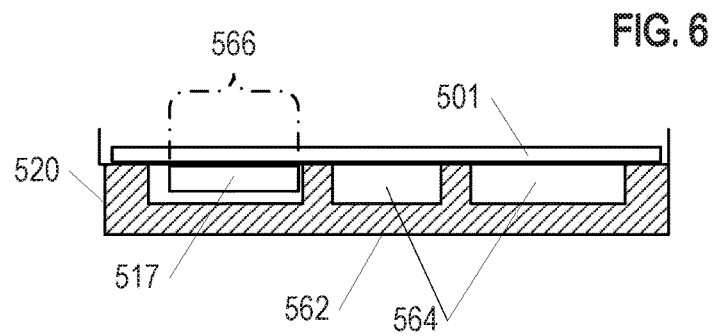

FIGS. 4H and 4I show gaps between opposing side edges of PV module 401 and standing seams, particularly PV pan seam 414 in an exemplary PV roof system according to various embodiments. As shown, in order to improve aesthetics (e.g., color matching) and to reduce debris (e.g., dirt, water, ice) from being lodged between PV modules 401 and standing seams, the gaps G between the two structures can be taped (with a colored tape) or painted accordingly. In some embodiments, sealant (e.g. a silicon-based sealant) can be used to fill the gap. In other embodiments, sealing member 450 (e.g., made of rubber or other suitable materials) can also be inserted and secured within gap G or seam. Sealing member 450 or tape or adhesive in the side gaps G can also improve adhesion or strength of the bond between PV module 401 and PV pan 420, as such elements add further locations where PV module 401 is bonded to PV pan 420 in addition to adhesive under PV module 401. In other embodiments, sealing member 450 can be positioned between PV module 401 and a rail physically connected to underside of PV module 401.

As discussed in greater detail herein, in other embodiments, vertical seams 414 may be attached to either side of PV modules 401 so as create an integrated pan and module, thereby eliminating the need for a separate PV module pan. In such cases, the PV module is actually part of the building envelope. This distinction is significant because in such embodiments, wiring may only reside under the PV modules and therefore, within the building envelope, triggering different code requirements related to wire management.

FIGS. 5-8 and 9A-9B are perspective views and schematic cross sectional or front views of a portion of BIPV system according to other various embodiments. In the embodiments shown in these figures, PV modules 501 and PV module pan 520 are integrated into a single structure, thereby simplifying the installation process. As shown, a bottom surface (e.g., backsheet) of PV module 501 is bonded (e.g., adhered, secured, coupled) to pan 520 (e.g., sheet metal). In such embodiments, pan 520 extends across the entire or substantially the entire bottom surface of PV module 501, forming PV module-pan assembly 560 (e.g., a bonded PV module and pan). Thus, PV module-pan assembly 560 forms a portion of a new roofing membrane (e.g., maintaining the area between the pan and module dry) above an existing roof or roof surface. Pan 520 includes standing seams that can be interlocked (e.g., with seam clips and a seam cover) to seams of adjacent pans as described above. In other embodiments, pan 520 can include inverted seams as noted above with respect to other embodiments.

In various embodiments, pan 520 is coupled to spacer or support 562 that is attached to the roof surface or other roof structure. In some embodiments, pan 520 can be coupled to PV module 501 prior to installation to a roof surface. Support 562 can be made of foam or other suitable materials (e.g., polystyrene, polyisocyanurate foam) and can elevate PV module 501 and pan 520, referred to in combination as PV module-pan assembly 560, above the existing roof surface (e.g., to provide channels for airflow or j-box(es) as described in more detail below). As described above, adjacent columns of non-PV roof pans can sit on battens or other spacers (e.g., insulation layers) to maintain a planar or uniform height of the plurality of pans and PV modules forming the building integrated PV system.

In certain embodiments, support 562 can include one or more channels 564 passing underneath and open to a bottom surface of pan 520. Channels 564 can provide space to accommodate junction box 517 attached to the bottom of PV module-pan assembly 560 as well as space for associated wires. Also, channels 564 can provide space for airflow underneath PV module-pan assembly 560. Further, openings 566 (e.g., a window, cut-out) can be formed in pans 560 to allow junction box 517 to extend down into one of channels 564 when PV module-pan assembly 560 is coupled to support 562. In certain embodiments, rows of channels 564 or other cut-outs (e.g., perforations) can be made through support 562 to allow wires to be run in a direction generally transverse (e.g., side to side) to a longitudinal axis of pan 560.

Figure 7:
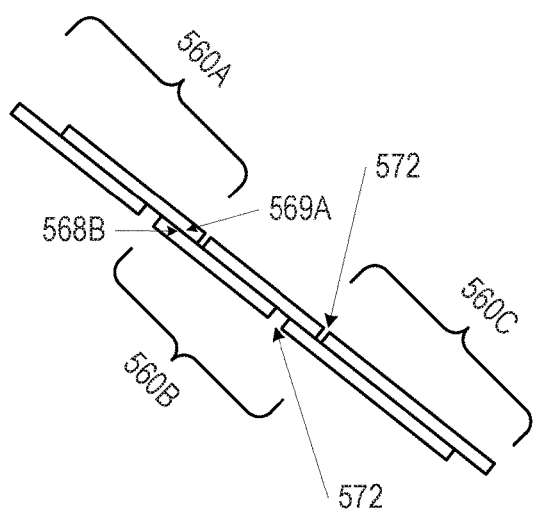

At one end, for example, first edge portion 568, of pan 520 may extend past PV module 501 to allow room for two successive assemblies 560 to overlap within a column. Thus, first edge portion 568 of a top surface of pan 520 can be exposed. Second edge portion 569 (e.g., an overhang, ledge) of PV module-pan assembly 560, on the opposing side of PV module-pan assembly 560 from first edge portion 568, can extend in an opposite direction from first edge portion 568 past a portion (e.g., top or bottom edge portion) of support 562 when PV module-pan assembly 560 is coupled to support 562. This arrangement can allow for a portion of first PV module-pan assembly 560A to lay or be positioned on a region of second PV module-pan assembly 560B within a column of PV module-pan assemblies. For example, as shown in FIG. 7, second edge portion 569A of first PV module-pan assembly 560A overlaps and sits on top of exposed portion 568B, a top surface of second PV module-pan assembly 560B. This will tend to direct rain water down the array rather than under the array.

In systems as shown with pan-to-pan contact (e.g., a bottom pan surface portion of first PV module-pan assembly 560A to a top pan surface portion of second PV module-pan assembly 560B), gap 572 can be present between PV modules 502 and/or supports 562 at these overlapped portions. In some embodiments, gap 572 extends between the bottom edge and top edge of first PV module-pan assembly 560A and second PV module-pan assembly 560B, or PV module 501 edges. In other embodiments, portions of PV module 501 edges of first PV module-pan assembly 560A and second PV module-pan assembly 560B can abut each other when installed. In yet further embodiments, gap 1972 can be filled or covered (e.g., reduced) with a sealant or with the use of edge trims or other sealing members (e.g., gaskets, edge protect, tape) as described above. The sealing members can be made of rubber or other suitable materials.

Additionally, in some embodiments, a sealant or other adhesive (e.g., butyl) can be used to bond overlapping pan portions of first PV module-pan assembly 560A and second PV module-pan assembly 560B. Second PV module-pan assembly 560B and third PV pan-module assembly 560C can be overlapped in a similar manner as first PV module-pan assembly 560A and second PV module-pan assembly 560B. Additional PV module pan assemblies can be added as desired. In certain embodiments, grooves (e.g., channels, indents, recesses, ridges) can be formed in first edge portions 568 and second edge portions 569 that contact and can couple with each other when overlapped. Such grooves can help reduce or prevent capillary action of moisture or water between pans, for example, in an up-roof direction. In some embodiments butyl caulk or sealant can be included between the overlapped sections.

Figure 8:
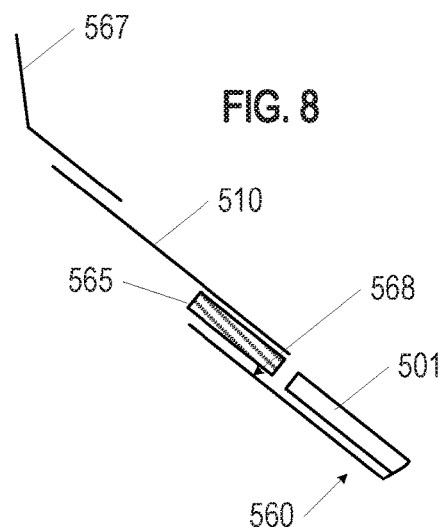

Non-PV roof pans can be used as dummy modules or transition pans for areas where no PV modules are desired or needed, and/or at the transition to an eave or a ridge. Non-PV roof pans 510 can be installed on exposed edge portion of pan 520 of PV module-pan assembly 560. For example, as shown in FIG. 8 showing a side view of an up-roof portion of a building PV integrated system, lower edge portion of non-PV pan 510 is positioned on exposed first edge portion 568 of PV module-pan assembly 560. Spacer 565 (e.g., filler, offset, support, batten, pad) can be positioned between exposed first edge portion 568 and lower edge portion of non-PV roof pan 510 to elevate non-PV roof pan 510 to a uniform or substantially uniform height as PV module 501. In certain embodiments, an opposing edge portion of non-PV roof pan 510 can extend under flashing 567 or a ridge cap depending on where the assembly with respect to features of the roof.

Figure 9A:
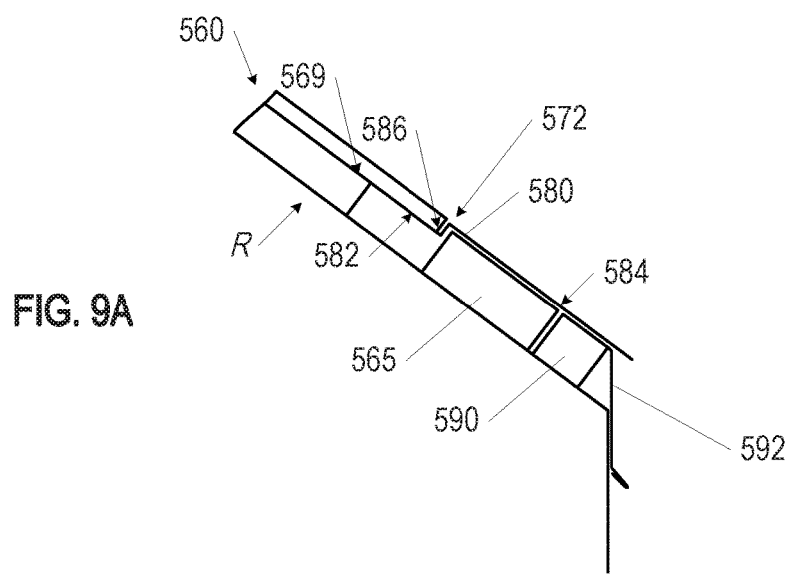

FIG. 9A shows a down-roof portion of a BIPV system according to various embodiments. In the system shown in this figure, Z-shaped (non-PV) pan 580 can be positioned at a bottom edge of PV module-pan assembly 560 such that first leg 582 of Z-shaped pan 580 extends in an up-roof direction underneath overhang or ledge portion 569 of PV module-pan assembly 560. Second leg 584 of Z-shaped pan 580 extends in a down-roof direction towards eave or gutter of roof R. Second leg 584 is positioned on spacer 565 to elevate Z-shaped (non-PV) pan 580 to a uniform or substantially uniform height as PV module-pan assembly 560. Middle body portion 586 (e.g., wall portion) extends between or couples the two leg portions, first leg 582 and second leg portion 584. Middle body portion 586 extends in a direction generally transverse or perpendicular to roof surface R when mounted to either PV module-pan assembly 560 or spacer 565. Middle body portion 576 can fit within gap 572 between pan structures, and can prevent PV module-pan assembly 560 from sliding down-roof (e.g., provides a stopping surface).

Figure 9B:
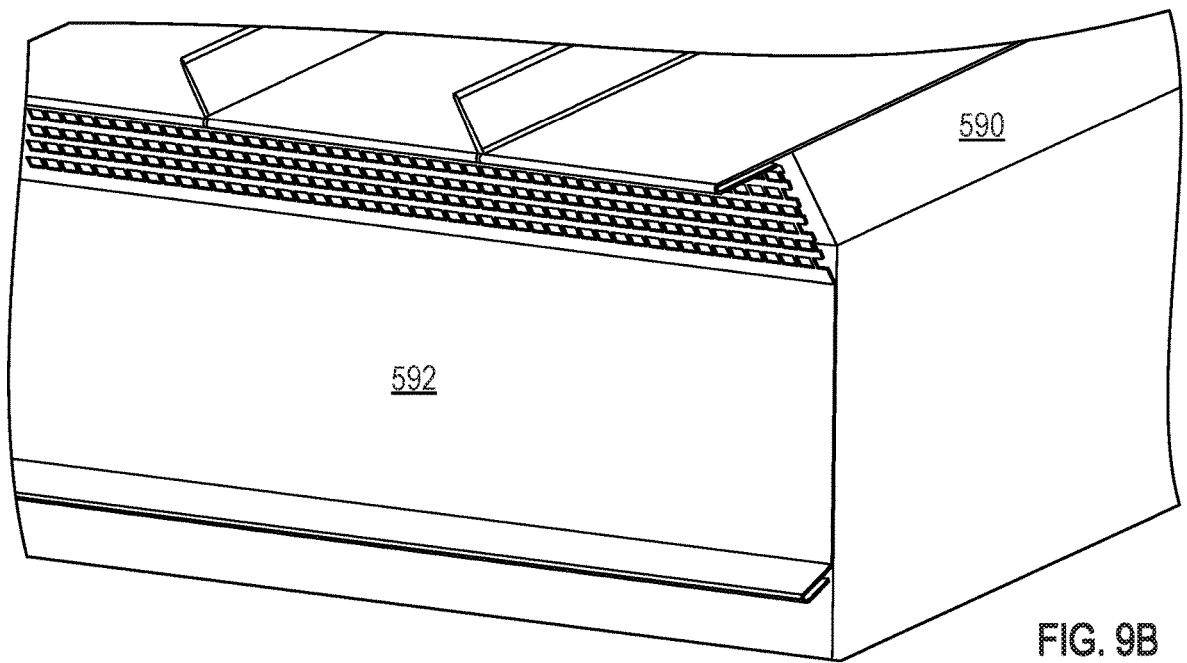
FIG. 9B shows a close-up view of roof eave portion of a roof including a louvered vent portion configured in accordance with embodiments of this technology.

In various embodiments, a vent such as vent 590 (e.g., louvered vent, coravent, vented batten) is provided in front of spacer 565 at eave portion of roof R to allow air to flow through space 565 and underneath PV module pan assemblies 560. FIG. 9B shows in more detail a portion of an eave portion including perforated or caged vent cover 592 usable with various embodiments described herein. Air can flow or enter through such vent cover 592 and vent 590 and flow under PV module pan assemblies or between PV modules and pans of PV module pan assemblies.

Assembly of Building Integrated Photovoltaic Systems

FIGS. 10A-10H show an exemplary installation of BIPV system 1000 on building 1002 (e.g., roof surface of a home) including one or more features or components (e.g., roofing components, transition pans, PV module assemblies, roof pans, underlayment layers), in whole or in part, according to various embodiments of the present technology. BIPV system 1000 includes columns of roof pans 1010 and PV module-pan assemblies 1060 secured together via one or more standing seams (each PV module-pan assembly 1060 being a coupled structure of PV module 1001 and PV pan 1020). The columns of PV module-pan assemblies 1060 can further include down-roof transition pans 1091 and up-roof transition pans 1089 at eave and ridge portions, respectively, of roof surface 1003. BIPV system 1000 can be positioned or mounted on roof surface 1003, either directly to the wooden roof deck or over an existing layer of composition shingles. Intermediate layers of insulation (e.g., isoboard), batten, moisture, and fire protection layers can be laid upon roof surface at least in part below BIPV system 1000. The roof and/or roof surface 1003 of building 1001 can include various components including ridge cap 1093, edge trims 1095, flashing 1097 (e.g., rake, eave, ridge), vents, and gutters.

FIGS. 10B-10H are a series of figures showing an exemplary installation sequence of BIPV system 1000 and other various roofing components according to various embodiments. In some aspects, eave flashing 1097 can be installed onto existing roof surface 1003, which can be composition shingle roof or roof deck. Next, side edging or trimming 1095 can be applied to sides of roof surface 1003.

Layers or rows (e.g., battens) of insulation 1005 (e.g., foam, polyisocyanurate foam) can be installed on portions of roof surface where columns of roof pan (e.g., metal pans) are to be positioned. As noted above, one or more underlayment or other intermediate layers 1007 can be positioned between deck and insulation or insulation and roof pans. Then roof pans 1010 can be laid on top of insulation layer 1005 and/or intermediate layer 1007 and secured with staples, nails, screws or other suitable fasteners. Next, one or more rows of vented battens 1092 (e.g., metal, foam, polyisocyanurate foam) are secured to roof surface at down-roof and up-roof end portions (e.g., by the eave and ridge, respectively) in areas of roof surface 1003 configured to include PV module-pan assemblies 1060.

Down-roof transition pan 1091 can be installed on portion of vented batten 1092 adjacent side of previously installed roof pans 1010. PV module-pan assemblies 1060 are installed, with first PV module-pan assembly 1060A lapped onto a rear or up-roof portion of down-roof transition pan 1091. Second PV module-pan assembly 1060B is lapped onto the rear or up-roof portion of first PV module-pan assembly 1060A. Next, up-roof transition pan 1089 is positioned onto and lapped onto rear or up-roof portion of second PV module-pan assembly 1060B. As shown, two or more (e.g., additional) columns of transition pans 1089, 1091 and PV module-pan assemblies 1060 are similarly installed forming PV array of three columns and two rows of PV modules. In other embodiments, different configurations of PV modules can be included as desired.

Finally, a further layer of insulation 1005 and optional intermediate layers 1007 is installed on second side of the array formed by PV module-pan assemblies 1060, and corresponding columns of non-PV roof pans 1010 are positioned and mounted thereon as on other side of roof surface 1003. Flashing 1097 (e.g. rake flashing) can be installed onto sides of the roof surface (e.g., on the side edging or trimming). Finally, ridge cap 1093 can be installed over ridge. In certain embodiments, a ridge vent can be provided or installed within ridge cap 1093 as described in more detail below.

Supplementary PV Array Hardware

Various aspects of the present disclosure further describe components of structures that can aid in the installation and operation of BIPV systems, including but not limited to, grounding clips and wiring tunnels. In particular, in some embodiments as described in more detail below, one or more grounding members or clips for the PV modules can be positioned under seam covers in contact with a plurality of the seams. In some embodiments, cables or conduits can run along the seams under cover. In other embodiments, cables or conduits can be run along the outer surface of cover and a second cover can be positioned over a first seam cover to conceal cables.

FIGS. 11A-11H show various views of grounding clips 1100 configured in accordance with certain embodiments described herein. In various embodiments, grounding clips 1100 may be used in addition to mounting clips 432. Grounding clip 1100 can be made of stainless steel or other suitable metals or materials. In some embodiments, grounding clip 1100 can be manufactured from a sheet metal stamping process. In application, grounding clips 1100 can provide for structural stability and support to non-PV pans, PV pans, and other standing seam elements on a PV array system. Grounding clips 1100 can also electrically ground such structural elements such that accumulated charge, voltage, or static electricity is drawn away from and does not affect PV modules 1122 supported in the PV array system. In other words, grounding clips can electrically isolate standing seams of structural support pans, as well as rails of PV modules, from electrically conductive and solar energy collecting PV modules.

Figure 11D:
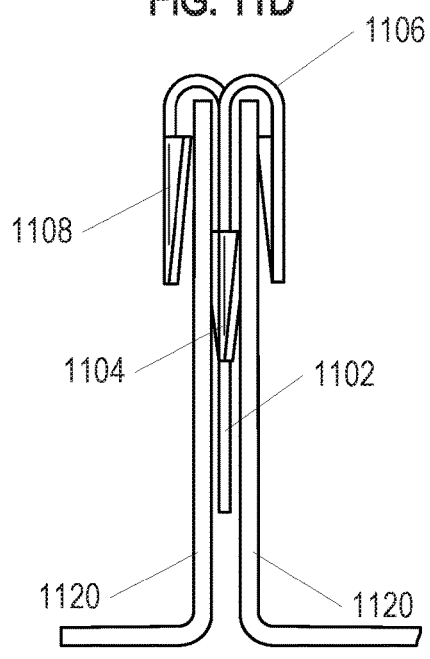
Figure 11E:
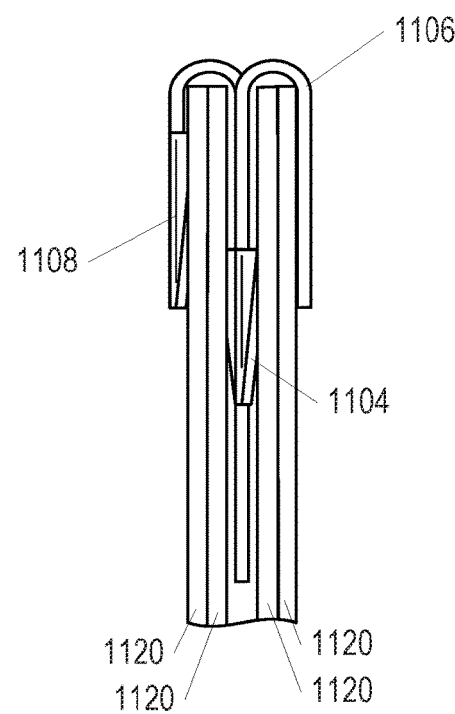
Figure 11F:
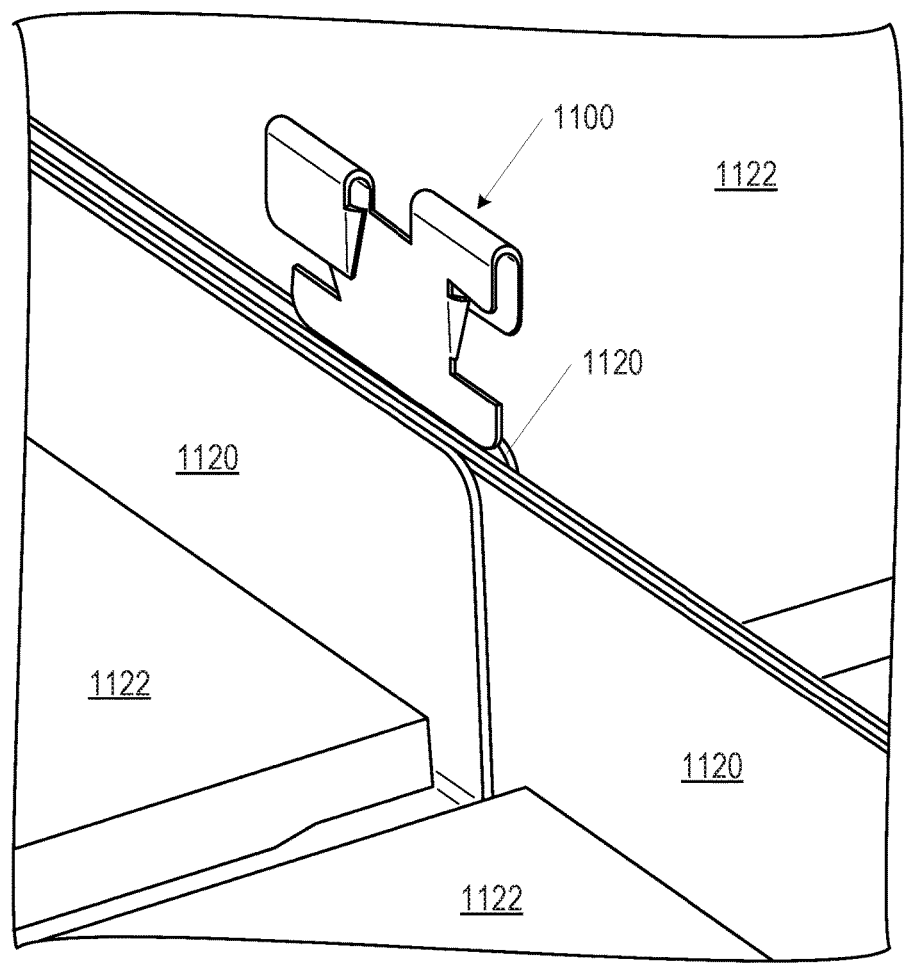
Figure 11G:
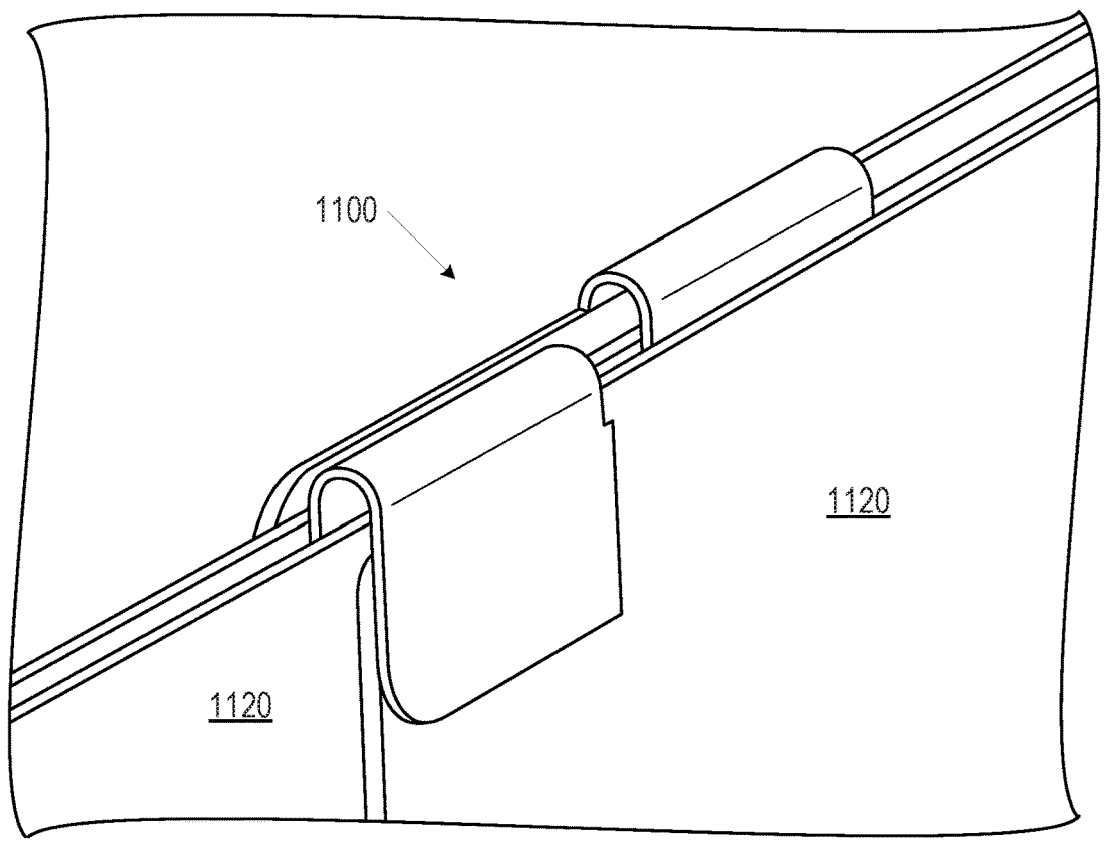

In various embodiments, grounding clip 1100 includes one or more teeth (e.g., projections, tabs, protrusions, 1104, 1108, 1110) configured to cut or "bite" into standing seam portions 1120 of adjacent, lapped, or overlapped pans (e.g., scrape through a paint coating of the pans or pierce or engage into the pans). Grounding clips 1100 can thereby bond support pans, including both PV module pans and non-PV pans (e.g., roof pans, dummy modules, transition pans) together. Grounding clip 1100 can bond two panels lapped or positioned side to side as shown in FIG. 11F. As shown in FIG. 11G, grounding clip 1100 can also couple and electrically ground four PV pans 1122 where their standing seams 1120 overlap. In various embodiments, the seam cap may fit over bonding clip 1100.

In some embodiments, particularly shown in FIGS. 11A and 11B, grounding clip 1100 includes body portion 1102 adapted to be inserted between standing seams 1120 of at least two lapped, adjacent, or side-by-side panels 1122 or pans. As shown, inner teeth 1104 extending from opposing side portions of body portion 1102 are configured to engage inner surfaces of lapped standing seams 1120 adjacent to and facing each other. Further, grounding clip 1100 can include hemmed, bent, or curved tab portions 1106 that extend around or over top or upper portions of standing seams 1120 or similar structures. Bent or curved tab portions 1106 can include pair of outer teeth 1108 for engaging outer surfaces of corresponding lapped standing seam 1120 portions adjacent to and facing laterally opposite directions.

Grounding clips 1100 can electrically ground pans 1120 together when installed, directing electrical charge (e.g. static electricity not necessarily generated by PV modules 1122) away from the PV array system to ground. As shown in FIG. 11D, outer teeth 1108 can engage lapped standing seam 1120 portions of two pans, thus grounding two pans together when installed. Similarly, inner teeth 1104 engage paired standing seams 1120 of two pans, with body portion 1102 in between standing seams 1120. Grounding clip 1100 can be configured or sized such that a seam cap can be installed over grounding clip 1100. FIGS. 11E and 11F show an installation of grounding clip 1100 for grounding four lapped standing seams 1120 together, with FIG. 11F showing the positioning of grounding clip over four standing seams 1120 of pans holding PV modules 1122, and with FIG. 11E showing the engagement of grounding clip between four standing seams 1120 after installation. As shown in FIG. 11E, outer teeth 1108 can engage lapped standing seam 1120 exterior face portions, while inner teeth 1104 engage paired standing seams 1120 interior face portions, of two pans, with body portion 1102 in between standing seams 1120.

Figure 11H:
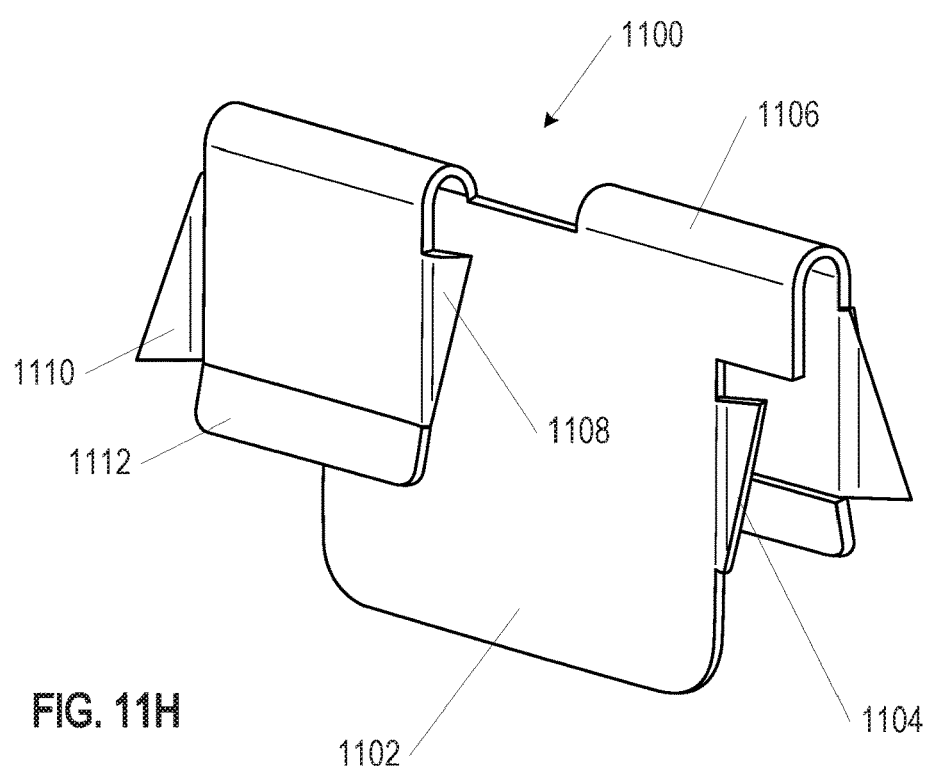

In certain embodiments, particularly shown in FIGS. 11B, 11C and 11H, grounding clip 1100 includes body portion 1102, pair of inner teeth 1104 extending from opposing side portions of body portion 1102, and curved tab portions 1106, and can also include additional projections, referred to as secondary outer teeth 1110, as well as wings 1112 extending from the ends of curved tab portions 1106. Secondary outer teeth 1110 project laterally outward away from the body portion 1102 of grounding clip 1100. Secondary outer teeth 1110 can be configured to cut or "bite" into or engage seam cover or cap as described above, seam cover being positioned over coupled or interlocked standing seams 1120. Wings 1112 can provide for a further frictional interface or tension spring to secure grounding clip 1100 in place with standing seams 1120.

FIGS. 12A-12C show views of conduits, cables, or wires 1200 of PV system extending or running beside seam covers or caps 1204. Color matched trim piece or secondary cover 1202 can be secured or snap-locked to seam cover 1204 or cap to conceal conduits or wires 1200. In certain embodiments, wire clip 1206 can be secured beside seam cover or cap 1204 under secondary cover 1202 to further secure or hold PV conduits, cables, or wires 1200. Wires 1200 can electrically connect with electrical outlets or other such connections (not shown) of PV modules 1201 to interconnect solar panels together as a PV system. Secondary cover 1202, similar to seam covers or caps 1204, can be configured to connect either or both of non-PV pans and PV pans (along with PV modules, dummy modules, or roof pans, as appropriate) together with a generally uniform appearance.

Wiring Layouts

FIGS. 13A-13M show various examples of portions of wiring systems (e.g., wire management, wire solutions, electrical circuits, configurations, connections, routes, conduits, or pathways) for electrically coupling or connecting PV modules 1301 of PV module-pan assemblies 1360 (e.g., column to column, in a column, in East-West or North-South directions) as part of BIPV system 1300 according to various embodiments. As noted above, one or more channels or pathways can be tunneled or cut through portions of insulation or insulation layers to run PV wires. In various embodiments, micro-inverters, DC optimizers, or other module-level electronics can optionally be electrically connected to one or more of PV modules 1301 as part of overall array and BIPV system 1300.

Figure 13A:
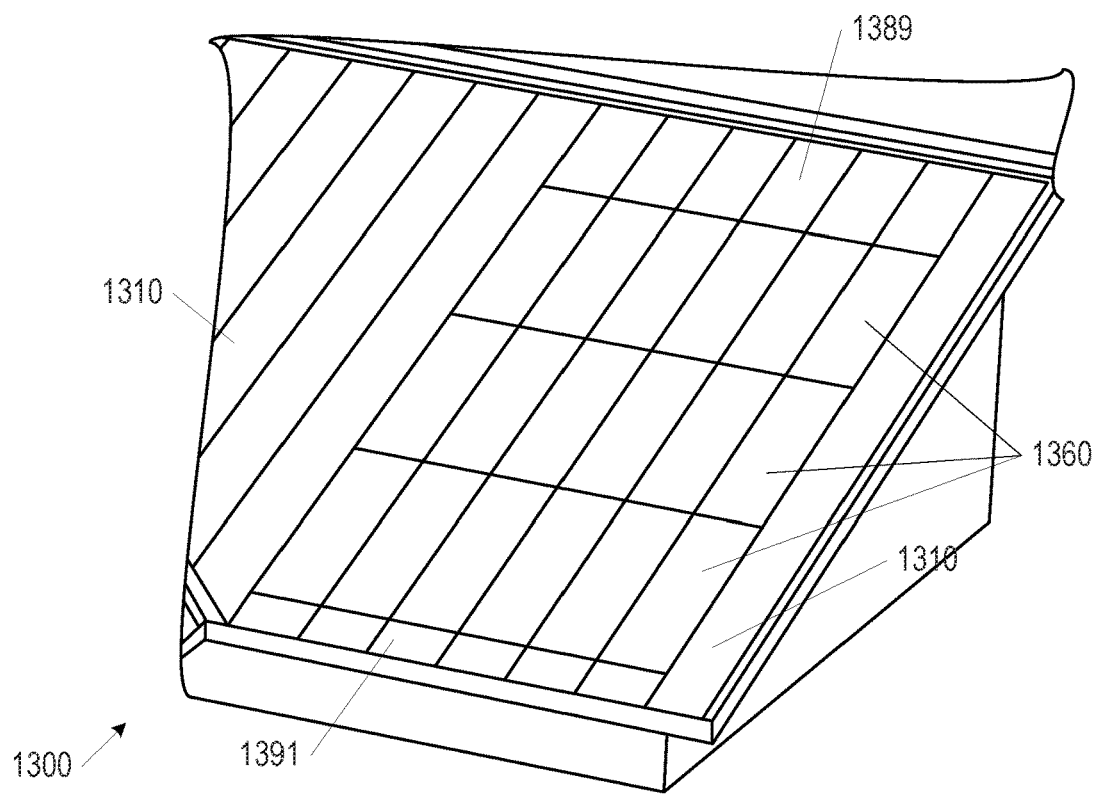
Figure 13B:
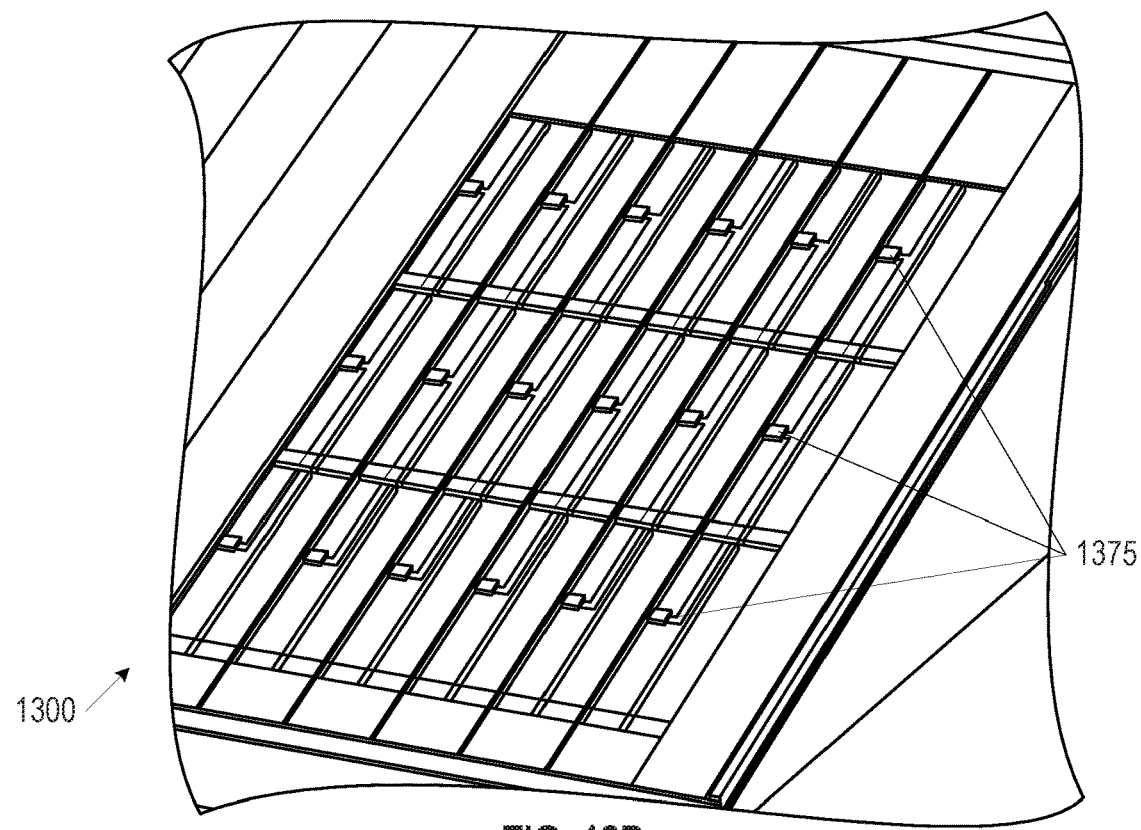

As shown in FIGS. 13A-13C, BIPV system 1300 can include columns and rows of PV module-pan assemblies 1360, upper transition pans 1389, (e.g., up-roof) and lower transition pans 1391 (e.g., down-roof), and non-PV or roof pans 1310. FIG. 13B shows a portion of BIPV system 1300 with PV modules removed for clarity, showing that columns of PV modules of a PV array can be serially connected by electrically connecting ("stringing up and down") the columns from one junction box 1375 to next junction box 1375. Respective columns can be connected by running wire under either or both of upper transition pans 1389 or lower transition pans 1391, or under lapped portions of PV module-pan assemblies 1360.

Figure 13F:
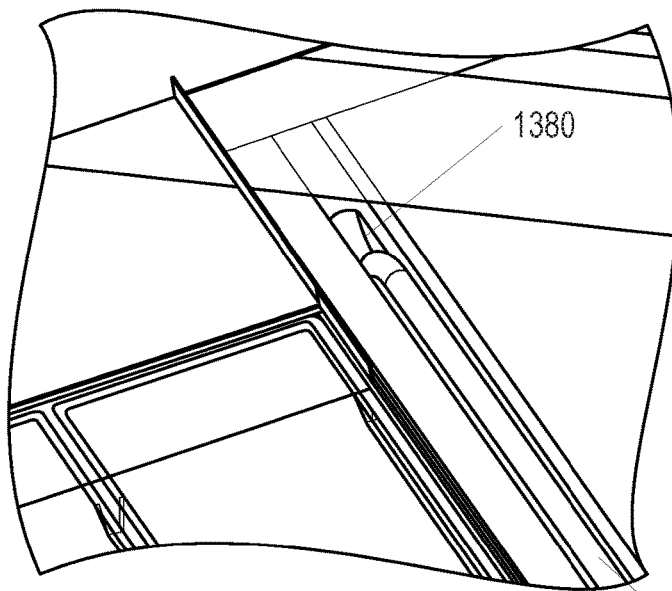
Figure 13G:
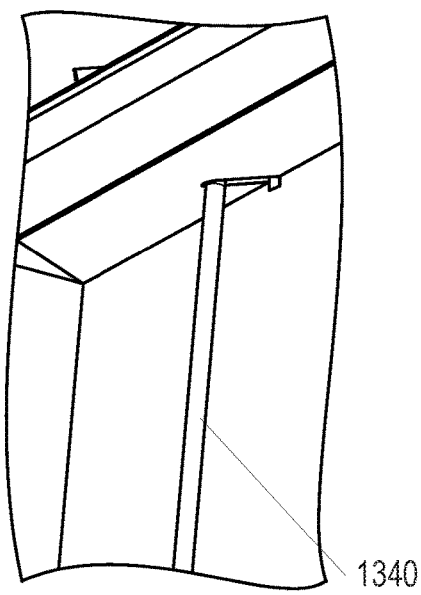
Figure 13H:
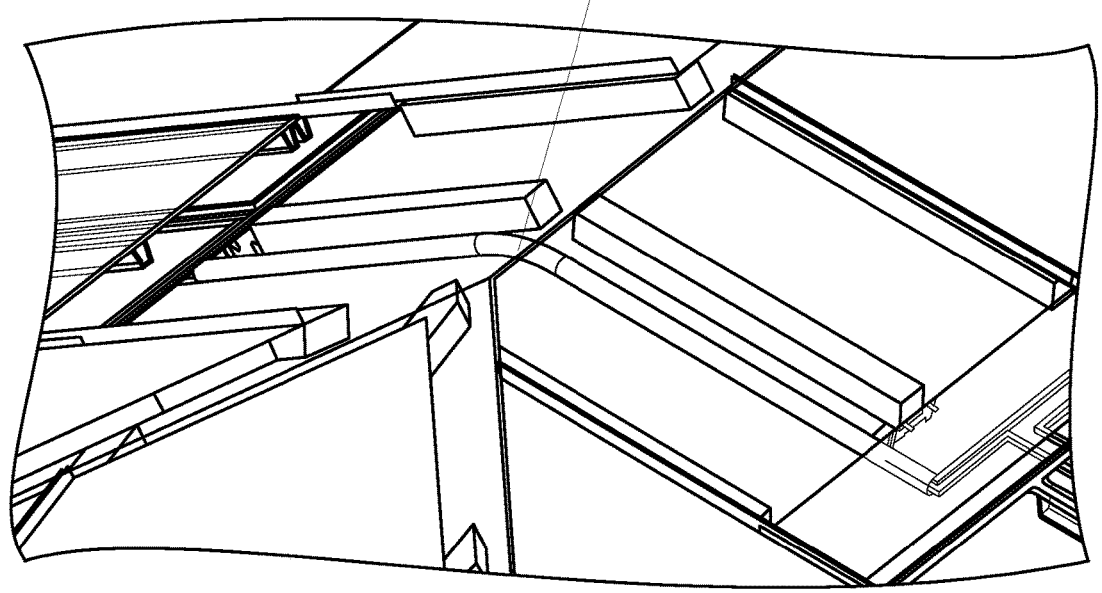

Various wiring arrangements are possible for any given array in BIPV system 1300. FIG. 13C shows an example of column-to-column stringing within BIPV system 1300 array (e.g., under lapped portions of PV module pan assemblies 1360A and 1360B). FIG. 13D shows column-to-column stringing at top of array (e.g., under up-roof transition pans 1389, here semi-transparent, above array columns). Further, the transition from conduit 1340 to exit the array can be routed through channel 1342 formed in insulation layer under the adjacent column of non-PV pan as shown in FIGS. 13D-13E. Conduit 1340 can then exit out through rake 1344 of roof. In other embodiments, conduit 1340 can be run vertically through to the roof eave and exit through slot or opening 1380 in eave as shown in FIGS. 13F-13G. In certain embodiments, two or more arrays on opposing sides of roof ridge can be connected by having conduit transition at ridge of roof that wires from each of arrays run to as shown in FIG. 13H.

FIG. 13I shows a wiring schematic for exemplary array 1300 in FIG. 13B. In this schematic, junction boxes are strung together along the length of each column and at North-South ends of the array, optionally connected beneath transition pans. FIG. 13J shows an exemplary wiring schematic of array 1300 of PV modules with single junction boxes, stringing all PV modules of array 1300 in series. FIGS. 13K-13M show exemplary wiring schematics for stringing or connecting PV modules having two separate junction boxes (V+ and V−). PV modules of these arrays can be "handed" or polarized as shown. FIG. 13K shows a schematic connecting positive and negative poles of PV modules with alternating short and long electrical connections. FIG. 13L shows connecting positive and negative poles of PV modules with short electrical connections laterally and longitudinally for poles that are relatively proximate to each other in array 1300. FIG. 13M shows connecting positive and negative poles of PV modules with a diagonal electrical connections within each row and short connections between rows of array 1300 to connect all PV modules in series. Thus, junction boxes can be positioned accordingly such that internal PV wires run to positive and negative junction boxes at terminal ends of each. Such arrangement of junction boxes can reduce internal and external resistance and the amount of copper wiring or bussing required for each PV module and for connecting PV modules in array 1300. Accordingly, such arrangement can also lower manufacturing cost, installation costs, or improve efficiency. All of the wiring schematics considered may further include a home run to connect array 1300 to a respective electrical grid (e.g., the customer's main electric panel).

FIGS. 14A-14D show other wiring solutions or pathways that can incorporate structural accommodations in support pans as part of PV pan-module assemblies 1460. For example, holes or other openings 1400 can be made in seams 1414 or other pan portions of PV module-pan assemblies 1460 such that wiring 1403 can be routed from column to column via such openings 1400. Grommet seals 1402 (shown here as exploded from opening 1400) can be positioned into openings around wires to seal opening 1400 after routing.

Figure 14A:
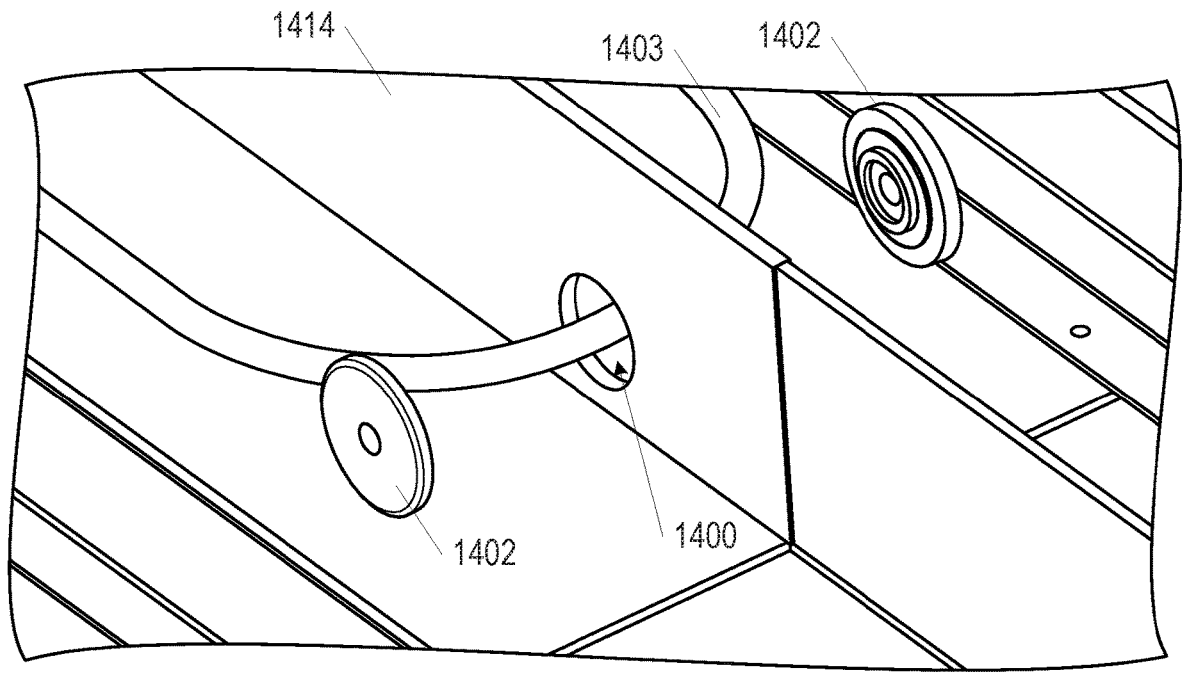
Figure 14B:
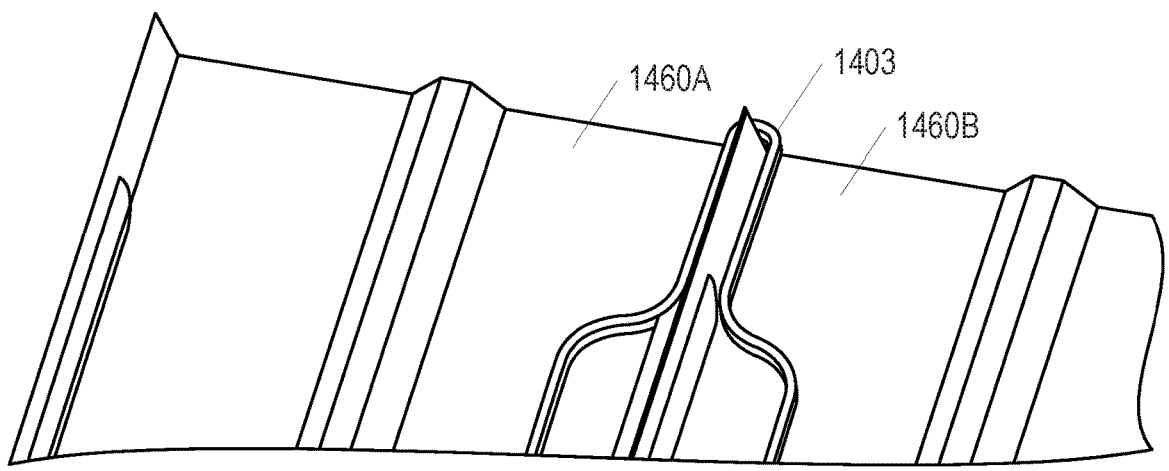
Figure 14C:
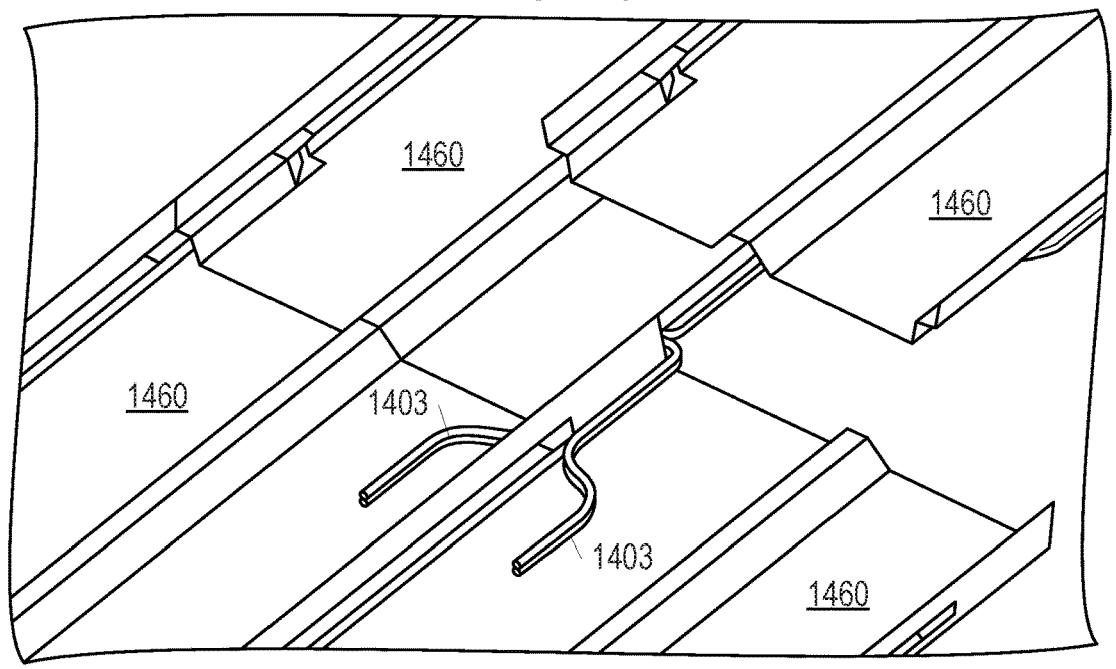
Figure 14D:
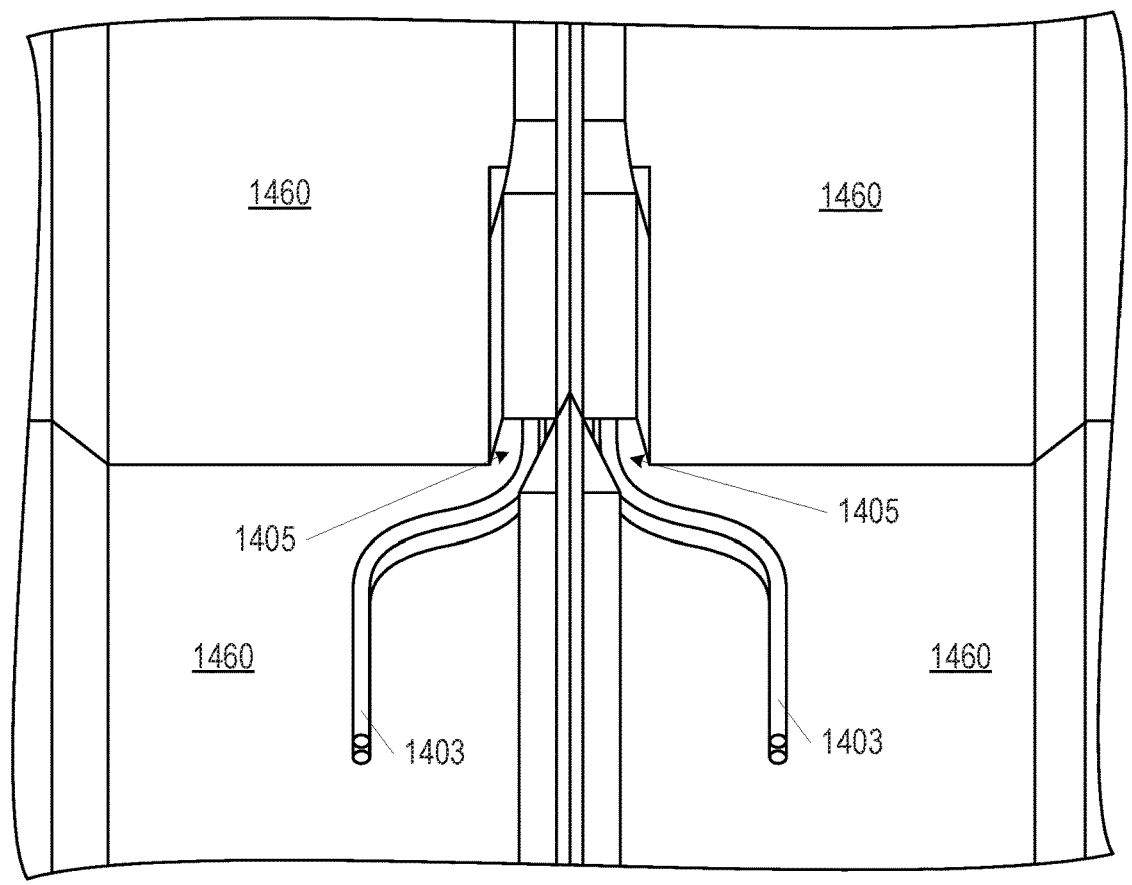

In some embodiments, particularly in configurations as seen above in FIGS. 3A-3C and 4A-4D, wires can be passed or routed column to column around end portions of overlapped portions of PV pans in column. For example, as shown in FIGS. 14B-14D, wires 1403 can be wrapped around up-roof seam end portions of two adjacent PV module pan assemblies 1460A, 1460B. As shown, wires 1403 can be understood to be located on the undersides of PV module pan assemblies 1460A, 1460B, or alternatively resting on PV pans of PV module-pan assemblies 1460 positioned to be between an upper surface of PV pans and a lower surface of PV modules connected thereto. Down-roof end portions of each PV module pan can include recessed portions 1405 (e.g., cavities, tunnels channels) that can be spaced over wires 1403 when lapping PV module-pan assemblies 1460 onto each other.

FIG. 14E shows an exploded view and FIG. 14F shows a perspective view of PV module-pan assembly 1460 according to various embodiments. Assembly 1460 includes exemplary PV pan 1420 that holds PV module 1401 (with PV module 1401 being transparent for this illustration). FIG. 14G shows a bottom perspective view of PV pan 1420. In these views, PV pan 1420 is seen with a gap in the lower surface, forming a workspace between the main trough portion of PV pan 1420 and support bar 1429. Moreover, PV pan 1420 does not have a central or middle rail or support leg, providing for more room for electronics or wire management. In the space between the main trough portion of PV pan 1420 and support bar 1429, multiple wiring routes can be laid allowing more room for cables, better air flow, a wide opening for symmetric or asymmetric wiring, and other conveniences in installation. Further, support bar 1429 can be used as a surface for nailing down or securing the edge of PV pan 1420, and the overall shape of PV pan 1420 can be easier to manufacture. PV module 1401 can be any solar cell laminate as considered herein to be a bonded or adhered (e.g. with a sealant bead) to PV pan 1420. In an array of PV pans 1420, wiring/cabling channels can be aligned with support bars 1429 facing each other across rows of PV module-pan assemblies 1460.

Phase Change Material Aspects

Figure 15A:
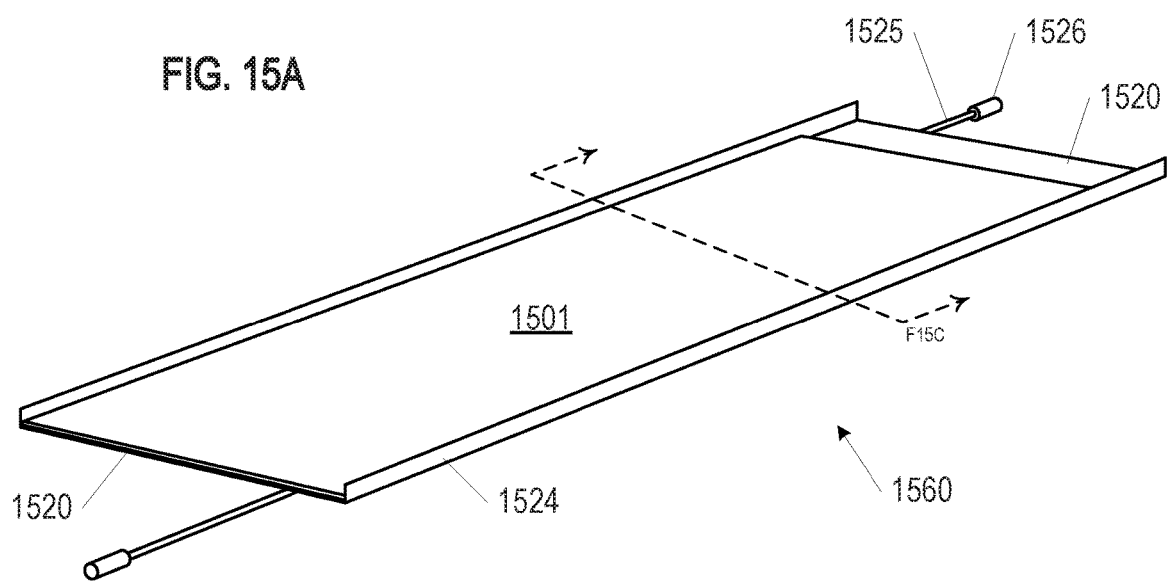
FIGS. 15A-15D show various views of a photovoltaic module pan assembly capable of supporting a heat transfer or phase change material usable with a building integrated photovoltaic system as described herein according to various embodiments of this technology.
Figure 15B:
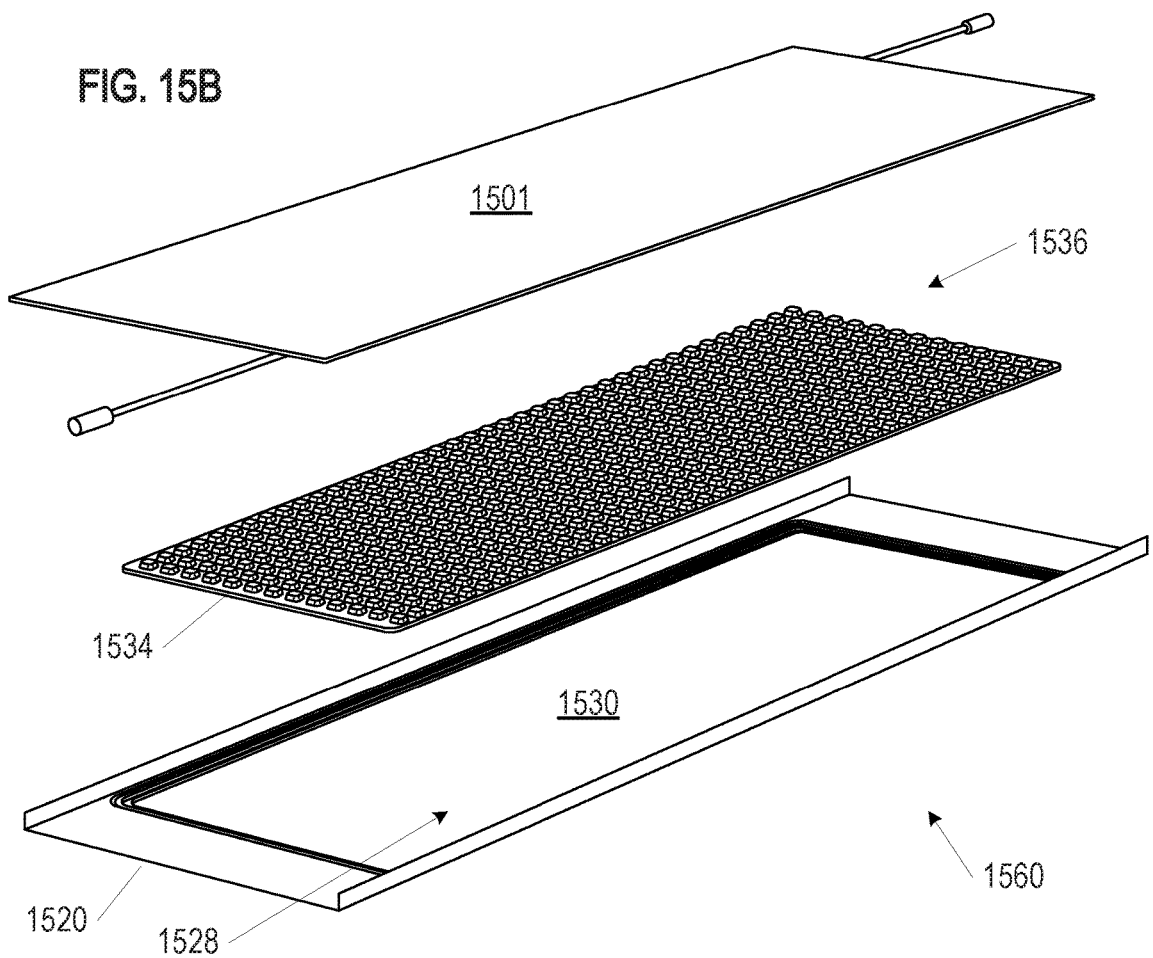

FIGS. 15A-15D are top perspective, exploded, section, and detail views, respectively, of PV module-pan assembly 1560 usable with building integrated PV systems (e.g., system 200) as described herein according to various embodiments. FIG. 15A shows a perspective view of completed PV module-pan assembly 1560 while FIG. 15B shows an exploded view of the same. PV module-pan assembly 1520 includes PV module 1501 bonded to pan 1520. Pan 1520 can include standing seams 1524 on opposing side portions for coupling pans 1520 with other pans (e.g., other PV pans, non-PV pans, roof pans, etc.) as noted above. Standing seams 1524 can be monolithically or separately attached/formed components. Standing seams 1524 can extend perpendicular to planar surface portions of pan 1520, extend at a non-perpendicular angle, and/or be hemmed to round edges. For example, standing seams 1524 can be hemmed inward or medially relative to opposing side portions of the pan. In other embodiments, pans 1520 can include inverted seams.

Referring to FIGS. 15A-15D together, pan 1520 includes first substantially planar surface 1532 (e.g., upper or top surface portion) on which PV module 1501 is mounted. First substantially planar surface 1532 includes opposing substantially planar shoulder portions 1546 that PV module 1501 is positioned or configured to be positioned on. Further, pan 1520 can be bonded to first substantially planar surface 1532 via adhesive 1544 (e.g., strip(s), patch(es), pad(s)) as noted above. Pan 1520 can include recessed portion 1528 (e.g., cavity, lower portion), where recessed portion 1528 includes second substantially planar surface portion 1530 (e.g., lower or bottom surface portion) positioned below or under first substantially planar surface 1532. First substantially planar surface 1532 and second substantively planar surface 1530 can be spaced apart by sidewall portions. While shown as being substantially planar, either of first substantially planar surface 1532 and second substantively planar surface 1530 can also include projections, bumps, or other non-planar features. Further, in some embodiments, pan 1520 does not include second substantively planar surface 1530 portion, such that pan 1520 (and by extension, at least a portion of underside of mounted PV module 1501) can be open to the roof or roof surface on which pan 1520 is mounted.

PV module 1501 can be bonded or otherwise secured to pan 1520 using known techniques. For example, PV module 1501 can be bonded with adhesive 1544 such that a watertight or substantially water-tight seal is provided between PV module 1501 and pan 1520. In certain embodiments, strips or pads of VHB tape or other suitable material of a desired height can be applied to pan 1520 to set a desired height of PV module 1501. Adhesive or sealant 1544 can then be applied, and PV module 1501 can be set on top of the adhesive and VHB tape to bond PV module 1501 to pan 1520 at the desired height.

PV module-pan assembly 1560 can include one or more active or passive cooling or heat transfer features. In certain embodiments, the PV system includes one or more fans configured to provide airflow underneath PV modules 1501. In other embodiments, PV module-pan assemblies 1560 can include one or more heat sink features (e.g., fins), thermoelectric devices (e.g., materials for cooling), and/or layer or sheet of heat storage materials 1534 (e.g., phase change materials), where in many aspects, heat storage materials 1534 have a relatively high heat capacity as compared to other components of a BIPV system.

PV module-pan assemblies 1560 can include one or more electrical components for electrically connecting PV modules 1501 to an overall PV system, and further, for example, to a household electrical system to provide power to the home. The electrical components can include, but are not limited to, wires 1525, junction boxes 1538, and connectors 1526 (e.g., MC4 connectors). Many of these electrical components are located or pass under PV module 1501. Conventional PV electrical components can be rated or certified for eighty-five degrees centigrade (85° C.). In certain areas, due to increased ambient temperatures and/or operation of BIPV systems, the area under PV modules 1501 may approach and or even exceed this temperature. Therefore, improved heat transfer features can reduce the operating temperature to a desired level and result in improved safety and efficiency of PV modules 1501 (e.g., electrical components).

One or more layers or sheets of heat storage material 1534 can be positioned within recess portion 1528 of pans 1520. Heat storage material 1534 can be, for example, a phase change material such as BioPCM™. Such phase change materials can absorb heat and thereby transition between or change phases (e.g., when reaching or exceeding a melting or freezing temperature or boiling point) from a first phase to a second phase (e.g., from solid to liquid, from liquid to gas, from solid to gas) without raising a temperature of the air around the phase change material during the phase change. For example, heat storage material 1534 can absorb heat from operating PV modules 1501, electrical components, and/or the ambient environment temperature. As heat storage material 1534 reaches a characteristic melting or sublimation temperature (e.g., melting peak) as a result of absorbing heat, it undergoes a phase change. When the temperature of heat storage material 1534 is lowered or passively drops past the phase change temperature, the reverse occurs (e.g. solidification, condensation, or deposition). Further, heat from heat storage material 1534 can be released when phase change material returns to the first phase, for example, when a heat source is removed or ambient temperature decreases.

In addition or alternatively, phase change materials can also be wrapped around the electrical components (e.g., wires, cables, connectors, etc.) in place of or in addition to a phase change material layer placed in a pan.

During a phase change, phase change material remains at a steady or near constant temperature as the phase change material transitions between phases until the phase change material completes or substantially completes the phase transition. During the phase change material phase transition, the temperature of the space or air around the phase change material does not substantially raise even as the temperature of the space or air around it continues to absorb heat. The choice of heat storage material 1534 for any given implementation can be optimized based on expected temperatures from ambient environment, electrical components, and/or PV modules 1501. As the temperature of PV modules 1501 or ambient environment is lowered or removed (e.g., when the sun sets, in the evening), phase change material can return or transition back from the second phase to the first phase (e.g., releasing heat into the ambient air or surroundings when ambient temperature and temperature under the PV modules is lower). By returning to the first phase prior to the next day, when the temperature is once again expected to exceed a desired temperature (e.g., of PV modules 1501 or electrical components), phase change material is ready to absorb heat again and undergo the process (phase change) in response to increased heat so the cycle can be repeated.

As an example, during operation certain BIPV systems can result in an increase of up to or about fifty degrees centigrade (50° C.) over ambient (e.g., in areas under PV modules 1501). In certain locations, temperatures can approach about fifty degrees centigrade (50° C.) ambient or above, which can lead to a temperature of about one hundred degrees centigrade (100° C.) under PV modules 1501. As noted above, certain electrical components are generally rated for about eighty-five degrees centigrade (85° C.). Therefore, in this example, temperatures above about thirty-five degrees centigrade (35° C.) ambient can result in potentially reaching or exceeding the temperature rating on certain electrical components (e.g., in an area under PV modules 1501) during certain times of the day.

Generally, phase change material can return to the first phase after transitioning to the second phase (e.g., re-freeze or become solid or liquid again). In order for the phase change material to return to the first phase from the second phase, the material may need to have a characteristic melting or freezing temperature (e.g., from liquid to solid) above an expected evening or night temperature (highest) in a location where BIPV system is installed. For example, if the melting or freezing temperature of the phase change material is below that of the highest expected evening or night temperature, the phase change material may not be able to re-freeze or return to the first phase when ambient temperature exceeds the freezing temperature.

In certain embodiments, it can be desirable to choose a phase change material having a melting or freezing temperature that is closer to a maximum operating temperature of PV modules 1501 and/or electrical components (e.g., about 85° C.) than that of the highest expected ambient evening or night temperature where BIPV system is installed. For example, if the phase change material undergoes a phase change at a temperature of about forty degrees centigrade (40° C.) in a location where the ambient evening temperature is about thirty-five degrees centigrade (35° C.), then the transition from the first phase to the second phase can occur earlier in the day than desired, and consequentially reduce the amount or time of heat protection, relative to choosing a phase change material with a temperature closer to the maximum operating temperature. In other examples, heat storage materials 1534 can have characteristic phase change temperatures (e.g., melting points) from about sixty degrees centigrade (60° C.) to about eighty degrees centigrade (80° C.), from about sixty degrees centigrade (60° C.) to about seventy-five degrees centigrade (75° C.), about sixty degrees centigrade (60° C.) to about seventy degrees centigrade (70° C.), or about sixty-five degrees centigrade (65° C.) to about seventy degrees centigrade (70° C.). Such embodiments of heat storage materials 1534 can provide improved or increased heat transfer. In certain embodiments, the phase change temperatures can be lower or higher depending on the ambient temperature or maximum operating temperatures.

Further, in certain embodiments, the phase change materials can decrease the change in temperature between peak and minimum temperatures (e.g. the delta between expected maximum and minimum temperatures) of PV modules 1501 and electrical components. This can reduce the amount of cycling or maintain a more steady temperature, which in turn can improve reliability of the PV modules and electrical components, as well as increase efficiency.

Figure 15C:
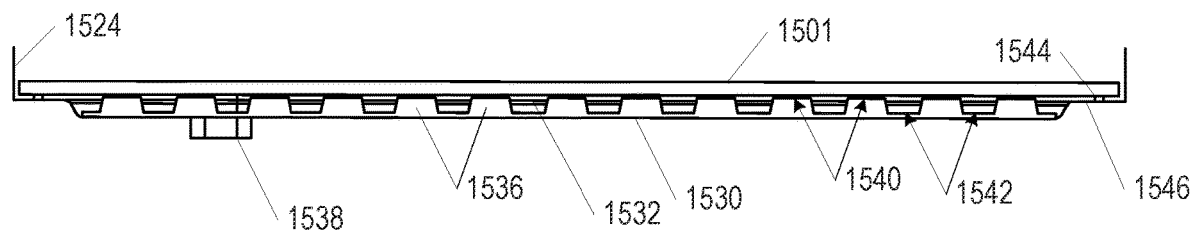
Figure 15D:
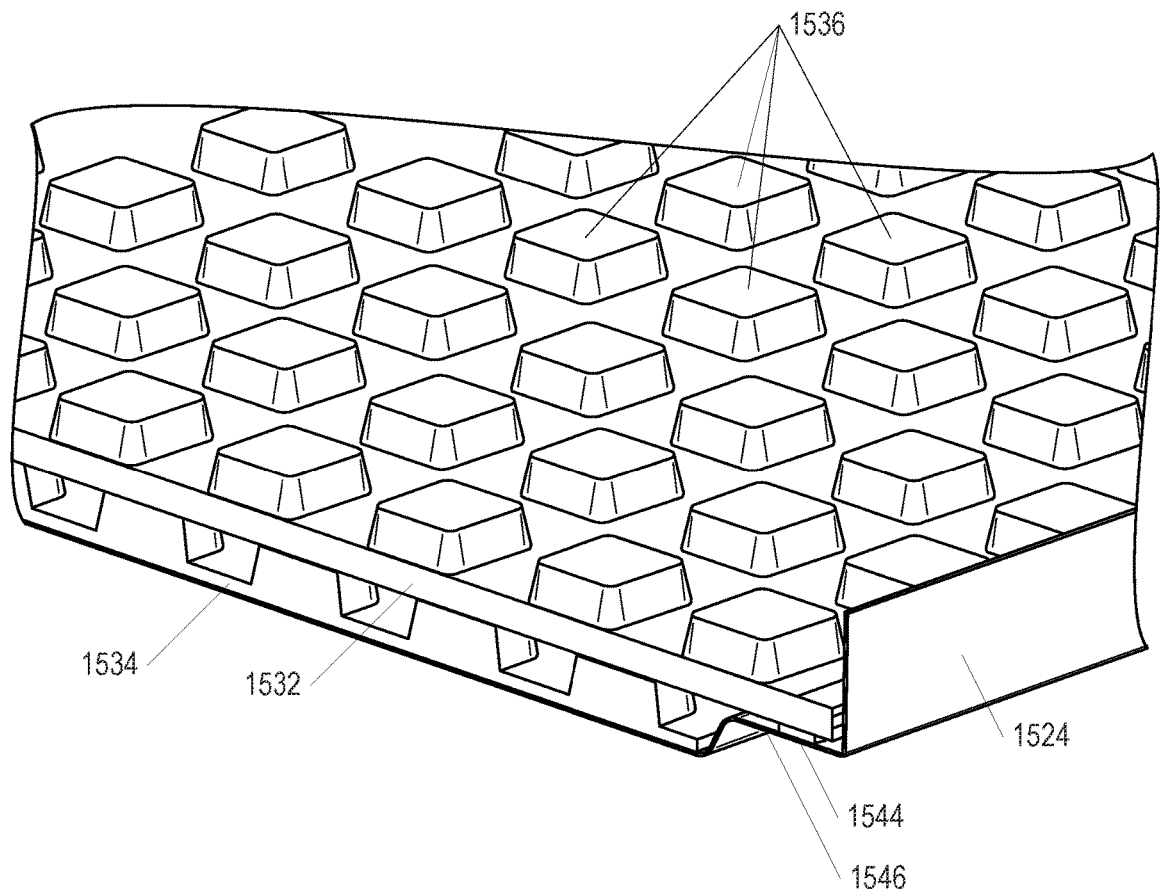

As shown in FIGS. 15B-15D, heat storage material 1534 (e.g., phase change material) can include pockets or pouches 1536 configured to hold the actual phase change material inside. Such pouches 1536 can hold phase change material such that when the material transitions, for example, from a solid to a liquid or liquid to a gas, the material remains contained within. Shown in FIG. 15C (a cross-sectional view taken along the line F15C in FIG. 15A), pouches 1536 can form series of peaks or ridges 1540 (e.g., bumps, projections) and valleys 1542. Such a structure can also provide channels through which air can flow under PV modules 1501 through heat storage material 1534 layer. Junction box 1538 can connect to PV modules 1501 through a hole or cutout region of heat storage material 1534.

In certain embodiments, shown in FIG. 15D, peaks of pouches 1536 can contact or further support PV modules 1501 above pan 1520 or roof surface. In other embodiments, a gap can be provided between underside of PV modules 1501 and layer of heat storage material 1534. In some embodiments, heat storage material 1534 layer can be inverted such that peaks 1536 are positioned against the second surface of pan 1520 or roof surface, and planar surface portion of heat storage material 1534 is oriented towards underside of PV module 1501.

Supplementary PV Array Variations

FIGS. 16A-16I are schematic diagrams showing wiring options for solar cell sections 1600 of a PV module accounting for shading caused by standing seams 1614. With standing seams 1614 extending upward above a substantively uniform plane of a PV module, at various times during the day, as the angle of incident sunlight changes (either or both of altitude and azimuth angles) standing seams 1614 can cast a shadow and shade a portion of solar cell sections 1600. The resulting power loss from a set of solar cell sections 1600 is proportional to the area under shade. Using conventional wiring techniques, when shading occurs even more power can be lost due to the shaded solar cell sections 1600 of a PV module limiting the overall current in the PV module, making the entire PV module less efficient. Accordingly, the manner in which solar cell sections 1600 can be set up to include bypass circuits such that solar cell sections 1600 which become shaded can be shunted or bypassed while under shade and not act as a power sink while shaded. These arrangements of solar cells are referred herein to as shade tolerant.

Figure 16A:
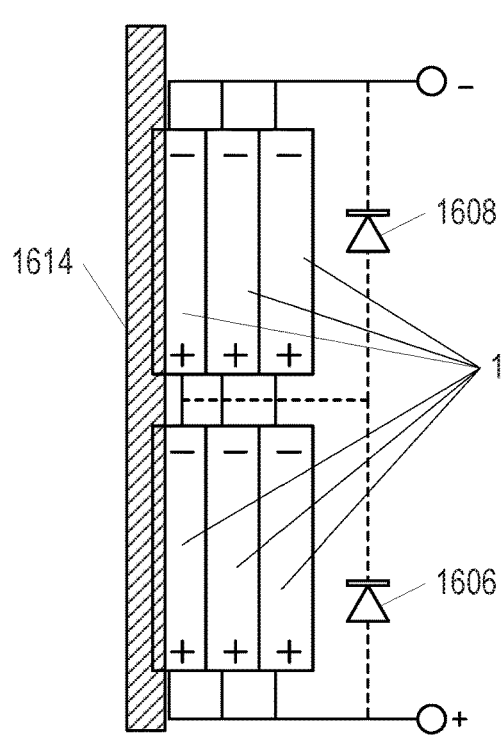
FIGS. 16A-16J are a series of diagrams showing schematic wiring options for solar cell sections of a photovoltaic module accounting for shading caused by standing seams, in accordance with various embodiments of this technology.

FIG. 16A shows a set of six solar cell sections 1600, in two sets of three wired in parallel and in series (referred to as a shingling arrangement), and with standing seam 1614 proximate to one side of the set of solar cell sections 1600. By orienting solar cell sections 1600 as shown, solar cell sections 1600 can be connected in series within one sub-string column and connected in parallel across adjacent sub-string columns. Solar cell sections 1600 closest to standing seam 1614 will tend to receive the most shading from standing seam 1614. When this occurs, first bypass diode 1606 and second bypass diode 1608 allow for bypassing of one or the other of the set of three solar cell sections, depending on which section is shaded. This arrangement can thereby limit loss of current to the shaded area only.

Figure 16B:
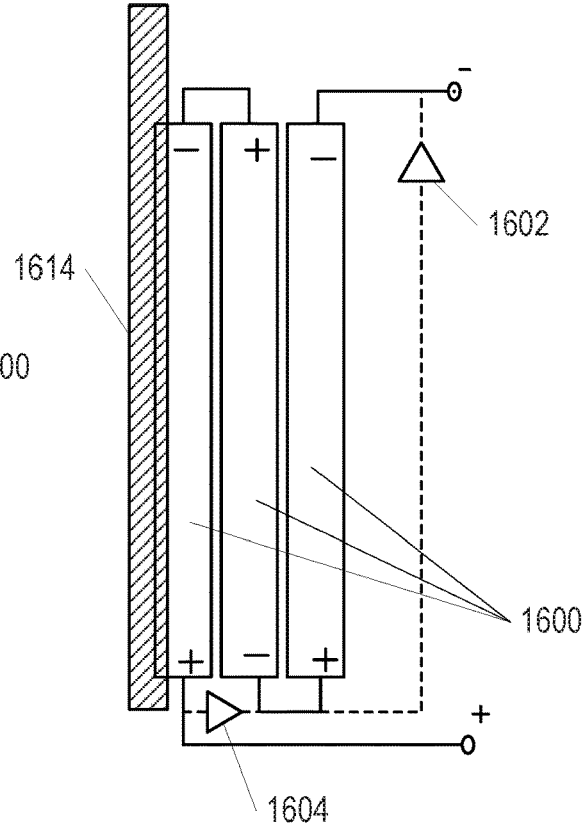

FIG. 16B shows a set of three solar cell sections 1600 wired in series, with panel diode 1602 in line with solar cell sections 1600 connecting to an electrical grid, and with standing seam 1614 proximate one side of the set of solar cell sections 1600. Solar cell section 1600 closest to standing seam 1614 will tend to receive the most of a shade pattern due to shadows cast by standing seam 1614. Bypass diode 1604 is positioned in-line between solar cell sections 1600 proximate to standing seam 1614, and can allow for the bypass of solar cell sections 1600 proximate to standing seam 1614 such that current loss is limited to one-third (⅓) of the power delivered by the overall module.

Figure 16C:
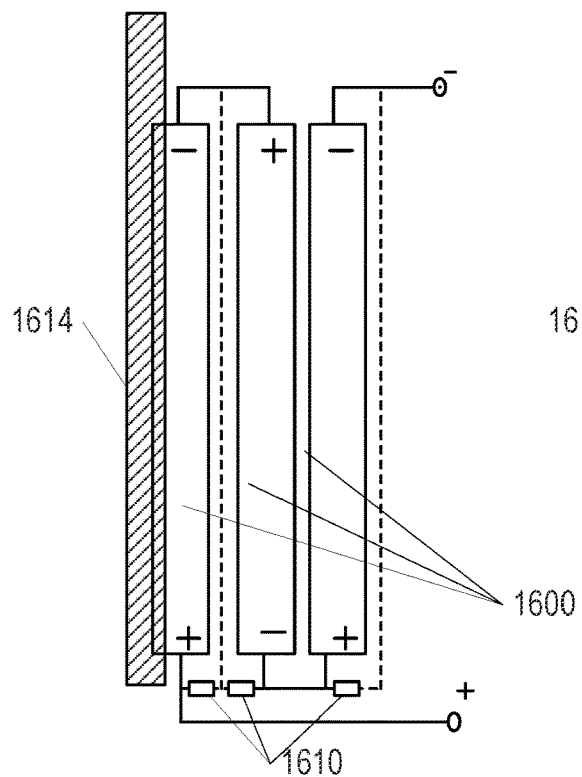
Figure 16D:
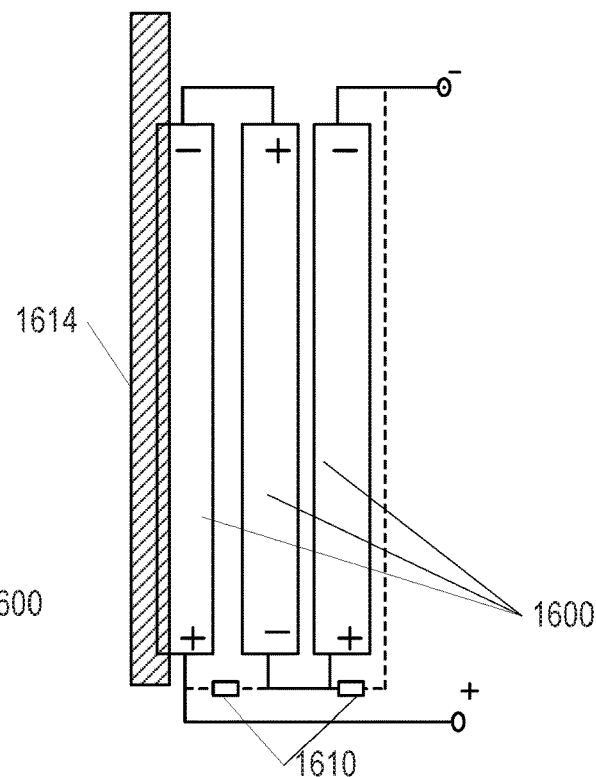

FIG. 16C and FIG. 16D show embodiments and arrangements applying cell string optimizers 1610 within the circuit of solar cell sections 1600. FIG. 16C shows an embodiment with one optimizer 1610 per solar cell sub-string and FIG. 16C shows an embodiment with one optimizer 1610 per every two solar cell sub-strings. Optimizers 1610 can be embedded within a solar panel module, either in a junction box or within the laminate. Optimizers 1610 help to limit the shading loss of shaded solar cell sections 1600 by maximizing performance of each sub-string with maximum power point tracking (MPPT). Optimizers 1610 can minimize or eliminate mismatch loss between sub-strings that are under a shade pattern and sub-strings that are not. In some aspects, a single optimizer can be used with a long solar cell sub-string (e.g. shown in FIG. 16B) or with a short solar cell sub-string (e.g. shown in FIG. 16A), depending on the operating voltage range of optimizer 1610.

Figure 16E:
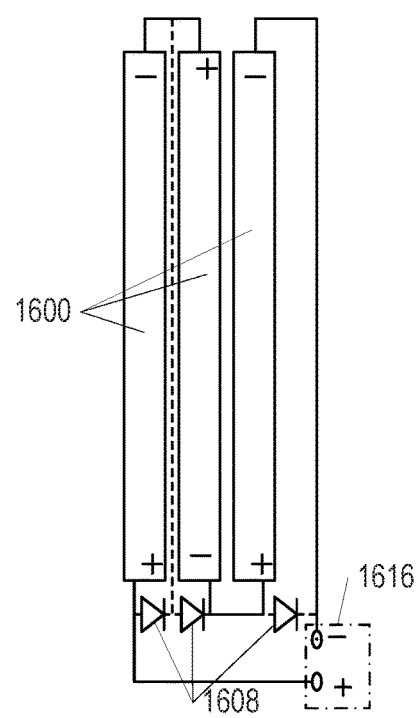
Figure 16F:
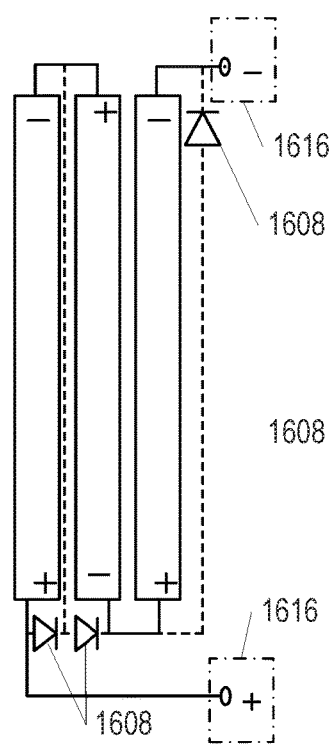
Figure 16G:
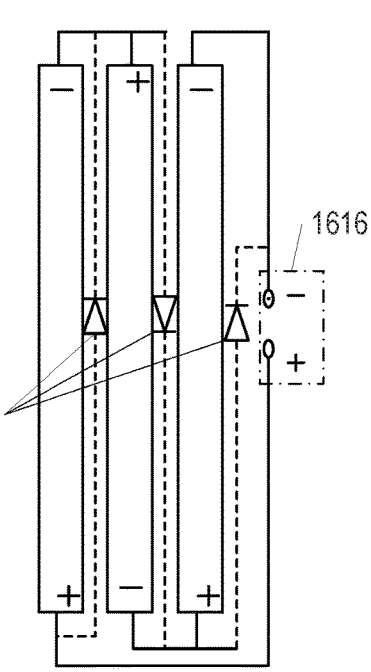

FIGS. 16E, 16F, 16G, 16H, 16I, and 16J show various embodiments of solar cell section 1600 layouts that can mitigate loss due to shading, in situations where shade patterns on one or more sub-strings of solar cell sections 1600 turn on bypass diode(s) 1608. (Standing seams 1614 are not shown in these Figures for clarity.) FIG. 16E shows a three bypass diode 1608 configuration where solar cell sections 1600 (sub-strings) are connected to one junction box 1616 that is positioned close to an end of PV module. FIG. 16F shows a three bypass diode 1608 configuration where solar cell sections 1600 are connected to two junction boxes 1616 (where two diodes 1608 are directed toward one of junction boxes 1616) that are positioned at opposite ends of PV module respectively. FIG. 16G shows a three bypass diode 1608 configuration where solar cell sections 1600 are connected to one junction box 1616, all being positioned proximate to the middle of PV module. This arrangement can be more energy efficient than configurations with two sub-strings per diode installations.

Figure 16H:
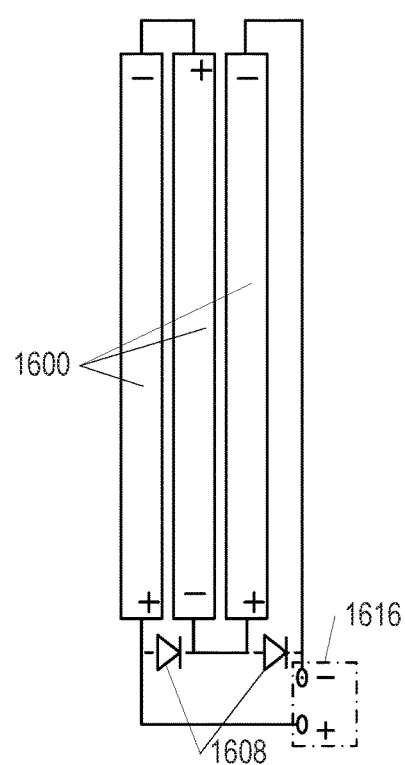
Figure 16I:
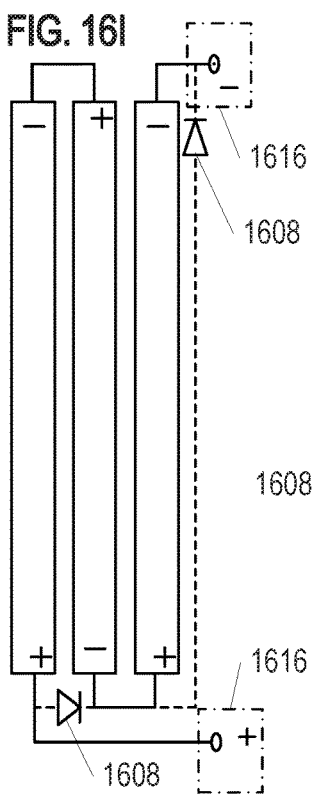
Figure 16J:
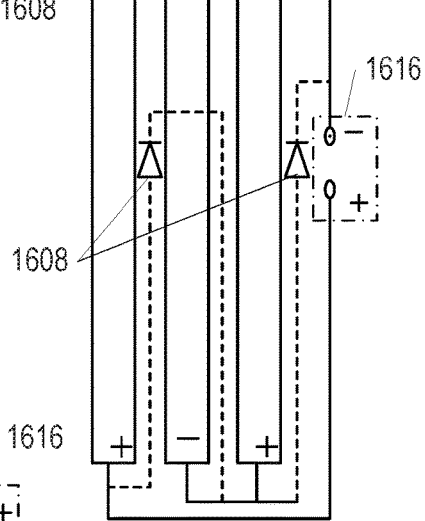

FIG. 16H shows a two bypass diode 1608 configuration where solar cell sections 1600 (sub-strings) are connected to one junction box 1616 that is positioned close to an end of the PV module. FIG. 16I shows a two bypass diode 1608 configuration where solar cell sections 1600 are connected to two junction boxes 1616 positioned at respective opposite ends of the PV module. FIG. 16J shows a two bypass diode 1608 configuration where solar cell sections 1600 are connected to one junction box 1616, all being positioned proximate to the middle of PV module.

Figure 16K:
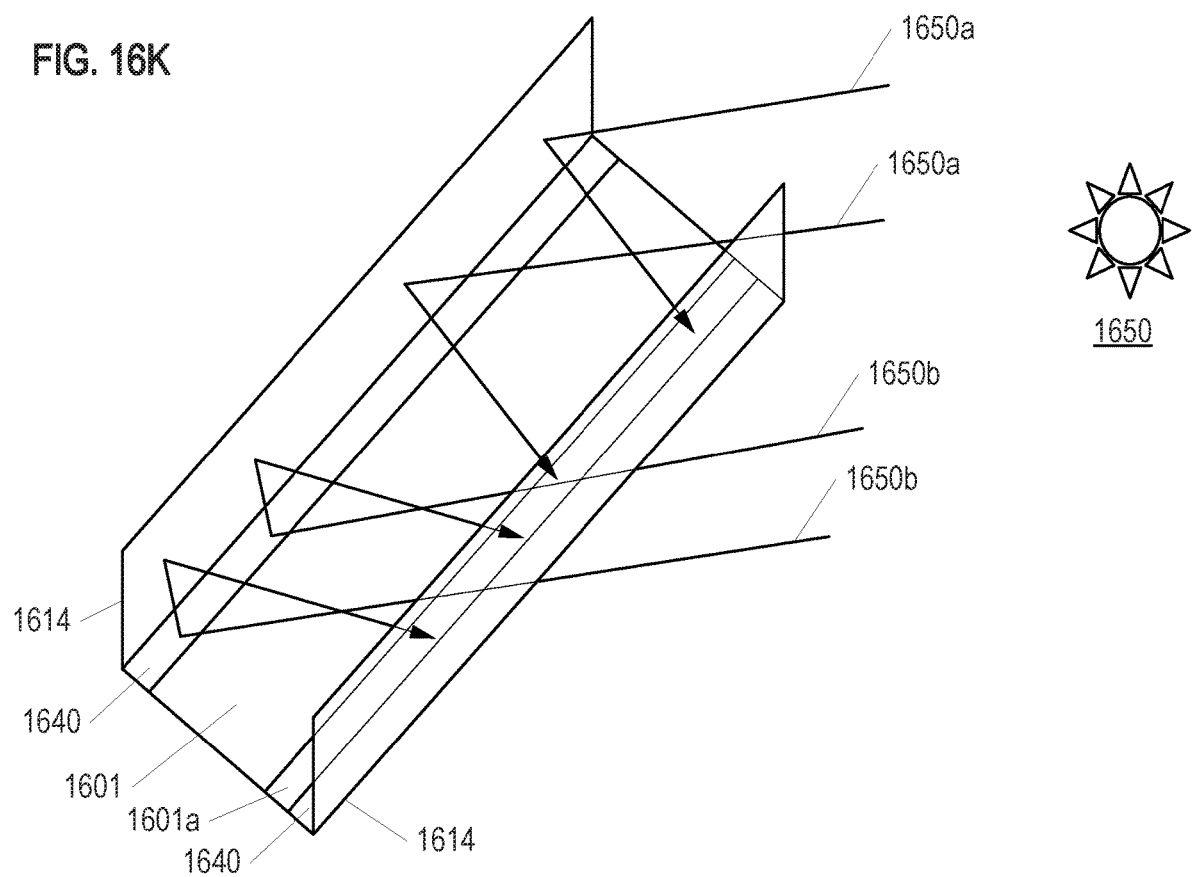
FIG. 16K shows incident solar energy on a photovoltaic panel and standing seam roof panel on the longitudinal sides thereof.

A further embodiment shown in FIG. 16K considers the use of laminated and reflective surfaces on standing seam 1614 in combination with optical texture film 1640 alongside both longitudinal edges of PV module 1601 surface. With sunrays 1650 at a given angle relative to surface of PV module 1601, shade region 1601a is created due to the relative height of standing seam 1614. As shown, the surface of standing seam 1614 can be reflective, due to either a light redirected film and/or texture of the seam, to redirect sun rays 1650a, 1650b to shaded region 1601a of PV module 1601. Specifically, rays 1650a can be directly incident on standing seam 1614 and then reflect or refract off of the surface of standing seam 1614 onto shade region 1601a of PV module 1601. Alternatively or additionally, rays 1650b can be directly incident on optical texture film 1640 and then reflect or redirect onto the surface of standing seam 1614, then further reflecting or refracting onto shaded region 1601a of PV module 1601.

Figure 17:
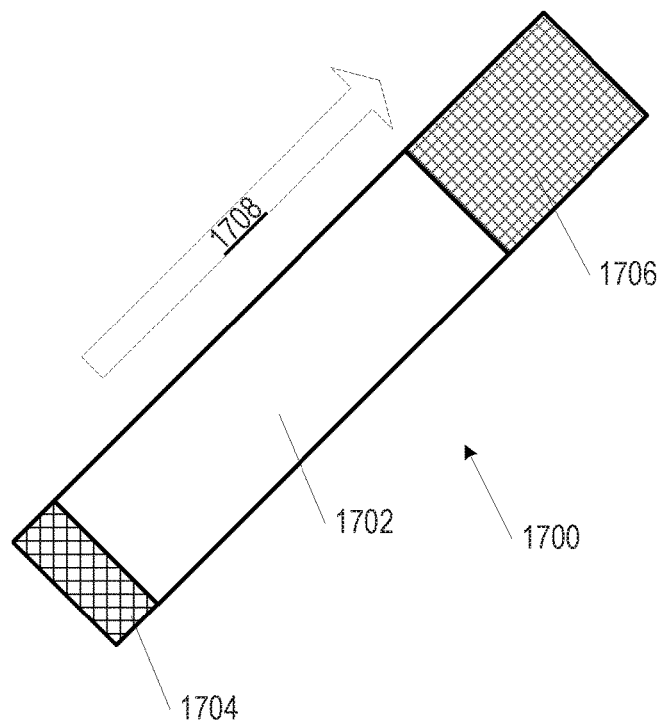
FIG. 17 shows an embodiment of a PV column of a solar panel array, where the PV column is configured to take advantage of convection and related heat transfer, in accordance with various embodiments of this technology.

FIG. 17 shows an embodiment of PV column 1700 of a solar panel array where the PV column is configured to take advantage of convection and related heat transfer. On any given roof or structure, one or more PV panels 1702 are positioned between lower transition pan 1704 and upper transition pan 1706. The surface of lower transition pan 1704 can be coated with a thin film or other material that has a high solar reflectance and a low thermal emittance, which can be referred to as a "cool coating" material. Solar energy incident on lower transition pan 1704 can convert to become about 50% heat reflecting from lower transition pan 1704, or in other words, absorbing about 50% of the heat from incident solar energy. PV panels 1702 have the primary function of converting incident solar energy into electricity, absorbing about 70% of the heat from incident solar energy. The surface of upper transition pan 1706 can be coated with a thin film or other material that has a low solar reflectance and a low thermal emittance, a selective coating similar to or the same as the coating of for a solar thermal collector. Thus, for solar energy incident on upper transition pan 1706, about 90% of the heat from incident solar energy can be absorbed.

The transition along the slope of the surface or roof on which PV column 1700 is installed can thereby create a temperature gradient, hotter toward the bottom and cooler toward the top, such that convective air motion 1708 is increased or supplemented. Convective air motion 1708 can aid in cooling the overall solar panel array of which PV column 1700 is a part of, as well as an underlying roofing surface.

Figure 18:
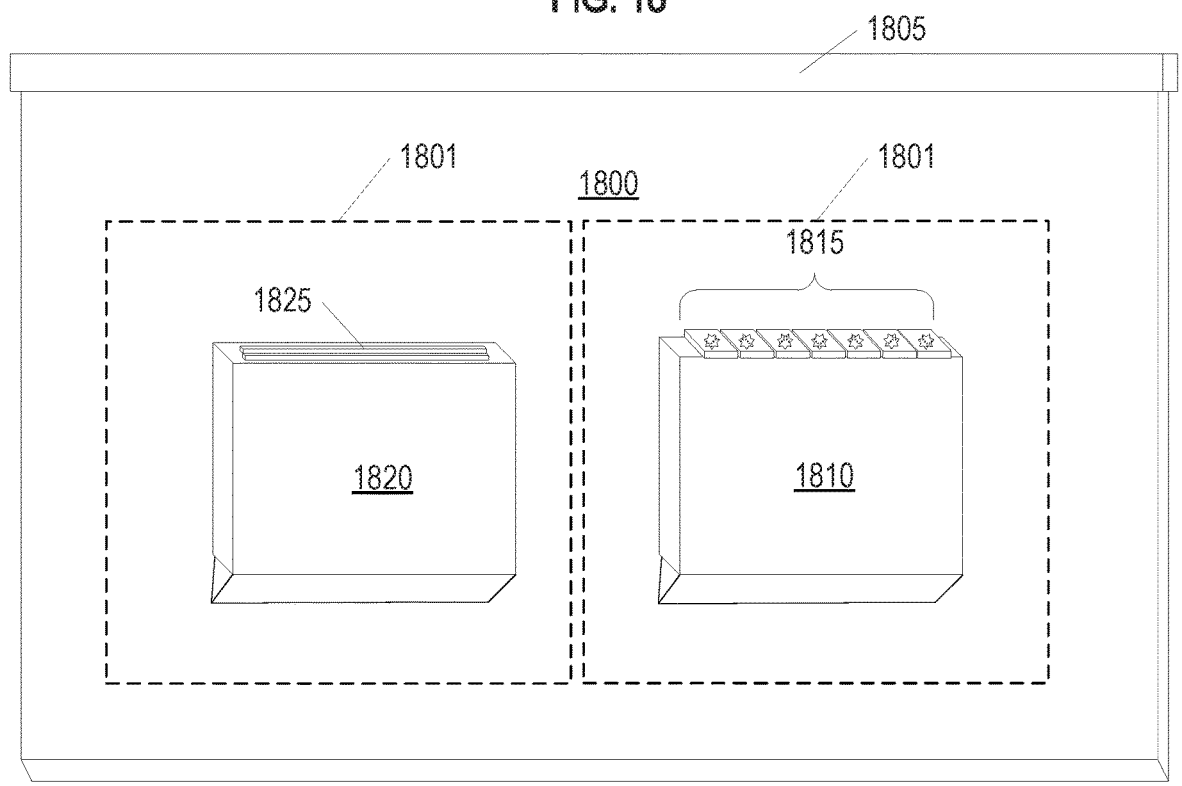
FIG. 18 shows a schematic representation of vent modules, in accordance with various embodiments of this technology.

FIG. 18 shows a schematic representation of a pair of vent modules according to embodiments. Two vent modules are shown in FIG. 18, active vent module 1810 and passive vent module 1820. Both versions are configured to draw air from underneath PV modules 1801 of a BIPV system without penetrating underlying roof 1800 or ventilating an attic beneath roof 1800. Either embodiment of the vent can be positioned at, along, or under top rows of roofing structures (e.g. underneath PV modules 1801) proximate to ridge 1805 of roof 1800 such that the air drawn by either active vent module 1810 or passive vent module 1820 exits underlying roof 1800 structure before reaching ridge 1805. Active vent module 1810 can include fans 1815 installed along its width to draw air into and through active vent module 1810. Passive vent module 1820 can include vent slots 1825, which can be either horizontal or vertical slots along width of passive vent module 1820.

In further aspects, either active vent module 1810 or passive vent module 1820 can be positioned toward the bottom or eave of roof 1800, to provide for an air inlet. Accordingly, air can be drawn into a space underlying PV modules 1801 by active vent modules 1810 or passive vent modules 1820 at bottom of roof 1800, generally cooling PV modules 1801. Similarly, heated or ambient hot air can egress through active vent modules 1810 or passive vent modules 1820 proximate to top of roof 1800, similarly cooling PV modules 1801.

Built-In/Re-Roofing BIPV Embodiment

As discussed herein, PV modules and assemblies of PV modules and supporting structural pans for PV modules can be integrated so that they make up the main surface of a roof. By having the PV modules be part of the roof, advantages can be obtained in comparison to more traditional "on-roof" arrays that are slightly elevated from the surface of a roof. For example, modules and assemblies that are built-into the framing structure of a roof can be lighter than on-roof installations, at least because the built-in BIPV solar array does not require a second structure above an existing roof. Further, a roof that is being replaced in a re-roofing installation can replace roof pans or tiles with BIPV modules or assemblies, which can be more efficient in reducing the amount of materials needed for a re-roofing installation. Also, electrical connections, junction boxes, and wiring can be generally housed underneath PV modules of BIPV assemblies, optionally within spaces of a supporting structural pan, protecting such components from precipitation, wind, and excess heat, and further hiding such components from an observer so as to make the overall BIPV system visually attractive or uniform.

Figure 19:
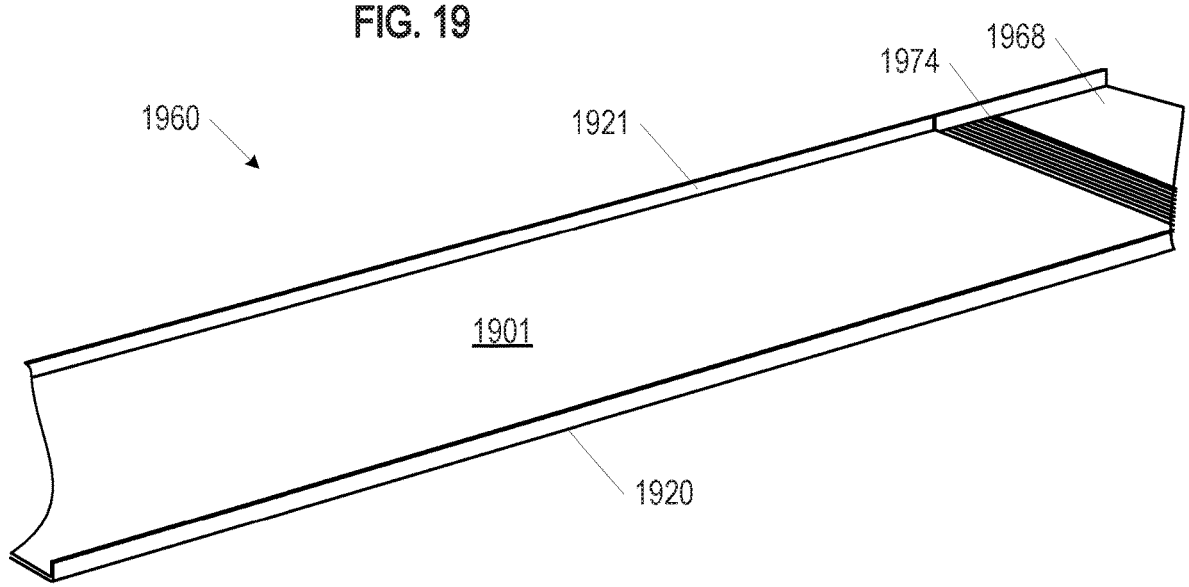
FIG. 19 shows a perspective view of PV module pan assembly with stand-off features usable with BIPV systems, in accordance with certain embodiments of this technology.

FIG. 19 is a perspective view of PV module pan assembly 1960 usable with BIPV systems (e.g., system 200, system 1000) as described herein according to various embodiments of the present technology. Similar to PV module-pan assemblies described herein, PV module pan assembly 1960 includes PV module 1901 bonded to pan 1920. Pan 1920 includes standing seams 1921 for forming interlocked seams with other PV module-pan assemblies 1960 or non-PV roof pans in the same column and in adjacent columns. Pans 1920 and non-PV pans can be overlapped in the same column as described above with respect to PV module-pan assembly 1960. Pan 1920 can also include grooves 1974 on exposed edge portion 1968 to prevent or reduce capillary action (e.g., water from running up-roof at the overlap) at the interface or contact surfaces of the overlapped portions of the PV module assemblies.

Figure 20A:
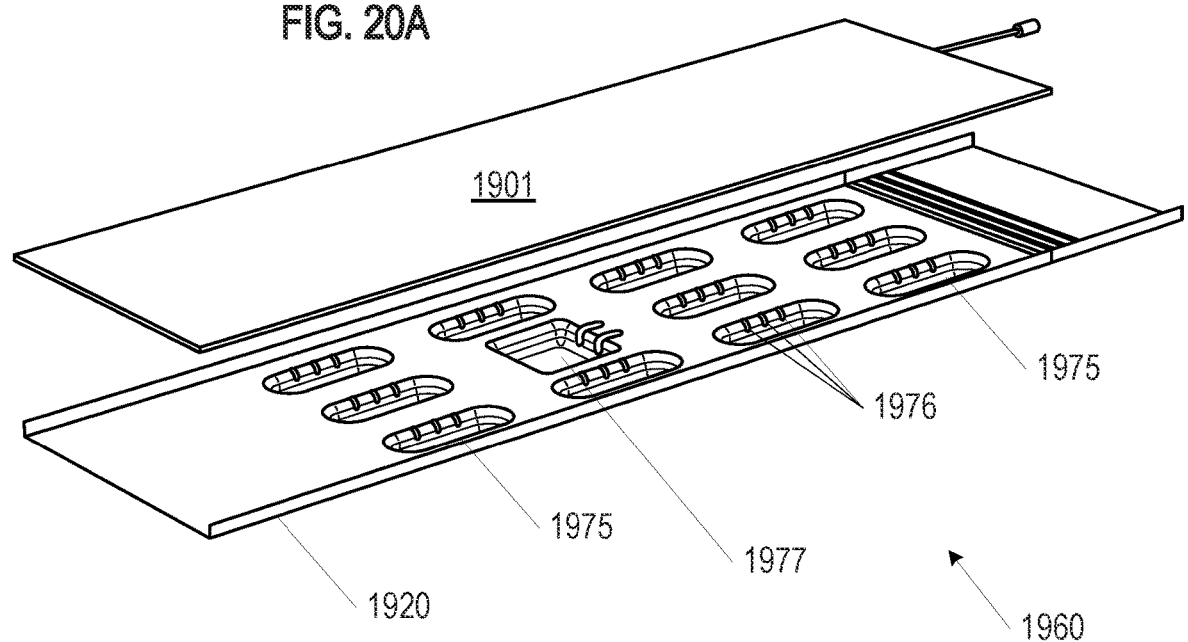
FIGS. 20A and 20B show partial exploded perspective views of PV module pan assembly with stand-off features usable with building integrated photovoltaic systems, in accordance with certain embodiments of this technology.
Figure 20B:
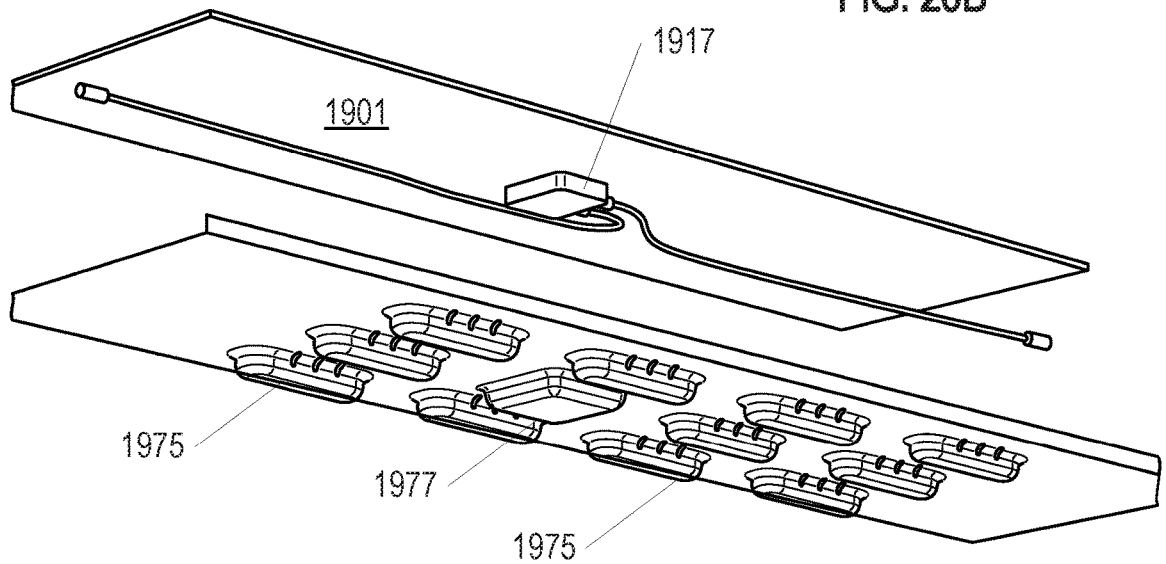

As shown in the exploded views of FIGS. 20A and 20B, pan 1920 includes a plurality of stamped standoff features 1975 (e.g., bumps, offsets, dents, wells, etc.). Standoff features 1975 can elevate or provide a height offset of the PV modules above a roof surface when PV module-pan assembly 1960 is installed. Standoff features 1975 can be stamped, punched, or otherwise monolithically formed from pan 1920. In other embodiments, standoff features 1975 can be formed separately from the rest of pan 1920 and secured with suitable fasteners or adhesive. Standoff features 1975 can create additional surface area for heat dissipation, ventilation channels between the underside of the pan and the roof surface through and around the features, and help provided rigidity to PV module pan assembly 1960. In further aspects, standoff features 1975 can provide spaces for the storage or arrangement of phase change materials that can have a heat storage capacity. While standoff features 1975 are shown as bumps as extending downward away from PV module 1901, in other embodiments, such bumps can extend upward toward PV module 1901 such that PV modules 1901 sit on convex portions of standoff features 1975—for example, pan 1920 can be inverted.

As further shown, standoff features 1975 can include plurality of holes 1976 (e.g., openings, apertures) through side or perimeter walls to allow further airflow under module 1901. Pan 1920 may also include well 1977. Well 1977 can be stamped or otherwise formed in pan 1920 to house or accommodate junction box 1917 connected to PV module 1901. Well 1977 can help protect junction box 1917 from physical damage as well as prevent or reduce fire intrusion. For example, pan 1920 can be pre-installed to PV module 1901 prior to installing PV module-pan assembly 1960 to a roof surface. Well 1977 can protect junction box 1917 from damage during shipping or installation. Two wells can be provided when two (2) junction boxes are required or used. Well 1977 and standoff features 1975 can be rounded or curved to help reduce wire abrasion. As described above, standoff features 1975 can be spaced apart to form channels or gaps there between. Such channels can allow for airflow and wires of overall system to run in multiple directions (e.g., across the width or length) under PV module-pan assembly 1960.

Figure 21:
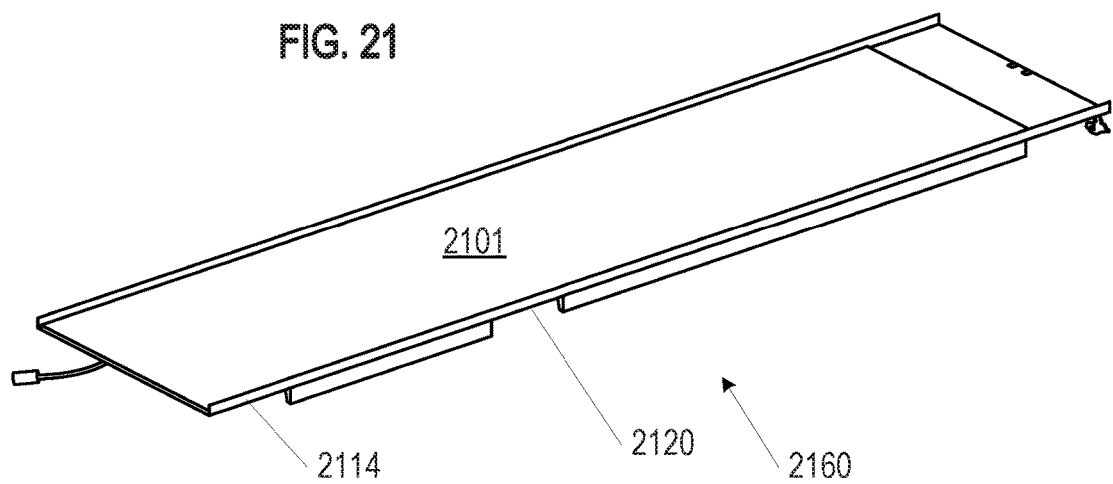
FIGS. 21-23 show top perspective, bottom perspective, and exploded views respectively, of another PV module pan assembly usable with PV systems, with FIGS. 24 and 25 showing detail views thereof, according to other various embodiments of this technology.
Figure 22:
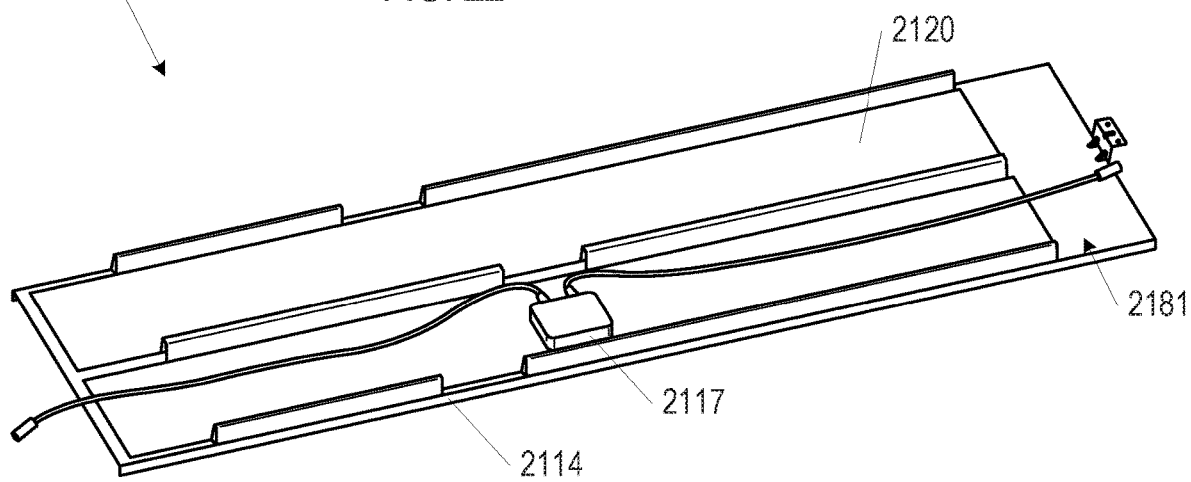
Figure 23:
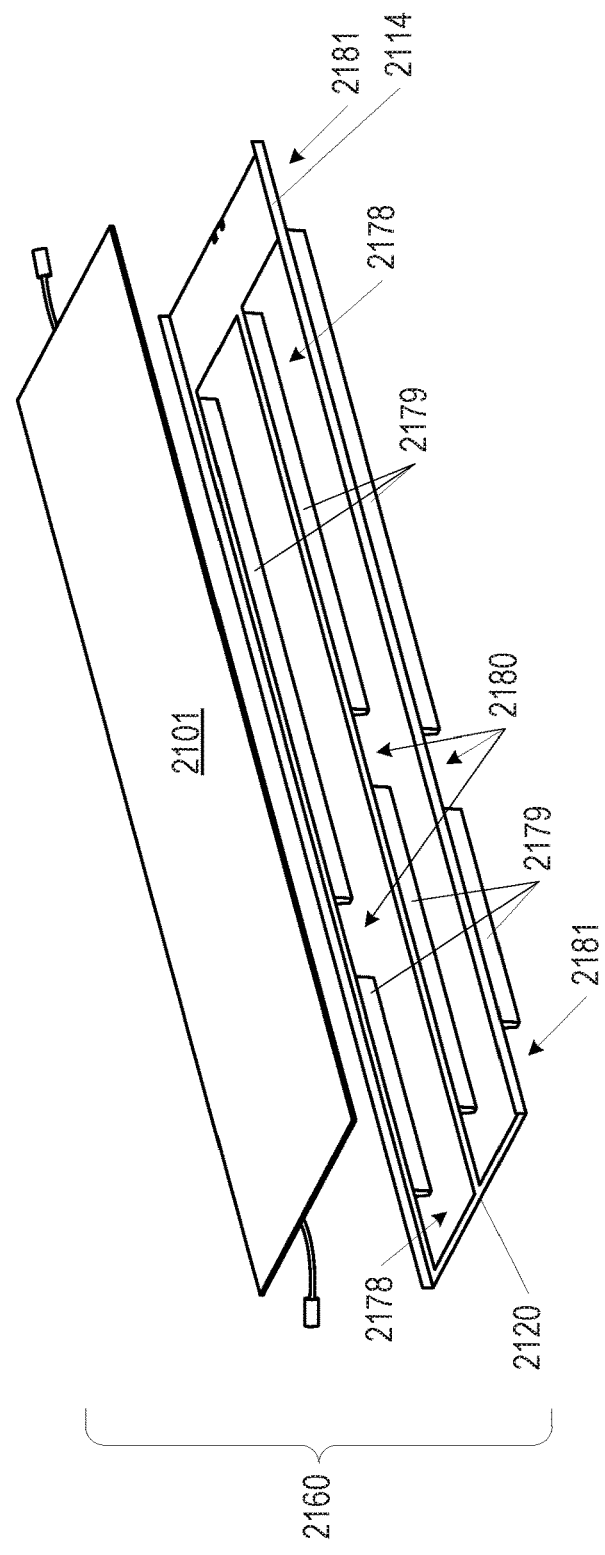

FIGS. 21-23 are top perspective, bottom perspective, and exploded views, respectively, of another PV module pan assembly 2160 usable with building integrated PV systems (e.g., system 1900) as described herein according to other various embodiments of the present technology. Similar to PV module pan assemblies 560 and 1960, module pan assembly 2160 includes PV module 2101 bonded to PV pan 2120. PV pan 2120 includes standing seams 2114 on opposing sides for coupling PV pans 2120 with other non-PV pans and/or PV pans as described above. Further, PV pan-module assembly 2160 can be provided with overhang and exposed edge portions and installed to overlap other PV pan-module assemblies as described above. PV pan-module assembly 2160 can include one or more of the same or similar features, for example, grooves to prevent capillary action.

In some embodiments, PV pan 2120 may include windows or openings 2178 that can be punched-out of the main body surface of PV pan 2120 during or after manufacture. Openings 2178 can allow for heat dissipation between PV modules 2101 and the roof surface on which PV pan 2120 is mounted. In certain embodiments, material punched-out or otherwise removed from surface of PV pan 2120 can be formed (e.g., bent, rolled, folded), for example, into three rows of leg support portions 2179 (e.g., ribs, supports, braces), such that two openings 2178 are formed between leg support portions 2179. Leg support portions 2179 can extend lengthwise along a longitudinal axis of PV module-pan assembly 2160. In other embodiments, leg portions can extend transverse to a longitudinal axis of PV module-pan assembly 2160 in place of, or in addition to, other lengthwise leg portions. Leg support portions 2179 can support and offset PV module 2101 from the roof surface. Leg support portions 2179 can be hemmed or otherwise rounded to reduce potential for wire abrasion. Segments of leg support portions 2179 can be removed, or leg support portions 2179 can be discontinuous, such that passageways 2180 can be formed to allow wires to pass across width-wise or side-to-side underneath PV module-pan assemblies 2160, in addition to running in a direction parallel to leg support portions. As shown in FIG. 28, leg support portions 2179 can include a middle leg and two opposing side legs. In other embodiments, a greater or lesser number of openings 2178 and/or leg support portions 2179 can be formed. In further embodiments, openings 2178 and/or leg support portions 2179 can be located in different positions of PV pan 2120.

While PV pan 2120 is shown as having passageways 2180 along the length of leg support portions 2179 and forming discontinuous leg support portions, in other embodiments, leg support portions 2179 can be substantially continuous. In such embodiments, wires can still pass side-to-side through passageways 2181 proximate the edge portions (e.g., under the ledge or exposed/overlapping portions) of PV module pan assembly 2160. For example, the wires from j-box 2117 shown in FIG. 22 can be run underneath edge portions of PV module-pan assembly 2160 in a side-to-side direction while j-box 2117 can extend through one of openings 2178. In this manner, j-box 2117 is offset from the center or mid-line of PV module-pan assembly 2160. However, in other embodiments, a different pattern or number of openings 2178 can be open and leg support portions 2179 formed, providing for different j-box 2117 positions as desired.

Figure 24:
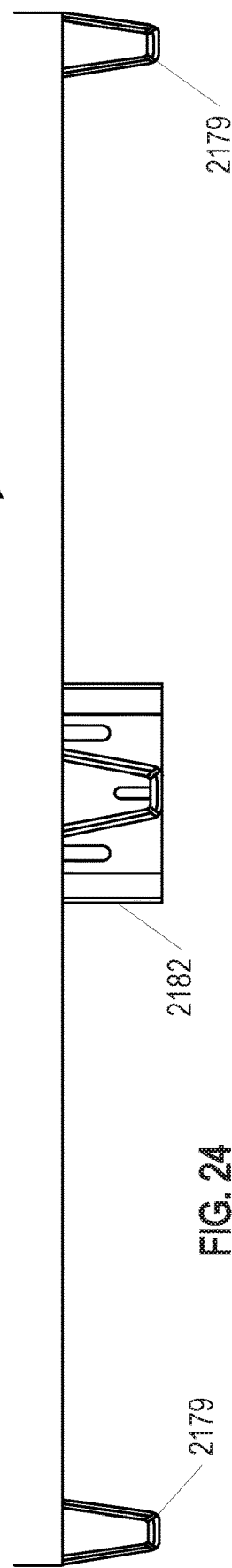
Figure 28B:
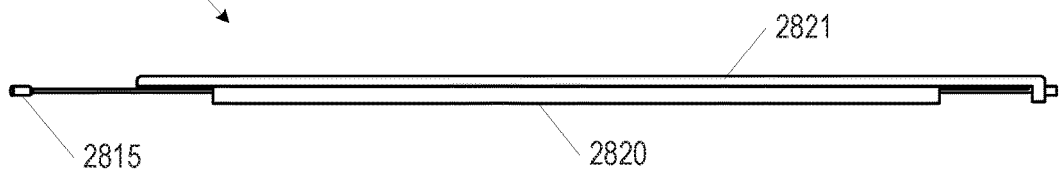
Figure 28C:
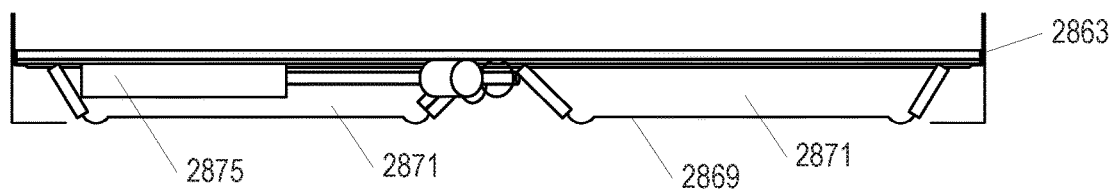
Figure 28D:
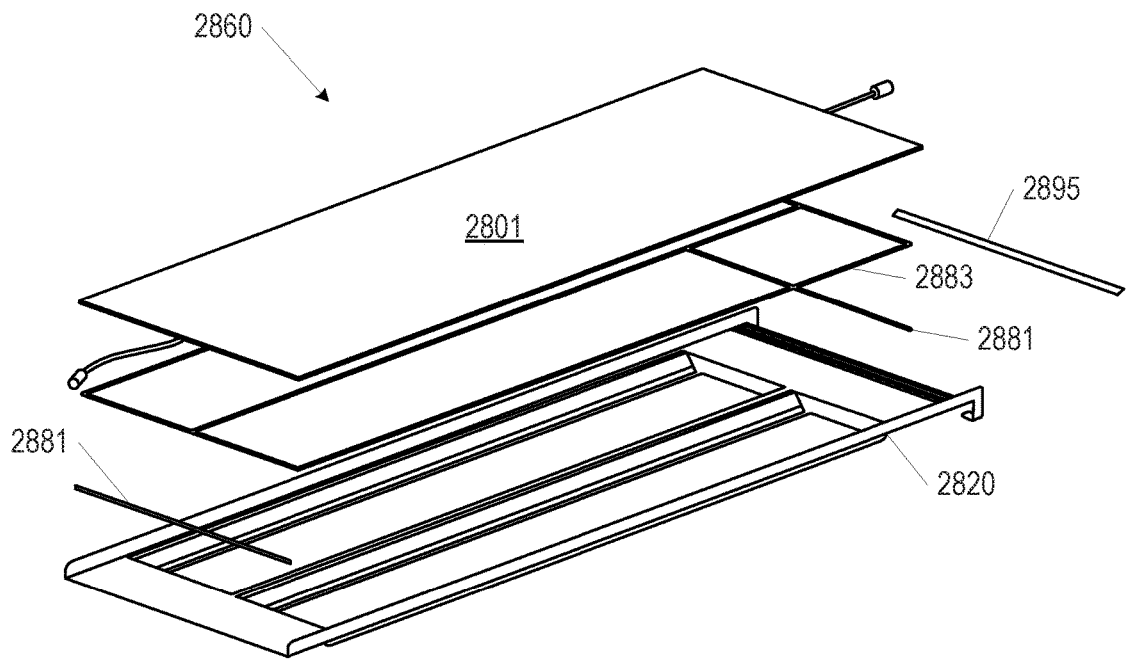
Figure 28E:
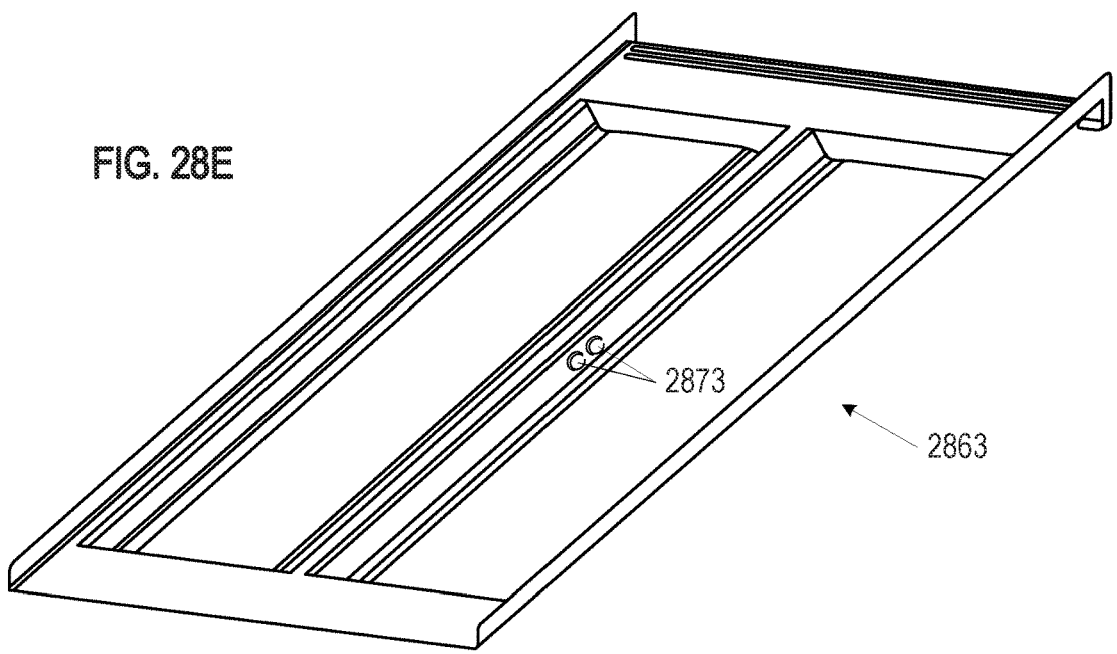
Figure 28F:
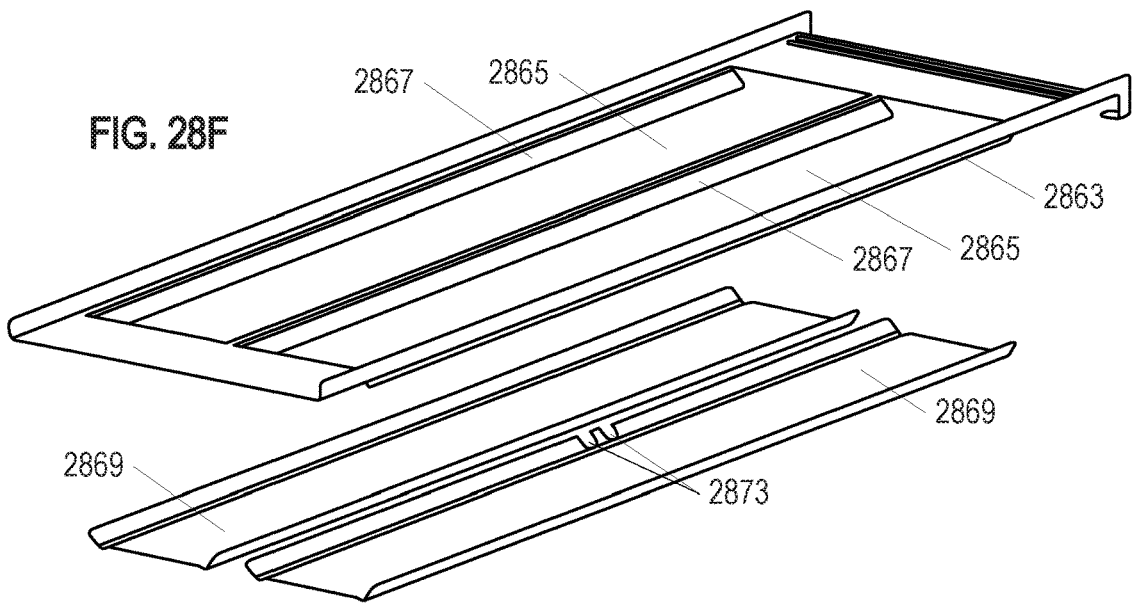
Figure 28G:
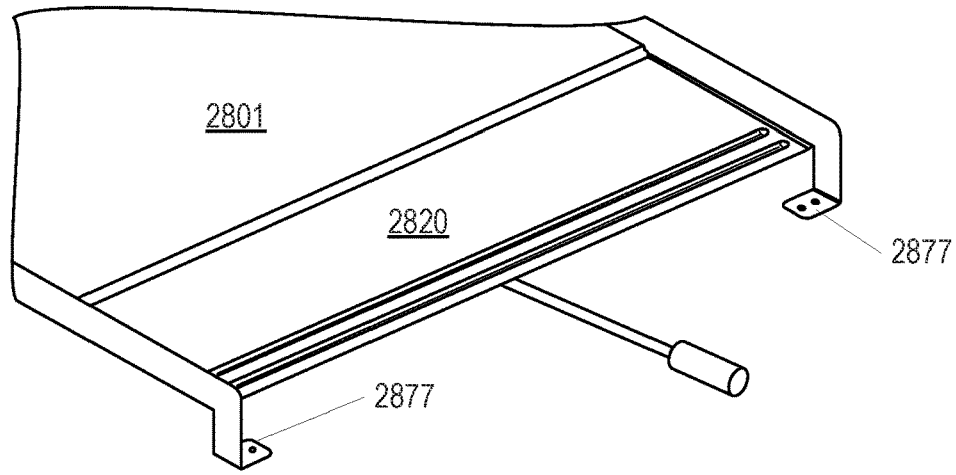
Figure 28H:
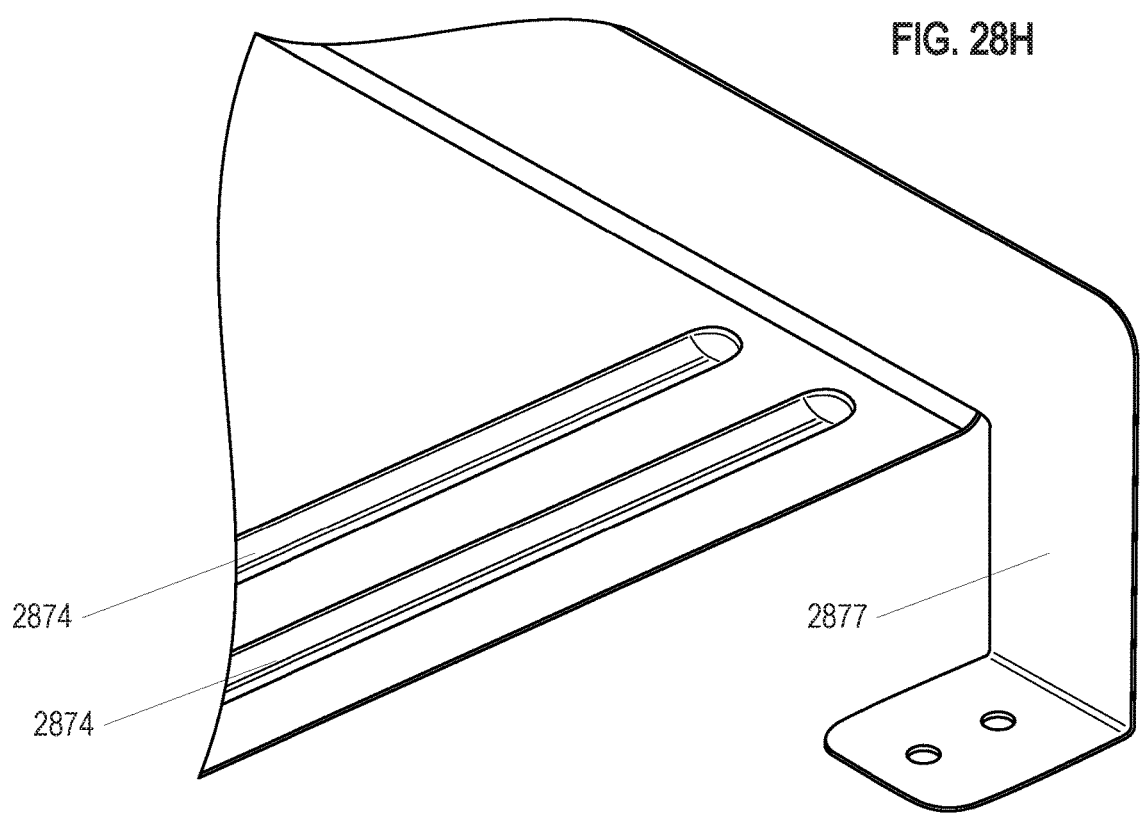
Figure 28I:
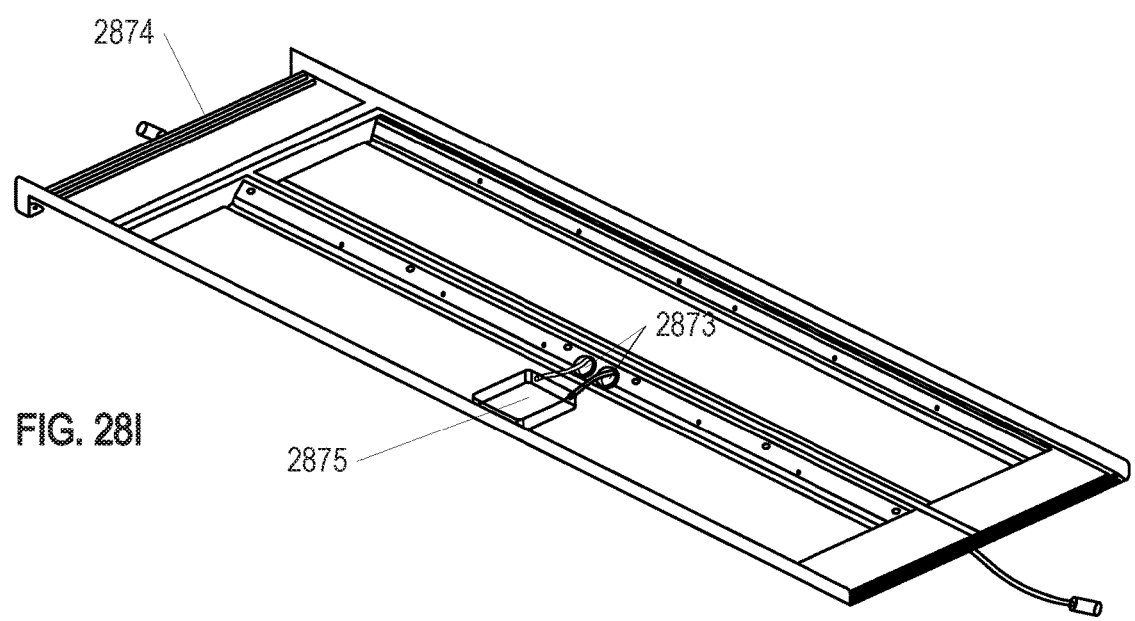
Figure 28J:
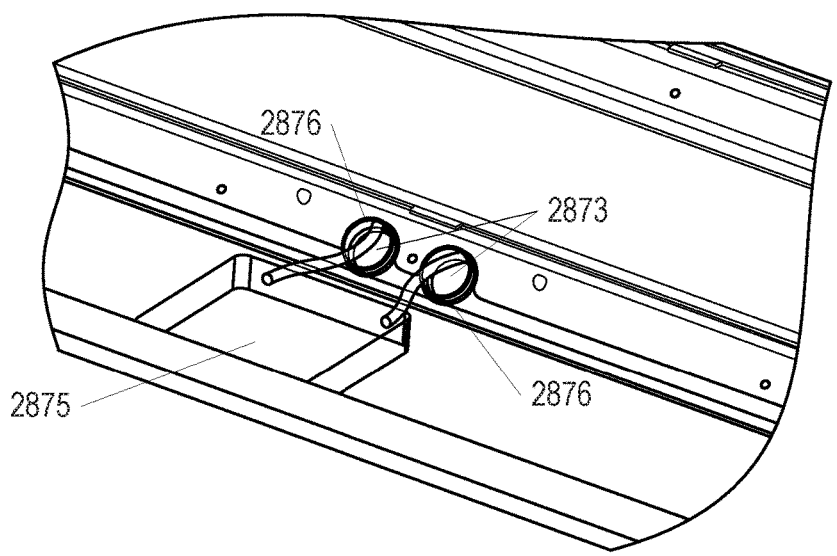
Figure 28K:
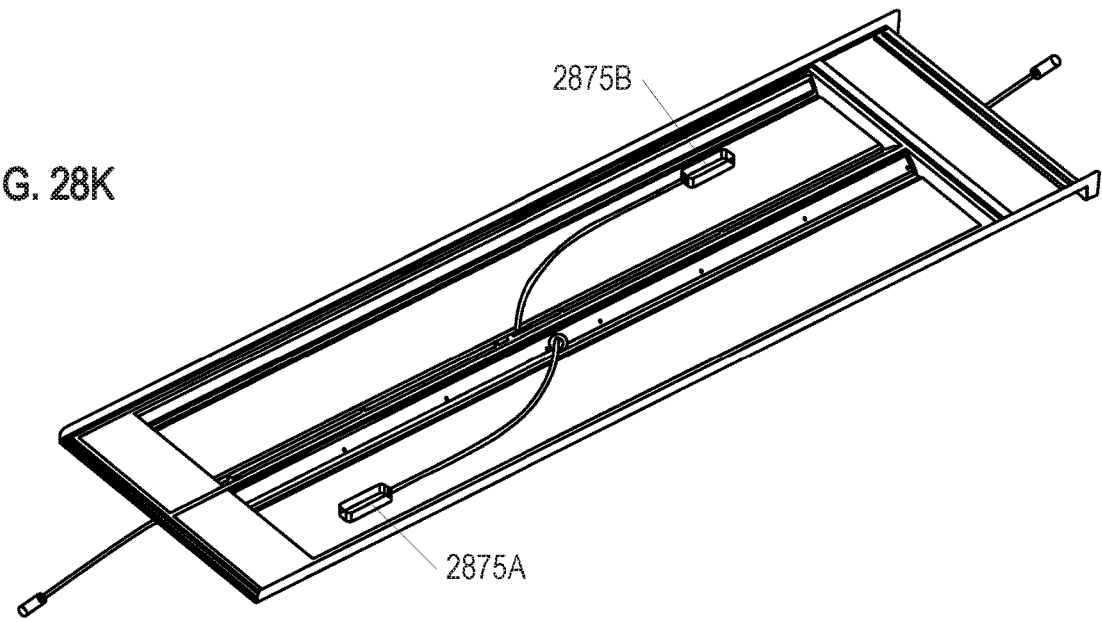
Figure 28O:
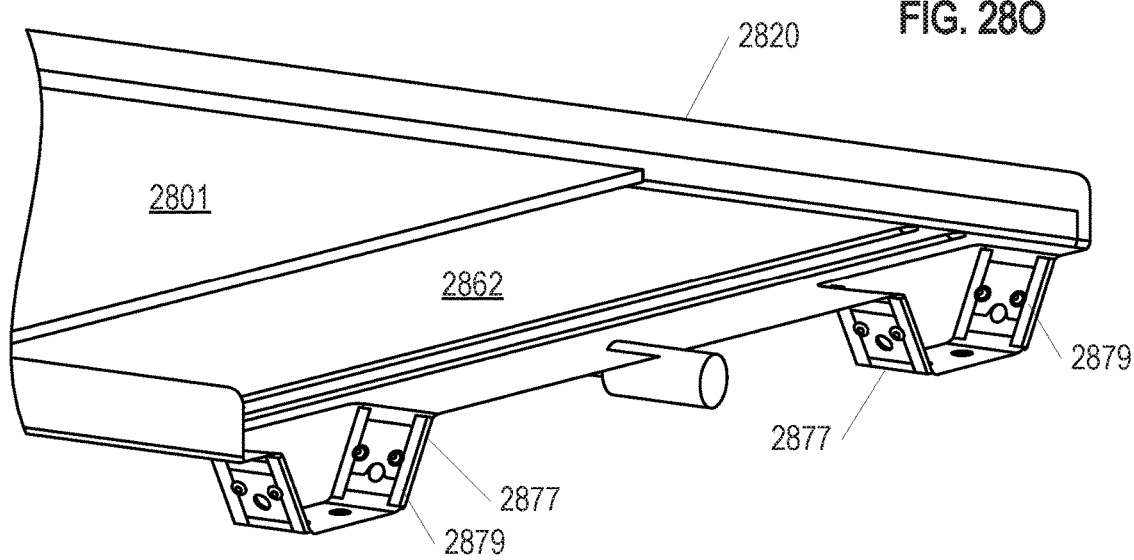
Figure 28L:
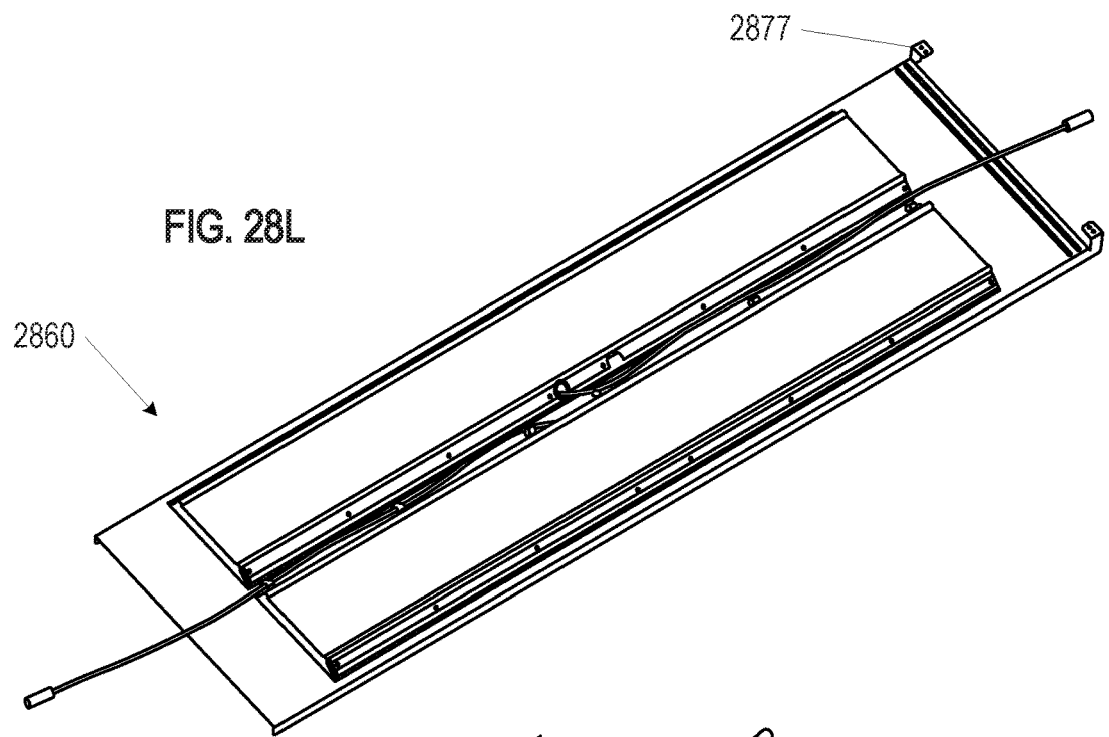
Figure 28M:
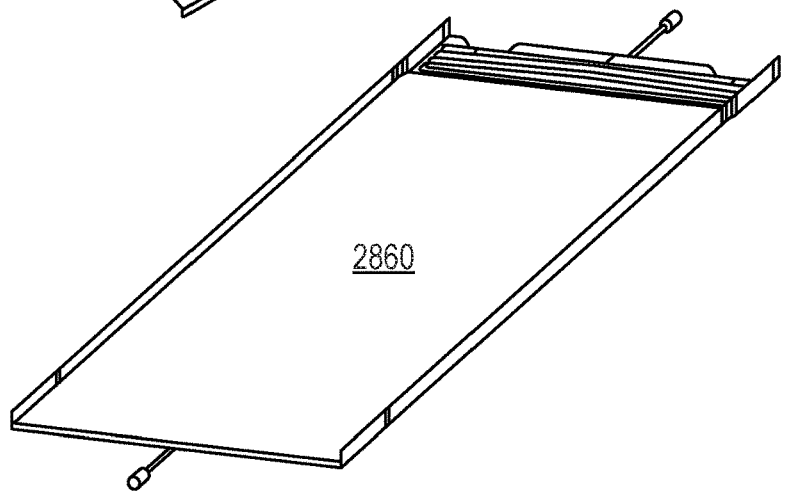
Figure 28N:
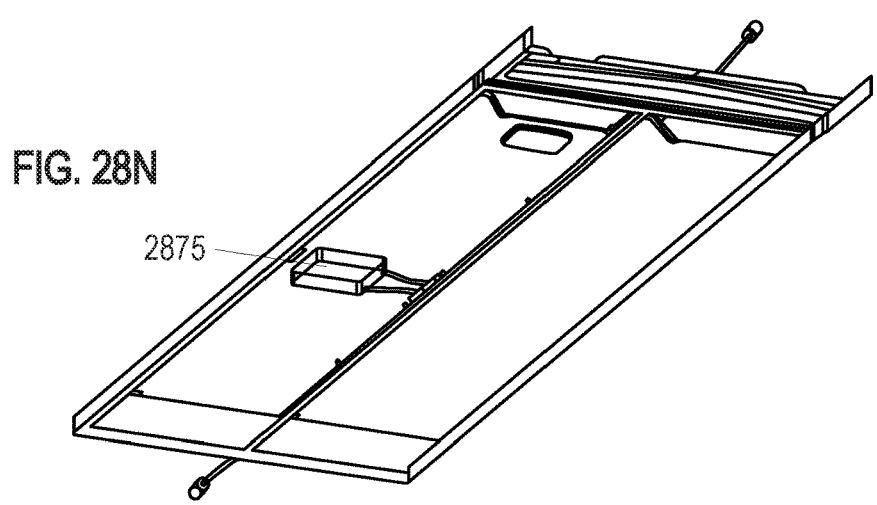
Figure 29A:
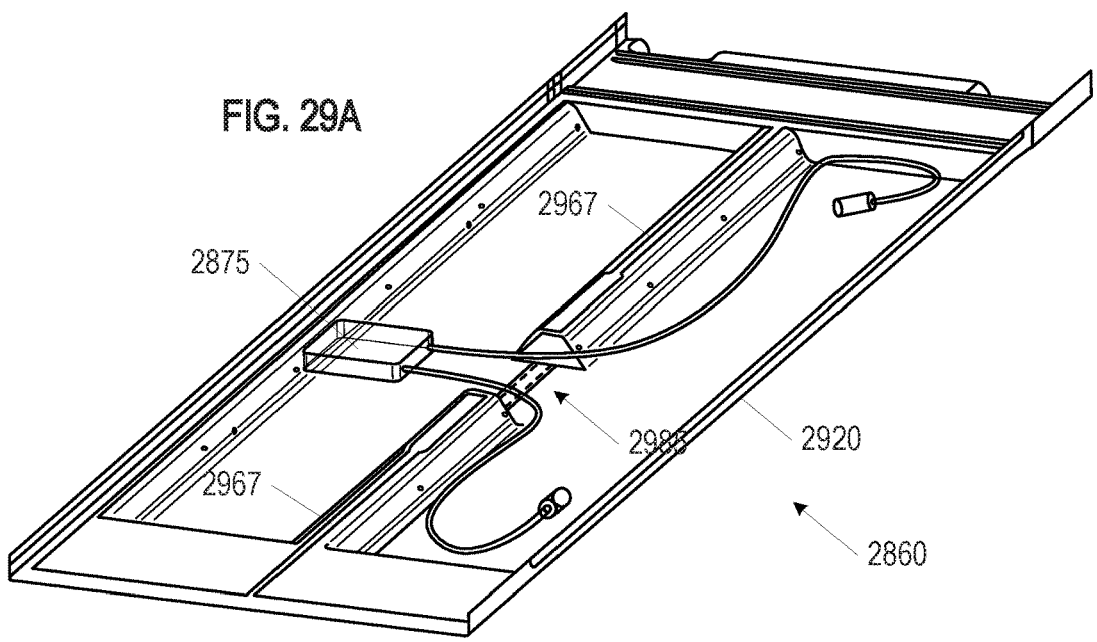
FIGS. 29A-29E show various views of an alternative embodiment for a pan of PV module-pan assembly, according to various embodiments of this technology.
Figure 29B:
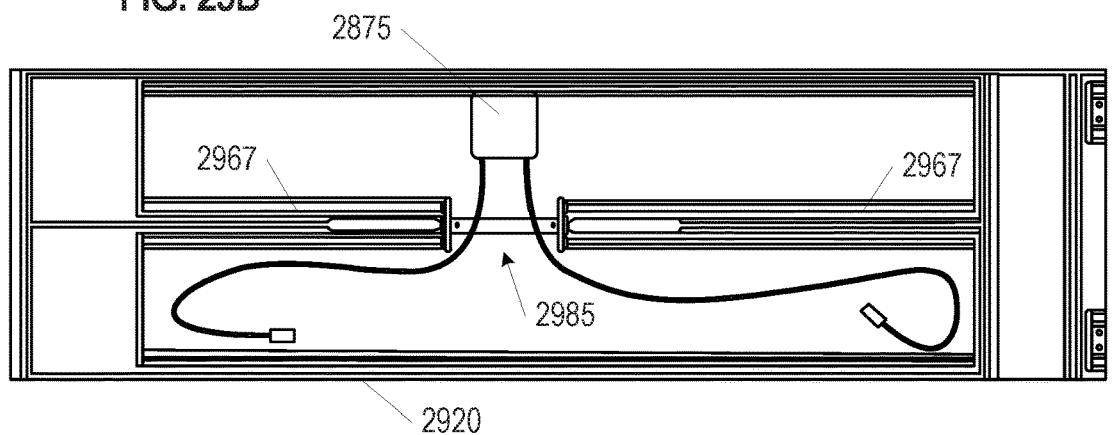
Figure 29C:
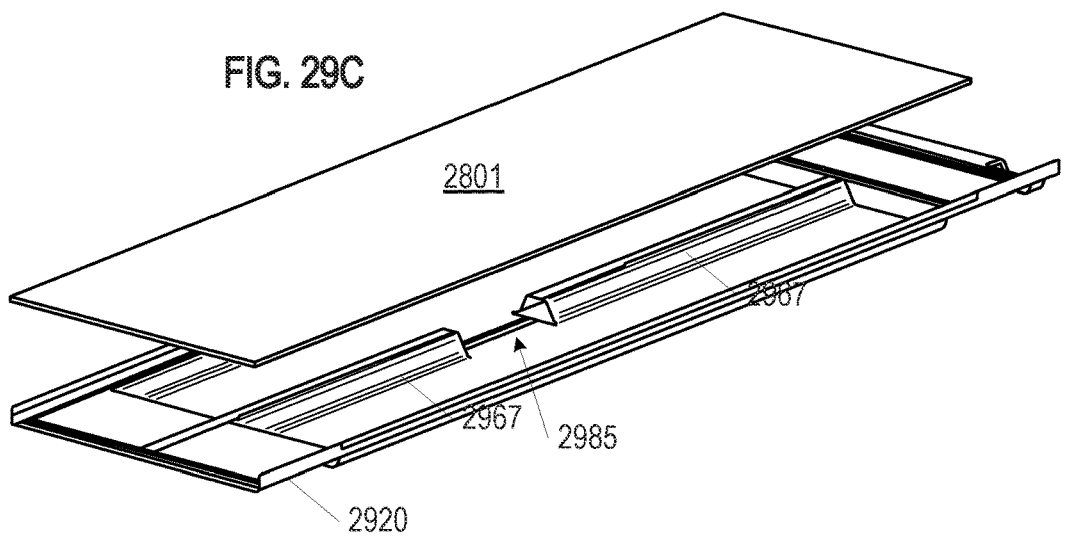
Figure 29D:
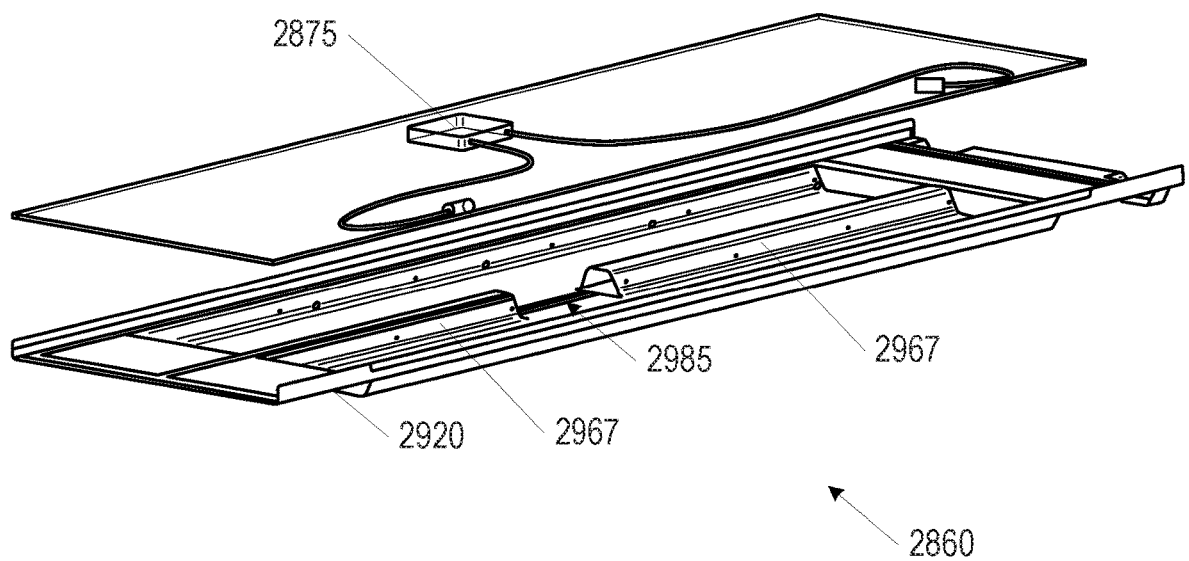
Figure 29E:
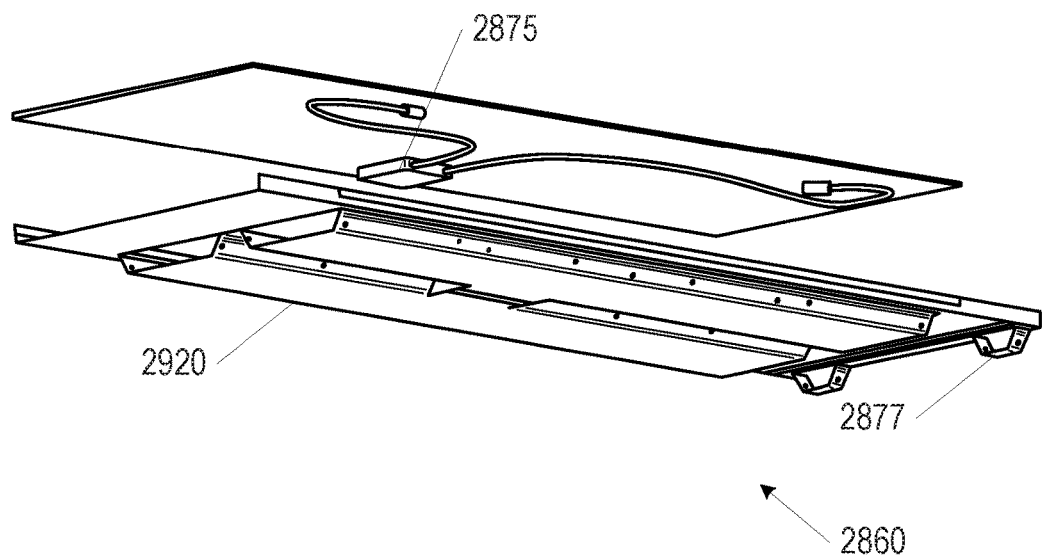

FIG. 24 is a front view of PV pan 2120 of FIGS. 21-23 with certain features removed for clarity. While shown as having a trapezoidal cross-section, leg support portions 2179 can be formed into other suitable shapes (e.g., rectangle, square). Further, roof attachment member 2182 positioned at the exposed edge portion of PV module-pan assembly 2160 can be provided to secure the overall assembly to the roof surface. FIG. 25 is a perspective view of roof attachment member 2182. Roof attachment member 2182 can be monolithically formed with PV pan 2120 or separately manufactured. Screws or other fasteners can couple roof attachment member 2182 to roof surface or structure. Roof attachment member 2182 can also be hemmed or curved accordingly. Additionally, when positioned at the end of the overlapping, exposed edge portion, roof attachment member 2182 is hidden or concealed from view when a second roof pan or PV module-pan assembly 2160 is overlapped over the edge portion.

FIGS. 26, 27A, and 27B are top, end, and cross-sectional schematic views of an alternative PV module pan assembly 2660 usable with BIPV systems as described herein. The cross-sectional view of FIG. 27B is taken along the line F27 shown in FIG. 26. Similar to PV module-pan assembly 2160, PV module-pan assembly 2660 includes series of openings 2678 punched-out of pan 2160. Angled leg support portions 2179 are formed from the punched out material, extending downward at about ninety degrees (90°). In other embodiments, leg (e.g., post, stand-off) portions can be separately formed and coupled to PV pan 2120. Further, a window or other opening 2678 can be punched-out for j-box 2117, with or without retaining the punched-out portion of PV pan 2120 for forming a support structure. As shown with respect to module pan assembly 2160, in certain embodiments, PV module 2101 mounted on PV pan 2120 can have a bottom surface exposed to an underlying roof surface on which PV module-pan assembly 2160 is mounted (e.g., without an intermediate lower surface pan). In other embodiments, one or a few large openings can replace multiple smaller openings. In such embodiments, PV module 2101 and PV pan 2120 can be bonded frictionally, with an adhesive, or the like, for example, along the longitudinal edges of each structure.

FIGS. 28A-28L are various views including top perspective, side, end, and exploded views of another PV module-pan assembly 2860 usable with building integrated PV systems (e.g., system 200, system 1000) as described herein according to other embodiments. Similar to PV module pan assemblies noted above, PV module-pan assembly 2860 includes PV module 2801 bonded to pan 2820. Pan 2820 can include standing seams 2821 (alternatively referred to as sidewalls) on opposing sides for coupling pans 2820 with other PV and/or non-PV pans as described above. Standing seams 2821 can be monolithically or separately attached and/or formed (e.g. bent or molded) components. Standing seams 2821 can extend perpendicular to the planar surface portions of pan 2820, extend at a non-perpendicular angle, and/or be hemmed to round edges.

Further, PV module assembly 2860 can be provided with overhang and exposed edge portions 2862 (e.g., pan 2820 portions that are not covered by PV module 2801 portions), and installed to overlap other assemblies as described above. PV module assembly 2860 can also include one or more of same or similar features, for example, grooves, channels, ridges 2874, or bumps to prevent or reduce capillary action (e.g., pulling water up-roof between lapped PV module pans). As shown, ridges 2874 can be two or three rows of spaced apart indentations. Electrical connectors 2815 can extend either from underneath portions of pan 2820 covered by PV module 2801 or edge portions 2862 of pan 2820.

As shown, pan 2820 includes a first substantially planar surface, first surface portion 2863 (e.g., an upper or top surface portion), with one or more openings 2865 formed between leg or support portions 2867 (e.g., strips, ribs). For example shown in FIG. 28F, first substantially planar surface 2863 can include three spaced apart support portions 2867 extending between front and rear substantially planar portions. Pan 2820 includes one or more second substantially planar surfaces, second surface portions 2869 (e.g., lower or bottom surface portions), forming one or more troughs 2871 or valleys when coupled to upper surface portion 2863, shown in FIGS. 28C and 28F. Second surface portions 2869 include upwardly extending sidewalls or flanges configured to be fastened or coupled with corresponding downwardly extending sidewalls or flanges of support portions 2867. In some aspects, the use of first surface portions 2863 and second surface portions 2869, being relatively narrower than a single surface member of the same combined width, can allow for easier manufacture and handling for installation. Further, the widths of first surface portions 2863 and second surface portions 2869 can correspond to and fit with the locations of support portions 2867, providing for more stable assembly. First surface portions 2863 and second surface portions 2869 can be spaced apart accordingly. For example, corresponding sidewalls or flanges of first surface portions 2863 and second surface portions 2869 can be attached with rivets, screws, or other suitable fasteners. In other embodiments, sidewalls or flanges of first surface portions 2863 and second surface portions 2869 can be adhered or welded together.

In other embodiments, instead of separately formed pieces, pan 2820 can be monolithically formed (e.g., a stamped one or two piece pan). While shown as being substantially planar, either of first surface portion 2863 or second surface portion 2869 can also include projections, bumps, or non-planar features. In some aspects, trim 2895, which can be a sealing member or a sealing cover (e.g. a watertight seal), may be attached to interface respective edges of first surface portion 2863 and PV module 2801.

As noted above, pan 2820 can include channels or ridges 2874 formed in or attached to rear surface portion of pan 2820 to prevent or reduce capillary action. Pan 2820 can further include openings 2873 (e.g., apertures) in one or more of sidewalls or flanges to allow wire (e.g., conduit or cables) to be passed through and run alongside an underside of pan 2820 through channels or gaps formed between sidewalls or flanges. Further, in some embodiments, wiring can be attached to bottom of pan 2820 via one or more clips or other fasteners. Holes and openings 2873 can include grommets 2876, other types of bushings, or other suitable inserts to round out the sharp edges in openings 2873. Wires can be, for example, positive and negative cables from one or more j-boxes 2875 positioned within troughs 2871 and mounted to bottom of a PV module. J-boxes 2875 can be center mounted or off-center mounted (e.g., more proximate to the sides and/or edges). For example, in certain embodiments, two j-boxes 2875A, 2875B can be mounted in respective troughs 2871 more proximate to opposing sides of pan 2820.

Pans can further include one or more mounting portions 2877 (e.g., feet, brackets, members) to be coupled to roof surfaces. Such mounting portions 2877 can be bent or hemmed from pan portions (e.g., standing seams) or separately formed and attached. Mounting portions 2877 can include L-shaped brackets formed or secured at opposing ends of pan. In other embodiments, mounting portions 2877 can be formed or secured along a rear or up-roof edge surface of pan as shown in FIGS. 28M-28Q. For example, mounting portions 2877 can be riveted to or otherwise coupled to recessed or cutout portions of rear surface portion of pan 2820 to provide improved rigidity and securement. Such mounting portions 2877 can be shaped to track the contour of troughs 2871, or can be arranged and constructed to otherwise form supporting structures for the overall PV module-pan assembly 2860.

In various embodiments, sharp or angled edges of bottom pan portions 2869 or troughs 2871, as well as mounting portions 2877, can be covered or capped (e.g., enclosed, wrapped) with rubber or other types of edge protection 2879 (e.g., tape). Edge protection 2879 can reduce or minimize the potential for sharp edges to fray wires that pass under PV modules 2801 and improve installer safety. In other embodiments, such edges can be hemmed or bent.

As noted above with reference to various embodiments, PV module 2801 can be bonded or otherwise secured to pan 2820. For example, PV module can be bonded with adhesive such that a watertight or substantially watertight seal is provided between PV module 2801 and pan 2820. As shown in the exploded view of FIG. 28D, strips or pads of VHB tape 2881 or other suitable material of a desired height can be applied to pan 2820 (including, for example, other structures connected to pan 2820 such as PV module supports) to set a desired height of adhesive or sealant. Adhesive 2883 or sealant can then be applied in a pattern as shown, and then PV module 2801 can be set on top of adhesive 2883 and VHB tape 2881 to bond PV module 2801 to pan 2820. Further, trim 2895 can be attached at the north-south edges of PV module 2801.

FIGS. 29A-29E show various views of an alternative embodiment for pan 2920 of PV module pan assembly 2860. (PV module 2860 has been made transparent in certain views for clarity.) Center support portion 2967 (also referred to as leg portion) of first surface portion 2863 in such an embodiment can be discontinuous. For example, cutout portion or recess 2985 can be formed to provide pathway for cable, conduits, j-boxes 2875, or wires. Space provided by cut-out portion or recess 2985 can remove the need for holes or openings to be formed in center support portion 2967 and running (e.g., fishing) wires or cables through holes and pulling wires through to an exterior portion of pan 2920. As a result, less time and labor (e.g., amount of people) may be required when installing PV module 2801 as part of such PV module-pan assembly 2860. For example, cables or wires from j-box(es) 2875 can come pre-clipped or otherwise secured (e.g., taped, fastened) to PV module 2801 in a desired orientation and position. J-boxes 2875 can be installed with wires extending through cutout portion or recess and secured with clips or other fasteners. In this manner, an additional individual or installer is not necessary to hold cables (e.g., in tension) and fish or run cables through holes in pan 2920 while one or more individuals set PV module 2801 onto an adhesive. If j-box 2875 and wires are pre-set or installed, then one or more individuals can set PV module 2801 onto pan 2920 without having to hold cables and run them through grommets or holes at the same time to reduce contact with PV module 2801 after being set onto pan 2920 and adhesive.

Figure 30:
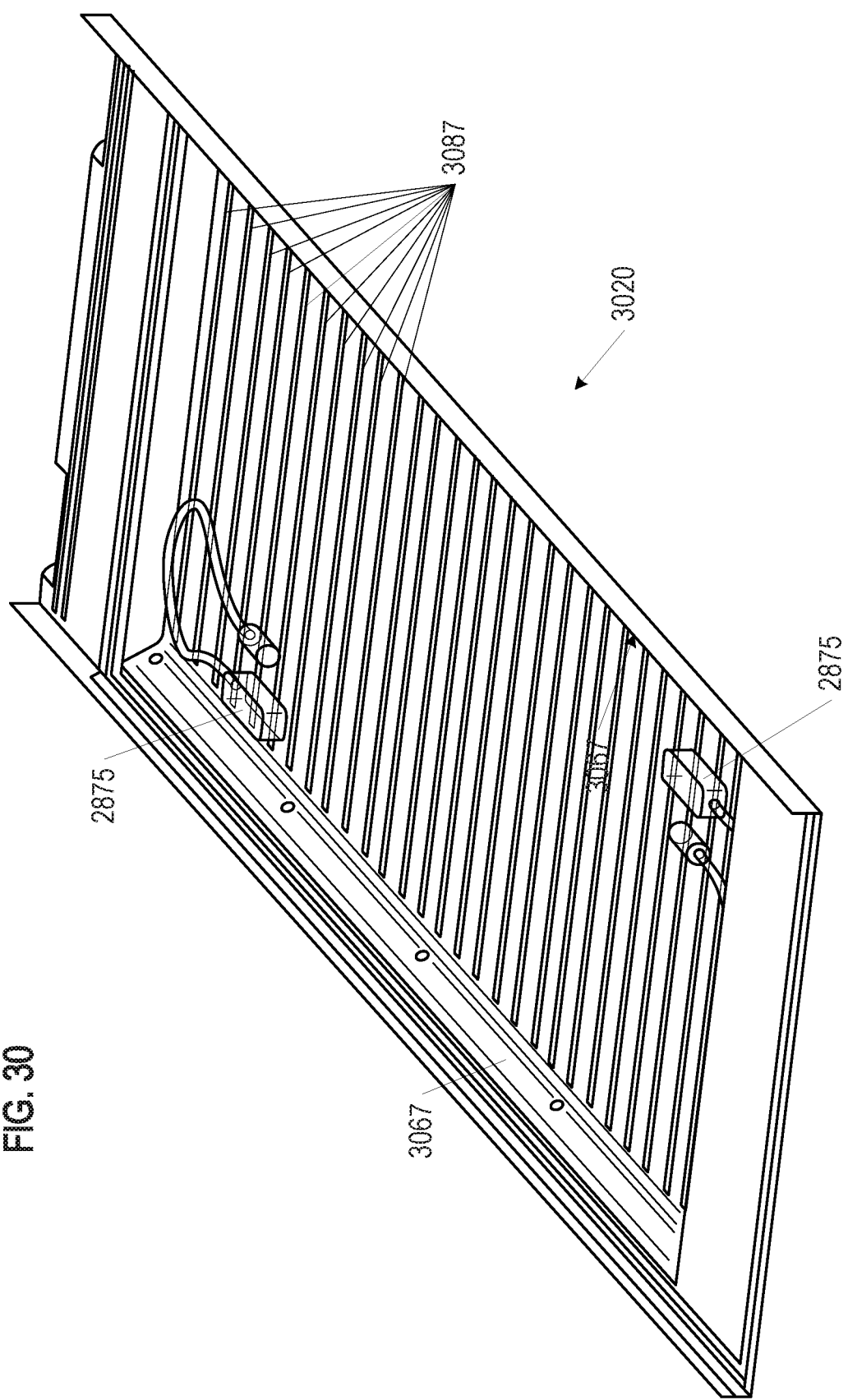
FIG. 30 shows a further embodiment of pan of PV module-pan assembly, according to various embodiments of this technology.

FIG. 30 shows a further embodiment of pan 3020 of PV module-pan assembly 2860. In such embodiments, a PV module (not shown) with "glass on glass" layers can be attached to pan. Such PV modules (e.g., with improved rigidity relative to single glass layered modules) can be attached to pan 3020 without a second leg or support (e.g., middle, center) between two opposing side legs or supports 3067. In other embodiments, other types of PV modules disclosed herein can be mounted onto pan 3020. Further, pan 3020 can include support ribs 3087 extending along the width of pan 3020 (e.g., extending substantially traverse or non-parallel to the longitudinally extending supports) to provide additional rigidity. The configuration and arrangement of support ribs 3087 can provide increased space below PV module and reduced manufacturing costs. While shown as having two j-boxes 2875, in other embodiments, single j-box 2875 can also be provided with pan 3020.

FIGS. 31A-31F show various views and aspects of exemplary lapped (e.g., overlapping or tiled portions) PV module-pan assemblies 3160 forming at least a portion (e.g., part of a column) of a PV array of any of BIPV systems as described herein. As shown, in certain embodiments, first PV module-pan assembly 3160A is positioned down-roof of second PV module-pan assembly 3160B. A front (e.g. a forward or down-roof) overhang or ledge portion of PV pan 3120B of second PV module-pan assembly 3160B is configured to be positioned (e.g., lapped) onto a back (e.g. rear or up-roof) planar surface portion of PV pan 3120A of first PV module-pan assembly 3160A. In various embodiments, at least where PV pan portions of the assemblies are lapped, there remains gap, opening, or space 3102 between coplanar or substantially coplanar PV modules (e.g., back edge of first PV module 3101A and front edge of PV module 3101B) attached to respective PV pans. In other embodiments, portions of PV pan-module assemblies 3160 can abut or contact each other (e.g., without a gap, space, or opening between the portions).

Figure 31A:
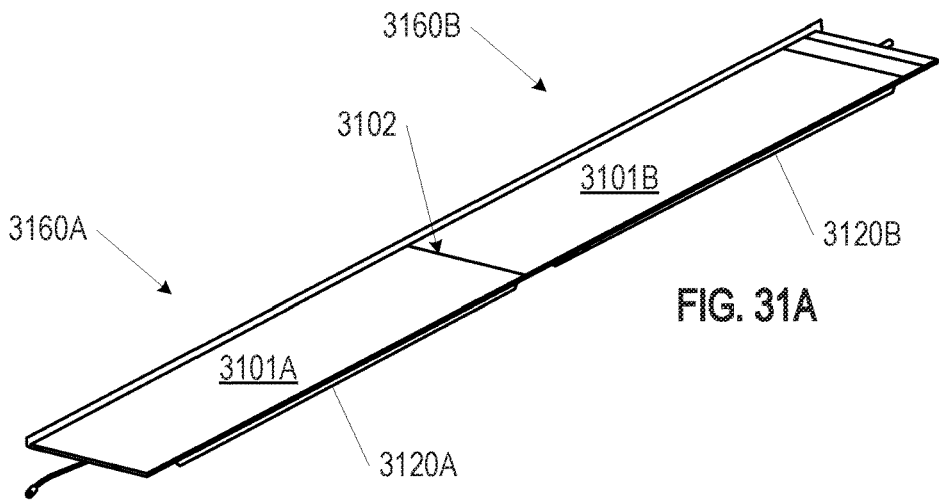
FIGS. 31A-31G show various views and aspects of exemplary lapped, overlapping, or tiled portions PV module-pan assemblies, according to various embodiments of this technology.
Figure 31B:
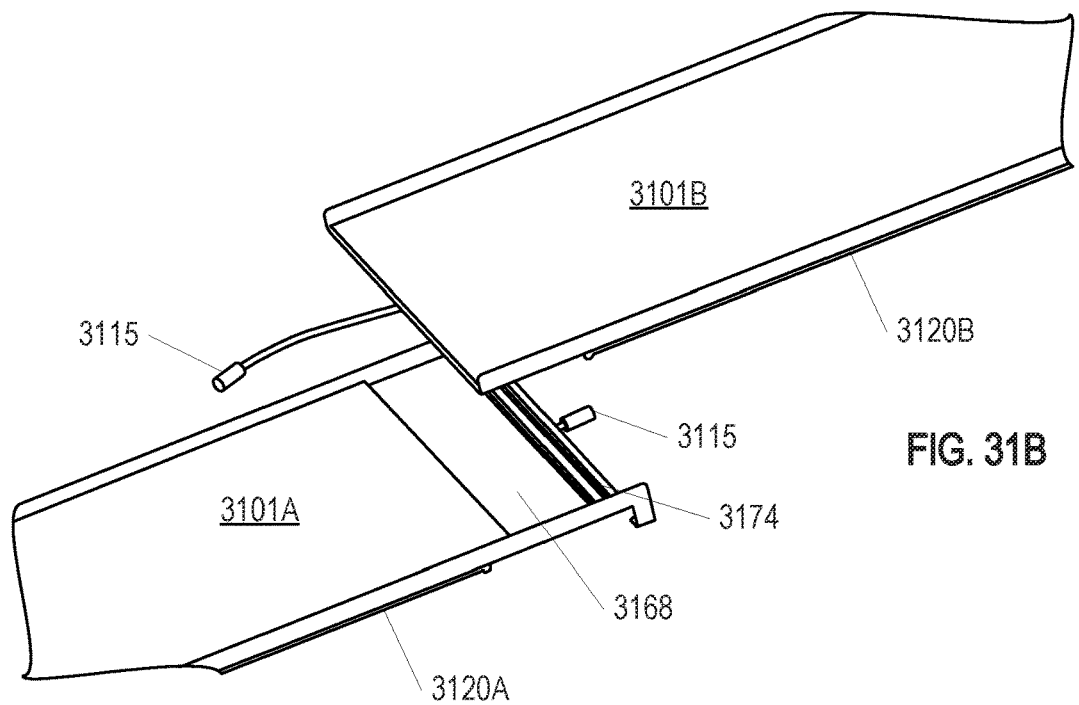
Figure 31C:
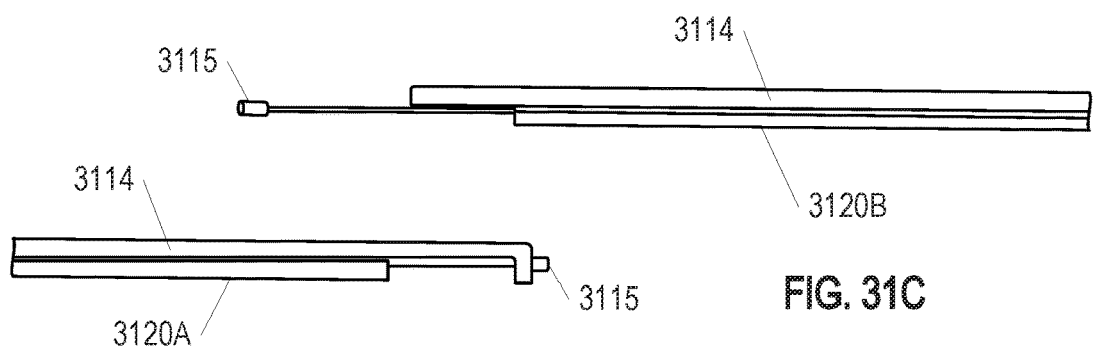
Figure 31D:
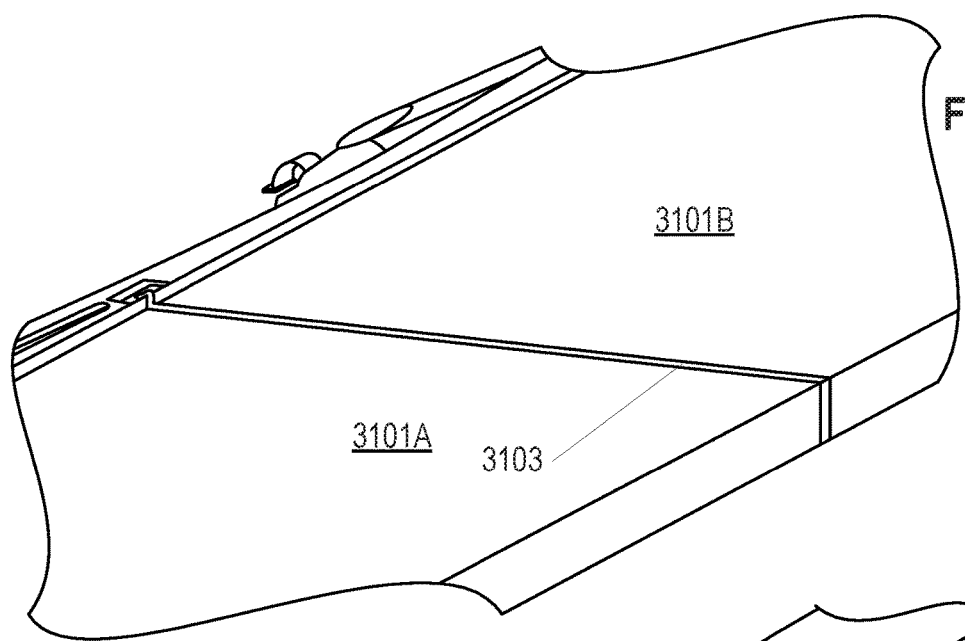

Electrical connectors 3115 coupled to each PV module-pan assembly 3160A, 3160B can further couple to each other to conduct electricity. Grooves 3174 can be present on an upper exposed surface of PV pans 3120, for example, as shown in FIG. 31B on the overhang surface 3168 of PV pan 3120A. Grooves 3174 can serve to break capillary action, diverting any water or other fluid that may breach in between the sealed interface of PV module-pan assemblies 3160. Grooves 3174 may further serve to provide for a frictional interface to secure adjacent PV module-pan assemblies 3160 within the same column to each other. Standing seams 3114 of PV pans 3120 can be further configured to align with each other to be at a generally uniform height when installed as part of a BIPV system or array.

Gap or space 3102 (which can alternatively be referred to as a horizontal seam) between PV modules 3101A and 3101B can be at least partially filled or covered with sealing member 3103 (e.g., a gasket, filler, cap, cover, trim, insert). For example, rubber, sealant, metal, foam, or other types of material can be used as sealing member 3103 to cover, fill, or seal gap including certain types of tape. Such sealing member 3103 materials can be color-matched or appear similar in color to PV pans 3120 or PV modules 3101. In certain embodiments, sealing member 3103 materials can be attached to a down-roof PV module 3101A. In other embodiments, sealing member 3103 materials can be attached to up-roof PV module 3101B or both PV modules 3101A and 3101B. In yet further embodiments, each PV module 3101 can include sealing members 3103. In such embodiments, corresponding sealing members 3103 can mate with each other when PV module-pan assemblies 3160 are lapped. In certain embodiments, sealing member 3103 can include or made of two materials with two different hardnesses. In some embodiments, gap 3102 is painted or filled with sealants, examples of which can be seen in FIG. 31G.

In certain embodiments, sealing member 3103 can be attached to bottom portion of up-roof PV module 3101B. Sealing member 3103 extends around, along, or follows the edge of up-roof PV module 3101B forming a substantially ninety degree turn from bottom portion of PV module 3101B up along forward edge of PV module 3101B. In some aspects, sealing member 3103 can include a convex or curved head portion 3104. Head portion 3104 can extend across gap or space 3102 above PV modules 3101A and 3101B to cover (e.g., conceal) space 3102 and can provide for a more uniform (e.g., more continuous without gaps or lines) or aesthetically pleasing appearance. Sealing member 3103 can be installed at an installation site in the field, or secured at the factory. Sealing member 3103 can be adhered or otherwise secured to other PV modules 3101 when installing array. Other cross-sectional shapes can be used in other embodiments, example configurations of which are shown in FIG. 38G. Further, in some embodiments, sealing members 3103 can have different durometers or hardnesses and gradients thereof, and include hollow portions as shown. In any given array of BIPV array according to various embodiments, different sealing member 3103 can be used between PV modules 3101 of the array.

Figure 31E:
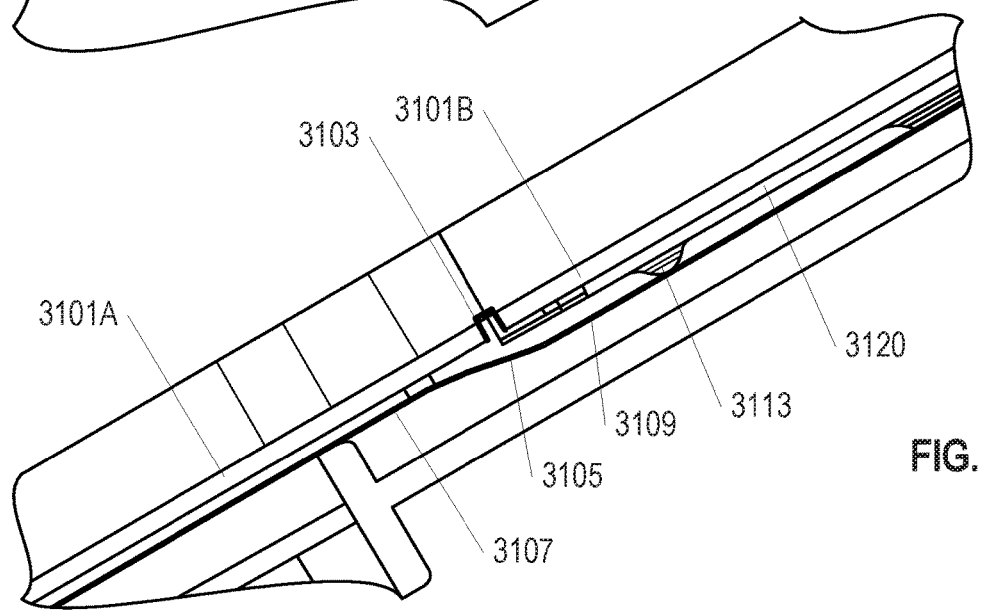
Figure 31F:
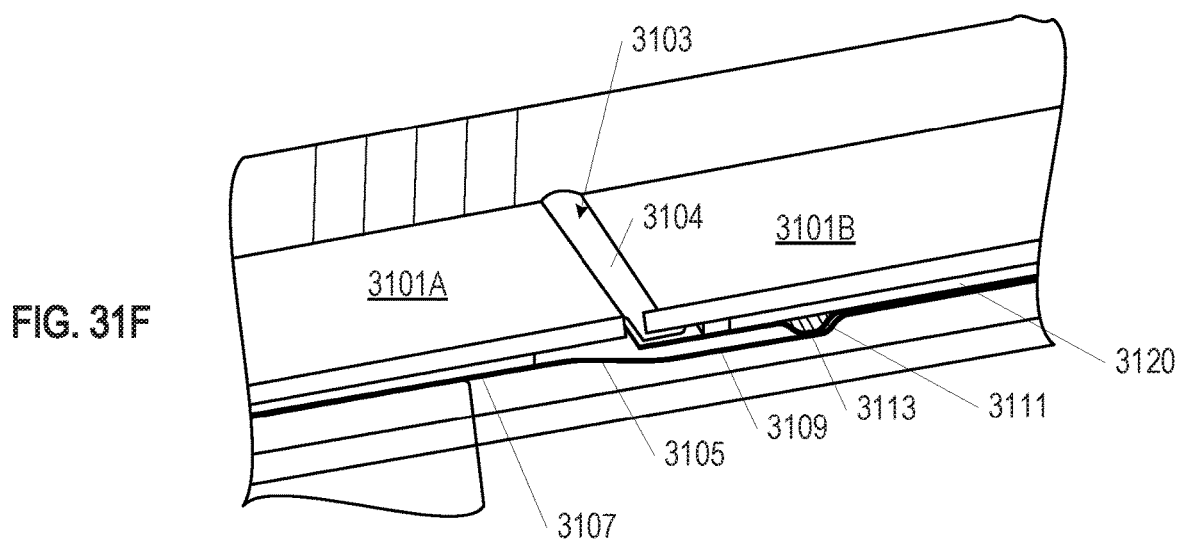

In various embodiments, as shown in FIGS. 31E and 31F, pans of PV module-pan assemblies 3160 can include first ramped surface 3105 (alternatively referred to as rear or up-roof surface portions) that extend between upper surface portion 3107 to lower surface portion 3109. Including lower surface portions 3109 at the rear or up-roof portions of PV pans 3120 allows corresponding and adjacent up-roof PV module-pan assemblies 3160 to be lapped onto rear or lower surface portions 3109 of down-roof PV module-pan assemblies 3160, and to allow PV modules 3101 to remain coplanar. In contrast, for example, lapping up-roof surface portions 3105 directly onto lower surface portions 3109 as first and second surfaces, respectively, adjacent to each other would elevate first surface slightly above second surface by virtue of the lapping.

Further, in some embodiments, the lower surface portion 3109 can form a lower or bottom surface of a valley between first ramped surface 3805 and second ramped (or sloped) surface 3111. In some aspects, PV pans 3120 of PV module-pan assemblies 3160 can include projection 3113 (e.g., a corresponding trough or valley) extending out from the bottom or underside of the front (e.g., down-roof) ledge or overhang portions. Projection 3113 can help an installer guide or position up-roof PV module-pan assembly 3160B onto down-roof PV module-pan assembly 3160A when installing array. In application, the installer can lap up-roof PV module-pan assembly 3160B onto down-roof PV module-pan assembly 3160A. Then the installer can slide up-roof PV module-pan assembly 3160B in an up-roof direction until projection 3113 contacts second ramped surface 3111 indicating to the installer that up-roof PV module-pan assembly 3160B is in the appropriate position relative to down-roof PV module-pan assembly 3160A. Therefore, gaps between the PV modules 3101 can be preset or predetermined and made substantially equivalent (allowing for use of uniform gap-filling members or sealants) or minimized when installing lapped pans.

Figure 31G:
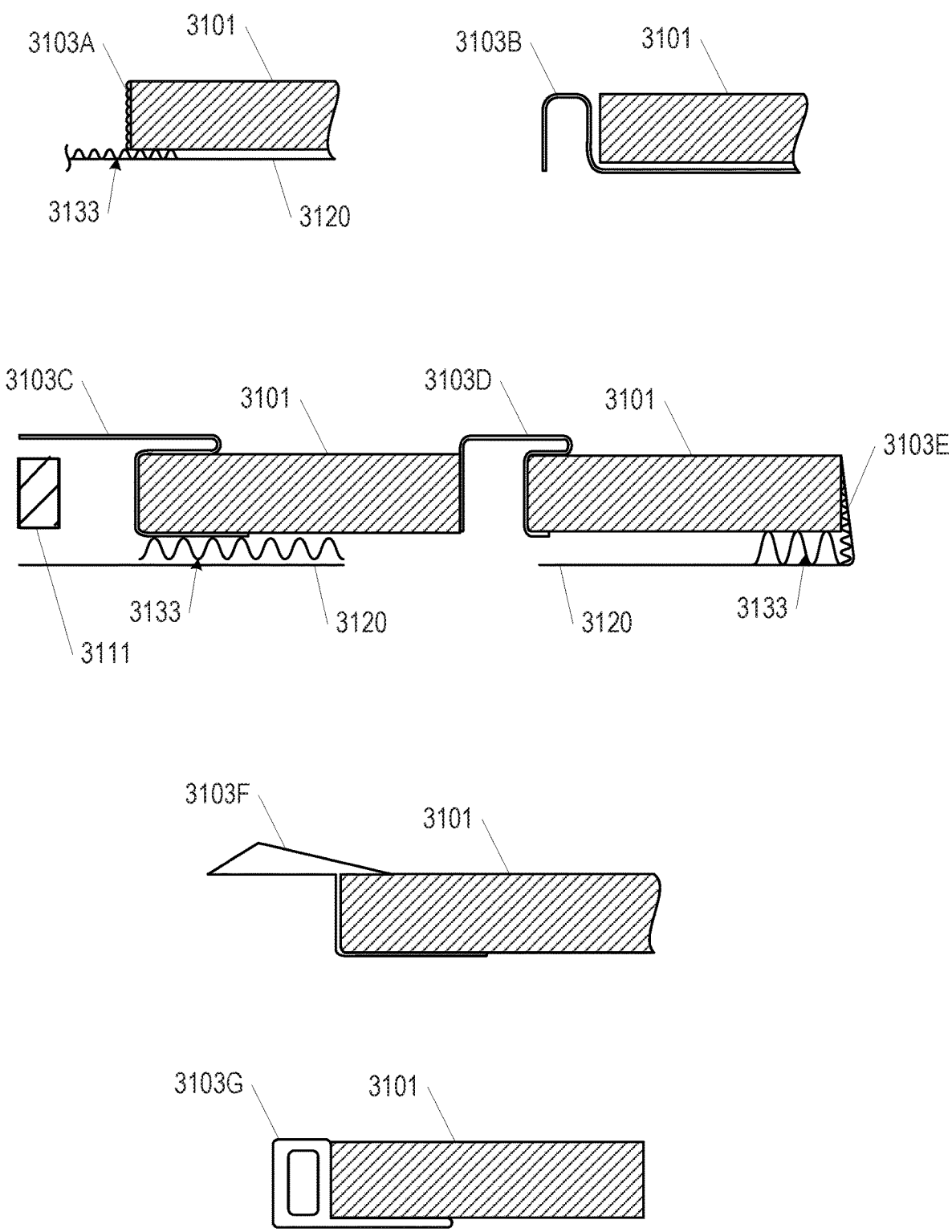

FIG. 31G shows several variations of sealing members 3103 useable with various embodiments. First sealing member 3103A is effectively a straight element flush with an edge surface of PV module 3101, with additional adhesive, tape or extruded sealant 3133 applied at the interface of first sealing member 3103A, PV module 3101, and underlying PV pan 3120. Second sealing member 3103B is a curved element extending underneath bottom of PV module 3101 and up along edge of PV module 3101, forming a structure to fill space or a gap at the edge of PV module 3101. Third sealing member 3103C is a curved element flush with a bottom, an edge, and top surface of PV module 3101, the top extension of third sealing member 3103C further covering a gap and batten 3111 and the bottom extension of third sealing member 3103C with additional adhesive, tape or extruded sealant 3133 applied at the interface of third sealing member 3103C, PV module 3101, and underlying PV pan 3120. Fourth sealing member 3103D is a contoured element flush with edges of PV modules 3101 on either side of fourth sealing member 3103D, in part covering a section of top surface of one of PV module 3101, and fourth sealing member 3103D further filling a gap between PV modules 3101 on either side. Fifth sealing member 3103E is a straight element lightly angled away from an edge surface of PV module 3101, with additional adhesive, tape or extruded sealant 3133 applied at the interface of fifth sealing member 3103E, PV module 3101, and underlying PV pan 3120.

As shown, all of third sealing member 3103C, fourth sealing member 3103D, and fifth sealing member 3103E can be used within the same column of PV modules 3101, which is also applicable to other sealing members 3103 discussed herein. Sixth sealing member 3103F is an angled element extending underneath bottom of PV module 3101, up along edge of PV module 3101, and forming an angled structure (referred to as a "head") to cover a top edge portion of PV module 3101 and an adjacent PV module 3101 or other structure adjacent. Seventh sealing member 3103G is a hollow block element extending underneath bottom of PV module 3101 and up along edge of PV module 3101, forming a hollow structure to fill space or a gap at the edge of PV module 3101. All of sealing members 3103 considered herein can be selected and applied to any given installation as appropriate or needed.

FIGS. 32A-32D show detailed views of various embodiments of roofing components that can be used with various solar panel array described herein, particularly with BIPV systems and with overlapping panel systems configured to be aesthetically seamless.

FIG. 32A shows, at the eave of roofing surface 3203, that vented eave flashing 3200 can be provided that is configured to allow airflow through columns of PV module-pan assemblies 3260, passing under corresponding PV modules 3201 mounted to 3220 pans of such PV module-pan assemblies 3260, as well as under non-PV pans 3210 (e.g. roof pans, dummy pans, transition pans) mounted on roofing surface 3203. This may be particular useful in hot climates where excessive heat affects the performance of BIPV system according to various embodiments of the disclosure.

Vented eave flashing 3200 can include first vented surface 3202 and second vented surface 3204 (e.g., front and rear surfaces, respectively) that are arranged opposing each other, with substantially planar surface 3206 extending therebetween. First vented surface 3202 and second vented surface 3204 can both include openings 3209 (e.g., vents) extending there through. Openings 3209 can be of various shapes (e.g., circular, oval, rectangular, etc.) and can be similarly sized or have different sizes. For example, surfaces can include rows of openings 3209 with openings 3209 progressively decreasing in size for each subsequent row (e.g., in an upward or downward direction). Openings 3209 can be sized to be large enough to allow sufficient airflow under PV modules 3201 while small enough to prevent bugs (e.g., bees, flies, etc.) from entering under PV modules 3201 through vented eave flashing 3200. Further, rows of openings 3209 in either or both of between first vented surface 3202 and second vented surface 3204 can be arranged such that openings 3209 are aligned with each other or in a staggered arrangement.

Planar surface 3206 extending between first vented surface 3202 and second vented surface 3204 can generally support transition pans, PV module pans, roof pans, or dummy module pans. Further, planar surface 3206 can include lip portion 3207 or overhang that hemmed portion of pan (e.g., down-roof transition pan) positioned on which planar surface 3206 can be coupled or secured.

Airflow under PV modules 3201 or other non-PV pans 3210 can flow in a direction up (e.g., up-roof) through vented battens and column (e.g., of PV module pan assemblies and transition pans) to roof ridge 3250, which can have ridge cap 3252. The airflow can continue out of roof ridge 3250 through ridge cap mesh 3255, and through ridge vents 3251 shown in FIGS. 32C-32D. Different configured ridge vents 3251 (e.g., vented Z-shaped flashings) can be positioned at end or up-roof end portions of column. In certain embodiments, ridge cap 3252 can be vented or include mesh screen portions (e.g., ridge cap mesh 3255). This passage for airflow can provide passive cooling (e.g., airflow) to cool PV modules. In other embodiments, ridge flashings 3254 under ridge cap 3250 can include large (e.g., more open area than material forming the flashing surfaces) openings and cutouts. In other embodiments, completely open areas can be provided under ridge cap 3252. Further, ridge cap 3252 can include openings, vents, or screen for heat transfer from airflow across ridge cap 3252.

In other embodiments, one or more fans 3256 (e.g., under the ridge, at the ridge, under the transition pans) can be provided at one or more of the structural or PV columns to provide additional airflow (e.g., active cooling, forced or convective airflow). In various embodiments, fans 3256 are powered by PV modules of the array. In other embodiments, additional or dedicated PV modules positioned on non-PV pans (e.g., roof or transition pans) can be provided to power fans 3256. In various embodiments, one or more attic fans can be installed to provide forced airflow, or active cooling, under PV modules 3201 or airflow into attic portion of building.

In some embodiments, BIPV systems can be configured to allow for some degree of wind or precipitation to pass underneath PV modules, but remain above the surface of PV pans, in turn ensuring that an underlying roof is not exposed to water. For example, in the context of FIGS. 32A-32D, gaps present near roof ridge 3250 and/or small intentionally-spaced gaps between PV modules 3201 or other non-PV pans 3210 within the same column can allow for precipitation (rain, snow, dew, etc.) to enter in under PV modules 3201, but remain above roof surface 3203, being carried on surface of structural support pans holding PV modules 3201 or other non-PV pans 3210. This water can run down the surface of structural support pans due to the slope of roof 3203, optionally passing through holes in vented battens, and pass out of openings 3209 in both of first vented surface 3202 and second vented surface 3204.

Figure 33A:
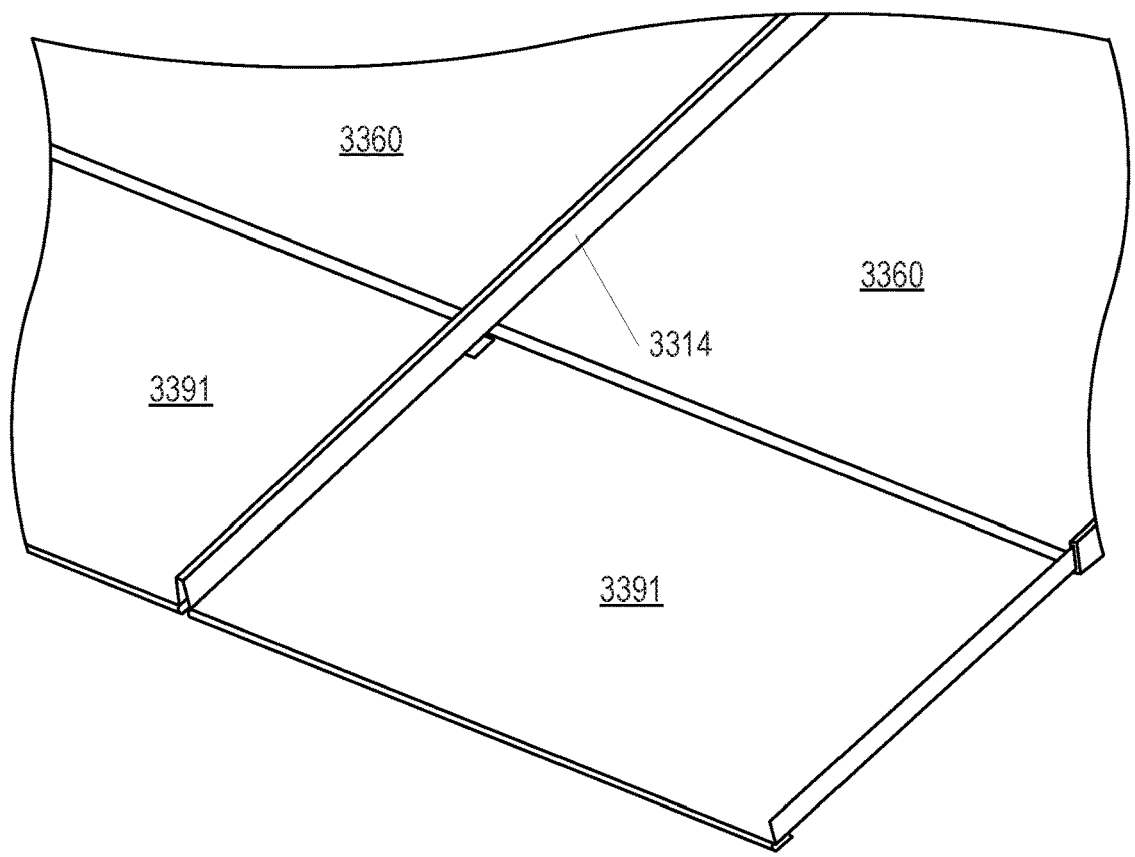
Figure 33B:
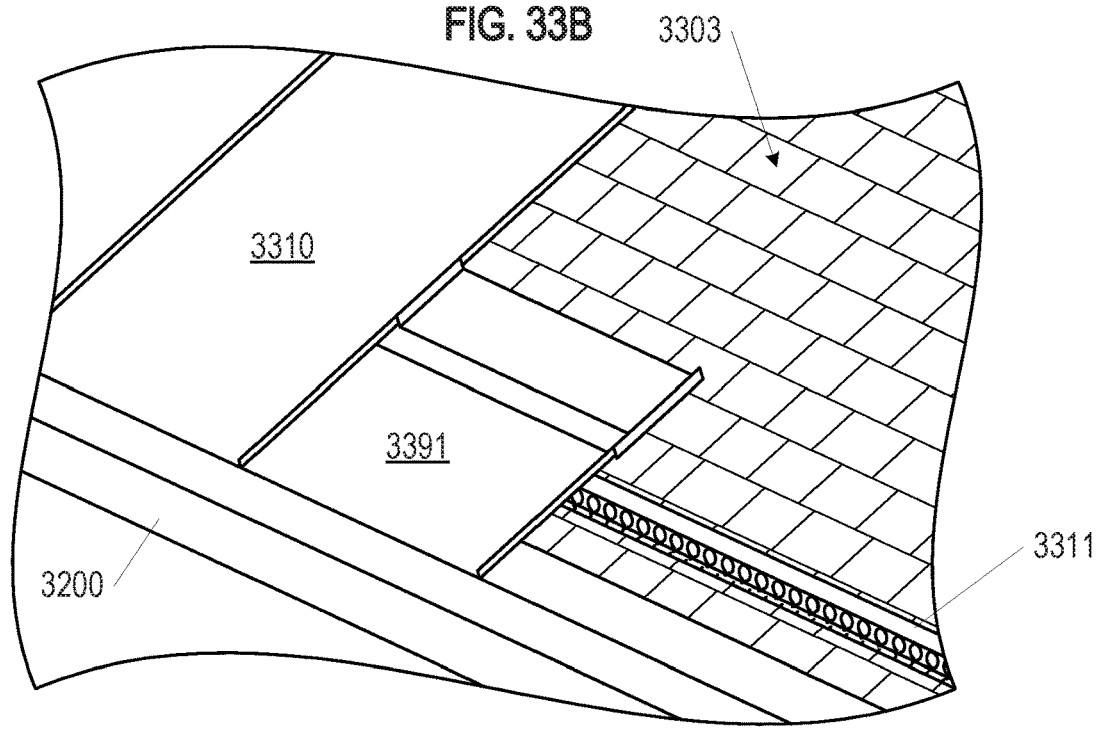
Figure 34A:
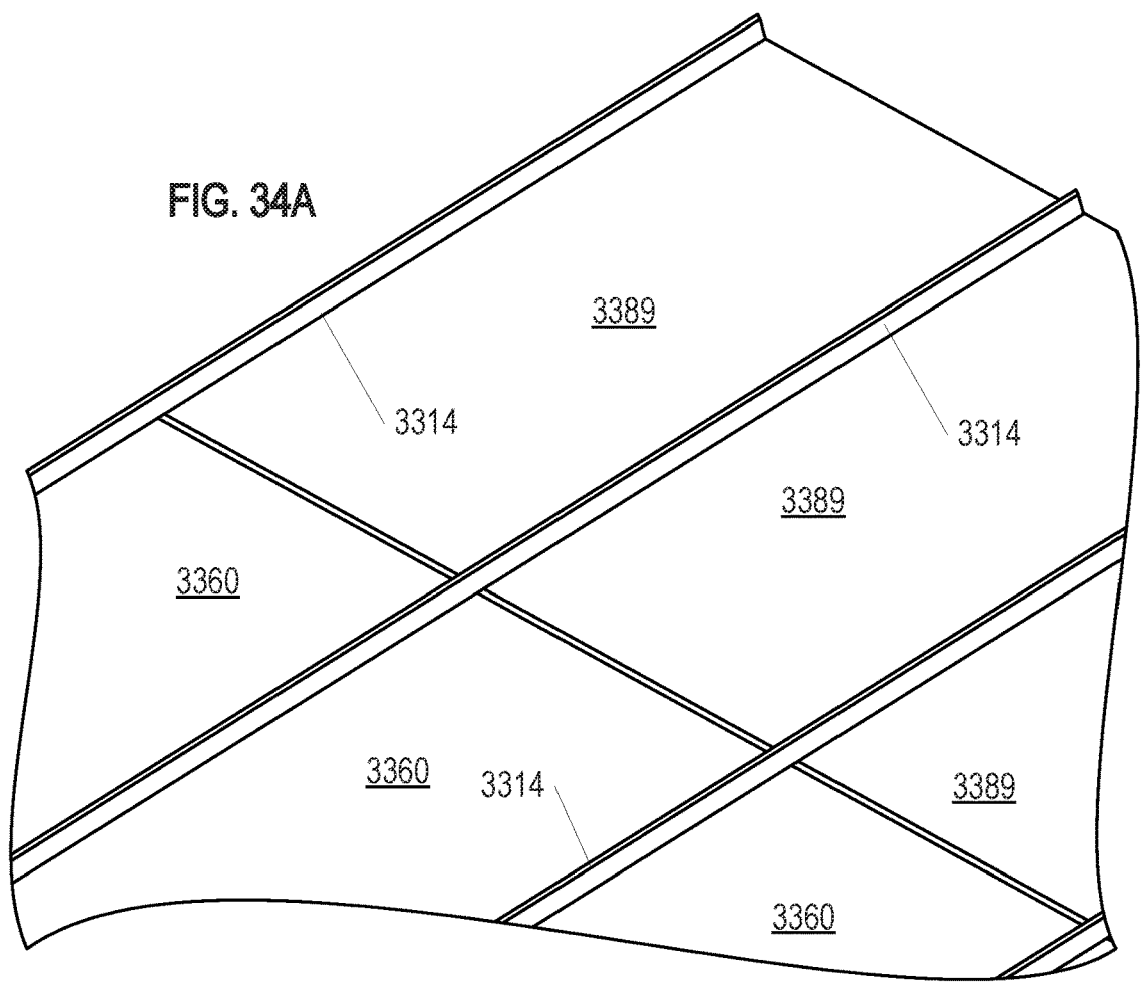
Figure 34B:
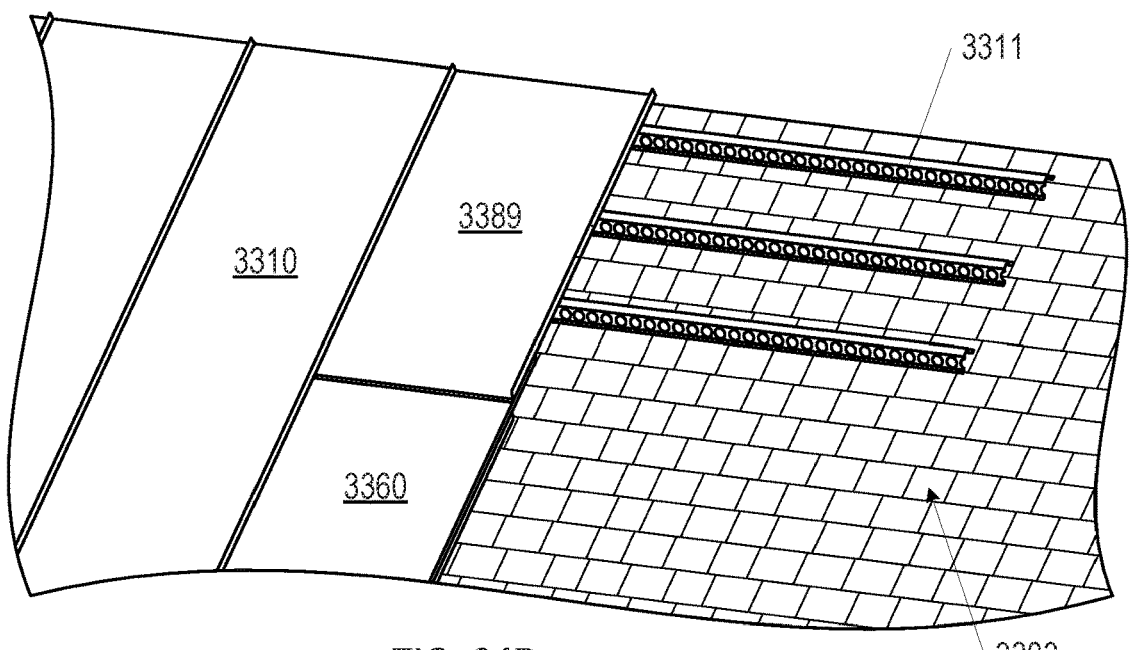

FIGS. 33A-33E show various views of down-roof transition pans 3391 or non-PV pans 3310 (e.g., dummy modules, roof pans) that can be positioned at down-roof end portions of a column of PV module-pan assemblies 3360. As shown in FIG. 33B, the airflow can flow through vented battens 3311 at ridge or up-roof end of a column, which can allow for airflow that enters through eave flashing 3200 to pass under column of PV module-pan assemblies 3160, through vented battens 3311, for example to roof ridge 3250 as noted above. PV module-pan assembly 3360 can be lapped onto planar surface portion 3392 (e.g., up-roof or lower portion) of down-roof transition pan 3391. Down-roof transition pan 3391 can be spaced (e.g. such that transition pan 3391 is coplanar with PV modules 3301) and supported above roof surface 3303 by one or more rows of vented battens 3311. Transition pan 3391 can include planar on-lapped surface 3393 (e.g., down-roof or upper) portion that is raised or relatively elevated above lapped portion 3395 via step 3394, such that non-lapped surface is coplanar or substantially coplanar (e.g., in elevation) with portion of corresponding lapped PV module portion. Non-lapped surface portion 3393 can be same or appear similar to roof pan surfaces or PV modules to provide a more uniform appearance across roof surface 3303. Standing seams 3314 can run along the sides of columns forming structure of overall BIPV system and array, securing adjacent columns and/or rows of PV module-pan assemblies 3360 and/or various non-3310 PV pans to each other.

Similarly to PV module pan assemblies, lapped portion 3395 on the surface of downward transition pan 3391 can include one or more ridges or channels 3374 to prevent or reduce capillary action (e.g., in an up-roof direction). Transition pan 3391 can also include one or more mounting feet 3396 configured to be secured to roof surface 3303 via one or more fasteners. As noted above, transition pans 3391 can also include one or more drains 3397 (e.g., indent or recess features) that can help improve egress of water or other debris (e.g., flowing from vertical seams of column of PV module pan assemblies). Additionally, transition pans 3391 can include corresponding standing seam portions and hemmed portions 3398 for attachment to flashings or other roofing components at eave of roof 3303. Standing seam or hemmed portions 3398 portions can be positioned laterally outward of corresponding seam portions of PV module-pan assembly that can be extended over lapped portion 3395 of down-roof transition pan 3391.

FIGS. 34A-34D show various views of up-roof transition 3389 or non-PV pans 3310 (e.g., dummy modules or roof pans) positioned over or mounted to rows of vented battens 3311 or other spacing layers at ridge portion of roof 3303. As noted above, up-roof transition pans 3389 can be roof pans or appear similar to roof pans having planar surface portion with opposing standing seams 3314 or bent up portions. In other embodiments, standing seams 3314 can be hemmed or bent over. In yet further embodiments, standing seams 3314 can be inverted or bent downward. Up-roof transition pans 3398 can have hemmed over portion 3399 (e.g., U-shaped or hooked edge portion or lip) configured to be positioned adjacent PV module positioned down-roof therefrom. Hemmed edge portion 3399 can reduce or decrease a risk of sharp edges damaging PV modules.

A portion of up-roof transition pan 3389 can be lapped over corresponding down-roof PV module-pan assembly 3360 (e.g., an up-roof portion of a pan) in column. Lapping portion of up-roof transition pan 3389 can be coplanar or substantially coplanar with PV module mounted or bonded onto corresponding down-roof PV module pan assembly 3360. Edge portion (e.g., down-roof hemmed portion) of such lapping portion can be spaced apart from up-roof portion of PV module when lapped. In other embodiments, at least a portion of hemmed portion can abut edge portion of PV module. Standing seams 3314 of up-roof transition pan 3389 can be positioned between (e.g., medially inward relative to) opposing standing seams of PV module pan assembly 3360 on which up-roof transition pan 3389 can be lapped. Up-roof transition pan 3389 can be secured to roof surface 3303 or vented battens 3311 that space and support up-roof transition pan 3389 above roof surface 3303 (e.g., coplanar with PV module).

FIGS. 35A-35I show other various embodiments of PV module pan assemblies that can be provided with BIPV systems as described herein. PV module-pan assemblies 3560 can include any of the other features, in whole or in part, of pans described herein. In some embodiments, as in FIG. 35A, pans 3520 of certain PV module-pan assemblies 3560 can be injection molded having one or more ribs 3521 (alternatively referred to as struts, fins, or supports) extending between opposing lateral sides of pan 3520. In other embodiments, as in FIG. 35B, ribs 3521 can extend longitudinally between end portions of pan 3520. Injection-molded pans 3520 can be made of plastic or other suitable polymer materials. As in FIGS. 35B and 35C, pan 3520 can include hole 3522 to accommodate structures that may be needed to pass through pan 3520, such as a junction box.

Figure 35A:
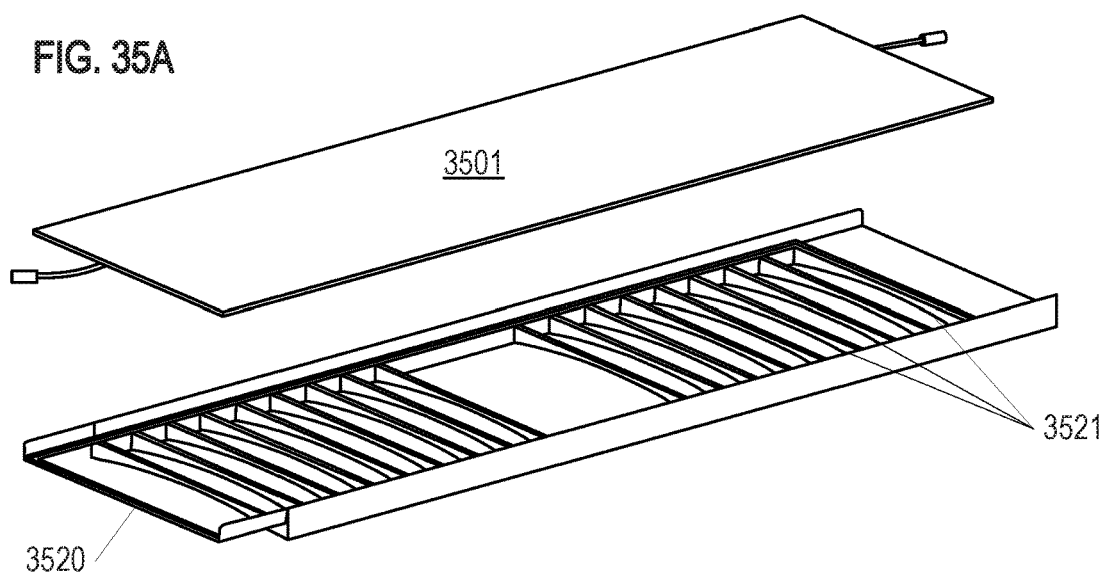
Figure 35B:
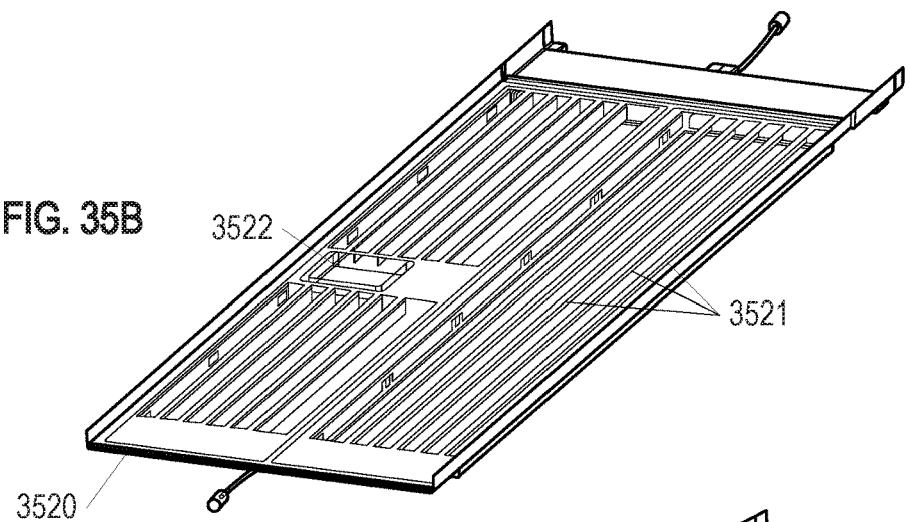
Figure 35C:
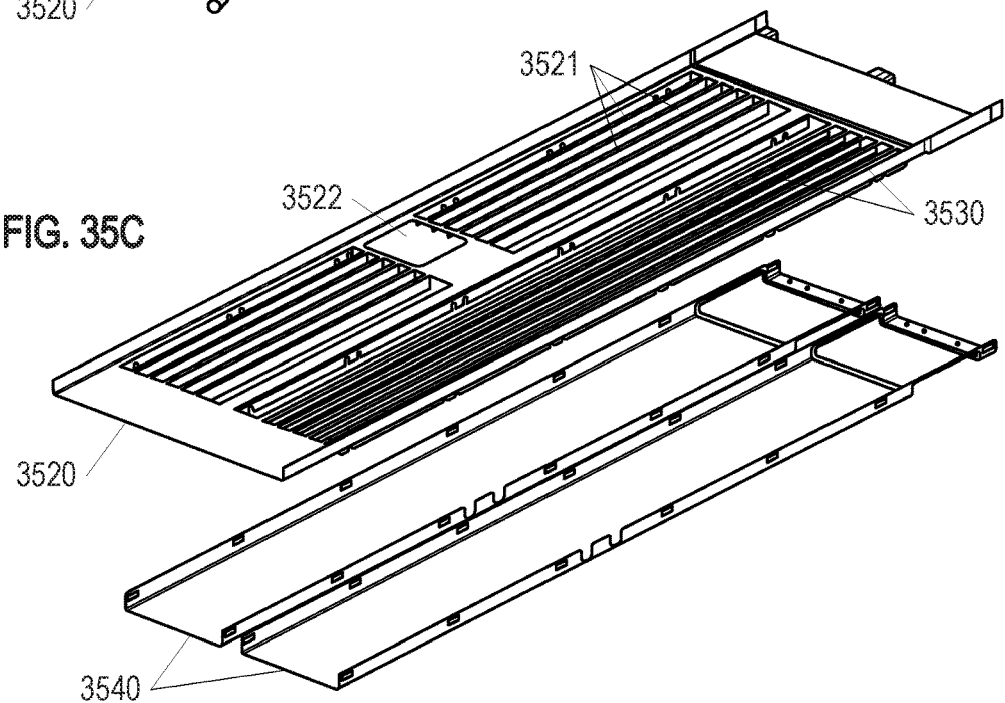
Figure 35D:
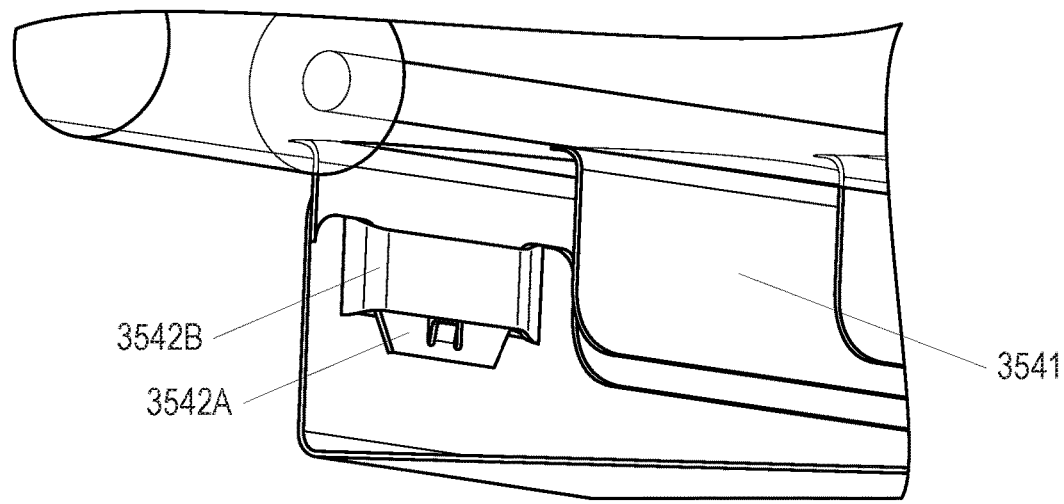
Figure 35E:
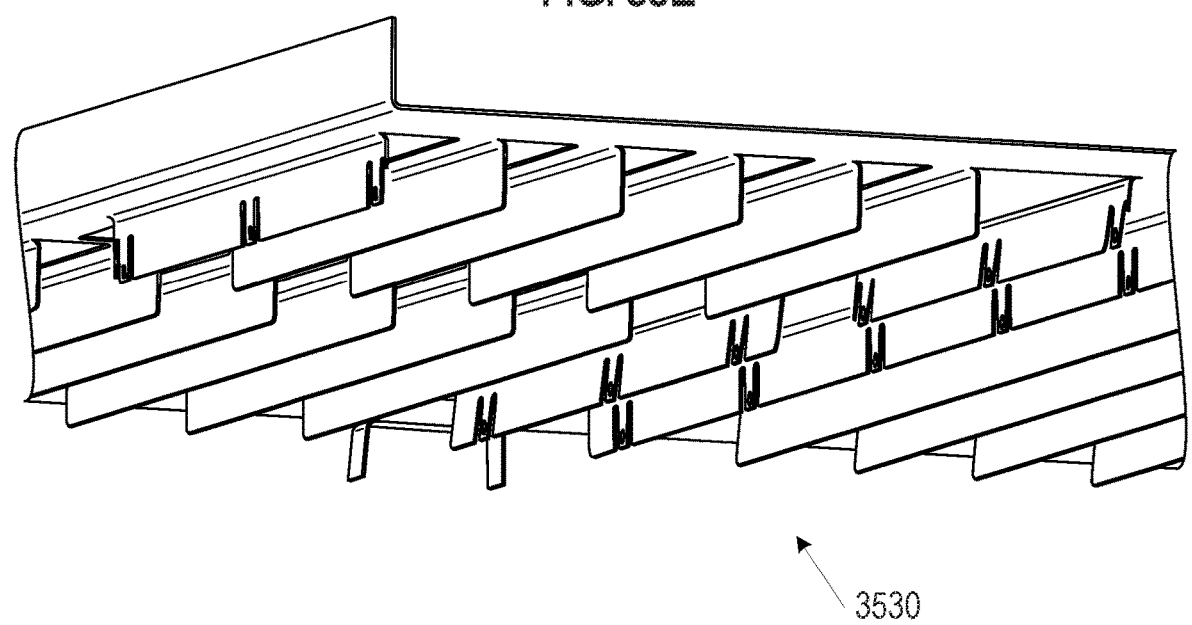

In other embodiments, as seen in FIG. 35C, ribs 3521 can be of different lengths or have different spacing between each other in one region of pan 3520 compared to another region of pan 3520 and extend longitudinally between respective end portions of pan 3520. Injection-molded pans 3520 can be made of plastic or other suitable polymer materials. Further, In other embodiments, as shown in FIGS. 35C-35D, pans of PV module pan assemblies can be stamped with a plurality of fins 3530 or other heat sink or cooling features (e.g., vortex generators). In certain embodiments, fins 3530 can be bent down, away from coupled PV module 3501. Pan 3520 can include one or more secondary base portions 3540 (e.g., trough or valley) coupled, or configured to be coupled, to upper surface portions 3541 of pan 3520 (e.g., PV module mounting portion). Secondary base portions 3540 can be coupled to upper surface portions 3541 with corresponding fasteners 3542A, 3542B (e.g., male and female couplings). For example, respective pan pieces can include corresponding fasteners that fit or snap-together (e.g., bridge lances and corresponding one-way tabs). Fins 3530 provide increased surface area for heat transfer from PV modules 3501 to secondary base portions 3540. Airflow through fin 3530 portions, shown in detail in FIG. 35E, can provide passive cooling.

Figure 35H:
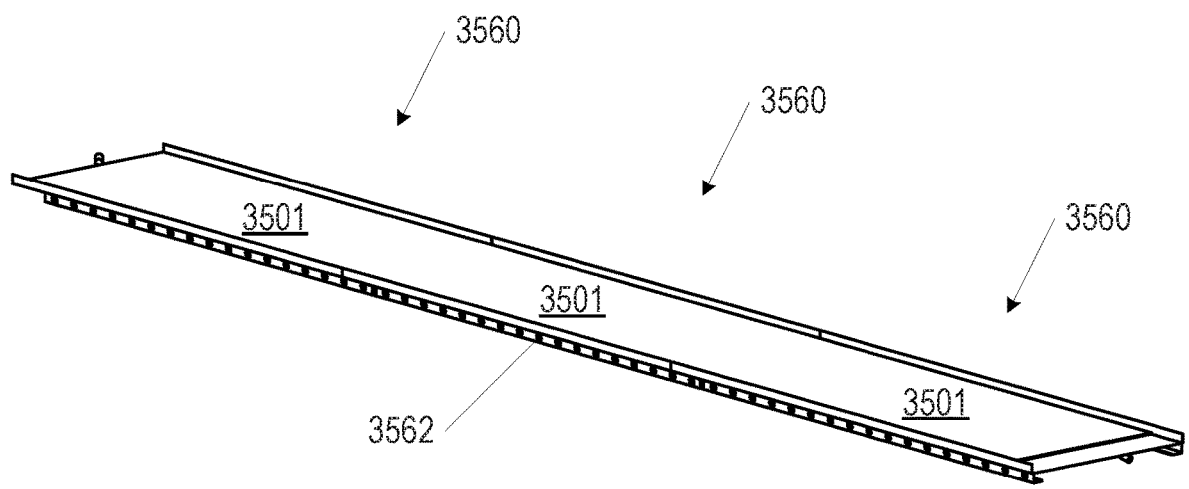
Figure 35I:
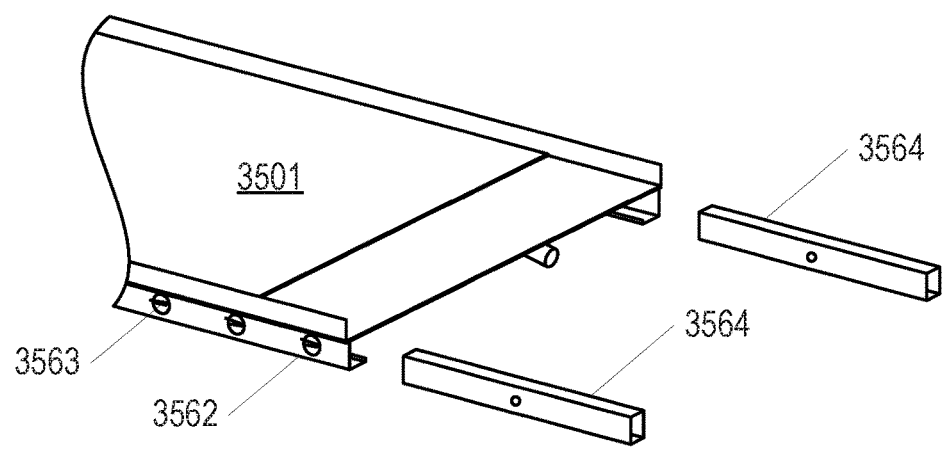

FIGS. 35F-35I show another embodiment of PV module-pan assembly 3560, FIG. 35F providing a perspective view of a single PV module-pan assembly 3560, FIG. 35G providing an exploded view, FIG. 35H providing a perspective view of a set of PV module-pan assemblies 3560 mounted to roof rails 3562, and FIG. 35I providing an exploded detail view of a connection joint of PV module-pan assembly 3560. PV module-pan assembly 3560 includes PV module 3501 bonded or otherwise coupled to upper or mounting surface of pan 3520. Roof rails 3562 can be mounted to underside of pan 3520 opposite PV module 3501. Roof rails 3562 can be welded or otherwise secured in position. Roof rails 3562 can include one or more holes 3563 for wire routing. Further, splices 3564 can be added at up-roof end portions of each roof rail 3562. As shown in FIG. 35I, splices 3564 can form joints or connecting portions where corresponding roof rails 3562 of up-roof pan module assembly and down-roof PV pan module assemblies 3560 are joined forming column of two or more lapped PV module-pan assemblies 3560. PV module-pan assemblies 3560 can be slid together with splices between corresponding roof rails 3562. Splices 3564 can provide improved stiffness or rigidity at each connection joint. Wires can be connected and clipped or taped to portions of pan 3520 or PV pan-module assembly 3560. Columns of PV pan-module assemblies, connected by roof rails 3562, can thereby be installed as a single unit. Roof rails 3562 can elevate PV modules up above a roof surface, in either built-in or on-roof embodiments of a solar panel system.

Figure 36B:
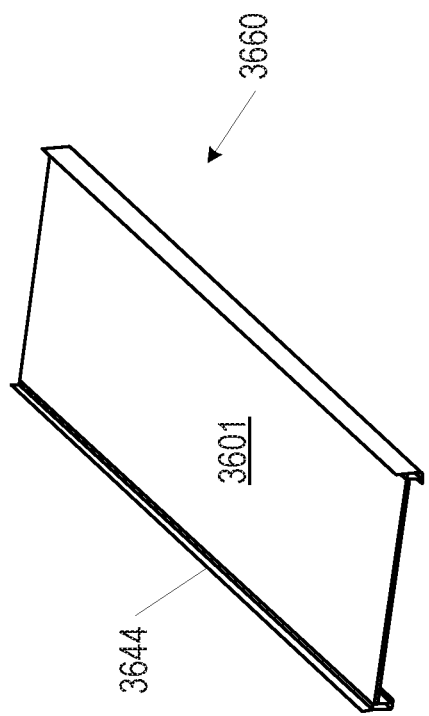
FIGS. 36A-36G show a further embodiment of PV module-pan assembly according to various embodiments of this technology.
Figure 36C:
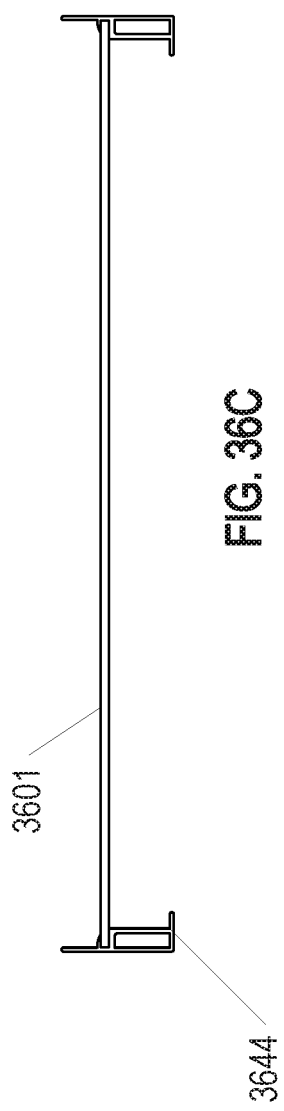
Figure 36A:
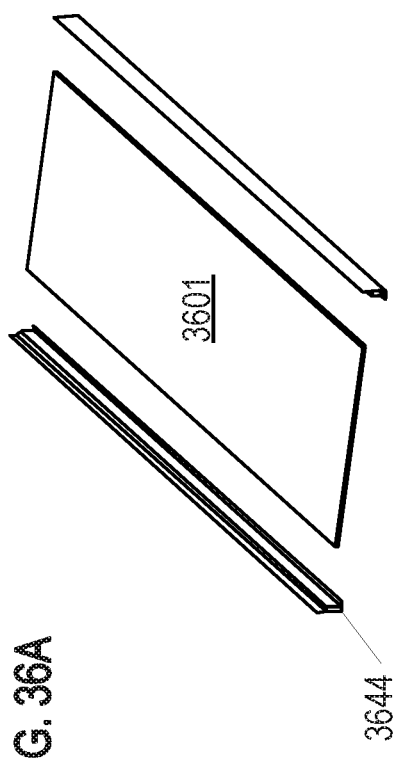
Figure 36D:
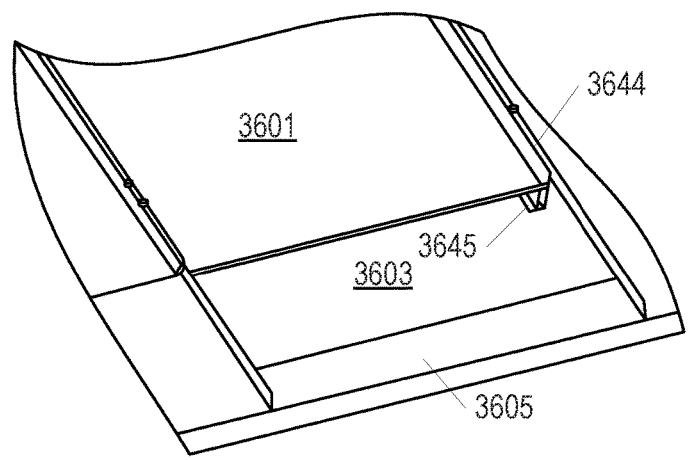
Figure 36E:
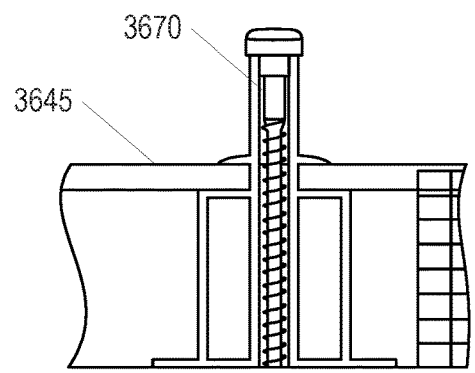
Figure 36F:
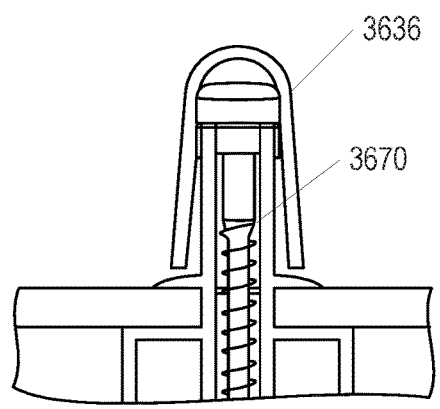
Figure 36G:
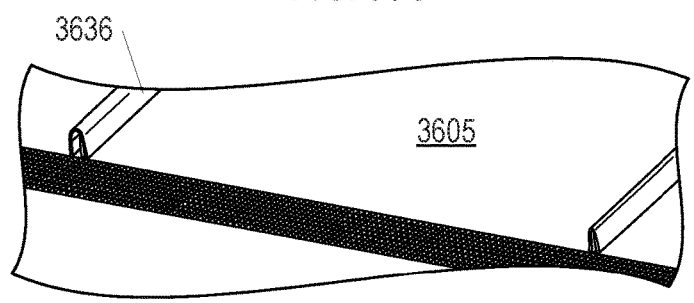

FIGS. 36A-36G show a further embodiment of PV module-pan assembly 3660, FIG. 36A being an exploded perspective view, FIG. 36B being a perspective view, and FIG. 36C being a cross-sectional view of the same. In such embodiments, PV modules 3601 can be provided with extruded frame portions 3644 adhered or otherwise coupled to PV modules 3660. Frame portions 3644 can be secured to roof surface. In certain embodiments, planar surface portion (e.g., pan portion) is not provided under PV module 3601.

FIGS. 36D-36G show a progression of installation using PV module-pan assemblies 3660. Extruded frame portions 3644 can include seams portions 3646 and also mounting feet portions 3645 extending downward from seam portions 3646, shown in FIG. 36D with PV module 3601 over roof surface 3603, where dummy pan 3605 is at eve of roof surface 3603. Mounting portions 3645 can be secured to roof surface via fasteners 3670 (e.g., screws), shown in FIG. 36E. Seam cap 3636 can be snapped over seam portions 3646 and fasteners 3670, shown in FIG. 36F. Finally, shown in FIG. 36G, the entirety of seams at dummy pans 3605 are covered with seam covers 3636 at the eave of the roof.

FIG. 36H shows a simplified schematic of PV module-pan assembly system, where PV module 3601 is mounted on frame portions 3644 along either longitudinal side of PV module 3601. Frame portions 3644 are secured to pan 3620 via mounting foot 3645, which is in turn adjacent to seam clip 3624. As shown, seam clip 3624 has tabs 3626 curving downward and outward from the top of seam clip 3624, thereby coupling with both pan 3620 and seam portions 3646 of frame portion 3644.

Figure 37A:
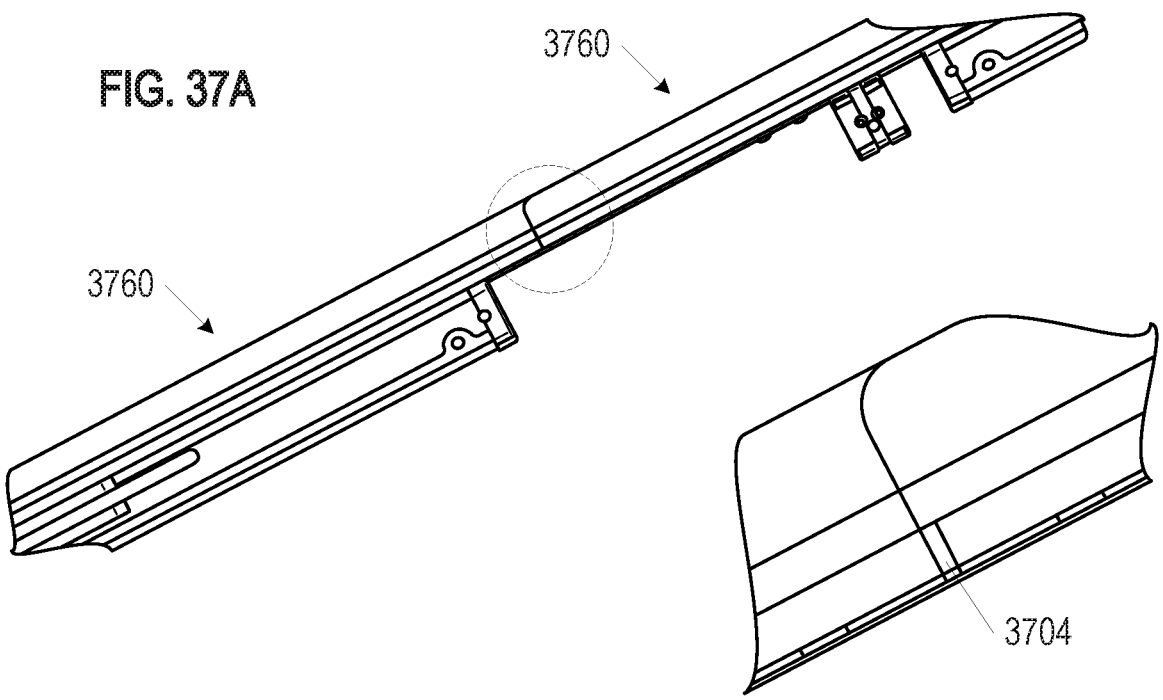
FIGS. 37A and 37B show a substantially co-planar PV module-pan assembly system according to various embodiments of this technology.
Figure 37B:
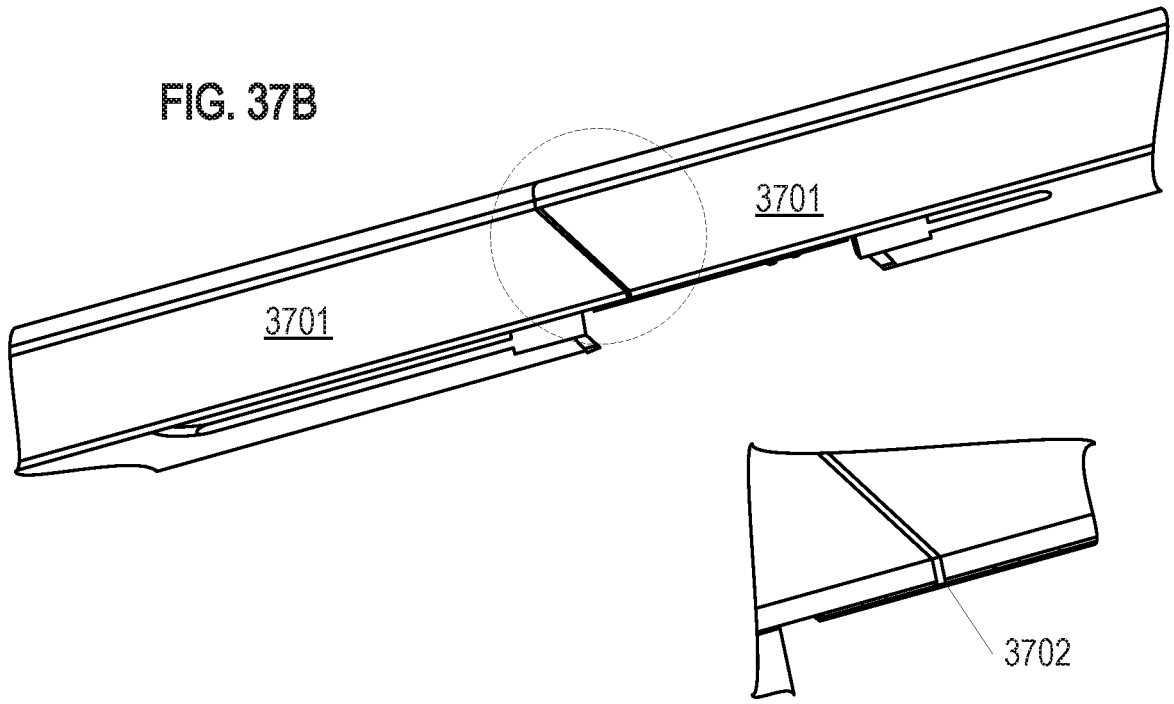

FIG. 37A is a side view and FIG. 37B is a perspective view illustrating a coplanar connection between PV modules 3701 and PV pan-module assemblies 3760. Gaps between PV modules 3701 and PV module-pan assemblies 3760 can be smoothed over, sealed, or made to appear seamless in various ways. In some embodiments, silicone 3702 can be applied in between two PV modules 3701, or between PV module and another structural module, at an installation site. In some aspects, silicone 3702 can be transparent to match the index of refraction of the glass of PV modules 3701. In other aspects, silicone 3702 can be black to match the color or light reflection properties of PV modules 3701 and or other structural modules. In further aspects, PV module-pan assemblies 3760 can be held together by a rubber strap 3704, which can be installed or manufactured as part of overall PV module-pan assemblies 3760 at a fabrication factory. The relatively seamless appearance can be both aesthetically pleasing and also contribute to efficiency of an overall solar panel system.

From the foregoing, it will be appreciated that specific embodiments of the invention have been described herein for purposes of illustration, but that various modifications may be made without deviating from the spirit and scope of the various embodiments of the invention. Further, while various advantages associated with certain embodiments of the invention have been described above in the context of those embodiments, other embodiments may also exhibit such advantages, and not all embodiments need necessarily exhibit such advantages to fall within the scope of the invention. Accordingly, the invention is not limited, except as by the appended claims.

While the above description describes various embodiments of the invention and the best mode contemplated, regardless how detailed the above text, the invention can be practiced in many ways. Details of the system may vary considerably in its specific implementation, while still being encompassed by the present disclosure. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific examples disclosed in the specification, unless the above Detailed Description section explicitly defines such terms. Accordingly, the actual scope of the invention encompasses not only the disclosed examples, but also all equivalent ways of practicing or implementing the invention under the claims.

The teachings of the invention provided herein can be applied to other systems, not necessarily the system described above. The elements and acts of the various examples described above can be combined to provide further implementations of the invention. Some alternative implementations of the invention may include not only additional elements to those implementations noted above, but also may include fewer elements. Further any specific numbers noted herein are only examples; alternative implementations may employ differing values or ranges, and can accommodate various increments and gradients of values within and at the boundaries of such ranges.

References throughout the foregoing description to features, advantages, or similar language do not imply that all of the features and advantages that may be realized with the present technology should be or are in any single embodiment of the invention. Rather, language referring to the features and advantages is understood to mean that a specific feature, advantage, or characteristic described in connection with an embodiment is included in at least one embodiment of the present technology. Thus, discussion of the features and advantages, and similar language, throughout this specification may, but do not necessarily, refer to the same embodiment.

Furthermore, the described features, advantages, and characteristics of the present technology may be combined in any suitable manner in one or more embodiments. One skilled in the relevant art will recognize that the present technology can be practiced without one or more of the specific features or advantages of a particular embodiment. In other instances, additional features and advantages may be recognized in certain embodiments that may not be present in all embodiments of the present technology.

Any patents and applications and other references noted above, including any that may be listed in accompanying filing papers, are incorporated herein by reference. Aspects of the invention can be modified, if necessary, to employ the systems, functions, and concepts of the various references described above to provide yet further implementations of the invention.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

Although certain aspects of the invention are presented below in certain claim forms, the applicant contemplates the various aspects of the invention in any number of claim forms. Accordingly, the applicant reserves the right to pursue additional claims after filing this application to pursue such additional claim forms, in either this application or in a continuing application.

The invention claimed is:

1. A building integrated photovoltaic system comprising:
a plurality of non-photovoltaic (non-PV) roof pans arranged in one or more non-PV roof pan columns on a support structure extending in an up-roof/down-roof direction to form a first part of a roof, each of the plurality of non-PV roof pans having a left side and a right side, wherein each of the left and right side comprise a vertically extending sidewall;
a plurality of photovoltaic (PV) module-pans arranged in one or more PV module-pan columns on the support structure extending in the up-roof/down-roof direction to form a second part of the roof, each of the plurality of PV module-pans having a left and a right side, wherein each of the left and right side comprise a vertically extending sidewall;
wherein each of the one or more PV module-pan columns and each of the one or more non-PV roof pan columns comprises a top and a bottom;
a plurality of transition pans located along at least the top of and bottom of the one or more PV module-pan columns, each of the plurality of transition pans having a left and a right side, wherein each of the left and right side comprise a vertically extending sidewall;
wherein the plurality of non-PV roof pans, the plurality of PV module-pans and the plurality of transition pans are arranged to form a plurality of columns that include the one or more non-PV roof pan columns and the one or more PV module-pan columns, wherein the vertically extending sidewalls of the left and right sides of the plurality of non-PV roof pans and the plurality of PV module-pans in adjacent columns are engaged with each other along a seam; and
a plurality of seam clips and seam covers arranged to secure the seam between the left and right sides of the plurality of non-PV roof pans and the plurality of PV module-pans in adjacent columns to each other.

2. The building integrated photovoltaic system of claim 1, further comprising grounding clips configured to engage with and electrically ground one or more of the plurality of PV module-pans, one or more of the plurality of non-PV roof pans, or both.

3. The building integrated photovoltaic system of claim 1, wherein the one or more non-PV roof pan columns, the one or more PV module-pan columns, the plurality of transition pans, and the seam covers form a substantially planar surface.

4. The building integrated photovoltaic system of claim 1, wherein each of the PV module-pans comprises a PV module layer having bypass diodes configured to bypass one or more solar cell sub-strings affected by a shade pattern of one or more standing seams.

5. The building integrated photovoltaic system of claim 1, wherein the one or more non-PV roof pan columns, the one or more PV module-pan columns, the plurality of transition pans, and the seam covers form a surface with a generally uniform appearance.

6. The building integrated photovoltaic system of claim 1, wherein at least one of the plurality of PV module-pans further comprises a compartment having a phase change material having a heat capacity such that the phase change material can transition from a first phase to a second phase at a transition temperature.

7. The building integrated photovoltaic system of claim 1, further comprising a plurality of vented battens positioned between the plurality of PV module-pans and the support structure, wherein the plurality of vented battens provide for an airflow path between the plurality of PV module-pans and the support structure.

8. The building integrated photovoltaic system of claim 1, wherein each of the plurality of non-PV pans and each of the plurality of PV module-pans are metal roof pans comprising a sheet of metal.

9. The building integrated photovoltaic system of claim 1
wherein the one or more non-PV roof pan columns comprises at least a first column that is entirely non-PV roof pans;
wherein the one or more PV module-pan columns comprises at least a second column that comprises a partial column having a first set of PV metal roof pans, each having one or more PV modules arranged on a top surface thereof, and at least one transition pan.

10. The building integrated photovoltaic system of claim 9, wherein each of the plurality of PV module-pans and each of the plurality of non-PV roof pans comprises a pair of standing seams running substantially an entire length of each of the plurality of PV module-pans and each of the plurality of non-PV roof pans on each side.

11. The building integrated photovoltaic system of claim 10,
wherein the plurality of seam clips are positioned between laterally adjacent PV metal roof pans in adjacent columns, wherein each of the plurality of seam clips includes tab portions configured to bend away from each other and cover one standing seam of the pair of standing seams.

12. The building integrated photovoltaic system of claim 11,
a wherein the seam covers are positioned over at least part of the plurality of seam clips and one standing seam of the pair of standing seams, wherein seam clip tab portions are configured to have wing portions having a spring tension, the wing portions being configured to mechanically couple with engagement portions of a seam cover and to frictionally interface with an interior surface of the seam cover.

13. The building integrated photovoltaic system of claim 9, further comprising a heat storage material, wherein the heat storage material comprises at least one compartment having a phase change material having a heat capacity such that the phase change material can transition from a first phase to a second phase at a transition temperature.

14. The building integrated photovoltaic system of claim 13, wherein each of the plurality of PV module-pans further comprises a structural support pan having stand-off sections forming one or more wells in which pouches of the heat storage material are contained.

15. The building integrated photovoltaic system of claim 9, wherein one or more of the plurality of non-PV roof pans comprise one or more non-PV modules configured to mimic the appearance of the one or more PV modules.

16. The building integrated photovoltaic system of claim 11, wherein one or more of the plurality of PV module pans comprises a bypass diode configured to bypass one or more solar cell sub-strings affected by a shade pattern of one or more of the standing seams or seam cover.

17. The building integrated photovoltaic system of claim 9, further comprising:
a plurality of vented battens positioned between the plurality of PV module pans and an underlying support structure, wherein the plurality of vented battens mount the plurality of PV module-pans and provide an airflow path between the plurality of PV module-pans.

18. The building integrated photovoltaic system of claim 9, wherein the at least one transition pan comprises up-roof transition pans disposed proximate to a roof ridge and is configured to have a low solar reflectance and a low thermal emittance such that about 90% of heat from incident solar energy can be absorbed.

19. The building integrated photovoltaic system of claim 9, wherein the at least one transition pan comprises a down-roof transition pan disposed proximate to a roof eave and is configured to have a high solar reflectance and a low thermal emittance such that about 50% of heat from incident solar energy can be absorbed.

20. A building integrated photovoltaic system comprising:
a plurality of non-photovoltaic (non-PV) roof pans arranged in one or more non-PV roof pan columns on a support structure extending in an up-roof/down-roof direction to form a first part of a roof, wherein each of the plurality of non-PV roof pan columns comprises a left side having a vertically extending sidewall and a right side having a vertically extending sidewall;
a plurality of photovoltaic (PV) module-pans arranged in one or more PV module-pan columns on the support structure extending in the up-roof/down-roof direction to form a second part of the roof, wherein each of the plurality of PV module-pans comprises a left side having a vertically extending sidewall and a right side having a vertically extending sidewall; and
a plurality of transition pans located along at least the top of and bottom of the one or more PV module-pan columns, each of the plurality of transition pans having a left side having a vertically extending sidewall and a right side having a vertically extending sidewall,
wherein the plurality of non-PV roof pans and the plurality of PV module-pans are configured to be arranged in a plurality of vertically extending columns in which adjacent columns are secured by engagement between the respective sidewalls of the left and right sides of adjacent non-PV roof pans and PV module-pans in adjacent columns along a seam.

* * * * *